(12) United States Patent
Chen et al.

(10) Patent No.: US 12,334,352 B2
(45) Date of Patent: Jun. 17, 2025

(54) METHOD AND SYSTEM FOR ETCH DEPTH CONTROL IN III-V SEMICONDUCTOR DEVICES

(71) Applicant: SEMICONDUCTOR COMPONENTS INDUSTRIES, LLC, Scottsdale, AZ (US)

(72) Inventors: Wayne Chen, Santa Clara, CA (US); Andrew P. Edwards, Santa Clara, CA (US); Clifford Drowley, Santa Clara, CA (US); Subhash Srinivas Pidaparthi, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/619,304

(22) Filed: Mar. 28, 2024

(65) Prior Publication Data

US 2024/0242969 A1    Jul. 18, 2024

Related U.S. Application Data

(62) Division of application No. 17/356,042, filed on Jun. 23, 2021, now Pat. No. 11,948,801.
(Continued)

(51) Int. Cl.
*H01L 21/306* (2006.01)
*H01L 21/308* (2006.01)
(Continued)

(52) U.S. Cl.
CPC ...... *H01L 21/30612* (2013.01); *H01L 21/308* (2013.01); *H01L 22/26* (2013.01);
(Continued)

(58) Field of Classification Search
CPC .......... H01L 21/02694; H01L 21/0415; H01L 21/046; H01L 21/0465; H01L 21/047; H01L 21/2056; H01L 21/2215; H01L 21/2252; H01L 21/2253; H01L 21/265; H01L 21/266; H01L 21/26553;
(Continued)

(56) References Cited

U.S. PATENT DOCUMENTS

2009/0294800 A1\* 12/2009 Cheng ............. H01L 21/823412
257/E21.403
2013/0299873 A1    11/2013 Disney et al.
(Continued)

*Primary Examiner* — Natalia A Gondarenko
(74) *Attorney, Agent, or Firm* — Kevin B. Jackson

(57) ABSTRACT

A method of manufacturing a vertical FET device includes providing a semiconductor substrate structure including a marker layer; forming a hardmask layer coupled to the semiconductor substrate structure, wherein the hardmask layer comprises a set of openings operable to expose an upper surface portion of the semiconductor substrate structure; etching the upper surface portion of the semiconductor substrate structure to form a plurality of fins; etching at least a portion of the marker layer; detecting the etching of the at least a portion of the marker layer; epitaxially growing a semiconductor layer in recess regions disposed between adjacent fins of the plurality of fins; forming a source metal layer on each of the plurality of fins; and forming a gate metal layer coupled to the semiconductor layer.

20 Claims, 93 Drawing Sheets

Related U.S. Application Data

(60) Provisional application No. 63/044,693, filed on Jun. 26, 2020.

(51) Int. Cl.
  H01L 21/66 (2006.01)
  H10D 30/01 (2025.01)
  H10D 30/63 (2025.01)
  H10D 62/85 (2025.01)

(52) U.S. Cl.
  CPC ......... H10D 30/021 (2025.01); H10D 30/025 (2025.01); H10D 30/63 (2025.01); H10D 62/8503 (2025.01)

(58) Field of Classification Search
  CPC ......... H01L 21/26586; H01L 21/28044; H01L 21/28061; H01L 21/28079; H01L 21/28088; H01L 21/3006; H01L 21/31155; H01L 29/0653; H01L 29/32; H01L 29/2003; H01L 29/66462; H01L 29/66522; H01L 29/78681; H01L 29/7786; H01L 29/7787; H01L 29/7788; H01L 29/78621; H01L 21/3245; H01L 21/2654; H01L 21/47576; H01L 21/4763; H01L 21/7682; H01L 21/76859; H01L 21/823814; H01L 21/82385; H01L 29/41725–41791; H01L 29/4236; H01L 29/41775; H01L 29/66575–66598; H01L 29/7856; H01L 29/6653; H01L 29/66803; H01L 29/7783; H01L 29/205; H01L 29/36; H01L 29/432; H01L 29/8083; H01L 29/66431; H01L 29/122–127; H01L 29/15–158; H01L 29/452; H01L 29/66924; H01L 29/475; H01L 29/0657; H01L 29/0638; H01L 29/0684; H01L 29/66795; H01L 29/7853; H01L 29/778–7789; H01L 21/8232; H01L 21/823418; H01L 21/823431; H01L 21/823437; H01L 21/823487; H01L 21/823821; H01L 21/823885; H01L 21/30612; H01L 21/308; H01L 22/26; H01L 29/66666; H01L 29/7827; H01L 29/0843; H01L 29/1066; H01L 29/66909; H01L 29/7828; H01L 29/785; H10D 30/021; H10D 30/024; H10D 30/025; H10D 30/63; H10D 30/0515; H10D 30/62; H10D 30/6211; H10D 30/6212; H10D 30/6219; H10D 30/6735; H10D 30/635; H10D 30/831; H10D 62/052; H10D 62/117; H10D 62/122; H10D 62/149; H10D 62/213; H10D 62/221; H10D 62/8503; H10D 62/343; H10D 64/027; H10D 64/251; H10D 64/252; H10D 64/2527; H10D 64/258; H10D 64/311; H10D 64/512; H10D 64/513; H10D 84/0126; H10D 84/0158; H10D 84/016; H10D 84/0177; H10D 84/0193; H10D 84/0195; H10D 84/05; H10D 84/08; H10D 84/82; H10D 84/834; H10D 84/837; H10D 84/853; H10D 84/87
  USPC ....... 438/327, 308, 349, 358, 378, 394, 618, 438/912, 798; 257/401, 76, 194, 256, 257/288, E29.246, E29.255, E29.312
  See application file for complete search history.

(56) References Cited

U.S. PATENT DOCUMENTS

| 2014/0370669 | A1* | 12/2014 | Disney | H01L 29/8083 438/192 |
|---|---|---|---|---|
| 2015/0318377 | A1* | 11/2015 | Cheng | H01L 29/6653 257/349 |
| 2020/0098885 | A1 | 3/2020 | Then et al. | |
| 2020/0388702 | A1 | 12/2020 | Hwang et al. | |

* cited by examiner

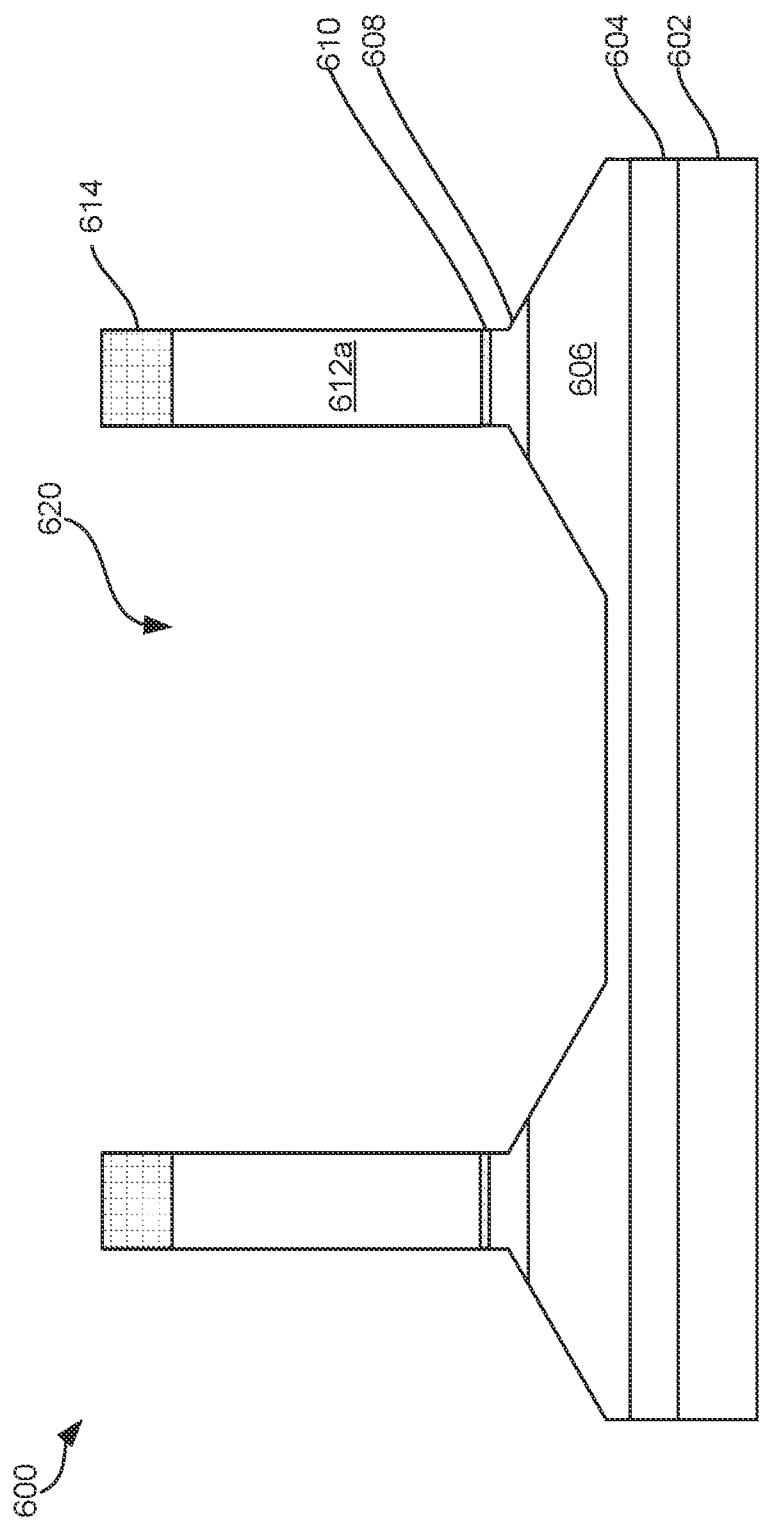

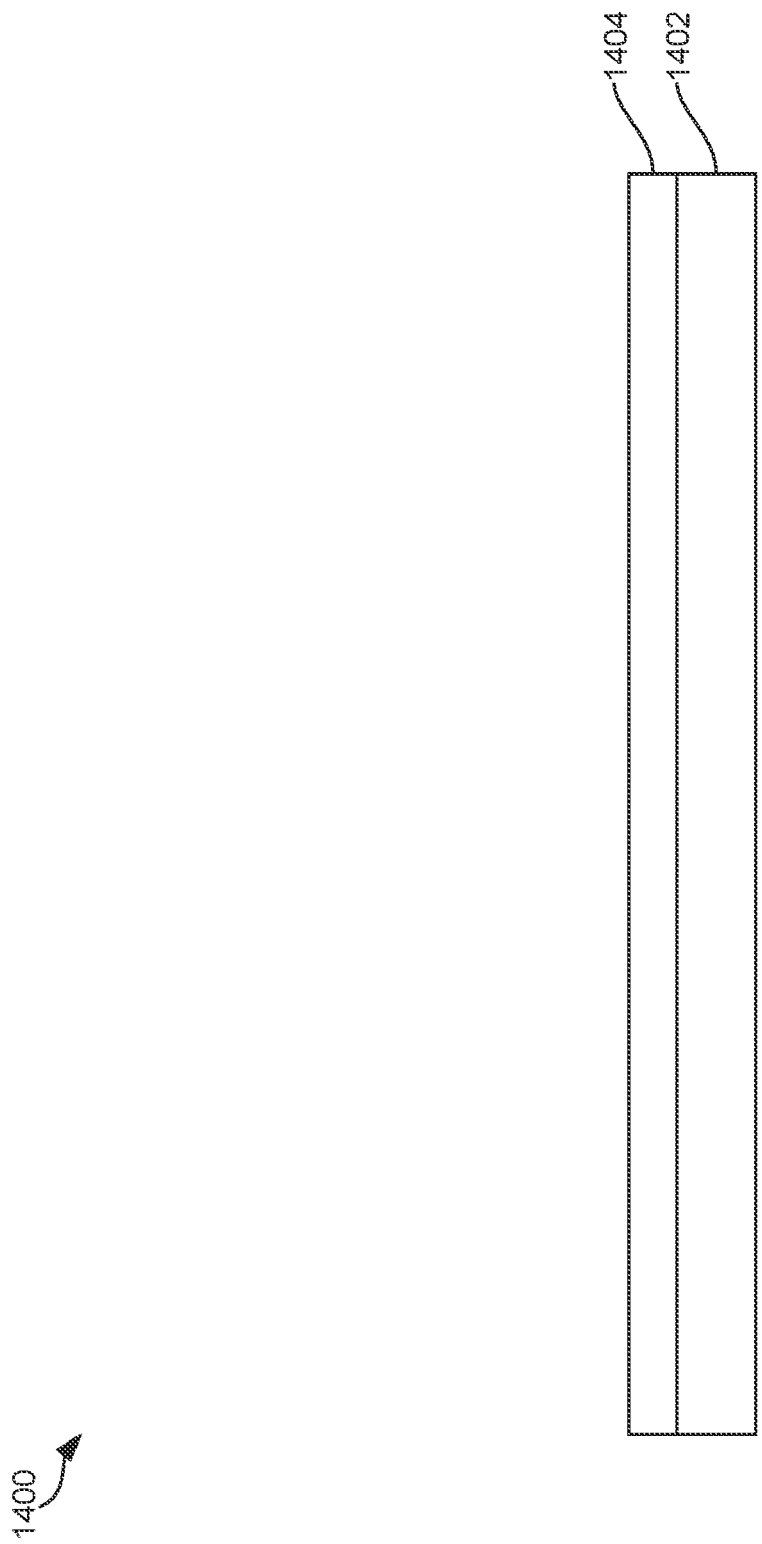

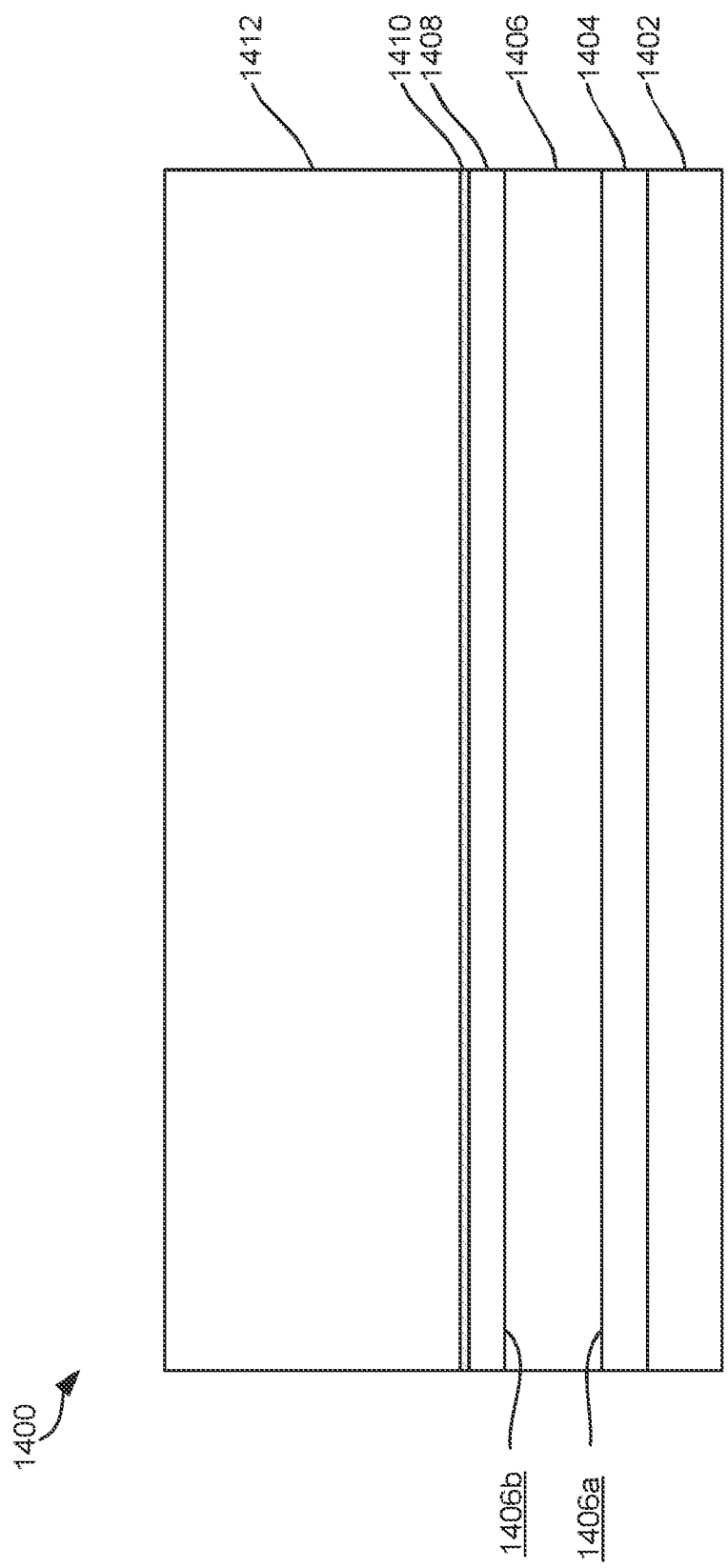

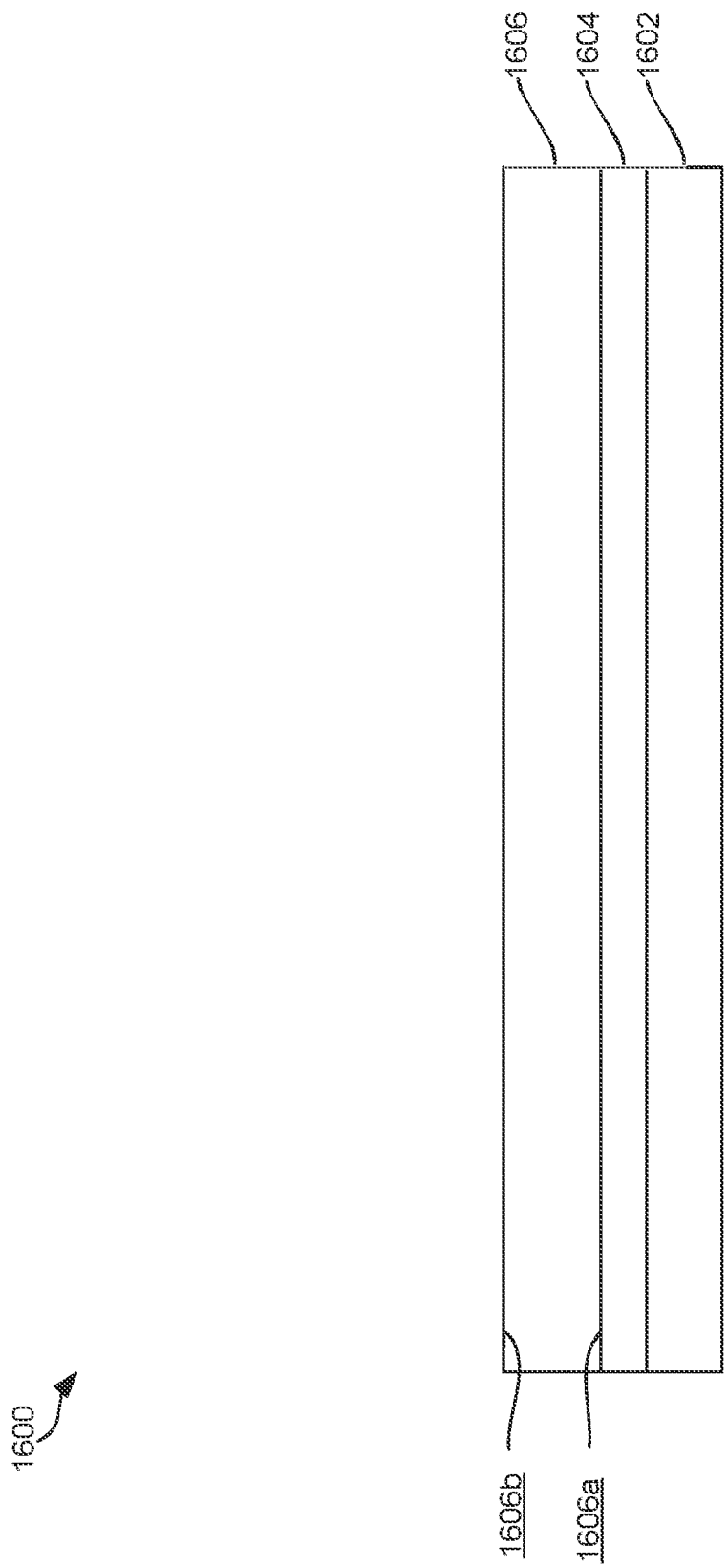

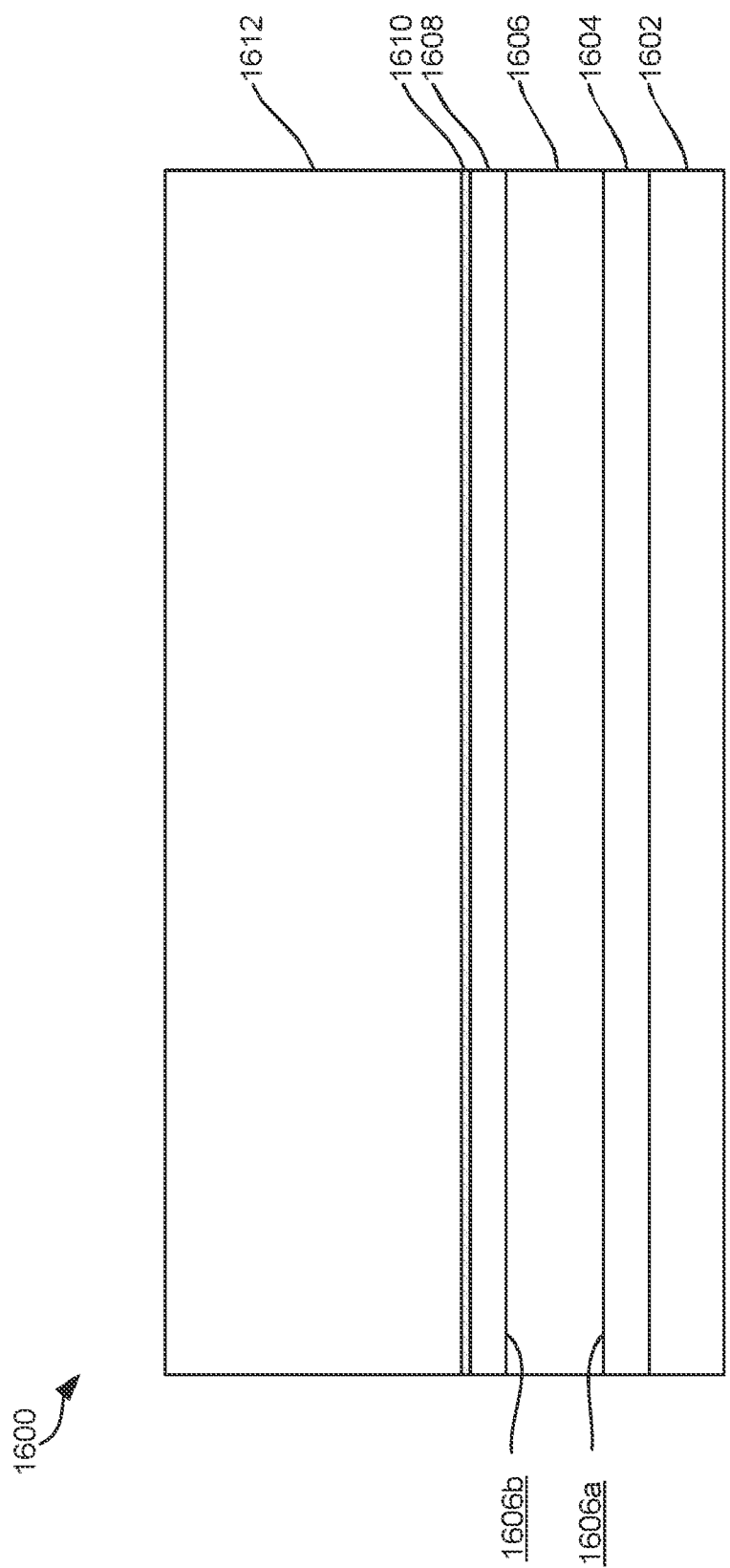

METHOD AND SYSTEM FOR ETCH DEPTH CONTROL IN III-V SEMICONDUCTOR DEVICES

CROSS-REFERENCE TO RELATED APPLICATIONS

This application is divisional application of U.S. patent application Ser. No. 17/356,042 filed on Jun. 23, 2021 and issued as U.S. Pat. No. 11,948,801 on Apr. 2, 2024, which claims the benefit of and priority to U.S. Provisional Patent Application No. 63/044,693, filed on Jun. 26, 2020, the disclosure of which are hereby incorporated by reference in its entirety for all purposes.

BACKGROUND

Power electronics are widely used in a variety of applications, including power conversion, electric motor drives, switching power supplies, and lighting. Power electronic devices such as transistors are commonly used in such power-switching applications. The operation of the present generation of power transistor devices, particularly with high-voltage (>600V) handling capability, is hampered by slow switching speeds and high specific on-resistance.

There is a need in the art to control the manufacturing process of transistors to improve the electrical performance of the transistors, such as breakdown voltage, leakage current, and specific on-resistance.

SUMMARY

Some embodiments of the present invention provide novel vertical-fin-based field-effect transistor (FET) devices and methods of manufacturing such FET devices with improved specific on-resistance, leakage current, and breakdown voltage. Some embodiments of the present invention provide novel metal-oxide-semiconductor field-effect transistor (MOSFET) devices and methods of manufacturing such MOSFET devices with improved specific on-resistance, leakage current, and breakdown voltage.

In one aspect of the present invention, a method of manufacturing a FET device includes: providing a semiconductor substrate structure including a marker layer; forming a hardmask layer coupled to the semiconductor substrate structure, wherein the hardmask layer comprises a set of openings operable to expose an upper surface portion of the semiconductor substrate structure; etching the upper surface portion of the semiconductor substrate structure to form a plurality of fins; etching at least a portion of the marker layer; detecting the etching of the at least a portion of the marker layer; epitaxially growing a semiconductor layer in recess regions disposed between adjacent fins of the plurality of fins; forming a source metal layer on each of the plurality of fins; and forming a gate metal layer coupled to the semiconductor layer.

In some embodiments, the substrate structure includes: a first epitaxial semiconductor layer coupled to a semiconductor substrate, wherein the first epitaxial semiconductor layer is characterized by a first conductivity type and a first dopant concentration; a second epitaxial semiconductor layer coupled to the first epitaxial semiconductor layer, wherein the second epitaxial semiconductor layer is characterized by the first conductivity type; a marker layer coupled to the second epitaxial semiconductor layer; a third epitaxial semiconductor layer coupled to the marker layer, wherein the third epitaxial semiconductor layer is characterized by the first conductivity; and a fourth epitaxial semiconductor layer coupled to the third epitaxial semiconductor layer, wherein the fourth epitaxial semiconductor layer is characterized by the first conductivity type and a second dopant concentration.

In some embodiments, the second semiconductor layer is characterized by a first graded dopant concentration that is a gradient linearly increased from the first dopant concentration to a third dopant concentration, wherein the third dopant concentration is greater than the first dopant concentration and less than the second dopant concentration.

In some embodiments, the third semiconductor layer is characterized by a second graded dopant concentration that is a gradient linearly increased from a third dopant concentration to the second dopant concentration, wherein the third dopant concentration is greater than the first dopant concentration and less than the second dopant concentration.

In one aspect of the present invention, a method of manufacturing a FET device includes: providing a semiconductor substrate; epitaxially growing a first semiconductor layer coupled to the semiconductor substrate, wherein the first semiconductor layer is characterized by a first conductivity type and a first dopant concentration; epitaxially growing a second semiconductor layer coupled to the first semiconductor layer, wherein the second semiconductor layer is characterized by the first conductivity type; epitaxially growing a third semiconductor layer coupled to the second semiconductor layer, wherein the third semiconductor layer is characterized by the first conductivity type; forming a marker layer coupled to the third semiconductor layer; epitaxially growing a fourth semiconductor layer coupled to the marker layer, wherein the fourth semiconductor layer is characterized by the first conductivity type and a second dopant concentration; forming a hardmask layer coupled to the fourth semiconductor layer, wherein the hardmask layer comprises a set of openings operable to expose an upper surface portion of the fourth semiconductor layer; forming a plurality of fins by etching, using the hardmask layer as a mask, the fourth semiconductor layer, wherein each of the plurality of the fins is separated by one of a plurality of recess regions; etching at least a portion of the marker layer; detecting the etching of the at least a portion of the marker layer; epitaxially growing a fifth semiconductor layer within the plurality of recess regions, wherein the fifth semiconductor layer is characterized by a second conductivity type opposite to the first conductivity type; forming a source metal layer on each of the plurality of fins; and forming a gate metal layer coupled to the fifth semiconductor layer.

In some embodiments, the second semiconductor layer is characterized by a graded dopant concentration that is a gradient linearly increased from the first dopant concentration to a third dopant concentration, wherein the third dopant concentration is greater than the first dopant concentration and less than the second dopant concentration.

According to an embodiment of the present invention, a method of manufacturing a field-effect transistor (FET) device includes providing a semiconductor substrate; epitaxially growing a first semiconductor layer coupled to the semiconductor substrate, wherein the first semiconductor layer is characterized by a first conductivity type and a first dopant concentration; epitaxially growing a second semiconductor layer coupled to the first semiconductor layer, wherein the second semiconductor layer is characterized by the first conductivity type; epitaxially growing a third semiconductor layer coupled to the second semiconductor layer, wherein the third semiconductor layer is characterized by the first conductivity type; and forming a marker layer coupled to the third semiconductor layer. The method also includes epitaxially growing a fourth semiconductor layer coupled to the marker layer, wherein the fourth semiconductor layer is characterized by the first conductivity type and a second dopant concentration; forming a hardmask layer coupled to the fourth semiconductor layer, wherein the hardmask layer comprises a set of openings operable to expose an upper surface portion of the fourth semiconductor layer; forming a plurality of fins by etching, using the hardmask layer as a mask, the fourth semiconductor layer, wherein each of the plurality of the fins is separated by one of a plurality of recess regions; etching at least a portion of the marker layer; detecting the etching of the at least a portion of the marker layer; epitaxially growing a fifth semiconductor layer within the plurality of recess regions, wherein the fifth semiconductor layer is characterized by a second conductivity type opposite to the first conductivity type; forming a source metal layer on each of the plurality of fins; and forming a gate metal layer coupled to the fifth semiconductor layer.

Etching of the at least a portion of the marker layer can include etching through the marker layer. The method can also include etching the third semiconductor layer and the second semiconductor layer using the hardmask layer as a mask for a predetermined time period. The second semiconductor layer can be characterized by a graded dopant concentration that is a gradient linearly increased from the first dopant concentration to a third dopant concentration, wherein the third dopant concentration is greater than the first dopant concentration and less than the second dopant concentration. The third semiconductor layer can be characterized by a fourth dopant concentration greater than the first dopant concentration. The second dopant concentration can be greater than the first dopant concentration.

In one aspect of the present invention, a FET device includes: a semiconductor substrate; a first semiconductor layer coupled to the semiconductor substrate, wherein the first semiconductor layer is characterized by a first conductivity type and a first dopant concentration; a second semiconductor layer coupled to the first semiconductor layer, wherein the second semiconductor layer is characterized by the first conductivity type; a plurality of fins coupled to the first semiconductor layer, each of which is separated by one of a plurality of recess regions, wherein each of the plurality of fins comprises: a marker layer coupled to the second semiconductor layer; a third semiconductor layer coupled to the marker layer, wherein the third semiconductor layer is characterized by the first conductivity type; a fourth semiconductor layer coupled to the third semiconductor layer, wherein the fourth semiconductor layer is characterized by the first conductivity type and a second dopant concentration; a fifth semiconductor layer epitaxially grown within the plurality of recess regions, wherein the fifth semiconductor layer is characterized by a second conductivity type opposite to the first conductivity type; a source metal layer coupled to each of the plurality of fins; and a gate metal layer coupled to the fifth semiconductor layer.

In one aspect of the present invention, a FET device includes: a semiconductor substrate; a first semiconductor layer coupled to the semiconductor substrate, wherein the first semiconductor layer is characterized by a first conductivity type and a first dopant concentration; a second semiconductor layer coupled to the first semiconductor layer, wherein the second semiconductor layer is characterized by the first conductivity type; a plurality of fins coupled to the second semiconductor layer, each of which is separated by one of a plurality of recess regions, wherein each of the plurality of fins comprises: a third semiconductor layer coupled to the second semiconductor layer, wherein the third semiconductor layer is characterized by the first conductivity type and a second dopant concentration; a marker layer coupled to the third semiconductor layer; a fourth semiconductor layer coupled to the marker layer, wherein the fourth semiconductor layer is characterized by the first conductivity type and a third dopant concentration; a fifth semiconductor layer epitaxially grown within the plurality of recess regions, wherein the fifth semiconductor layer is characterized by a second conductivity type opposite to the first conductivity type; a source metal layer coupled to each of the plurality of fins; and a gate metal layer coupled to the fifth semiconductor layer.

The second semiconductor layer can be characterized by a graded dopant concentration that is a gradient linearly increased from the first dopant concentration to a fourth dopant concentration, wherein the fourth dopant concentration is greater than the first dopant concentration and less than the third dopant concentration. The second dopant concentration can be greater than the first dopant concentration. The third dopant concentration can be greater than the first dopant concentration. The third dopant concentration can be greater than the second dopant concentration. The marker layer can include silicon or AlGaN. The marker layer can have a thickness in a range of 5-10 nm.

In one aspect of the present invention, a method of manufacturing a vertical FET device includes: providing a semiconductor substrate; epitaxially growing a first semiconductor layer coupled to the semiconductor substrate, wherein the first semiconductor layer is characterized by a first conductivity type and a first dopant concentration; epitaxially growing a second semiconductor layer coupled to the first semiconductor layer, wherein the second semiconductor layer is characterized by the first conductivity type; epitaxially growing a third semiconductor layer coupled to the second semiconductor layer, wherein the third semiconductor layer is characterized by the first conductivity type; forming a marker layer coupled to the third semiconductor layer; epitaxially growing a fourth semiconductor layer coupled to the marker layer, wherein the fourth semiconductor layer is characterized by the first conductivity type and a second dopant concentration; forming a hardmask layer coupled to the fourth semiconductor layer, wherein the hardmask layer comprises a set of openings operable to expose an upper surface portion of the fourth semiconductor layer; forming a plurality of fins by etching, using the hardmask layer as a mask, the fourth semiconductor layer, wherein each of the plurality of the fins is separated by one of a plurality of recess regions; etching at least a portion of the marker layer; detecting the etching of the at least a portion of the marker layer; depositing a dielectric spacer layer coupled to the hardmask layer and the plurality of recess regions; forming a first photoresist layer coupled to the dielectric spacer layer; etching the dielectric spacer layer and the marker layer within the plurality of recess regions; ion implanting dopants in the second semiconductor layer within the plurality of recess regions to form a gate region; removing the first photoresist layer; forming a gate metal layer coupled to the gate region within the plurality of recess regions; forming a second photoresist layer on the gate metal layer within the plurality of recess regions; etching the dielectric spacer layer and the hardmask layer using the second photoresist layer as a mask; removing the second photoresist layer; and forming a source metal layer coupled to the fourth semiconductor layer.

In one aspect of the present invention, a method for manufacturing a MOSFET device includes: providing a semiconductor substrate; epitaxially growing a first semiconductor layer coupled to the semiconductor substrate, wherein the first semiconductor layer is characterized by a first conductivity type and a first dopant concentration; epitaxially growing a second semiconductor layer coupled to the first semiconductor layer, wherein the second semiconductor layer is characterized by the first conductivity type; epitaxially growing a third semiconductor layer coupled to the second semiconductor layer, wherein the third semiconductor layer is characterized by the first conductivity type; forming a marker layer coupled to the third semiconductor layer; epitaxially growing a fourth semiconductor layer coupled to the marker layer, wherein the fourth semiconductor layer is characterized by the first conductivity type and a second dopant concentration; forming a hardmask layer coupled to the fourth semiconductor layer, wherein the hardmask layer comprises a set of openings operable to expose an upper surface portion of the fourth semiconductor layer; forming a plurality of fins by etching, using the hardmask layer as a mask, the fourth semiconductor layers, wherein each of the plurality of fins is separated by one of a plurality of recess regions; etching at least a portion of the marker layer; detecting the etching of the at least a portion of the marker layer; depositing a dielectric spacer layer coupled to the hardmask layer and the plurality of recess regions; forming a first photoresist layer coupled to the dielectric spacer layer; etching the dielectric spacer layer and the marker layer within the plurality of recess regions; depositing a metal dielectric layer on the third semiconductor layer within the plurality of recess regions; removing the first photoresist layer; forming a gate metal layer coupled to the metal dielectric layer within the plurality of recess regions; forming a second photoresist layer on the gate metal layer within the plurality of recess regions; etching the dielectric spacer layer and the hardmask layer using the second photoresist layer as a mask; removing the second photoresist layer; and forming a source metal layer coupled to the fourth semiconductor layer.

In one aspect of the present invention, a method for manufacturing a MOSFET device includes: providing a semiconductor substrate; epitaxially growing a first semiconductor layer coupled to the semiconductor substrate, wherein the first semiconductor layer is characterized by a first conductivity type and a first dopant concentration; epitaxially growing a second semiconductor layer coupled to the first semiconductor layer, wherein the second semiconductor layer is characterized by the first conductivity type; epitaxially growing a third semiconductor layer coupled to the second semiconductor layer, wherein the third semiconductor layer is characterized by the first conductivity type; forming a marker layer coupled to the third semiconductor layer; epitaxially growing a fourth semiconductor layer coupled to the marker layer, wherein the fourth semiconductor layer is characterized by the first conductivity type and a second dopant concentration; forming a hardmask layer coupled to the fourth semiconductor layer, wherein the hardmask layer comprises a set of openings operable to expose an upper surface portion of the fourth semiconductor layer; forming a plurality of fins by etching, using the hardmask layer as a mask, the fourth semiconductor layers, wherein each of the plurality of fins is separated by one of a plurality of recess regions; etching at least a portion of the marker layer; detecting the etching of the at least a portion of the marker layer; depositing a dielectric spacer layer coupled to the hardmask layer and the plurality of recess regions; forming a first photoresist layer coupled to the dielectric spacer layer; etching back the first photoresist layer to expose the dielectric spacer layer on top of the hardmask layer; removing a portion of the dielectric spacer layer on top of the hardmask layer and a portion of the dielectric spacer layer on sidewalls of the plurality of fins to expose at least a portion of sidewalls of the plurality of fins; stripping off the first photoresist layer from the dielectric spacer layer; forming a metal dielectric layer and a gate metal layer coupled to the portion of sidewalls of the fourth semiconductor layer; forming a second photoresist layer coupled to the gate metal layer; etching the gate metal layer, the metal dielectric layer, and the hardmask layer using the second photoresist layer as a mask; depositing a second oxide layer coupled to the gate metal layer and the fourth semiconductor layer; forming a third photoresist layer coupled to the second oxide layer; etching back the second oxide layer using the third photoresist layer as a mask to expose the fourth semiconductor layer; forming a source metal layer coupled to the fourth semiconductor layer and the second oxide layer; forming a fourth photoresist layer coupled to the source metal layer; and etching the second oxide layer using the fourth photoresist layer as a mask to expose the gate metal layer.

Numerous benefits are achieved by way of the present invention over conventional techniques. For example, embodiments of the present invention provide a method of manufacturing a vertical FET device with a marker layer, which can improve the product quality by accurately controlling the etch depth of trenches used for forming the gate layer. For some embodiments of the present invention that include a semiconductor layer with a graded dopant concentration, the drain-source on-resistance, the threshold voltage, the electric field (|E|), and the drain-source leakage current can be kept within a desired range by controlling the etch depth into the graded doping layer. These and other embodiments of the invention along with many of its advantages and features are described in more detail in conjunction with the text below and attached figures.

BRIEF DESCRIPTION OF THE DRAWINGS

FIGS. 6A-6G are partial cross-sectional views illustrating the intermediate stages of a method of manufacturing a vertical FET device according to an embodiment of the present invention.

DETAILED DESCRIPTION

Embodiments of the present invention relate to methods and systems to improve etch depth variation control in semiconductor processing operations. Embodiments of the present invention are applicable to a variety of semiconductor manufacturing operations, including the manufacturing of III-nitride semiconductor devices. Merely by way of example, embodiments are applied to the fabrication of vertical-fin-based FET devices, but embodiments of the present invention have applicability to a variety of device structures.

Figure 1:
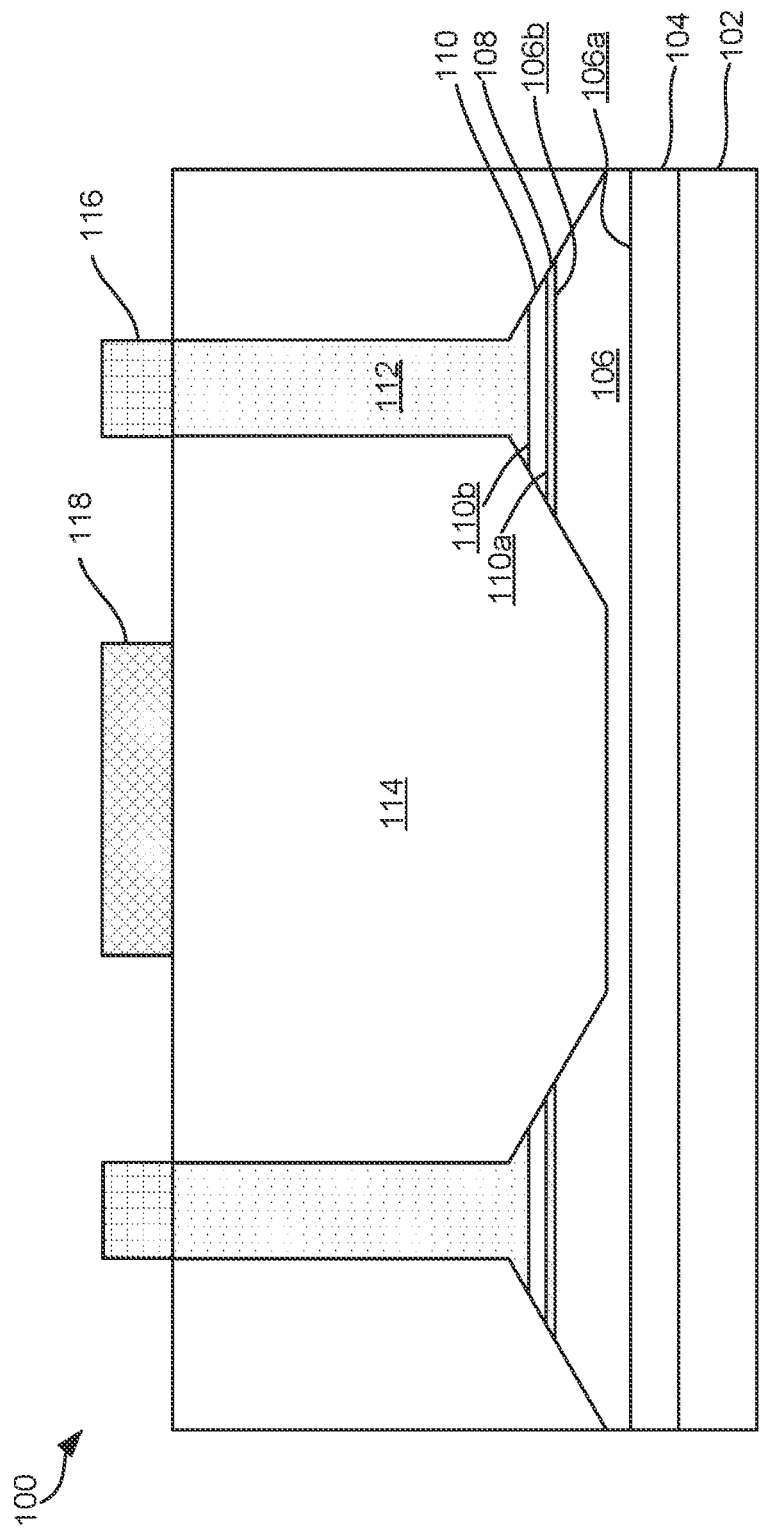
FIG. 1 is a partial cross-sectional view illustrating a vertical FET device manufactured according to an embodiment of the present invention.

FIG. 1 illustrates a partial cross-sectional view of a vertical FET device 100 according to an embodiment of the present invention. Vertical FET device 100 may include a semiconductor substrate 102, a first semiconductor layer 104 coupled to the semiconductor substrate 102, and a second semiconductor layer 106 coupled to first semiconductor layer 104. In one embodiment, semiconductor substrate 102 may include III-nitride compounds, such as gallium nitride (GaN). In one embodiment, semiconductor substrate 102 may include heavily n-type doped GaN, which can be used as drain contact. The dopant concentration of semiconductor substrate 102 may vary as appropriate to the particular application. In one embodiment, the dopant concentration of semiconductor substrate 102 may be in the range from about $5 \times 10^{17}$ atoms/cm$^3$ to about $1 \times 10^{19}$ atoms/cm$^3$. In one embodiment, semiconductor substrate 102 may have a resistivity of less than 0.020 ohm-cm$^2$. In one embodiment, first semiconductor layer 104 may include III-nitride compounds, such as GaN. For example, first semiconductor layer 104 may include n-type doped GaN. The dopant concentration of first semiconductor layer 104 may vary as appropriate to the particular application. In one embodiment, the dopant concentration of first semiconductor layer 104 may be about $1 \times 10^{16}$ atoms/cm$^3$. In one embodiment, second semiconductor layer 106 may include III-nitride compounds, such as GaN. For example, second semiconductor layer 106 may include n-type doped GaN. In one embodiment, second semiconductor layer 106 is characterized by a graded dopant concentration between a first side 106a and a second side 106b opposite first side 106a. The graded dopant concentration may vary as appropriate to the particular application. For example, the graded dopant concentration may be linearly increased from a lower dopant concentration at first side 106a adjacent first semiconductor layer 104 to a higher dopant concentration at second side 106b. In one embodiment, the lower dopant concentration may be $1 \times 10^{16}$ atoms/cm$^3$, and the higher dopant concentration may be $5.5 \times 10^{16}$ atoms/cm$^3$. In one embodiment, second semiconductor layer 106 may have a thickness of 0.2 µm.

Vertical FET device 100 may further include a marker layer 108 deposited on second semiconductor layer 106, and a third semiconductor layer 110 coupled to marker layer 108. In one embodiment, third semiconductor layer 110 may include III-nitride compounds, such as GaN. In one embodiment, third semiconductor layer 110 is characterized by a graded dopant concentration between a first side 110a and a second side 110b opposite first side 110a. For example, the graded dopant concentration can be linearly increased from a lower dopant concentration at first side 110a adjacent marker layer 108 to a higher dopant concentration at second side 110b. In one embodiment, the lower dopant concentration may be $5.5 \times 10^{16}$ atoms/cm$^3$, and the higher dopant concentration may be $7.5 \times 10^{16}$ atoms/cm$^3$. In one embodiment, third semiconductor layer 110 may have a thickness of 0.1 µm. In another embodiment, third semiconductor layer 110 is characterized by a uniform dopant concentration, such as $7.5 \times 10^{16}$ atoms/cm$^3$. In another embodiment, vertical FET device 100 may omit third semiconductor layer 110.

Vertical FET device 100 may further include a plurality of semiconductor fins 112 coupled to third semiconductor layer 110, and a semiconductor gate layer 114 coupled to second semiconductor layer 106 and surrounding semiconductor fins 112. In one embodiment, semiconductor fins 112 are n-type doped GaN with a dopant concentration of $1.3\times10^{17}$ atoms/cm$^3$ and a thickness of about 0.8 μm. Generally, semiconductor substrate 102 is more heavily doped than semiconductor fins 112, which, in turn, are more heavily doped than first semiconductor layer 104, second semiconductor layer 106, or third semiconductor layer 110, which together may be grouped as the drift layer in vertical FET device 100. In one embodiment, semiconductor gate layer 114 is p-type doped GaN with a dopant concentration of $1\times10^{19}$ atoms/cm$^3$.

Vertical FET device 100 may further include a source metal layer 116 formed on the plurality of semiconductor fins 112 and a gate metal layer 118 formed on semiconductor gate layer 114. In some embodiments, source metal layer 116 may include a refractory metal, a refractory metal compound, or a refractory metal alloy (e.g., TiN). In some embodiments, gate metal layer 118 may include nickel, gold, molybdenum, platinum, palladium, silver, or combinations thereof, and the like.

Figure 2:
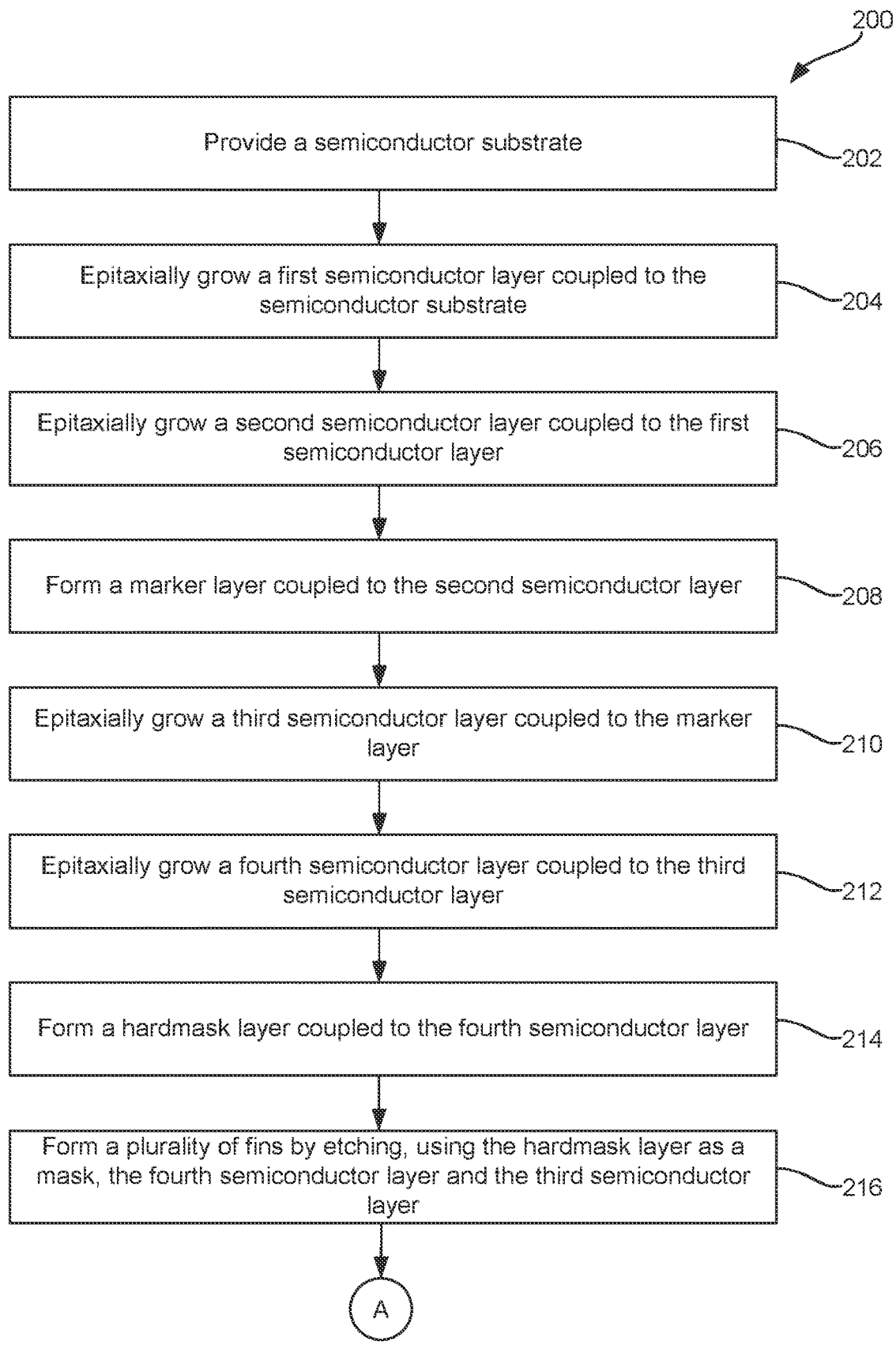
FIG. 2 is a simplified flowchart showing a method of manufacturing a vertical FET device according to an embodiment of the present invention.
Figure 2:
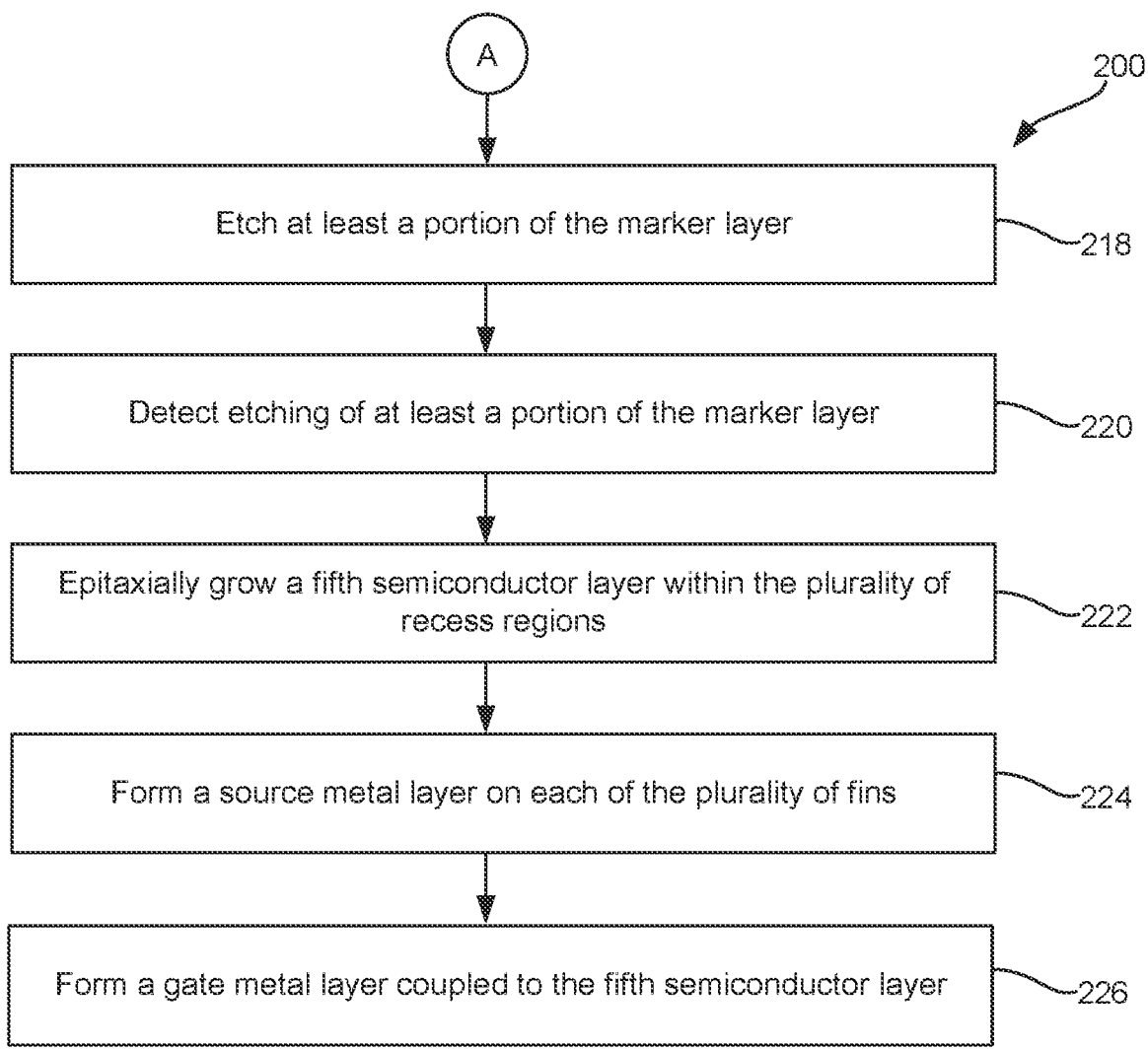

FIG. 2 is a simplified flowchart illustrating a method 200 for manufacturing a vertical FET device according to an embodiment of the present invention. Referring to FIG. 2, method 200 may include providing a semiconductor substrate (202). In one embodiment, the semiconductor substrate includes III-nitride compounds, such as GaN. In one embodiment, the semiconductor substrate is n+ type doped GaN substrate, having a dopant concentration in a range of about $5\times10^{17}$ atoms/cm$^3$ to about $1\times10^{19}$ atoms/cm$^3$ and a resistivity of less than 0.020 ohm-cm$^2$. Method 200 may include epitaxially growing a first semiconductor layer coupled to (e.g., deposited on) the semiconductor substrate (204). In one embodiment, the first semiconductor layer is characterized by a first conductivity type and a first dopant concentration. In one embodiment, the first semiconductor layer may include n-type doped GaN. The dopant concentration of the first semiconductor layer may be about $1\times10^{16}$ atoms/cm$^3$. In one embodiment, the first semiconductor layer has a thickness between 5 μm and 12 μm.

Method 200 may further include epitaxially growing a second semiconductor layer coupled to the first semiconductor layer, wherein the second semiconductor layer is characterized by the first conductivity type (206). In one embodiment, the second semiconductor layer is further characterized by a first graded dopant concentration between a first side and a second side opposite the first side. In one embodiment, the second semiconductor layer includes n-type doped GaN, and the first graded dopant concentration is linearly increased from a lower dopant concentration (e.g., $1\times10^{16}$ atoms/cm$^3$) at the first side adjacent the first semiconductor layer to a higher dopant concentration (e.g., $5.5\times10^{16}$ atoms/cm$^3$) at the second side. In one embodiment, the second semiconductor layer has a thickness of 0.2 μm.

Method 200 may further include forming a marker layer coupled to the second semiconductor layer (208). In one embodiment, the marker layer may comprise a GaN layer incorporating a metallurgical concentration of silicon of $1\times10^{19}$ atoms/cm$^3$. In another embodiment, the marker layer may comprise an AlGaN layer incorporating a metallurgical concentration of aluminum of $1.3\times10^{17}$ atoms/cm$^3$. In another embodiment, the marker layer may comprise an InGaN layer incorporating a metallurgical concentration of indium of $1\times10^{17}$ to $1\times10^{19}$ atoms/cm$^3$. In one embodiment, the marker layer may have a thickness in a range of 1-10 nm, preferably 3-8 nm. In an exemplary embodiment, the marker layer has a thickness of 5 nm.

Method 200 may further include epitaxially growing a third semiconductor layer coupled to the marker layer, wherein the third semiconductor layer is characterized by the first conductivity type (210). In another embodiment, the third semiconductor layer is further characterized by a second graded dopant concentration between a first side and a second side opposite the first side. In one embodiment, the third semiconductor layer may include n-type doped GaN, and the second graded dopant concentration is linearly increased from a lower dopant concentration (e.g., $5.5\times10^{16}$ atoms/cm$^3$) at the first side adjacent the marker layer to a higher dopant concentration (e.g., $7.5\times10^{16}$ atoms/cm$^3$) at the second side. In one embodiment, third semiconductor layer has a thickness of 0.1 μm.

Method 200 may further include epitaxially growing a fourth semiconductor layer coupled to the third semiconductor layer, wherein the fourth semiconductor layer is characterized by the first conductivity type and a second dopant concentration (212). In one embodiment, the second dopant concentration may be greater than the first dopant concentration. In one embodiment, the fourth semiconductor layer may include n-type doped GaN with a dopant concentration of $1.3\times10^{17}$ atoms/cm$^3$ and a thickness of about 12 μm.

Method 200 may further include forming a hardmask layer coupled to the fourth semiconductor layer, wherein the hardmask layer comprises a set of openings operable to expose an upper surface portion of the fourth semiconductor layer (214).

Method 200 may further include forming a plurality of fins by etching, using the hardmask layer as a mask, the fourth semiconductor layer and the third semiconductor layer, wherein each of the plurality of the fins is separated by one of a plurality of recess regions (216). In one embodiment, the depth of the recess regions 216 is between 0.6 and 1.0 μm. In one embodiment, the depth of the recess regions 216 is about 0.8 μm. In one embodiment, each of the plurality of fins may have a width (between recess regions) of about 0.2 μm.

Referring to FIG. 2, method 200 may further include etching at least a portion of the marker layer (218) and detecting the etching of at least a portion of the marker layer (220). In one embodiment, detection of the etching process may be conducted by standard methods (e.g., end point detectors). In one embodiment using a silicon layer as the marker layer, a spike of silicon dopant is readily detectable. In another embodiment using an AlGaN layer as the marker layer, the Al dopant concentration is readily detectable. In another embodiment using an In-doped layer, the In dopant is readily detectable. In one embodiment, method 200 may stop the etching process when it is detected that the etching process has reached the marker layer. In another embodiment, method 200 may further include etching through the marker layer, then continuing to etch the second semiconductor layer using the hardmask layer as a mask for a predetermined time period.

Method 200 may further include epitaxially growing a fifth semiconductor layer within the plurality of recess regions (222). In one embodiment, the fifth semiconductor layer may include p-type doped GaN with a dopant concentration of $1\times10^{19}$ atoms/cm$^3$. Then, method 200 may further include forming a source metal layer coupled to each of the plurality of fins (224) and forming a gate metal layer coupled to the fifth semiconductor layer (226). In some embodiments, the source metal layer may include a refractory metal, a refractory metal compound, or a refractory metal alloy (e.g., TiN). In some embodiments, the gate metal layer may include nickel, gold, molybdenum, platinum, palladium, silver, combinations thereof, and the like.

It should be understood that the specific steps illustrated in FIG. 2 provide a particular method of manufacturing a vertical FET device according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual steps. Furthermore, additional steps may be added or removed depending on a particular application. One of ordinary skill in the art would recognize many variations, modifications, and alternatives.

Figure 3A:
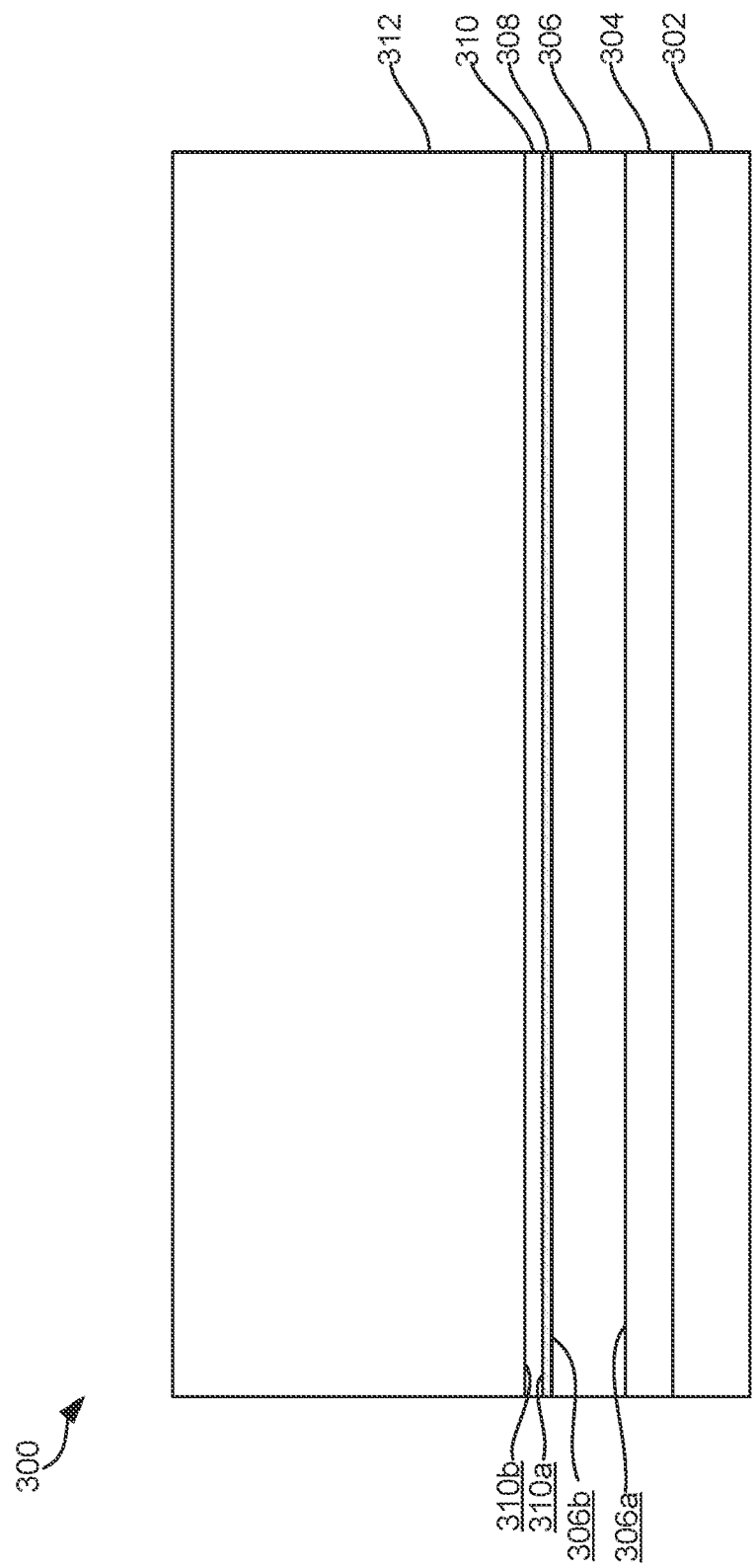
FIGS. 3A-3G are partial cross-sectional views illustrating the intermediate stages of a method of manufacturing a vertical FET device according to an embodiment of the present invention.

Referring back to FIG. 2 and with reference to FIGS. 3A-3G, a method of manufacturing a vertical FET device 300 is described according to some embodiments of the present invention. FIG. 3A is a partial cross-sectional view illustrating a vertical FET device 300 having an n+ type doped semiconductor substrate 302, an n-type doped first semiconductor layer 304 that is epitaxially grown on semiconductor substrate 302, and an n-type doped second semiconductor layer 306 that is epitaxially grown on first semiconductor layer 304. In one embodiment, second semiconductor layer 306 has a first graded dopant concentration between a first side 306a and a second side 306b opposite first side 306a. In one embodiment, the first graded dopant concentration increases linearly from a lower dopant concentration (e.g., $1 \times 10^{16}$ atoms/cm$^3$) at first side 306a adjacent first semiconductor layer 304 to a higher dopant concentration (e.g., $5.5 \times 10^{16}$ atoms/cm$^3$) at second side 306b. In one embodiment, second semiconductor layer 306 has a thickness of 0.2 μm. A marker layer 308 is deposited on second semiconductor layer 306. In one embodiment, the marker layer 308 may comprise a GaN layer incorporating a metallurgical concentration of silicon of $1 \times 10^{19}$ atoms/cm$^3$. In another embodiment, the marker layer 308 may comprise an AlGaN layer incorporating a metallurgical concentration of aluminum of $1.3 \times 10^{17}$ atoms/cm$^3$. In another embodiment, the marker layer 308 may comprise an InGaN layer incorporating a metallurgical concentration of indium of $1 \times 10^{17}$ to $1 \times 10^{19}$ atoms/cm$^3$. In one embodiment, the marker layer 308 may have a thickness in a range of 1-10 nm, preferably 3-8 nm. In an exemplary embodiment, the marker layer 308 has a thickness of 5 nm.

A third semiconductor layer 310 is epitaxially grown on marker layer 308. In one embodiment, third semiconductor layer 310 may include n-type doped GaN and has a second graded dopant concentration between a first side 310a and a second side 310b opposite first side 310a. In one embodiment, the second graded dopant concentration increases linearly from a lower dopant concentration (e.g., $5.5 \times 10^{16}$ atoms/cm$^3$) at first side 310a adjacent marker layer 308 to a higher dopant concentration (e.g., $7.5 \times 10^{16}$ atoms/cm$^3$) at second side 310b. In one embodiment, third semiconductor layer 310 has a thickness of 0.1 μm. In one embodiment, the lower dopant concentration (e.g., $5.5 \times 10^{16}$ atoms/cm$^3$) within the second graded dopant concentration of third semiconductor layer 310 may be equal to or greater than the higher dopant concentration (e.g., $4.5 \times 10^{16}$ atoms/cm$^3$) within the first graded dopant concentration of second semiconductor layer 306.

A fourth semiconductor layer 312 is epitaxially grown on third semiconductor layer 310, wherein fourth semiconductor layer 312 is characterized by the first conductivity type and a second dopant concentration. In one embodiment, vertical FET device 300 may omit third semiconductor layer 310. In such embodiments, fourth semiconductor layer 312 is epitaxially grown on marker layer 308. In one embodiment, fourth semiconductor layer 312 includes n-type doped GaN with a dopant concentration of $1.3 \times 10^{17}$ atoms/cm$^3$ and a thickness of about 0.6-0.8 μm. In another embodiment, the second dopant concentration of fourth semiconductor layer 312 may be greater than the first dopant concentration of first semiconductor layer 304. In another embodiment, the second dopant concentration (e.g., $1.3 \times 10^{17}$ atoms/cm$^3$) of fourth semiconductor layer 312 may be greater than the higher dopant concentration (e.g., $4.5 \times 10^{16}$ atoms/cm$^3$) within the first graded dopant concentration of second semiconductor layer 306. In another embodiment, the second dopant concentration (e.g., $1.3 \times 10^{17}$ atoms/cm$^3$) of fourth semiconductor layer 312 may be greater than the higher dopant concentration (e.g., $7.5 \times 10^{16}$ atoms/cm$^3$) within the second graded dopant concentration of third semiconductor layer 310. In another embodiment, the second dopant concentration (e.g., $7.5 \times 10^{16}$ atoms/cm$^3$) of fourth semiconductor layer 312 may be equal to the higher dopant concentration (e.g., $7.5 \times 10^{16}$ atoms/cm$^3$) within the second graded dopant concentration of third semiconductor layer 310.

Figure 3B:
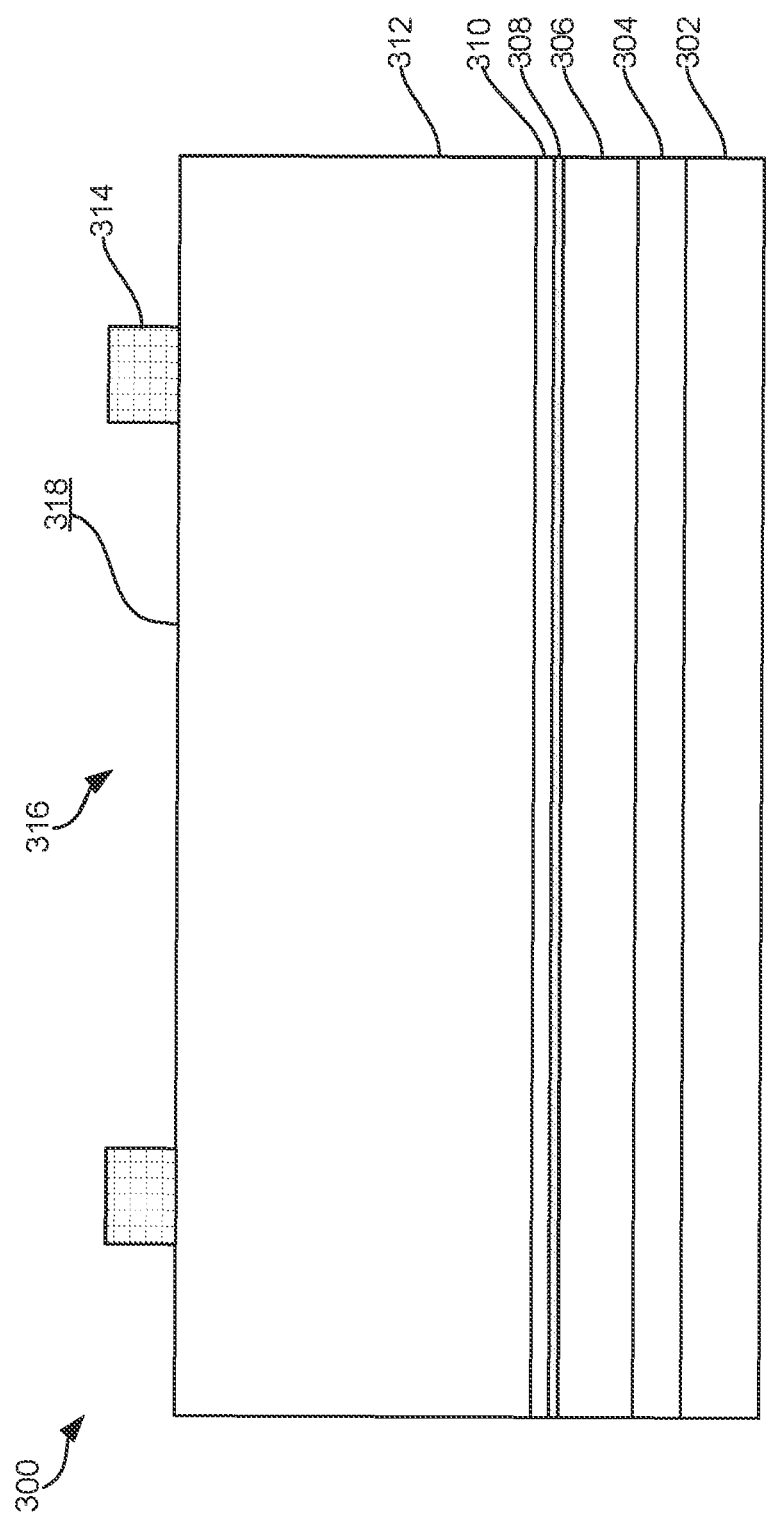
Figure 3C:
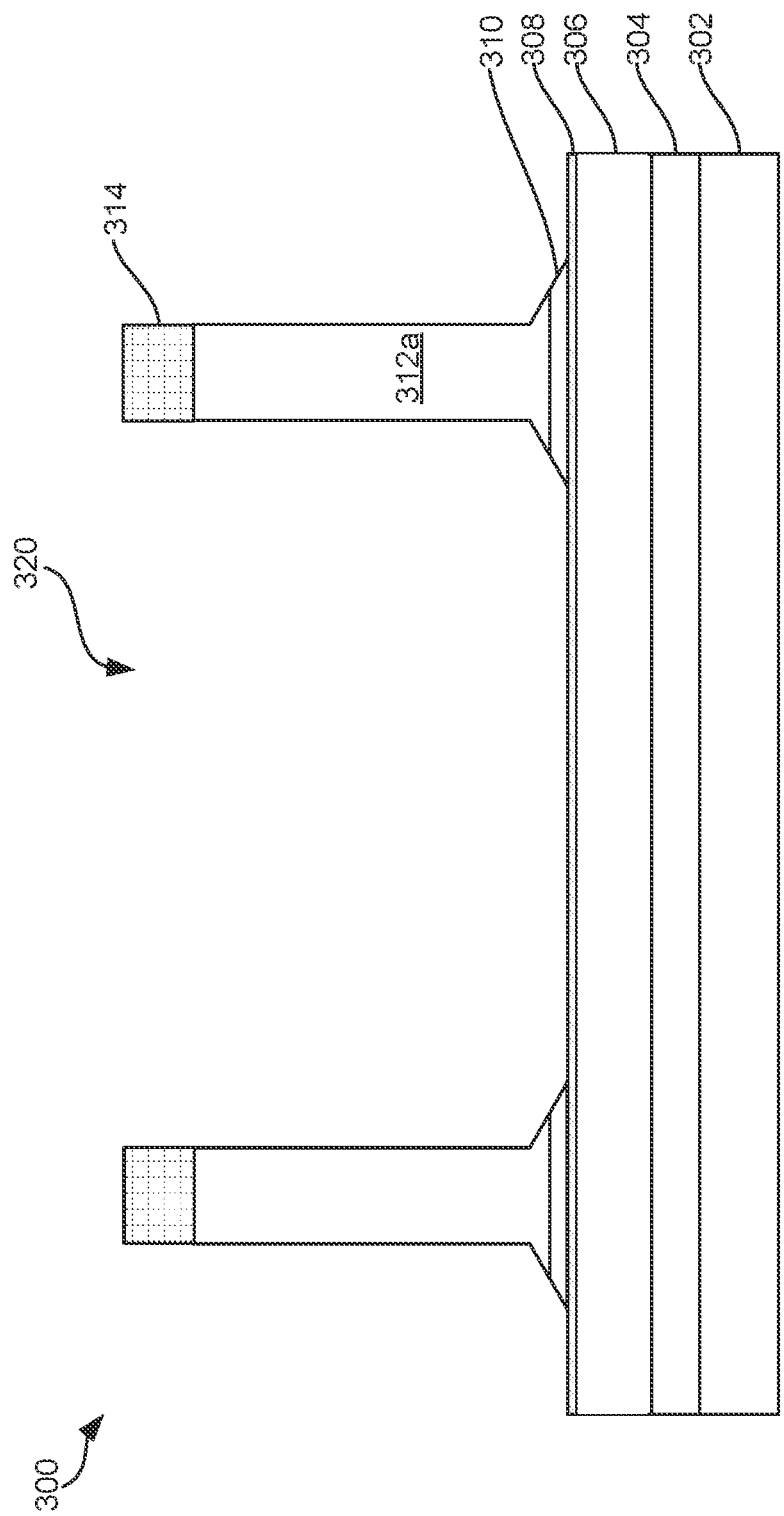

Referring to FIG. 3B, a hardmask layer 314 is formed on fourth semiconductor layer 312. Hardmask layer 314 comprises a set of openings 316 operable to expose an upper surface portion 318 of fourth semiconductor layer 312. Referring to FIG. 3C, an etching process is performed using hardmask layer 314 as a mask to form a plurality of fins 312a within fourth semiconductor layer 312. Each of the fins 312a is separated by one of a plurality of recess regions 320 formed by the etching process. As shown in FIG. 3C, the etching process is monitored to detect when the etching process reaches marker layer 308. In one embodiment, the detection of the etching process reaching the marker layer may be conducted by standard methods (e.g., end point detectors). In one embodiment using a silicon layer as the marker layer, a spike of silicon dopant is readily detectable. In another embodiment using an AlGaN layer as the marker layer, the Al dopant is readily detectable. In another embodiment using an In-doped layer, the In dopant is readily detectable. The dopant can be detected when at least a portion of marker layer 308 is etched. The detection of the etching of the marker layer will be described in detail below.

Figure 3D:
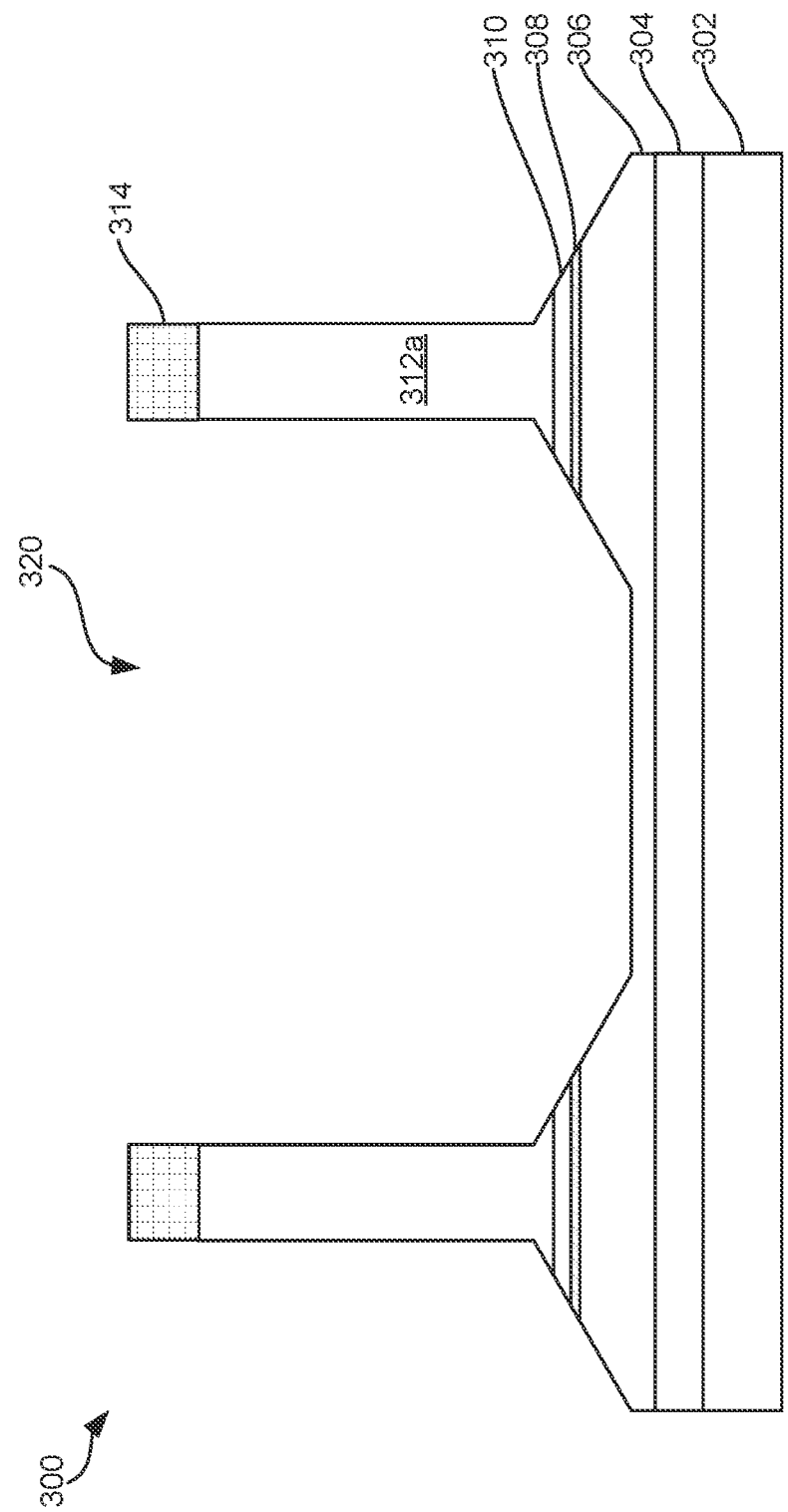

During the process of etching at least a portion of marker layer 308, a detection process can be used to detect when the etching process reaches marker layer 308. In one embodiment, the subsequent etching process may be finely controlled to achieve a predetermined etch depth in a target doping layer. Alternatively, in one embodiment, the etching process may stop as the etching process reaches the marker layer 308 or a portion of the marker layer 308. Referring to FIG. 3D, the subsequent etching process may be timed to achieve an etch depth of 0.1 μm in second semiconductor layer 306. It should be noted the etch depth within second semiconductor layer 306 may vary as appropriate to the particular application.

In the embodiment shown in FIG. 3D, the bottom portion of the fins 312a has a shape of an isosceles trapezoid. However, it is noted that the bottom portion of the fins 312a may have a shape different from the shape shown in FIG. 3D after the etching process. Embodiments of the present invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In one embodiment, after forming the recess regions 320, a cleaning process is carried using a tetramethylammonium hydroxide (TMAH) solution of about 25% by weight, at a temperature of about 85° C., and for a duration of about 30 minutes. In another embodiment, prior to performing a cleaning using the TMAH solution, a pre-cleaning, such as piranha clean using a $H_2SO_4$:$H_2O_2$ in a volume ratio 2:1 for two minutes, may also be performed.

Figure 3E:
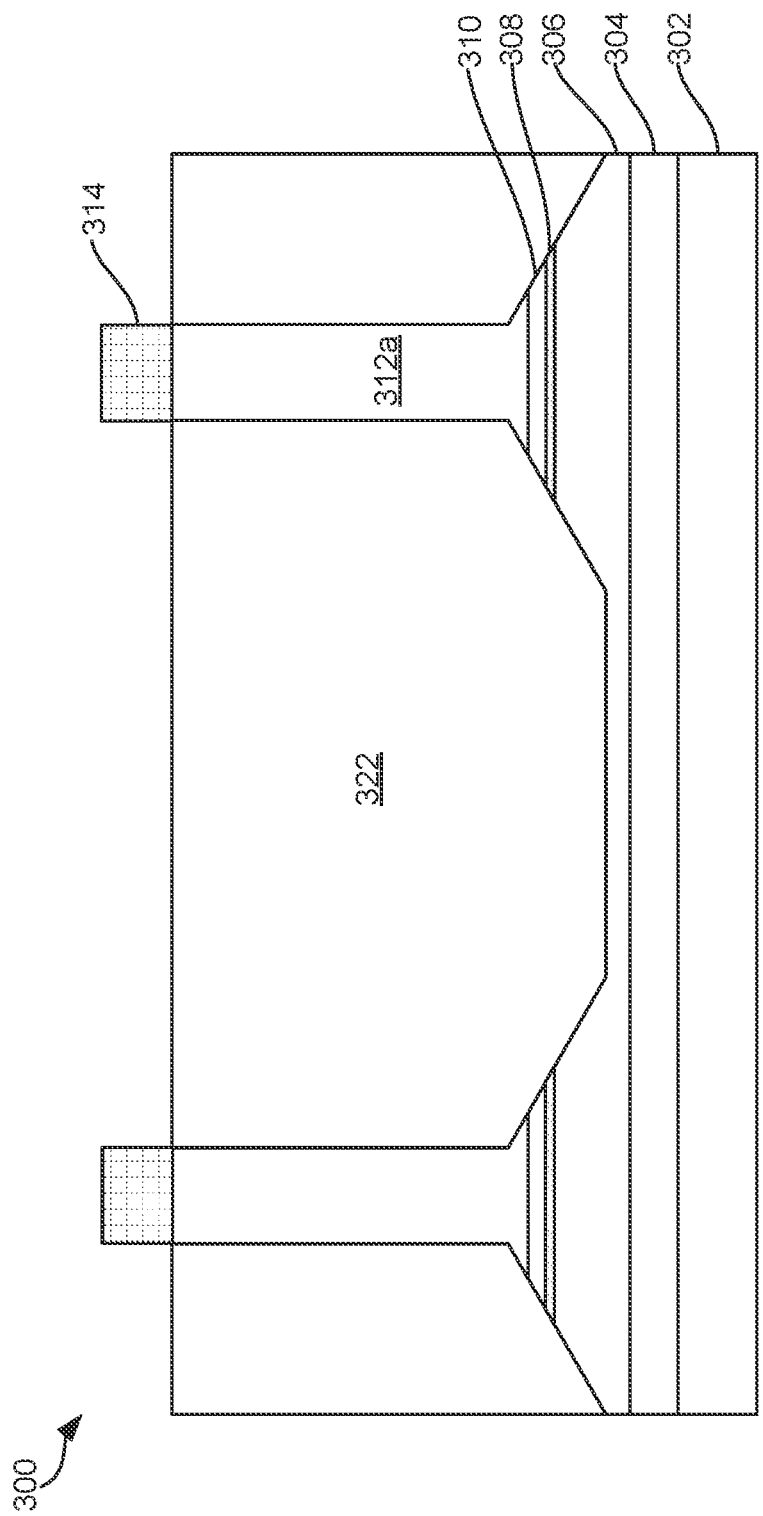
Figure 3F:
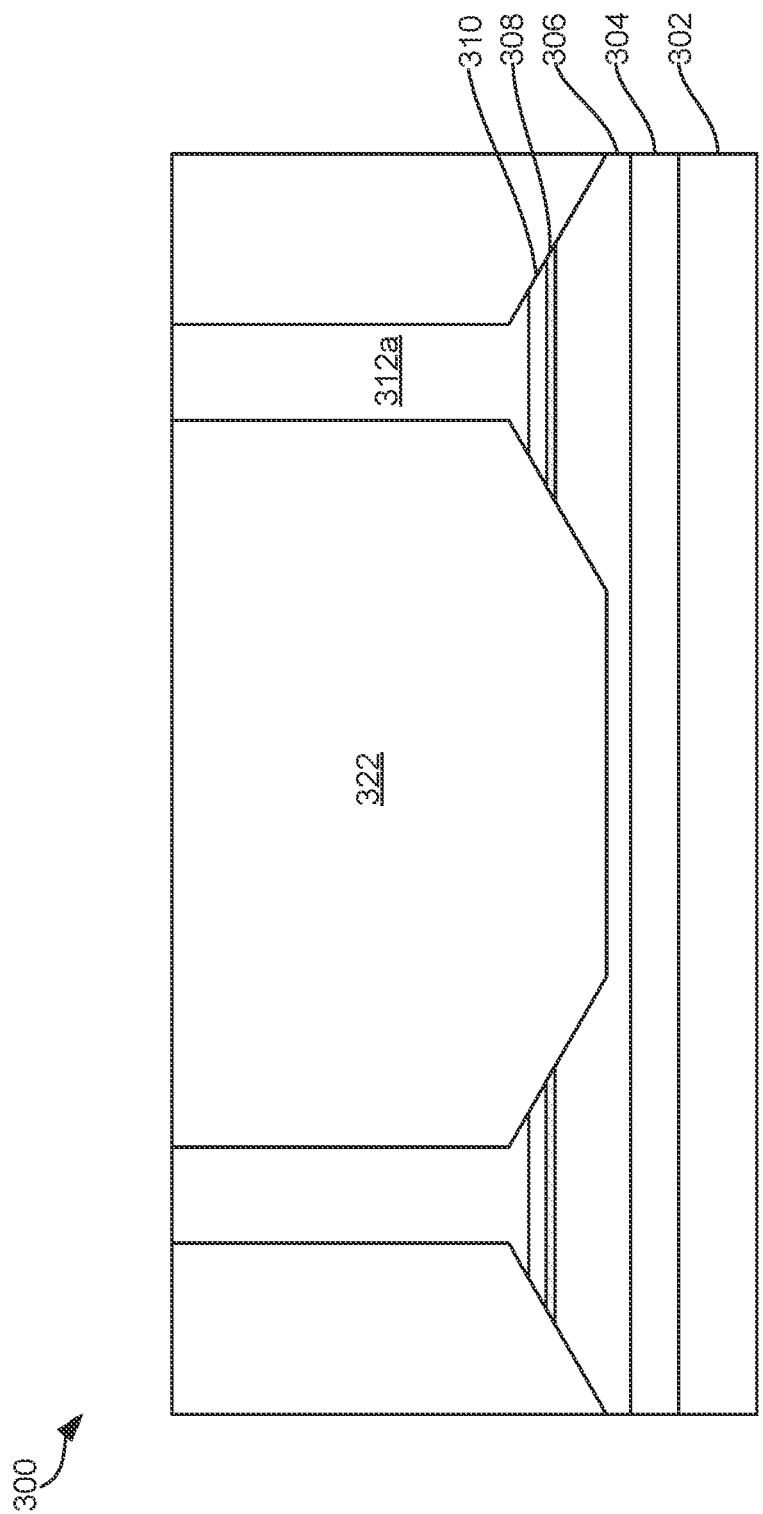

Referring to FIG. 3E, a fifth semiconductor layer 322 is epitaxially regrown within the plurality of recess regions 320. In one embodiment, the upper surface of fifth semiconductor layer 322 is substantially planar with the upper surface of semiconductor fins 312a. As shown in FIG. 3E, fifth semiconductor layer 322 is coupled to second semiconductor layer 306. Fifth semiconductor layer 322 provides the gate layer for vertical FET device 300. In one embodiment, fifth semiconductor layer 322 may include p-type doped GaN with a dopant concentration of $1\times10^{19}$ atoms/$cm^3$. Referring to FIG. 3F, hardmask layer 314 is then removed from semiconductor fins 312a.

Figure 3G:
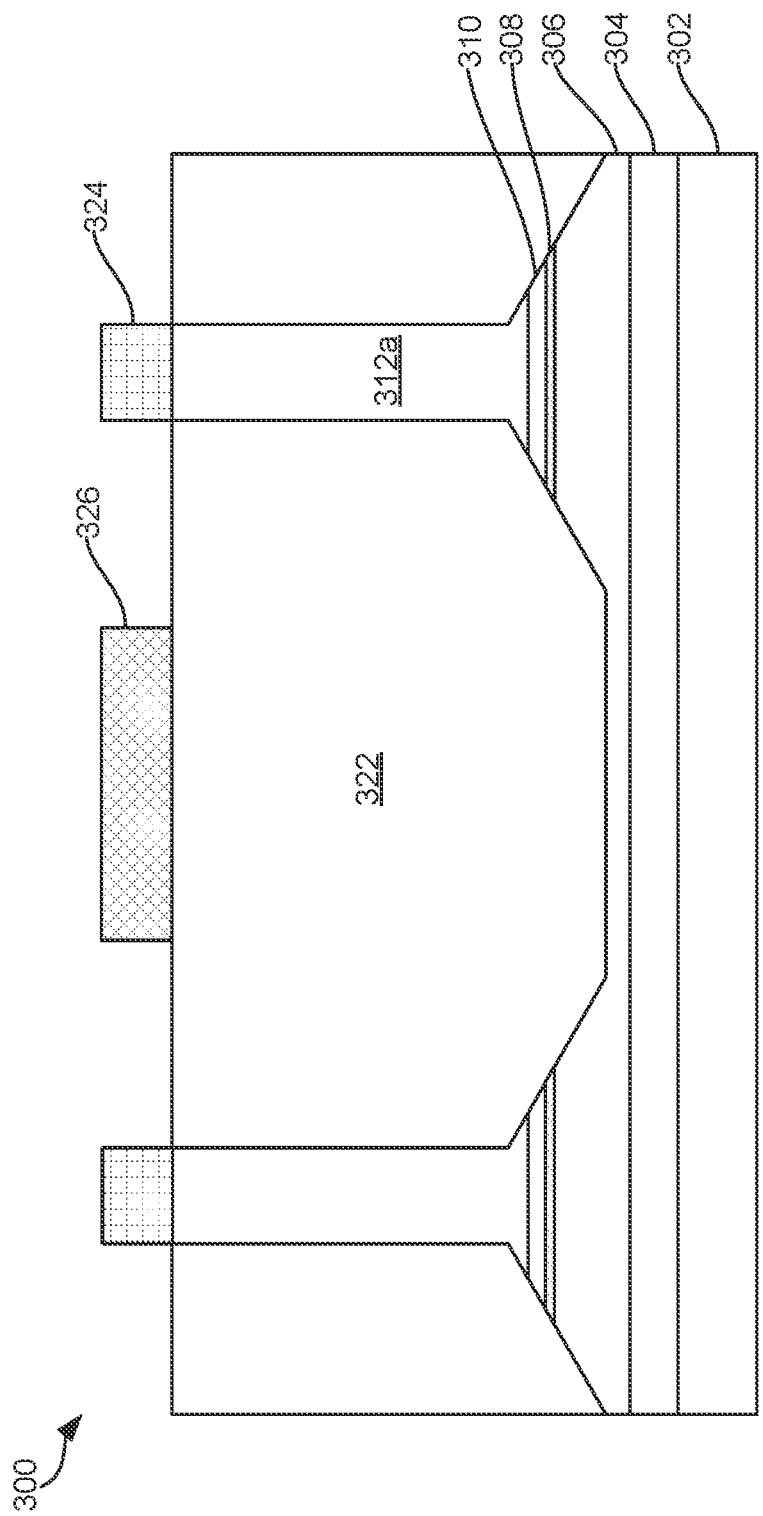

Referring to FIG. 3G, a source metal layer 324 is deposited on each of the fins 312a (i.e., coupled to fourth semiconductor layer 312). Then, a gate metal layer 326 is deposited on fifth semiconductor layer 322. In some embodiments, the source metal layer 324 may include a refractory metal, a refractory metal compound, or a refractory metal alloy (e.g., TiN). In some embodiments, the gate metal layer 326 may include nickel, gold, molybdenum, platinum, palladium, silver, combinations thereof, and the like.

Figure 4:
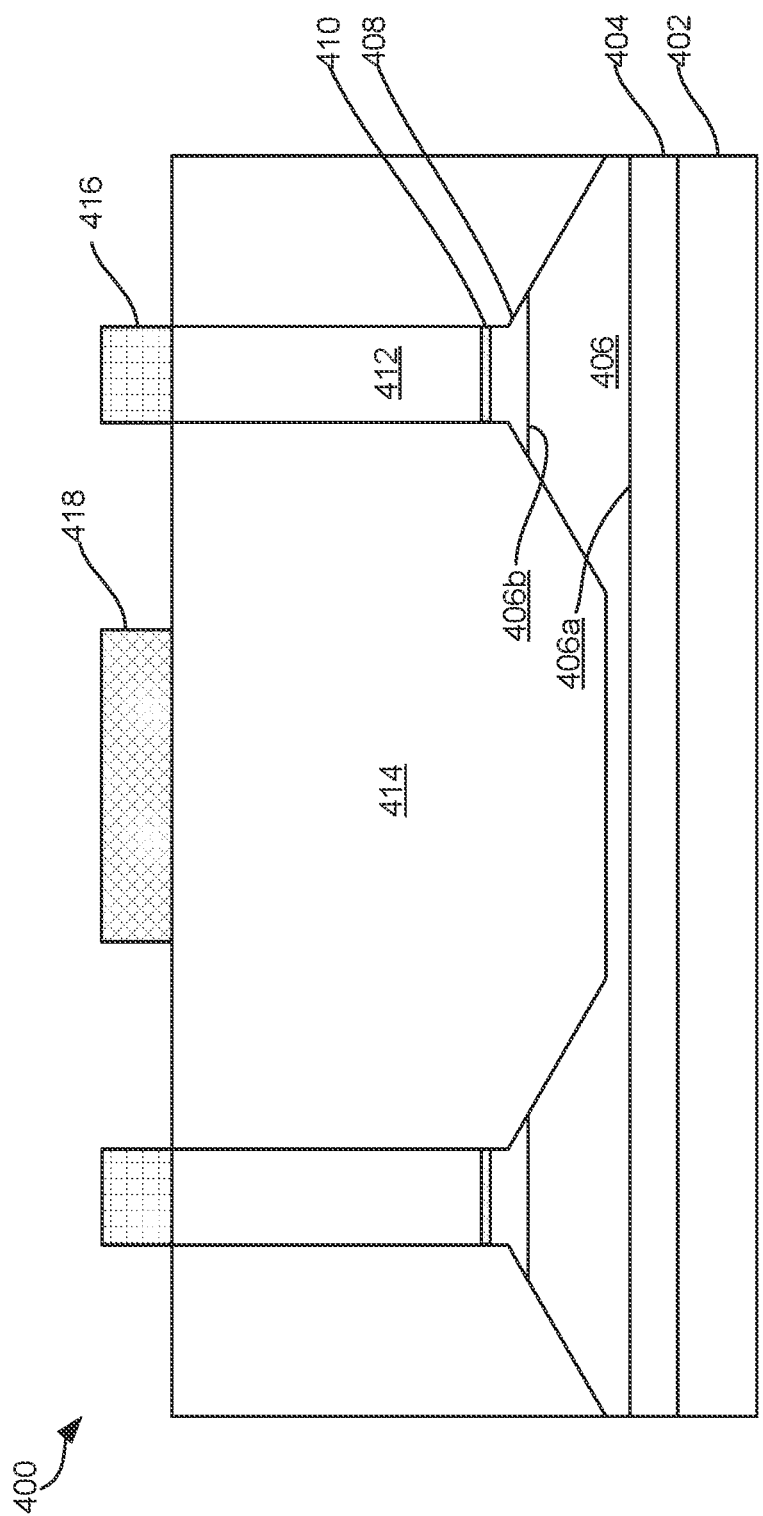
FIG. 4 is a partial cross-sectional view illustrating a vertical FET device manufactured according to another embodiment of present invention.

FIG. 4 is a partial cross-sectional view illustrating a vertical FET device 400 manufactured according to another embodiment of the present invention. The difference between vertical FET device 100 and vertical FET device 400 is shown by the position of the marker layer. Specifically, vertical FET device 400 may include a semiconductor substrate 402, a first semiconductor layer 404 coupled to semiconductor substrate 402, and a second semiconductor layer 406 coupled to first semiconductor layer 404. In one embodiment, semiconductor substrate 402 may include III-nitride compounds, such as GaN. In one embodiment, semiconductor substrate 402 may include heavily n-type doped GaN, which can be used as drain contact. The dopant concentration of semiconductor substrate 402 may vary as appropriate to the particular application. In one embodiment, the dopant concentration of semiconductor substrate 402 may be in the range from about $5\times10^{17}$ atoms/$cm^3$ to about $1\times10^{19}$ atoms/$cm^3$. In one embodiment, semiconductor substrate 402 may have a resistivity of less than 0.020 ohm-$cm^2$. In one embodiment, first semiconductor layer 404 may include III-nitride compounds, such as GaN. For example, first semiconductor layer 404 may include n-type doped GaN. The dopant concentration of first semiconductor layer 404 may vary as appropriate to the particular application. In one embodiment, the dopant concentration of first semiconductor layer 404 may be about $1\times10^{16}$ atoms/$cm^3$. In one embodiment, first semiconductor layer 404 has a thickness of about 5 μm-12 μm. In one embodiment, second semiconductor layer 406 may include III-nitride compounds, such as GaN. For example, second semiconductor layer 406 may include n-type doped GaN. In one embodiment, second semiconductor layer 406 is characterized by a graded dopant concentration between a first side 406a and a second side 406b opposite first side 406a. For example, the graded dopant concentration is linearly increased from a lower dopant concentration at first side 406a adjacent first semiconductor layer 404 to a higher dopant concentration at second side 406b. In one embodiment, the lower dopant concentration may be $1\times10^{16}$ atoms/$cm^3$, and the higher dopant concentration may be $7.5\times10^{16}$ atoms/$cm^3$. In one embodiment, second semiconductor layer 406 may have a thickness of 0.3 μm.

Vertical FET device 400 may further include a third semiconductor layer 408 epitaxially grown on second semiconductor layer 406, and a marker layer 410 formed on third semiconductor layer 408. In one embodiment, third semiconductor layer 408 may include III-nitride compounds, such as GaN. For example, third semiconductor layer 408 may include n-type doped GaN. In one embodiment, the dopant concentration of third semiconductor layer 408 may be $7.5\times10^{16}$ atoms/$cm^3$. In another embodiment, vertical FET device 400 may omit third semiconductor layer 408. In such case, marker layer 410 is directly formed on second semiconductor layer 406.

Vertical FET device 400 may further include a plurality of semiconductor fins 412 coupled to marker layer 410, and a semiconductor gate layer 414 coupled to second semiconductor layer 406 and surrounding semiconductor fins 412. In one embodiment, semiconductor fins 412 are n-type doped GaN with a dopant concentration of $1.3\times10^{17}$ atoms/$cm^3$ and a thickness of about 0.6-0.8 μm. Generally, semiconductor substrate 402 is more heavily doped than semiconductor fins 412, which, in turn, are more heavily doped than first semiconductor layer 404, second semiconductor layer 406, or third semiconductor layer 408, which together may be grouped as the drift layer in vertical FET device 400. In one embodiment, semiconductor gate layer 414 is p-type doped GaN with a dopant concentration of $1\times10^{19}$ atoms/$cm^3$.

Vertical FET device 400 may further include a source metal layer 416 formed on the plurality of semiconductor fins 412 and a gate metal layer 418 formed on semiconductor gate layer 414. In some embodiments, source metal layer 416 may include a refractory metal, a refractory metal compound, or a refractory metal alloy (e.g., TiN). In some embodiments, gate metal layer 418 may include nickel, gold, molybdenum, platinum, palladium, silver, combinations thereof, and the like.

Figure 5:
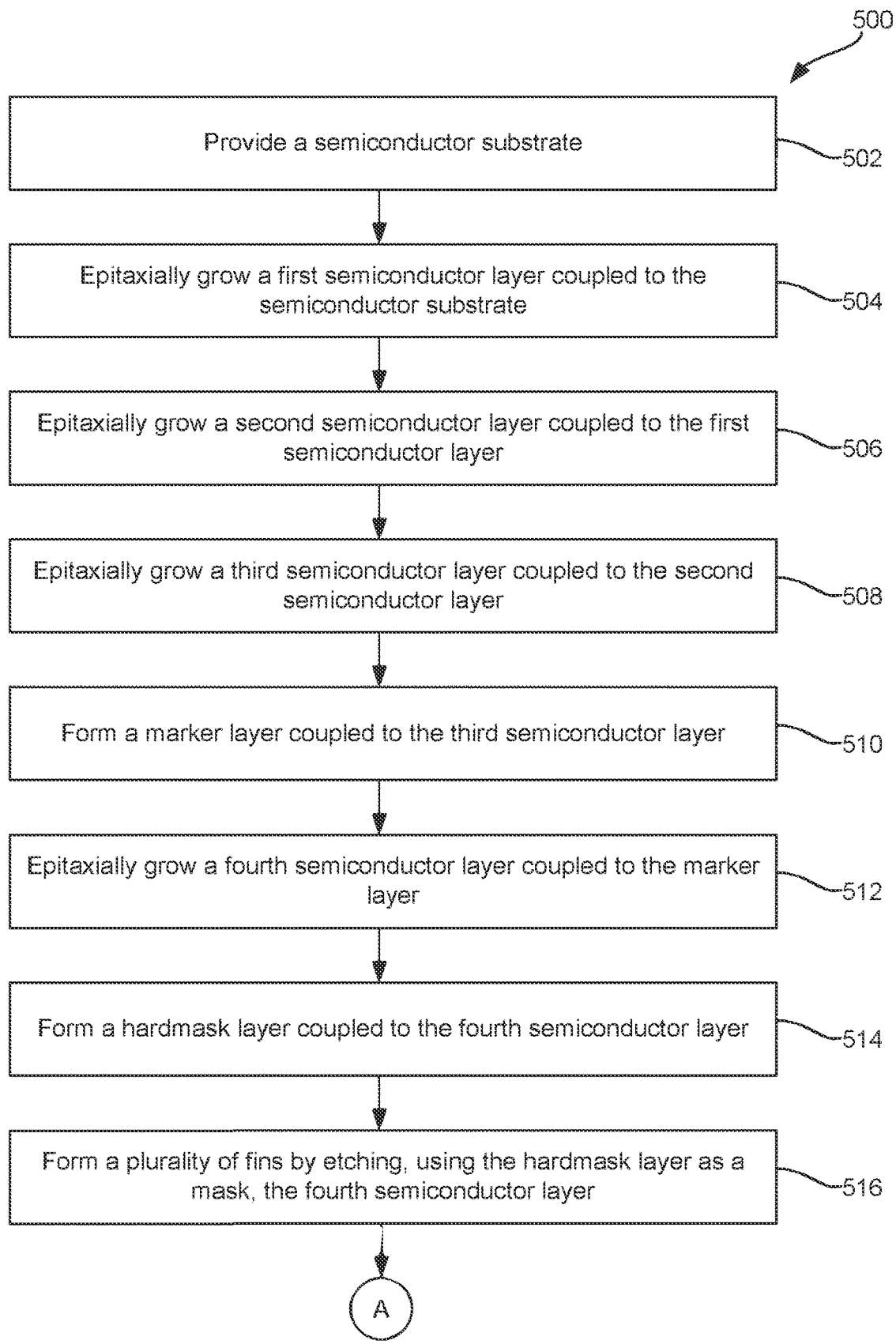
FIG. 5 is a simplified flowchart showing a method of manufacturing a vertical FET device according to an embodiment of the present invention.
Figure 5:
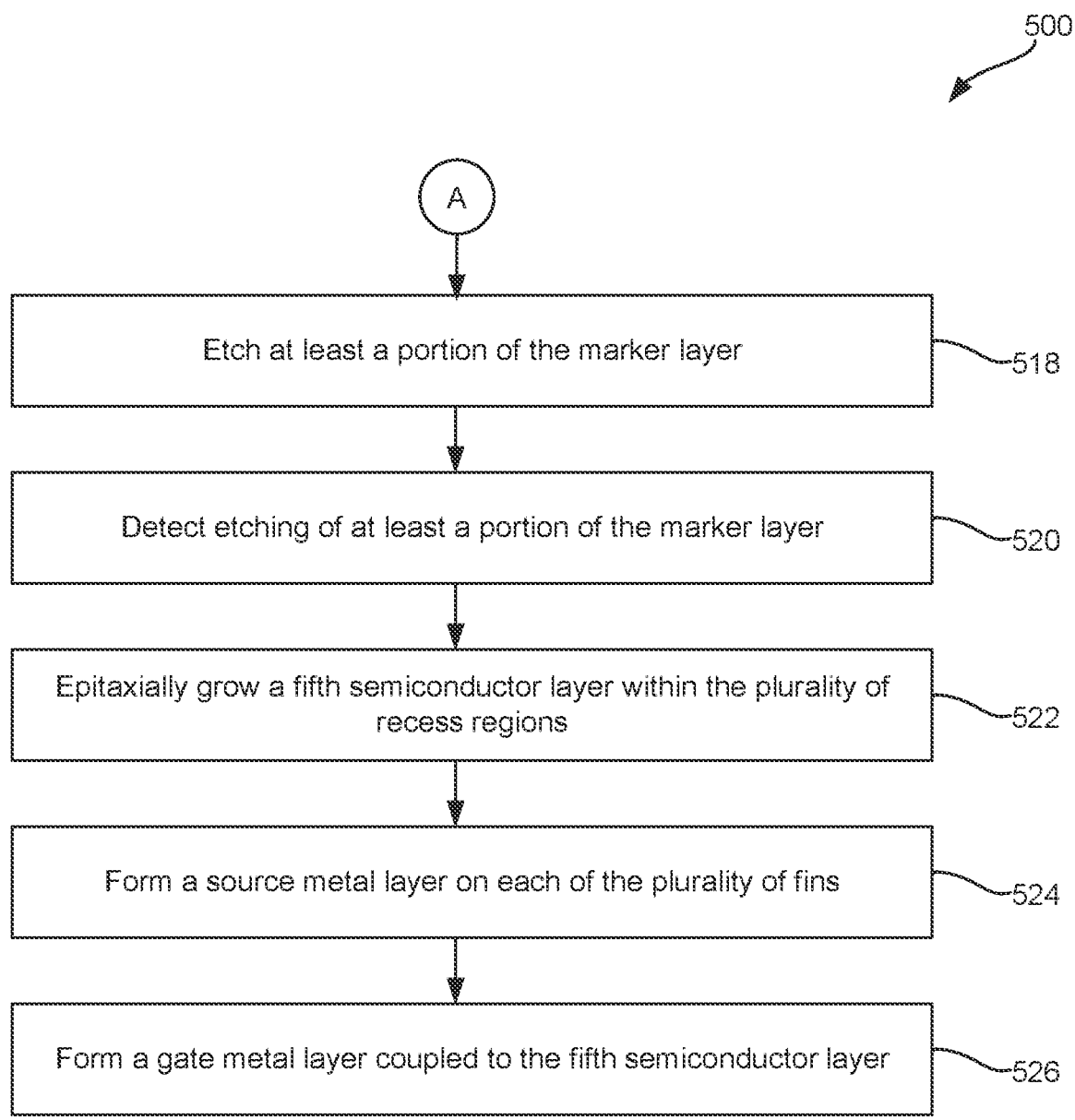

FIG. 5 is a simplified flowchart illustrating a method 500 for manufacturing a vertical FET device according to an embodiment of the present invention. Referring to FIG. 5, method 500 may include providing a semiconductor substrate (502). In one embodiment, the semiconductor substrate may include III-nitride compounds, such as GaN. In one embodiment, the semiconductor substrate is n+ type doped GaN substrate, having a dopant concentration in a range of about $4\times10^{17}$ atoms/$cm^3$ to about $1\times10^{19}$ atoms/$cm^3$ and a resistivity of less than 0.020 ohm-$cm^2$. A first semiconductor layer is epitaxially grown on or coupled to the semiconductor substrate (504). In one embodiment, the first semiconductor layer is characterized by a first conductivity type and a first dopant concentration. In one embodiment, the first semiconductor layer may include n-type doped GaN with a dopant concentration of about $1\times10^{16}$ atoms/$cm^3$.

Method 500 may further include epitaxially growing a second semiconductor layer coupled to the first semiconductor layer, wherein the second semiconductor layer is characterized by the first conductivity type (506). In one embodiment, the second semiconductor layer is further characterized by a graded dopant concentration between a first side and a second side opposite the first side. In one embodiment, the second semiconductor layer includes n-type doped GaN, and the graded dopant concentration is linearly increased from a lower dopant concentration (e.g., $1\times10^{16}$ atoms/cm$^3$) at the first side adjacent the first semiconductor layer to a higher dopant concentration (e.g., $7.5\times10^{16}$ atoms/cm$^3$) at the second side. In one embodiment, the second semiconductor layer has a thickness of 0.3 μm.

Method 500 may further include epitaxially growing a third semiconductor layer coupled to the second semiconductor layer, wherein the third semiconductor layer is characterized by the first conductivity type (508). In one embodiment, the third semiconductor layer may include n-type doped GaN with a dopant concentration of $1.3\times10^{17}$ atoms/cm$^3$. In one embodiment, the dopant concentration of the third semiconductor layer is greater than the first dopant concentration of the first semiconductor layer. In another embodiment, the dopant concentration (e.g., $1.3\times10^{17}$ atoms/cm$^3$) of the third semiconductor layer is greater than the higher dopant concentration (e.g., $7.5\times10^{16}$ atoms/cm$^3$) within the graded dopant concentration of the second semiconductor layer. In some embodiments, the thickness of the third semiconductor layer is about 0.1 μm-0.3 μm.

Method 500 may further include forming a marker layer coupled to the third semiconductor layer (510). In one embodiment, the marker layer may comprise a GaN layer incorporating a metallurgical concentration of silicon of $1\times10^{19}$ atoms/cm$^3$. In another embodiment, the marker layer may comprise an AlGaN layer incorporating a metallurgical concentration of aluminum of $1.3\times10^{17}$ atoms/cm$^3$. In another embodiment, the marker layer may comprise an InGaN layer incorporating a metallurgical concentration of indium of $1\times10^{17}$ to $1\times10^{19}$ atoms/cm$^3$. In one embodiment, the marker layer may have a thickness in a range of 1-10 nm, preferably 3-8 nm. In an exemplary embodiment, the marker layer has a thickness of 5 nm.

Method 500 may further include epitaxially growing a fourth semiconductor layer coupled to the marker layer, wherein the fourth semiconductor layer is characterized by the first conductivity type and a second dopant concentration (512). In one embodiment, the second dopant concentration of the fourth semiconductor layer is greater than the first dopant concentration of the first semiconductor layer. In one embodiment, the fourth semiconductor layer may include n-type doped GaN with a dopant concentration of $1.3\times10^{17}$ atoms/cm$^3$ and a thickness of about 0.3 μm-0.7 μm. In one embodiment, the second dopant concentration (e.g., $1.3\times10^{17}$ atoms/cm$^3$) of the fourth semiconductor layer is greater than the higher dopant concentration (e.g., $7.5\times10^{16}$ atoms/cm$^3$) within the graded dopant concentration of the second semiconductor layer.

Method 500 may further include forming a hardmask layer coupled to the fourth semiconductor layer, wherein the hardmask layer comprises a set of openings operable to expose an upper surface portion of the fourth semiconductor layer (514).

Method 500 may further include forming a plurality of fins by etching, using the hardmask layer as a mask, the fourth semiconductor layer, wherein each of the plurality of fins is separated by one of a plurality of recess regions (516). In one embodiment, the depth of the recess regions is between 0.6 and 1.0 μm. In one embodiment, the depth of the recess regions is about 0.8 μm. In one embodiment, each of the plurality of fins may have a width (between recess regions) of about 0.2 μm.

Referring to FIG. 5, method 500 may further include etching at least a portion of the marker layer (518) and detecting the etching of at least a portion of the marker layer (520). In one embodiment, the detection process may be conducted by standard methods (e.g., end point detectors). In one embodiment using silicon layer as the marker layer, a spike of silicon dopant is readily detectable. In another embodiment using AlGaN layer as the marker layer, the Al dopant is readily detectable. In one embodiment, method 500 may stop etching when it is detected that the etching process has reached the marker layer. In another embodiment, method 500 may further include etching through the marker layer, then continuing to etch the third semiconductor layer and/or second semiconductor layer using the hardmask layer as a mask for a predetermined time period.

Method 500 may further include epitaxially growing a fifth semiconductor layer within the plurality of recess regions (522). In one embodiment, the fifth semiconductor layer may include p-type doped GaN with a dopant concentration of $1\times10^{19}$ atoms/cm$^3$. Then, method 500 may further include forming a source metal layer coupled to each of the plurality of fins (524) and forming a gate metal layer coupled to the fifth semiconductor layer (526). In some embodiments, the source metal layer may include a refractory metal, a refractory metal compound, or a refractory metal alloy (e.g., TiN). In some embodiments, the gate metal layer may include nickel, gold, molybdenum, platinum, palladium, silver, combinations thereof, and the like.

It should be understood that the specific steps illustrated in FIG. 5 provide a particular method of manufacturing a vertical FET device according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual steps. Furthermore, additional steps may be added or removed depending on a particular application. One of ordinary skill in the art would recognize many variations, modifications, and alternatives.

Figure 6A:
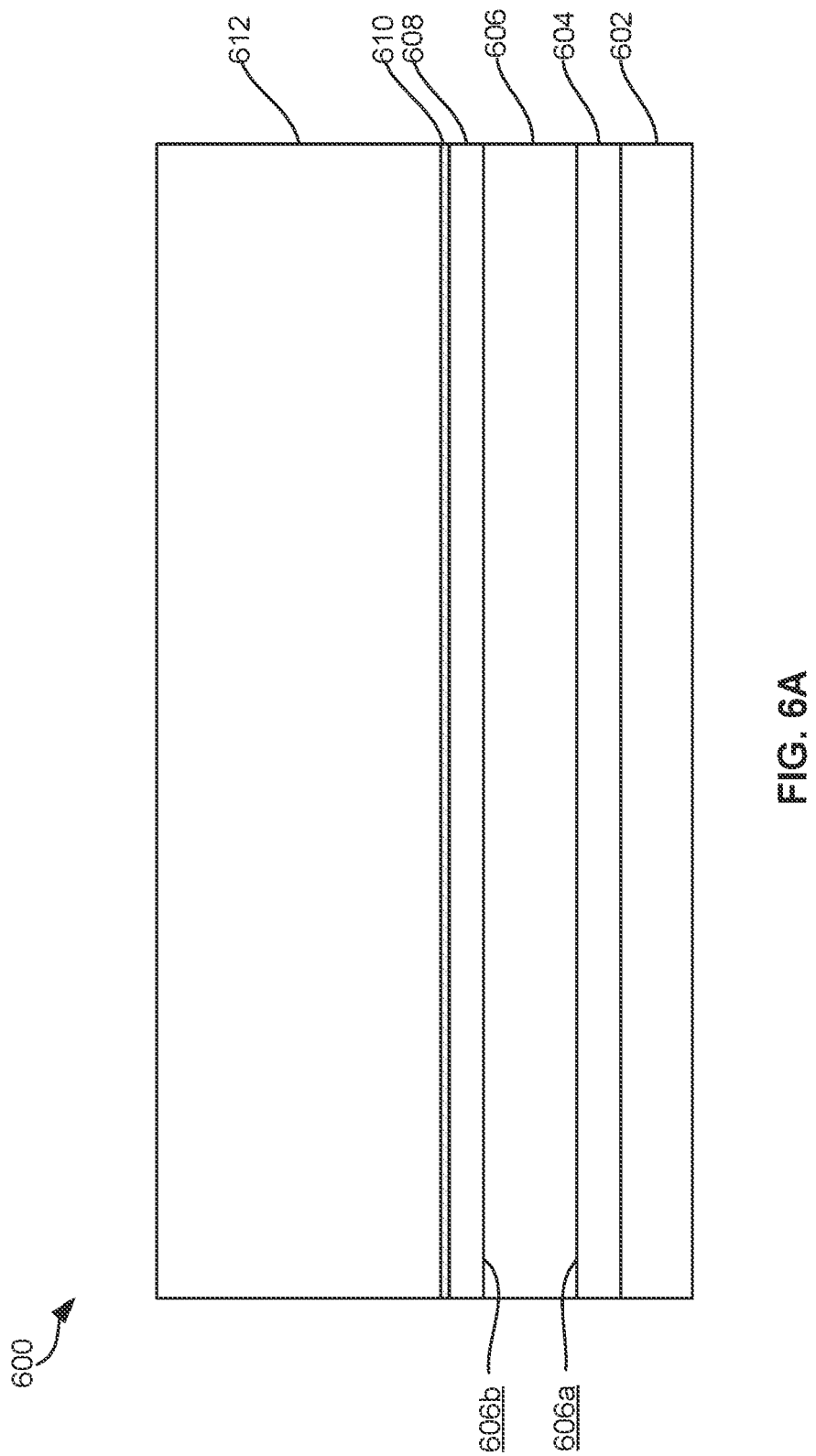

Referring back to FIG. 5 and with reference to FIGS. 6A-6G, a method of manufacturing a vertical FET device 600 is described according to an embodiment of the present invention. FIG. 6A is a partial cross-sectional view illustrating a vertical FET device 600 having an n+ type doped semiconductor substrate 602, an n-type doped first semiconductor layer 604 epitaxially grown on semiconductor substrate 602, and an n-type doped second semiconductor layer 606 epitaxially grown on first semiconductor layer 604. In one embodiment, first semiconductor layer 604 has a dopant concentration of $1\times10^{16}$ atoms/cm$^3$. In one embodiment, second semiconductor layer 606 has a graded dopant concentration between a first side 606a and a second side 606b opposite first side 606a. In one embodiment, the graded dopant concentration is linearly increased from a lower dopant concentration (e.g., $1\times10^{16}$ atoms/cm$^3$) at first side 606a adjacent first semiconductor layer 604 to a higher dopant concentration (e.g., $7.5\times10^{16}$ atoms/cm$^3$) at second side 606b. In one embodiment, second semiconductor layer 606 has a thickness of 0.3 μm.

A third semiconductor layer 608 is epitaxially grown on second semiconductor layer 606. Third semiconductor layer 608 is characterized by the first conductivity type. In one embodiment, the dopant concentration of third semiconductor layer 608 is greater than the dopant concentration of first semiconductor layer 604. In one embodiment, third semiconductor layer 608 include n-type doped GaN with a dopant concentration of $1.3 \times 10^{17}$ atoms/cm$^3$.

A marker layer 610 is deposited on third semiconductor layer 608. In one embodiment, the marker layer 610 may comprise a GaN layer incorporating a metallurgical concentration of silicon of $1 \times 10^{19}$ atoms/cm$^3$. In another embodiment, the marker layer 610 may comprise an AlGaN layer incorporating a metallurgical concentration of aluminum of $1.3 \times 10^{17}$ atoms/cm$^3$. In another embodiment, the marker layer 610 may comprise an InGaN layer incorporating a metallurgical concentration of indium of $1 \times 10^{17}$ to $1 \times 10^{19}$ atoms/cm$^3$. In one embodiment, the marker layer 610 may have a thickness in a range of 1-10 nm, preferably 3-8 nm. In an exemplary embodiment, the marker layer 610 has a thickness of 5 nm. In one embodiment, vertical FET device 600 may omit third semiconductor layer 608. In such embodiment, marker layer 610 is directly deposited on second semiconductor layer 606.

A fourth semiconductor layer 612 is epitaxially grown on marker layer 610. In one embodiment, fourth semiconductor layer 612 includes n-type doped GaN with a dopant concentration of $1.3 \times 10^{17}$ atoms/cm$^3$ and a thickness of about 0.3 μm-0.7 μm. In one embodiment, the dopant concentration of fourth semiconductor layer 612 is greater than the dopant concentration of first semiconductor layer 604. In another embodiment, the dopant concentration of fourth semiconductor layer 612 is greater than the higher dopant concentration within the graded dopant concentration of second semiconductor layer 606. In another embodiment, the dopant concentration of fourth semiconductor layer 612 is equal to or greater than the dopant concentration of third semiconductor layer 608.

Figure 6B:
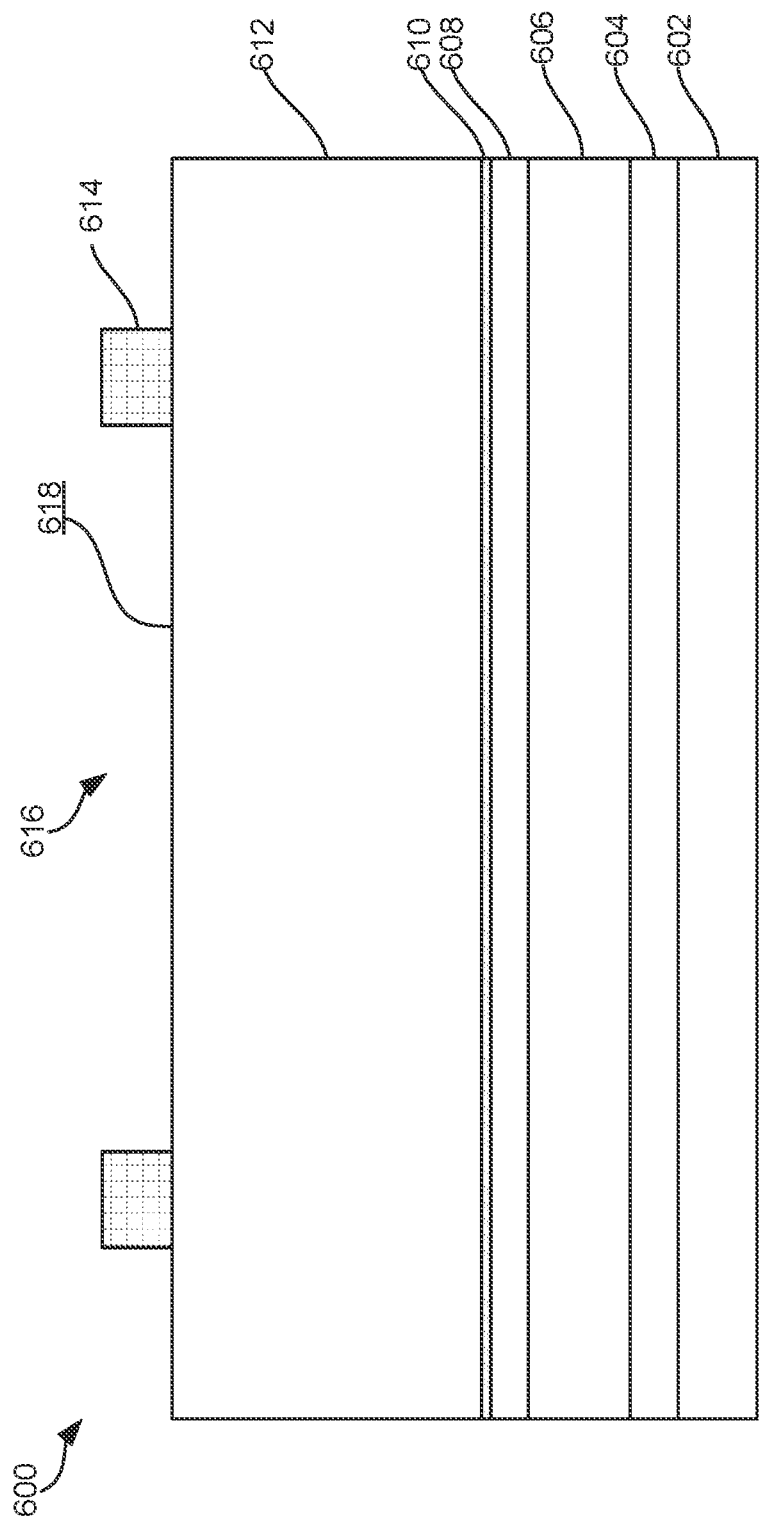
Figure 6C:
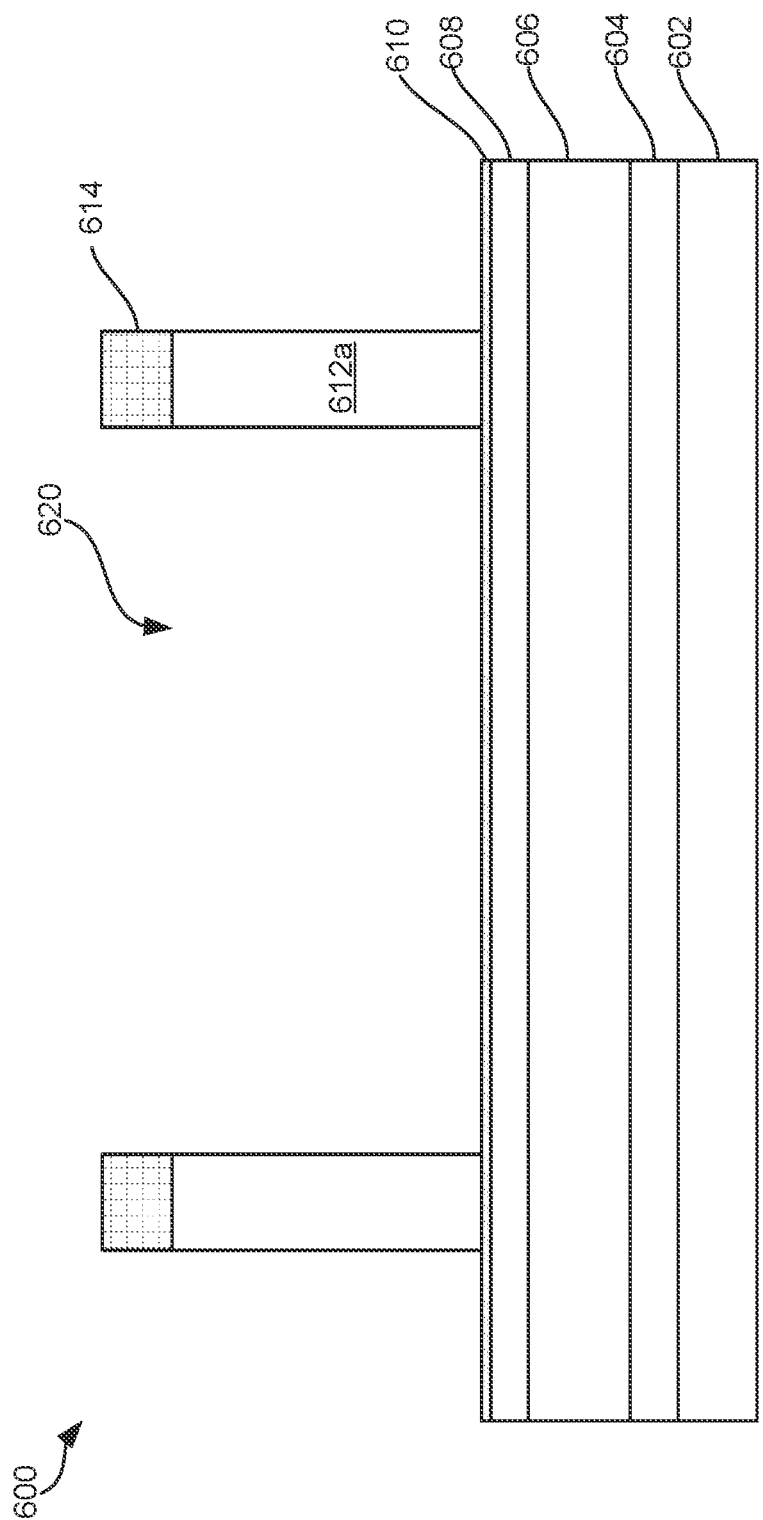

Referring to FIG. 6B, a hardmask layer 614 is formed on fourth semiconductor layer 612. Hardmask layer 614 comprises a set of openings 616 operable to expose an upper surface portion 618 of fourth semiconductor layer 612. Referring to FIG. 6C, an etching process is performed using hardmask layer 614 as a mask to form a plurality of fins 612a within fourth semiconductor layer 612. Each of the fins 612a is separated by one of a plurality of recess regions 620 formed by the etching process. As shown in FIG. 6C, the etching process is monitored to detect when the etching process reaches marker layer 610. In one embodiment, the detection process may be conducted by standard methods (e.g., end point detectors). In one embodiment using silicon layer as the marker layer, a spike of silicon dopant is readily detectable. In another embodiment using AlGaN layer as the marker layer, the Al dopant is readily detectable. In another embodiment using an In-doped layer, the In dopant is readily detectable. The detection of the etching process reaching the marker layer will be described in detail below.

During the etching of at least a portion of marker layer 610, a detection process is used to detect when the etching process reaches marker layer 610. In one embodiment, the subsequent etching process may be finely controlled to achieve a predetermined etch depth in a target doping layer. Referring to FIG. 6D, the subsequent etching may be timed to achieve an etch depth of 0.1 μm in second semiconductor layer 606. It should be noted that the etch depth within second semiconductor layer 606 may vary as appropriate to the particular application. In another embodiment, the subsequent etching may be timed to achieve an etch depth (e.g., 0.2 μm) in third semiconductor layer 608. In another embodiment, the etching process may stop once it is detected that the etching process has reached marker layer 610.

In one embodiment, after forming the recess regions, a cleaning process is carried using a TMAH solution of about 25% by weight, at a temperature of about 85° C., and for a duration of about 30 minutes. In another embodiment, prior to performing a cleaning using the TMAH solution, a pre-cleaning, such as piranha clean using a $H_2SO_4$:$H_2O_2$ in a volume ratio 2:1 for two minutes, may also be performed.

Figure 6E:
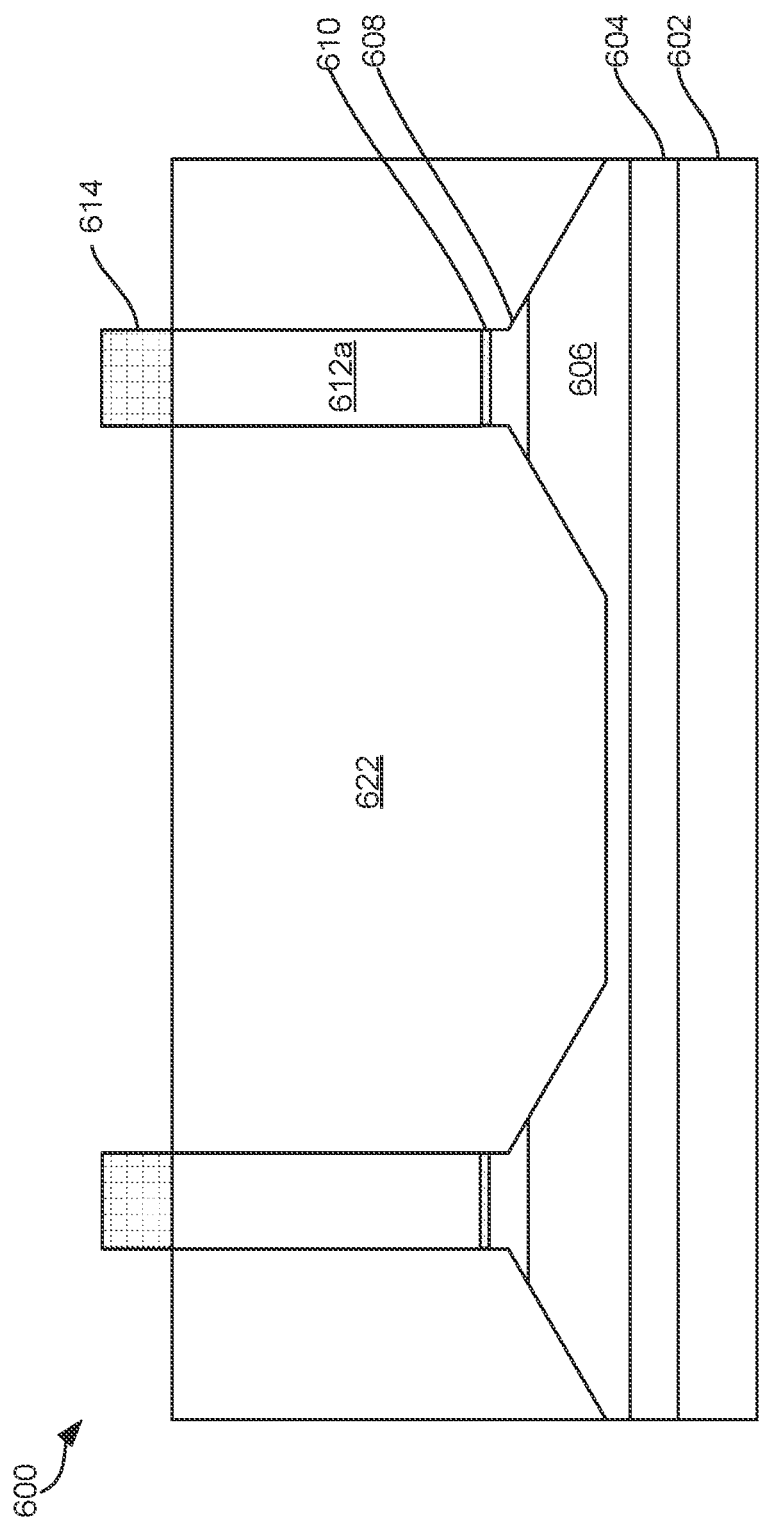
Figure 6F:
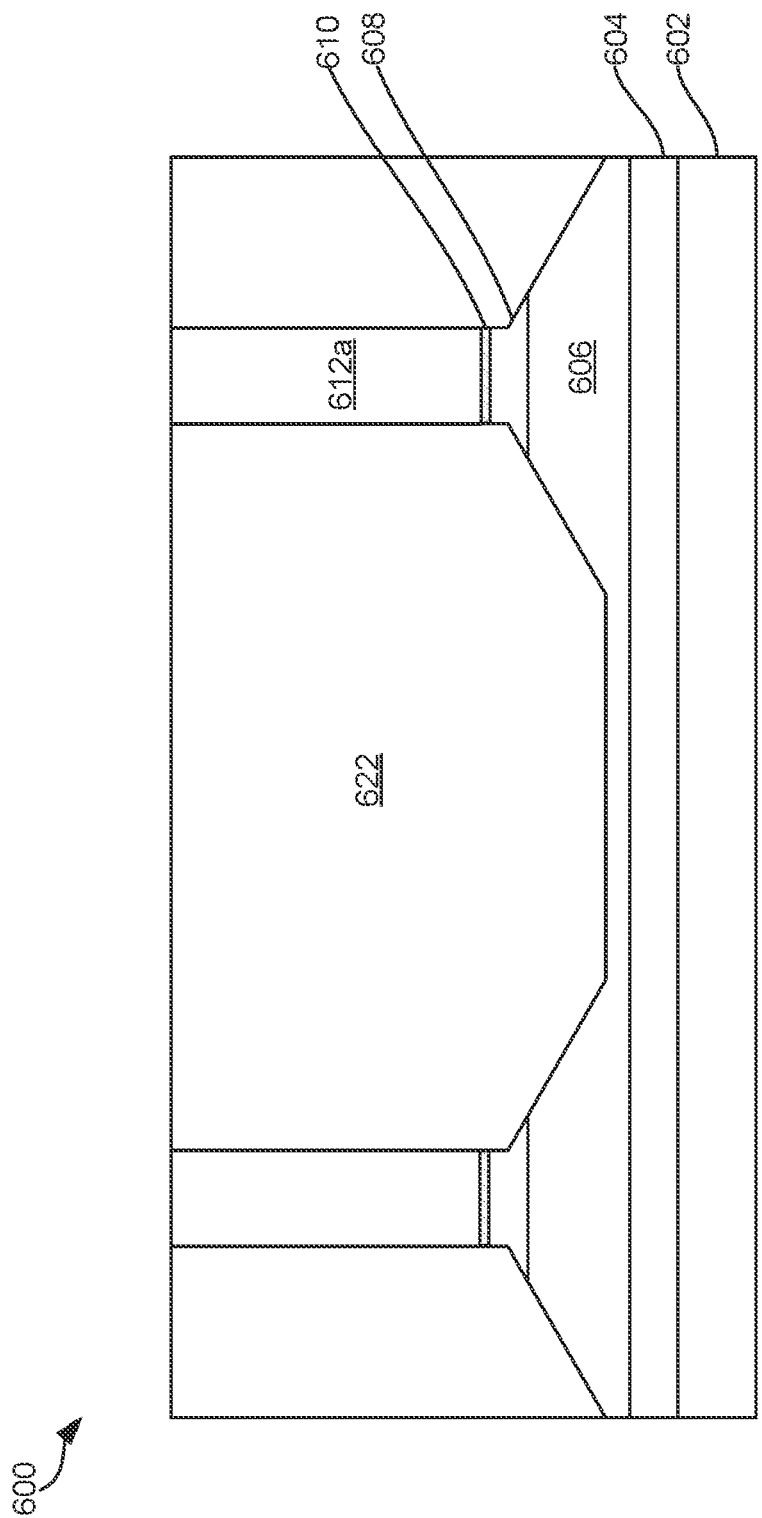

Referring to FIG. 6E, a fifth semiconductor layer 622 is epitaxially grown within the plurality of recess regions 620. In one embodiment, the upper surface of fifth semiconductor layer 622 is substantially planar with the upper surface of fourth semiconductor layer 612 (i.e., the upper surface of fins 612a). As shown in FIG. 6E, fifth semiconductor layer 622 is coupled to second semiconductor layer 606. Fifth semiconductor layer 622 provides the gate layer for vertical FET device 600. In one embodiment, fifth semiconductor layer 622 may include p-type doped GaN with a dopant concentration of $1 \times 10^{19}$ atoms/cm$^3$. Referring to FIG. 6F, hardmask layer 614 is then removed from fins 612a (i.e., from fourth semiconductor layer 612).

Figure 6G:
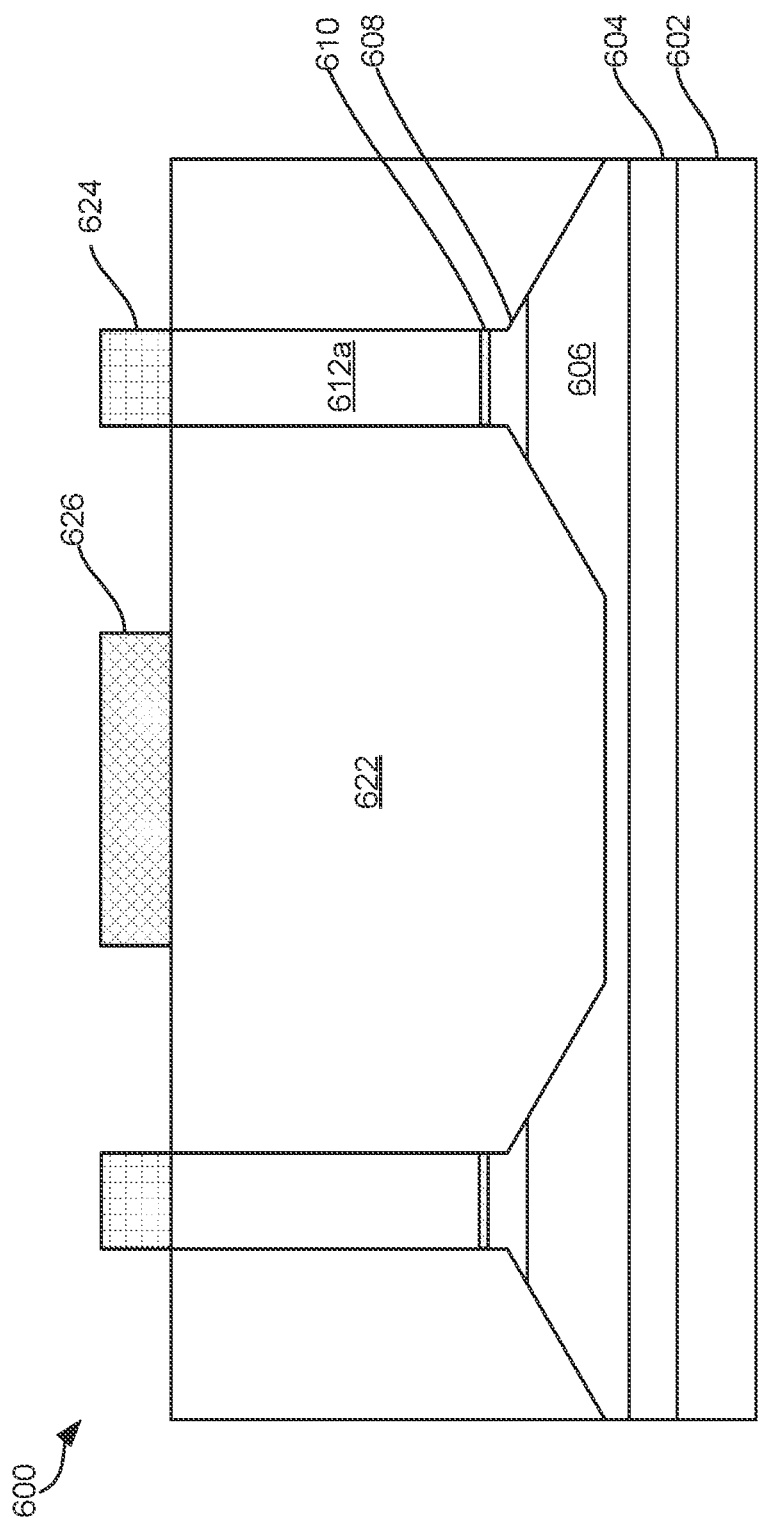

Referring to FIG. 6G, a source metal layer 624 is deposited on each of the fins 612a (i.e., on the fourth semiconductor layer 612). Then, a gate metal layer 626 is deposited on fifth semiconductor layer 622. In some embodiments, source metal layer 624 may include a refractory metal, a refractory metal compound, or a refractory metal alloy (e.g., TiN). In some embodiments, gate metal layer 626 may include nickel, gold, molybdenum, platinum, palladium, silver, combinations thereof, and the like.

In the manufacturing process of vertical FET devices, the control of etch depth may be critical for meeting the electrical performance of the vertical FET devices. For example, a goal in etching the plurality recess regions (e.g., recess regions 320 shown in FIG. 3C) is to complete the etching process within a target doping layer (e.g., second semiconductor layer 306 shown in FIG. 3D). Over-etching will result in a series of gating effects due to the drift layer (e.g., second semiconductor layer 306) with low dopant concentration being exposed to the depletion caused by the p-type doped gate layer (e.g., fifth semiconductor layer 322 shown in FIG. 3G). Under-etching will extend the fins (e.g., fins 312a shown in FIG. 3G) with higher doping concentration into the drift layer (e.g., second semiconductor layer 306 shown in FIG. 3G), which can result in high electric field (|E|) at the interface of the gate layer (e.g., fifth semiconductor layer 322 shown in FIG. 3G) and the drift layer (e.g., third semiconductor layer 310).

Figure 7A:
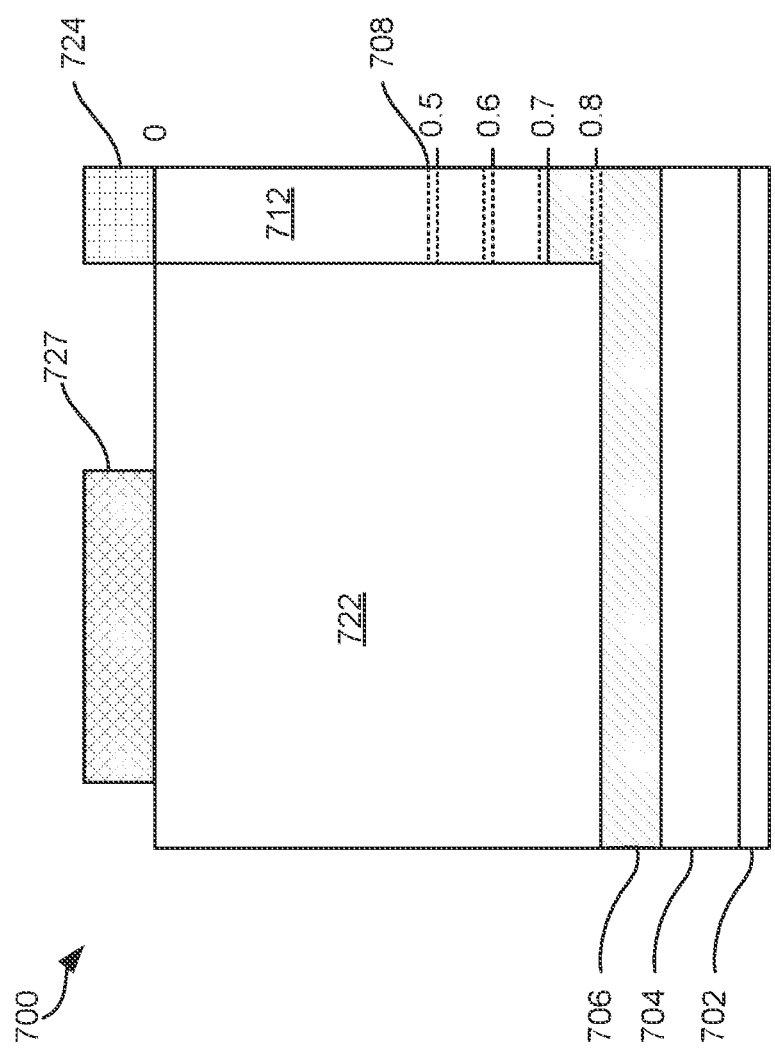
FIG. 7A is a partial schematic view illustrating a vertical FET device with a hypothetical marker layer positioned at different depths according to an embodiment of the present invention.

FIG. 7A is a partial schematic view illustrating a vertical FET device 700 with a hypothetical marker layer 708 positioned at different depths according to an embodiment of present invention. As shown in FIG. 7A, vertical FET device 700 includes an n+ GaN substrate 702, a drift layer including a n-GaN layer 704, a graded n-GaN layer 706 with a dopant concentration in the range of about $1 \times 10^{16}$ atoms/cm$^3$ to about $1 \times 10^{17}$ atoms/cm$^3$, an n-GaN fin 712 with a dopant concentration of about $1 \times 10^{17}$ atoms/cm$^3$, a p-GaN gate layer 722, a source metal layer 724, and a gate metal layer 727. Vertical FET device 700 includes a marker layer 708 positioned at different depths as different variations. In one embodiment, marker layer 708 includes a silicon layer with a dopant concentration of about $1 \times 10^{19}$ atoms/cm$^3$.

In the embodiment shown in FIG. 7A, the bottom portion of fin 712 is rectangular for sake of simplicity of description. In FIG. 7A, the "0" location denotes the upper surface of fin 712; the "0.8" location denotes that the marker layer 708 is positioned at the bottom of the gate layer 722, that is 0.8 μm below the upper surface of fin 712; the "0.7" location denotes that the marker layer 708 is positioned at the top of the graded n-GaN layer 706, that is 0.7 μm below the upper surface of fin 712; and the "0.6" and "0.5" locations denote that the marker layer 708 is positioned at a position above the graded n-GaN layer 706 by 0.1 μm and 0.2 μm, respectively. It should be noted that the thickness of layers and regions in the drawings may be exaggerated for clarity.

Figure 7B:
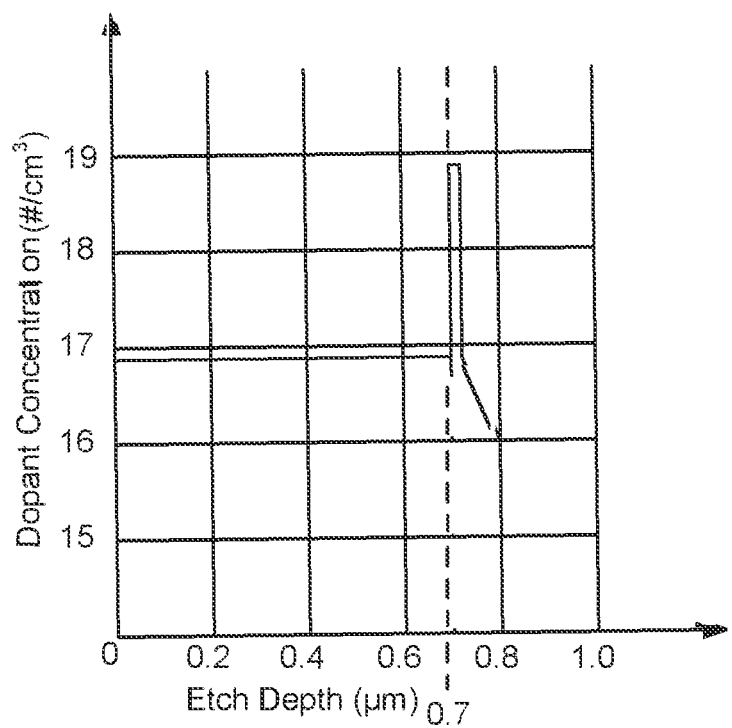
FIG. 7B is a schematic graph illustrating a dopant concentration detected during etching of the recess regions for the gate layer according to an embodiment of the present invention.

FIG. 7B is a schematic graph illustrating the dopant concentration detected during etching of the recess regions for gate layer 722. In the example shown in FIG. 7B, marker layer 708 is positioned at the "0.7" location (i.e., the top of the graded n-GaN layer 706). In the coordinate system shown in FIG. 7B, the horizontal axis represents etch depth starting from the upper surface of fin 712, and the vertical axis represents logarithmic value of the detected dopant concentration (Log Nd). As shown in FIG. 7B, the Log Nd remains at about 17 with the etching process progressing until it reaches marker layer 708, where the Log Nd increases to about 19. After that, the Log Nd decreases as the etching process proceeds within graded n-GaN layer 706.

Figure 7C:
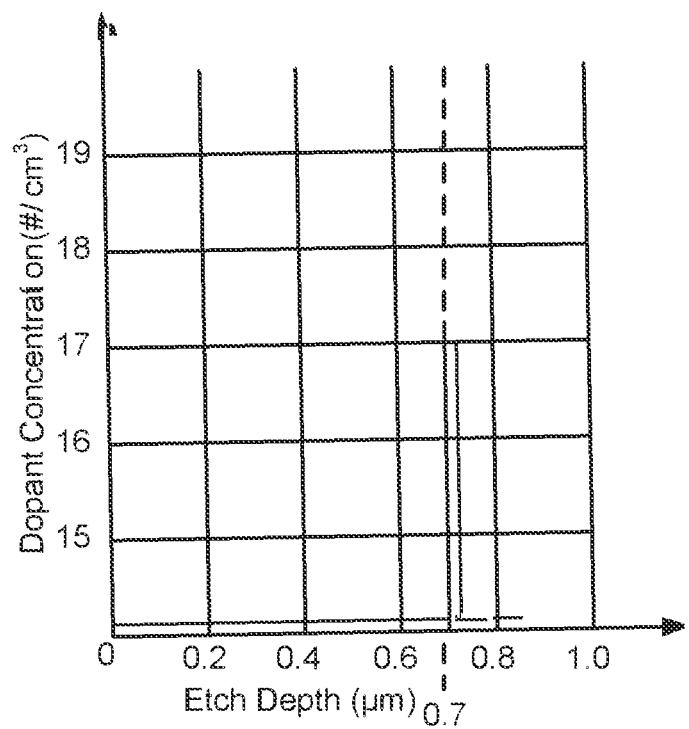
FIG. 7C is a schematic graph illustrating a dopant concentration detected during etching of the recess regions for the gate layer according to another embodiment of the present invention.

FIG. 7C is a schematic graph illustrating the dopant concentration detected during etching of the recess regions for gate layer 722. In comparison with the embodiment shown in FIG. 7B, marker layer 708 used in the embodiment shown in FIG. 7C comprises AlGaN with an Al dopant concentration of $1.7 \times 10^{17}$ atoms/cm$^3$. Similar to the coordinate system shown in FIG. 7B, the horizontal axis shown in FIG. 7C represents etch depth starting from the upper surface of fin 712 and the vertical axis represents Log Nd. As shown in FIG. 7C, the Log Nd remains low with the etching process progressing until it reaches marker layer 708, where the Log Nd increases to about 17. After that, the Log Nd decreases to a low level as the etching process proceeds within graded n-GaN layer 706.

Figure 8A:
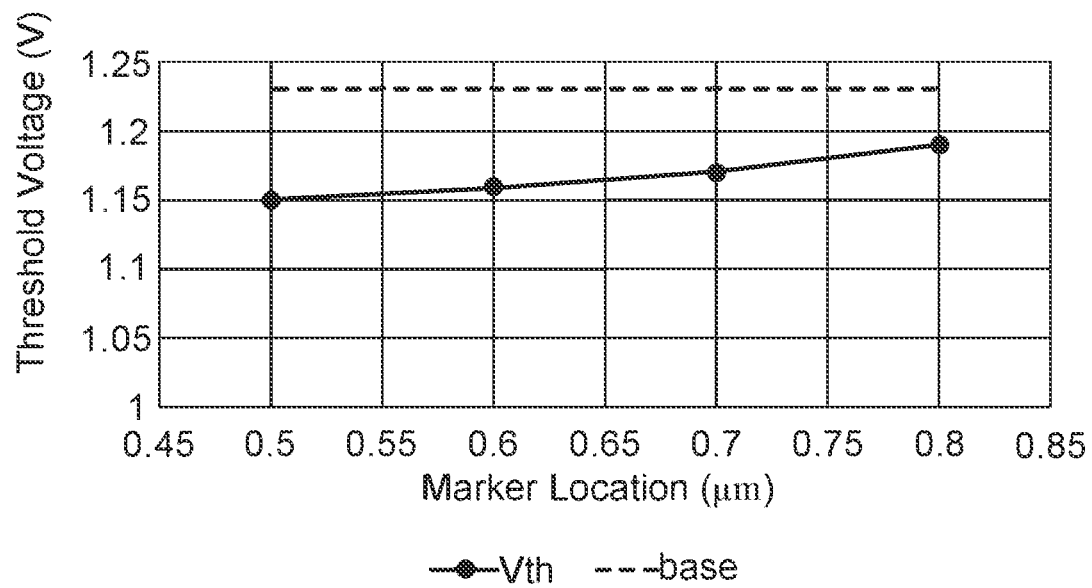
FIG. 8A is a schematic graph illustrating a threshold voltage ($V_{TH}$) of a vertical FET device with a marker layer of silicon as a function of the location of the marker layer according to an embodiment of the present invention.

FIG. 8A is a schematic graph illustrating a threshold voltage ($V_{TH}$) of the vertical FET device 700 with a marker layer of silicon as a function of the locations of the marker layer. In the coordinate system shown in FIG. 8A, the horizontal axis represents the locations of the marker layer starting from the upper surface of fin 712 (represented by "0"), and the vertical axis represents the V of the vertical FET device 700. In FIG. 8A, the $V_{TH}$ of a comparative vertical FET device without the marker layer is shown as the baseline (base). As shown in FIG. 8A, the $V_{TH}$ of the vertical FET device 700 is gradually increasing with the location of the marker layer. In some embodiments, the detection process as described with reference to FIG. 2 can detect that the $V_{TH}$ of the vertical FET device 700 exceeds a predetermined threshold. For example, the $V_{TH}$ of the vertical FET device is 1.17 for a marker layer positioned at "0.7" location. When it is detected that the $V_{TH}$ exceeds 1.17, this indicates that the etching process has reached the marker layer 708.

Figure 8B:
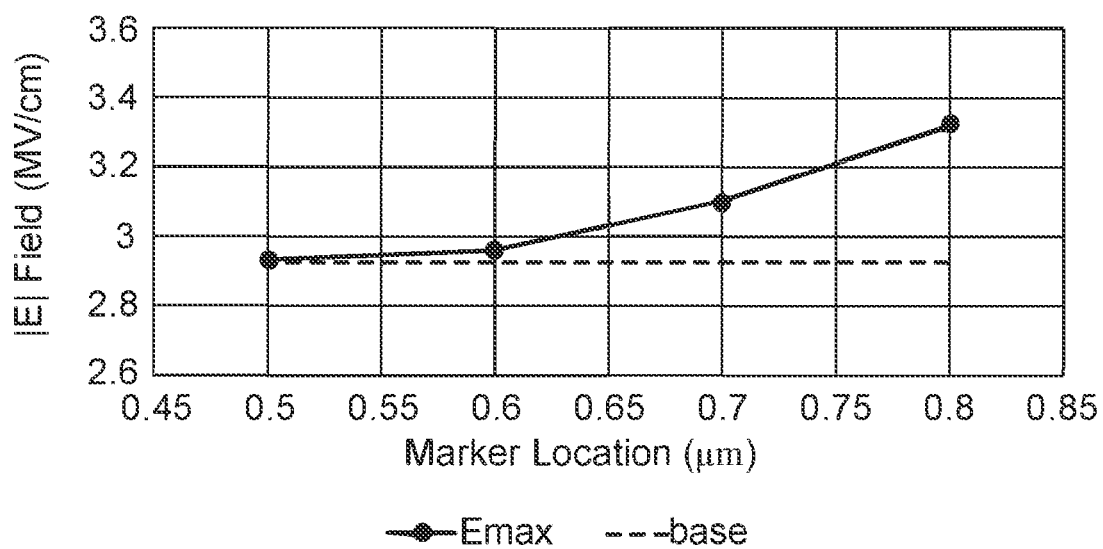
FIG. 8B is a schematic graph illustrating a maximum electric field (Emax) of a vertical FET device with a marker layer of silicon as a function of the location of the marker layer according to an embodiment of the present invention.

FIG. 8B is a schematic graph illustrating a maximum electric field (Emax) of the vertical FET device 700 with a marker layer of silicon as a function of the location of the marker layer. In the coordinate system shown in FIG. 8B, the horizontal axis represents the location of the marker layer 708 starting from the upper surface of fin 712 (represented by "0"), and the vertical axis represents the Emax which is measured at an electrical voltage of 1200V. In FIG. 8B, the Emax of a comparative vertical FET device without the marker layer is shown as the baseline (base). As shown in FIG. 8B, the Emax of the vertical FET device 700 is gradually increasing with the location of the marker layer. In some embodiments, the detection process as described with reference to FIG. 2 can detect when the Emax of the vertical FET device 700 exceeds a predetermined threshold. For example, the Emax of the vertical FET device 700 is 3.09 for a marker layer positioned at "0.7" location. When it is detected that the Emax exceeds 3.09, it indicates that etching process has reached the marker layer 708.

Using embodiments of the present invention, a series of device fabrication runs can be performed to fabricate a series of FET devices with differing etching process conditions. By analyzing the $V_{TH}$ and/or the Emax that characterize the FET devices, an analysis can be performed to determine the etch process conditions that result in FET devices having a $V_{TH}$ less than a predetermined threshold and/or FET devices having an Emax less than another predetermined threshold.

Figure 9A:
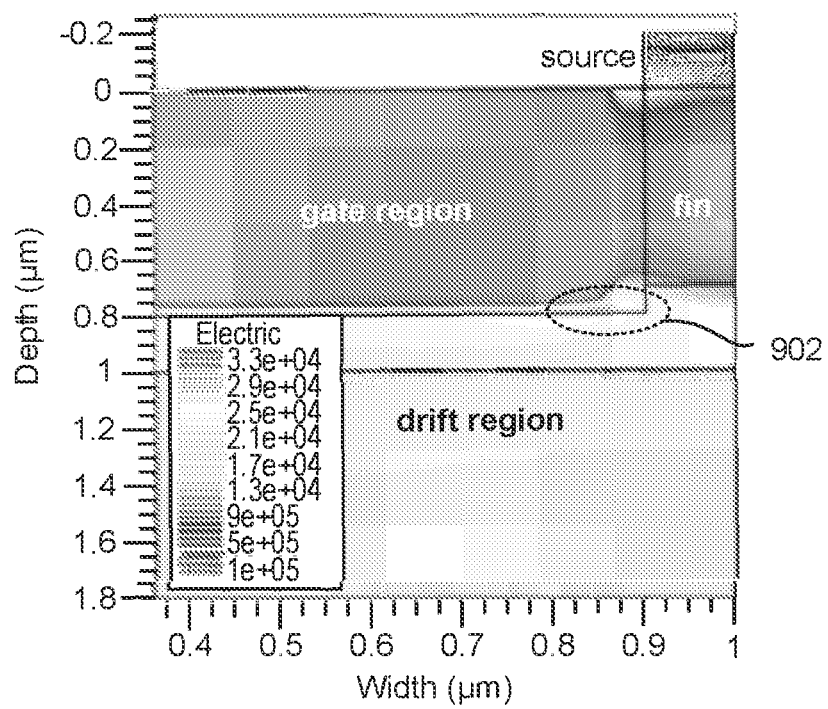
FIG. 9A is a 2D cross-sectional plot illustrating a magnitude of an electric field ($|E|$) of a comparative vertical FET device without a marker layer.
Figure 9B:
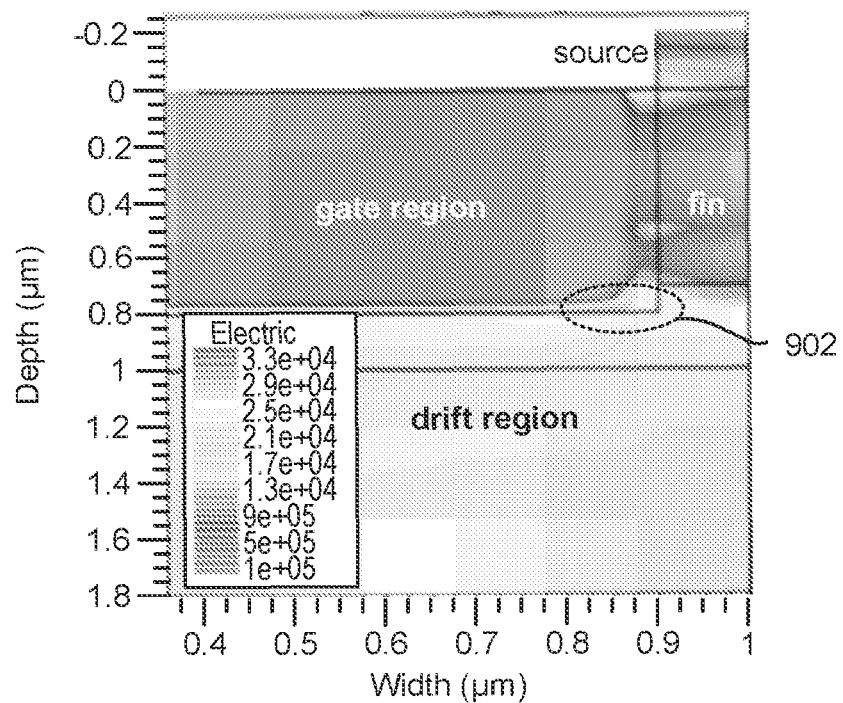
FIGS. 9B-9E are 2D cross-sectional plots illustrating a magnitude of an $|E|$ of a vertical FET device with a marker layer of silicon positioned at different locations according to an embodiment of the present invention.
Figure 9C:
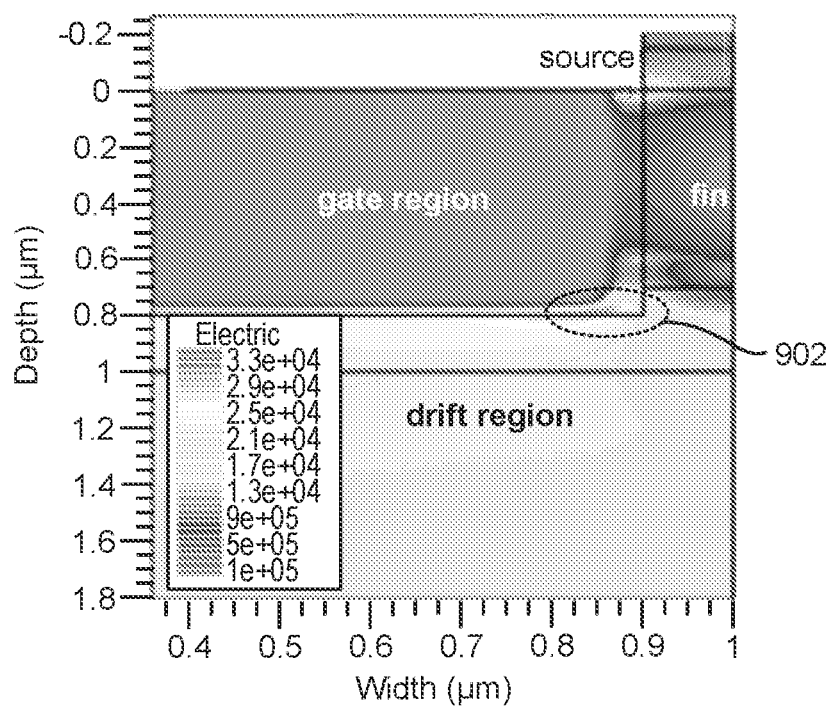
Figure 9D:
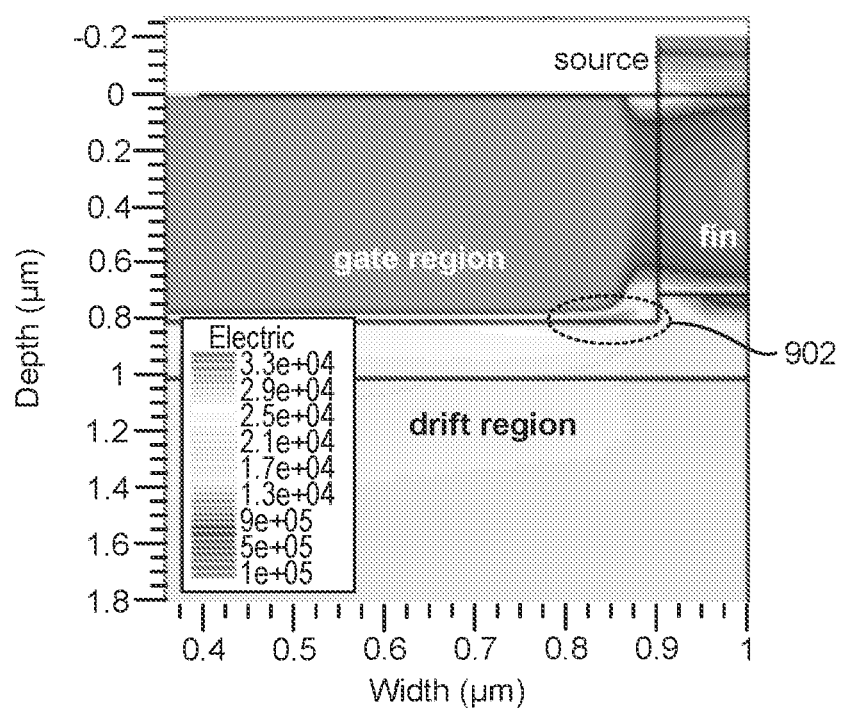
Figure 9E:
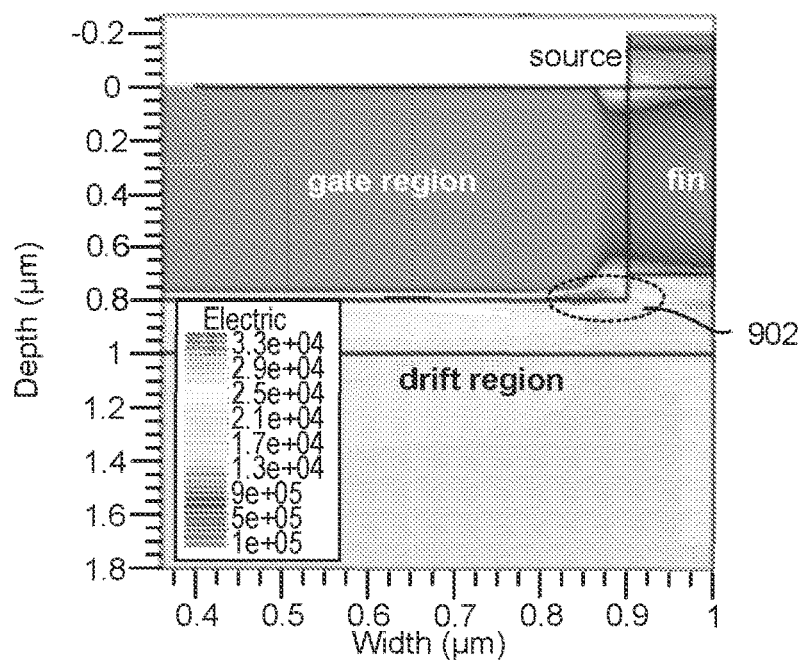
Figure 9F:
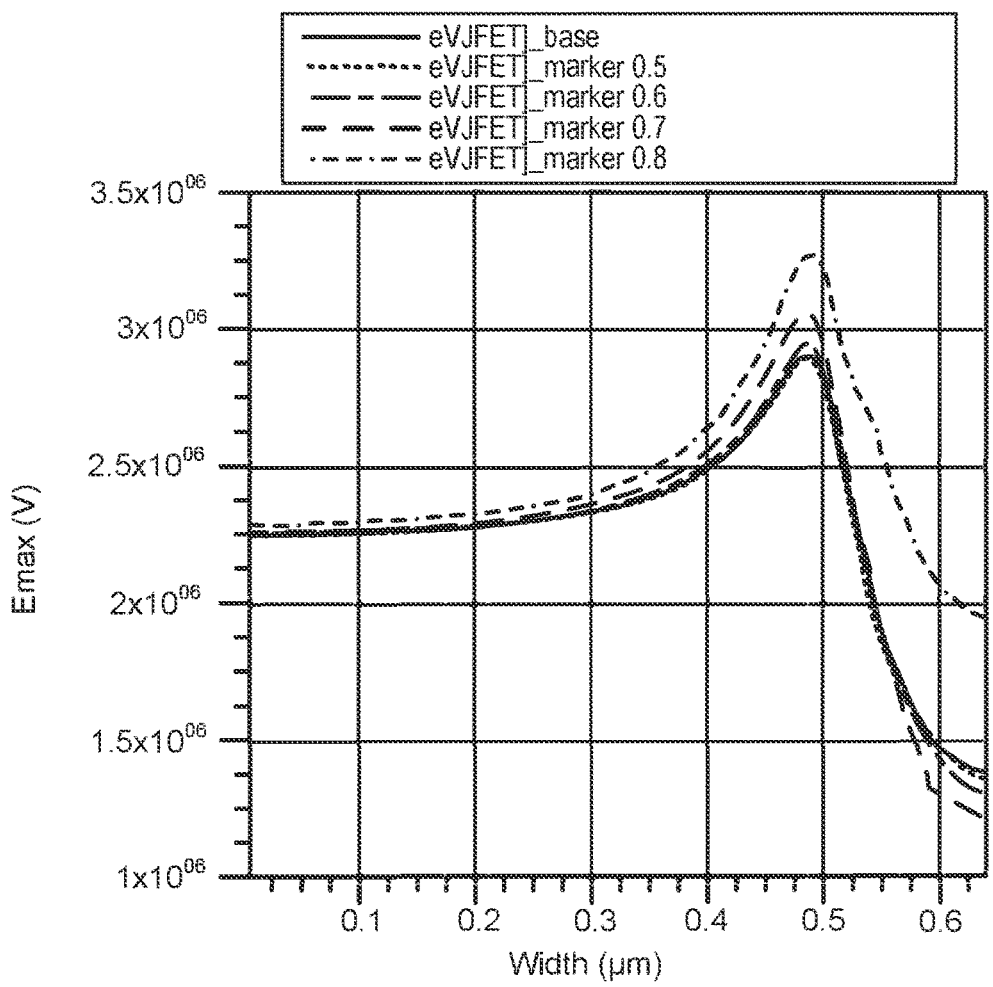
FIG. 9F shows the overlay of cutlines through the maximum electric field (Emax) as shown in FIGS. 9A-9E.

FIG. 9A is a 2D cross-sectional plot illustrating a magnitude of an |E| of a comparative vertical FET device without the marker layer. FIGS. 9B-9E are 2D cross-sectional plots illustrating the magnitude of the |E| of vertical FET device 700 with marker layer 708 of silicon positioned at different locations. The |E|'s of the comparative vertical FET device and that of the vertical FET device 700 are measured at $V_{DS}$=1200V and $V_{GS}$=0V. FIG. 9B shows the |E| of vertical FET device 700 with marker layer 708 positioned at "0.5" location; FIG. 9C shows the |E| of vertical FET device 700 with marker layer 708 positioned at "0.6" location; FIG. 9D shows the |E| of vertical FET device 700 with marker layer 708 positioned at "0.7" location; and FIG. 9E shows the |E| of vertical FET device 700 with marker layer 708 positioned at "0.8" location. In FIGS. 9A-9E, the top left region denotes the gate region (e.g., gate layer 722 shown in FIG. 7A), the top right region denotes the fin (e.g., fin 712 shown in FIG. 7A), and the bottom region denotes the drift region (e.g., graded n-GaN layer 706 shown in FIG. 7A). The Emax in FIGS. 9A-9E appears at about the interface of the gate region and drift region close to the fin and is denoted by the ellipse 902. It can be seen that the Emax is becoming worse with the location of the marker layer gets closer to the drift region. FIG. 9F shows the overlay of cutlines through the Emax as shown in FIGS. 9A-9E. It can be seen from FIG. 9F that the Emax for the vertical FET device 700 with a marker layer positioned at "0.8" location is the worst.

Using embodiments of the present invention, a series of device fabrication runs can be performed to fabricate a series of FET devices having a marker layer positioned at different depths. By analyzing the magnitude of the |E| characterizing the FET devices, an analysis can be performed to evaluate the impact of the marker layer to the performance of the FET devices. Based upon the evaluation, the depth of the marker layer can be adjusted to retain the benefits provided the marker layer and to control the quality of the FET devices at the same time.

Figure 10:
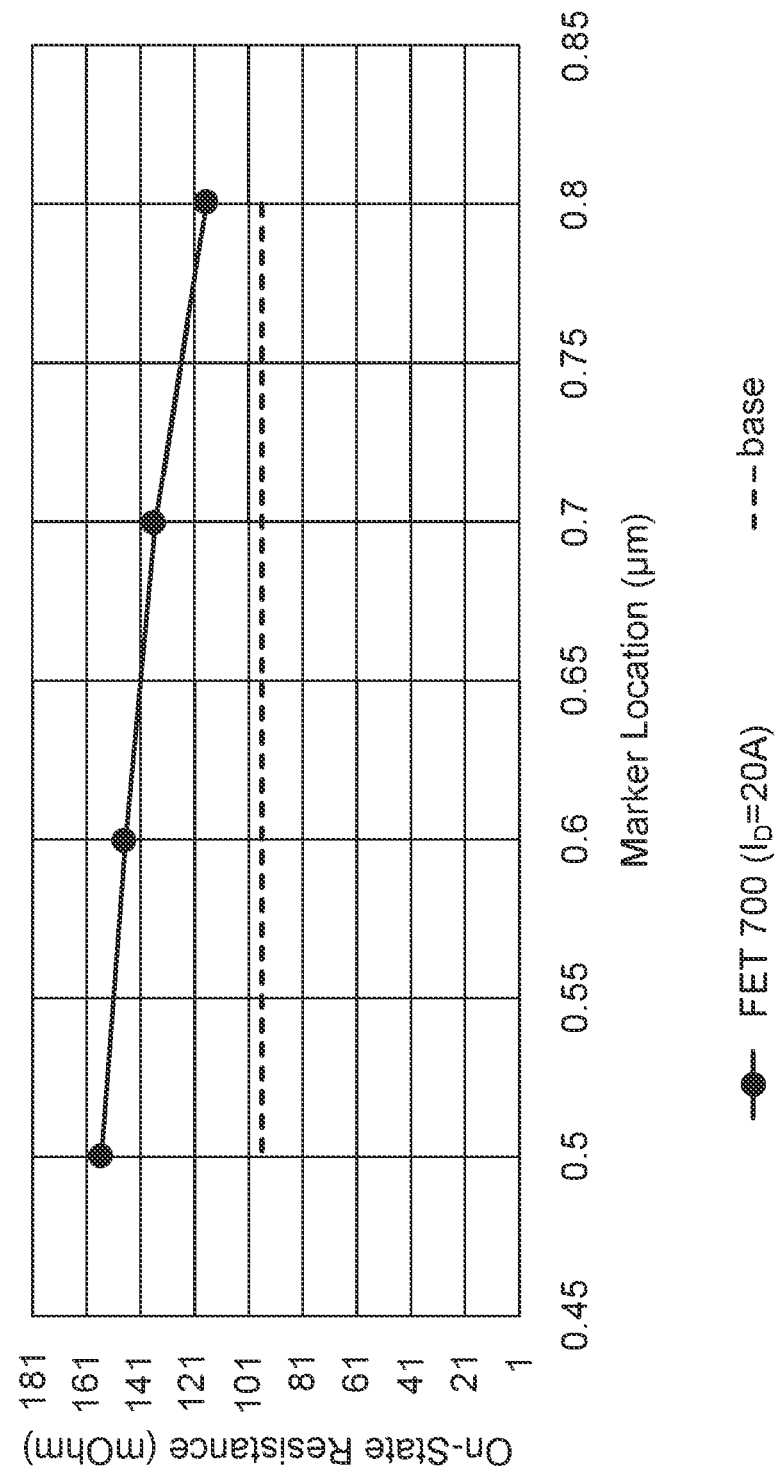
FIG. 10 is a schematic graph illustrating an on-state resistance of a vertical FET device with a marker layer of aluminum gallium nitride (AlGaN) positioned at different locations according to an embodiment of the present invention.

FIG. 10 is a schematic graph illustrating the simulated on-state resistance of a vertical FET device 700 with marker layer 708 of AlGaN positioned at different locations. In the coordinate system shown in FIG. 10, the horizontal axis represents the location of the marker layer 708 starting from the upper surface of fin 712 (represented by "0"), and the vertical axis represents the on-state resistance of the vertical FET device 700 measured at $I_D$=20 A. In FIG. 10, the on-state resistance of a comparative vertical FET device without the marker layer is shown as the baseline (base). As shown in FIG. 10, the on-state resistance of the vertical FET device 700 with marker layer 708 of AlGaN is generally greater than that of the comparative vertical FET device and is gradually decreasing with increasing depth of the marker layer.

Using embodiments of the present invention, a series of device fabrication runs can be performed to fabricate a series of FET devices with differing etching process conditions. By analyzing the on-state resistance characterizing the FET devices, an analysis can be performed to determine the etch process conditions that result in FET devices having an on-state resistance greater than a predetermined threshold.

Figure 11A:
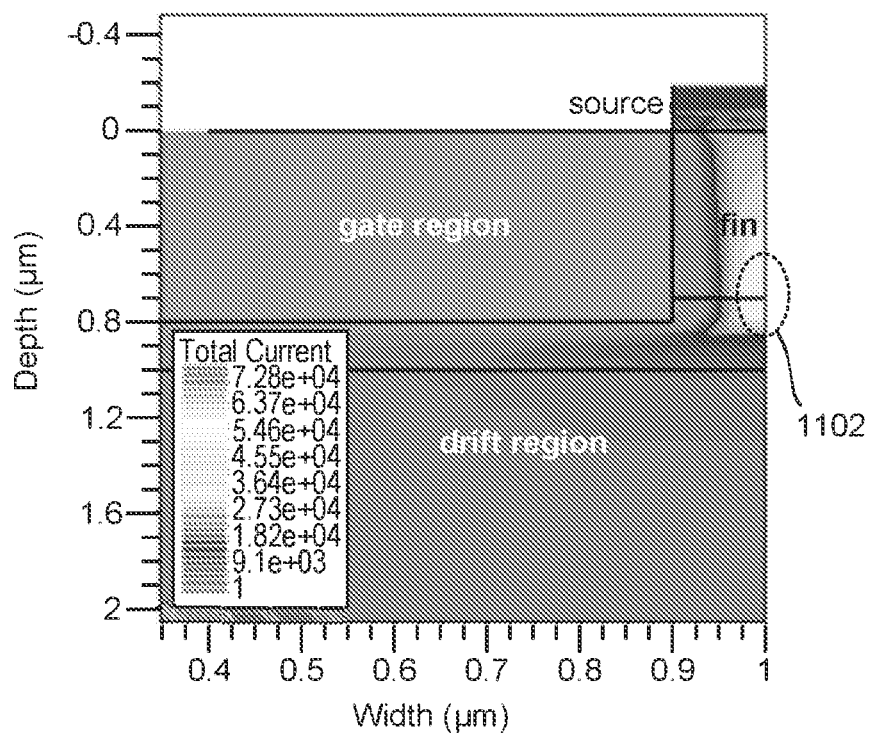
FIG. 11A is a 2D cross-sectional plot illustrating a total current density of a comparative vertical FET device without a marker layer.
Figure 11B:
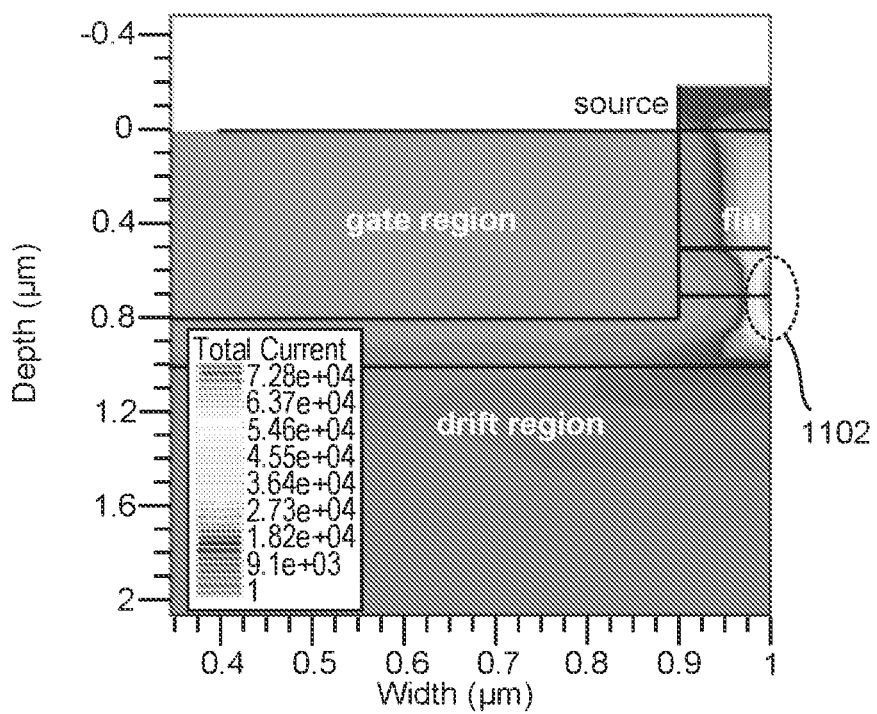
FIGS. 11B-11E are 2D cross-sectional plots illustrating total current densities of a vertical FET device with a marker layer of AlGaN positioned at different locations according to an embodiment of the present invention.
Figure 11C:
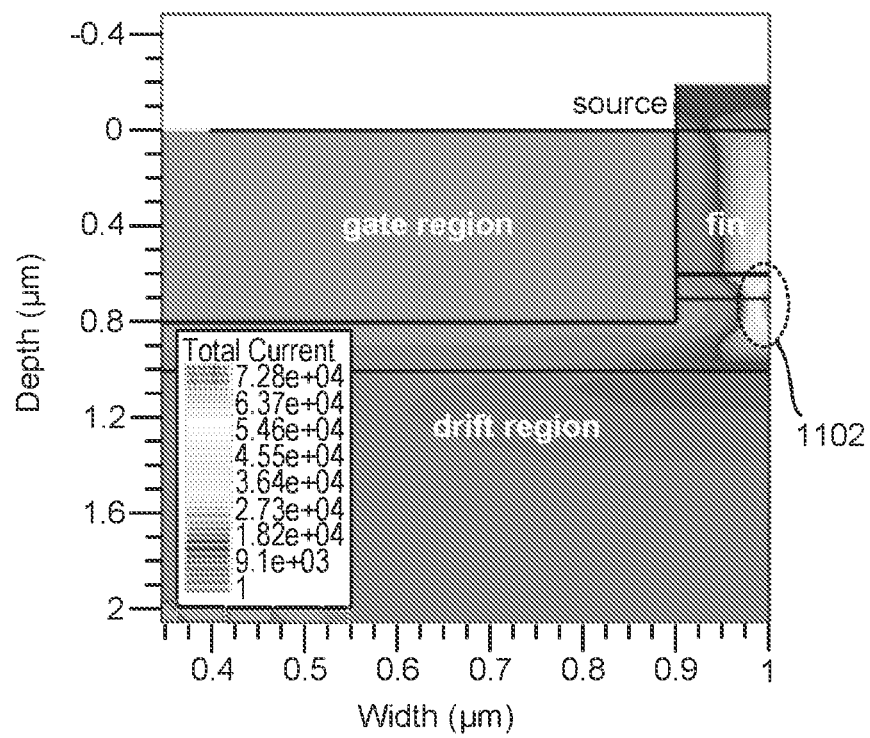
Figure 11D:
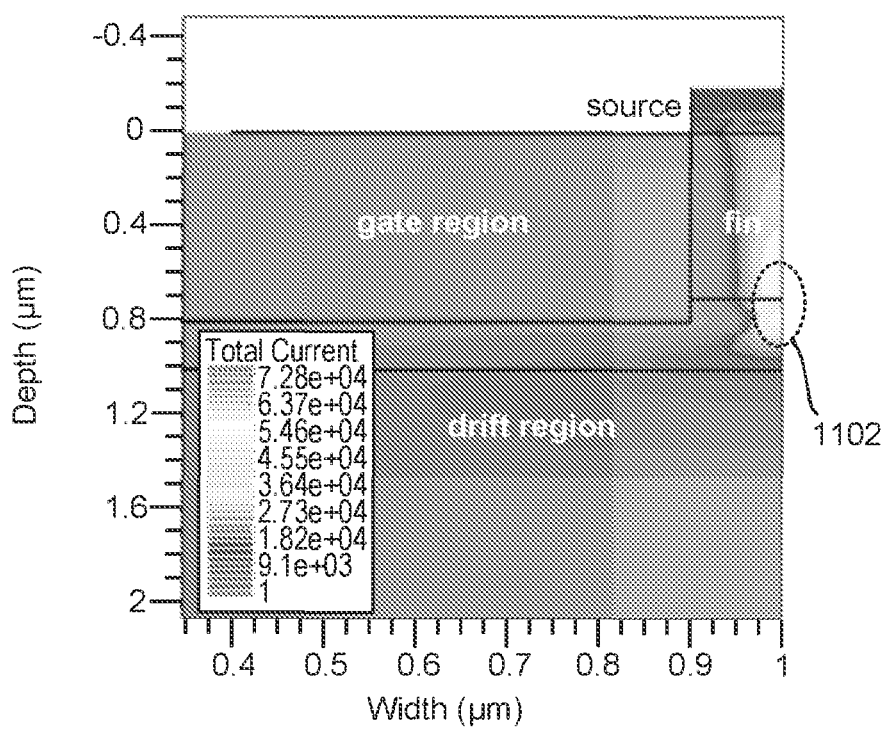
Figure 11E:
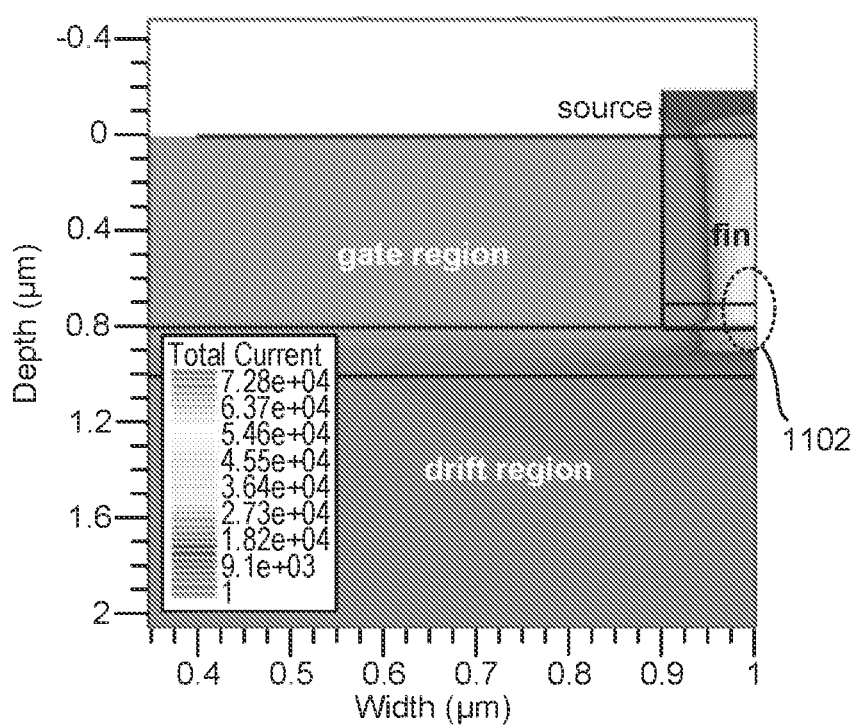

FIG. 11A is a 2D cross-sectional plot illustrating a total current density of a comparative vertical FET device without a marker layer. FIGS. 11B-11E are 2D cross-sectional plots illustrating the total current densities of vertical FET device 700 with marker layer 708 of AlGaN positioned at different locations. The total current density of the comparative vertical FET device and that of the vertical FET device 700 are measured at $I_D=2$ A. FIG. 11B shows the total current density of vertical FET device 700 with marker layer 708 positioned at "0.5" location; FIG. 11C shows the total current density of vertical FET device 700 with marker layer 708 positioned at "0.6" location; FIG. 11D shows the total current density of vertical FET device 700 with marker layer 708 positioned at "0.7" location; and FIG. 11E shows the total current density of vertical FET device 700 device with marker layer 708 positioned at "0.8" location. In FIGS. 11A-11E, the top left region denotes the gate region (e.g., gate layer 722 shown in FIG. 7A), the top right region denotes the fin (e.g., fin 712 shown in FIG. 7A), and the bottom region denotes the drift region (e.g., graded n-GaN layer 706 shown in FIG. 7A). The maximum total current densities in FIGS. 11A-11C and 11E appear at about the interface of the fin and drift region and are denoted by ellipse 1102. In FIG. 11D, the maximum total current density appears below the interface of the fin and the drift region. It can be seen that the on-state resistance of vertical FET device 700 with marker layer 708 is substantially increased compared with the comparative vertical FET device without the marker layer.

Using embodiments of the present invention, a series of device fabrication runs can be performed to fabricate a series of FET devices having a marker layer positioned at different depths. By analyzing the total current density characterizing the FET devices, an analysis can be performed to evaluate the impact of the marker layer to the performance of the FET devices. Based upon the evaluation, the depth of the marker layer can be adjusted to retain the benefits provided the marker layer and to control the quality of the FET devices at the same time.

Figure 12A:
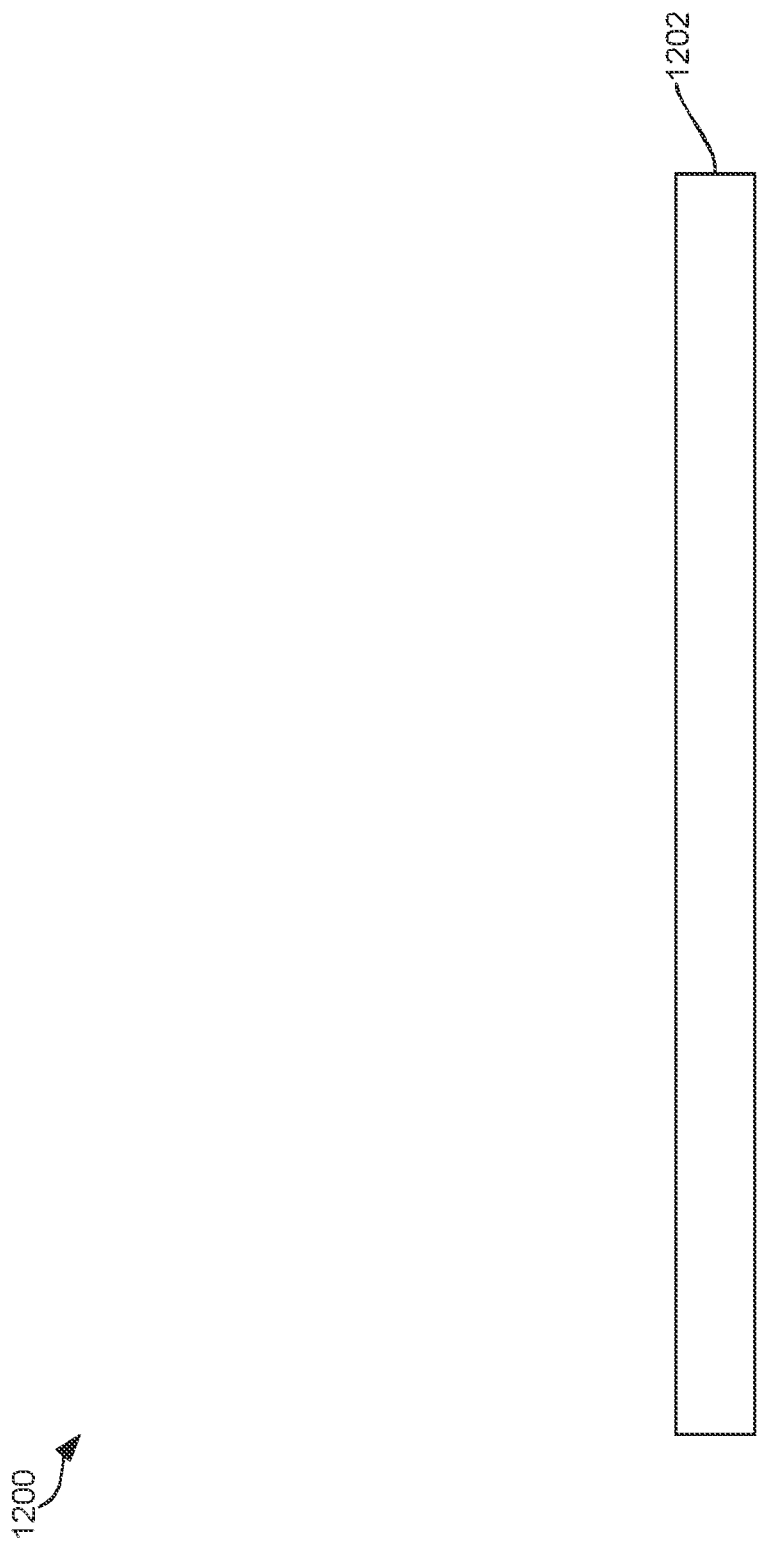
FIGS. 12A-12P are partial cross-sectional views illustrating the intermediate stages of a method of manufacturing a vertical FET device according to an embodiment of the present invention.
Figure 12B:
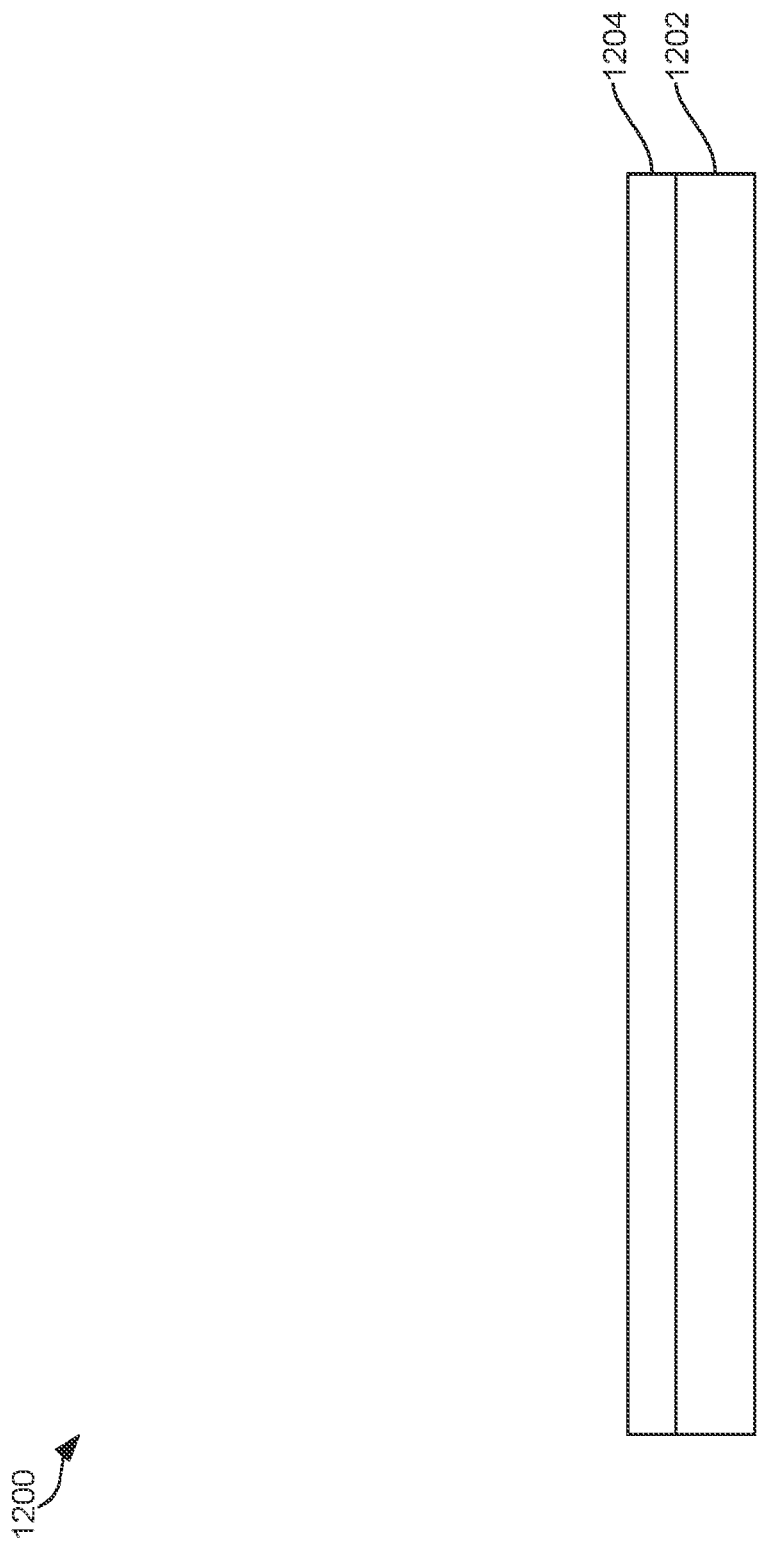
Figure 12C:
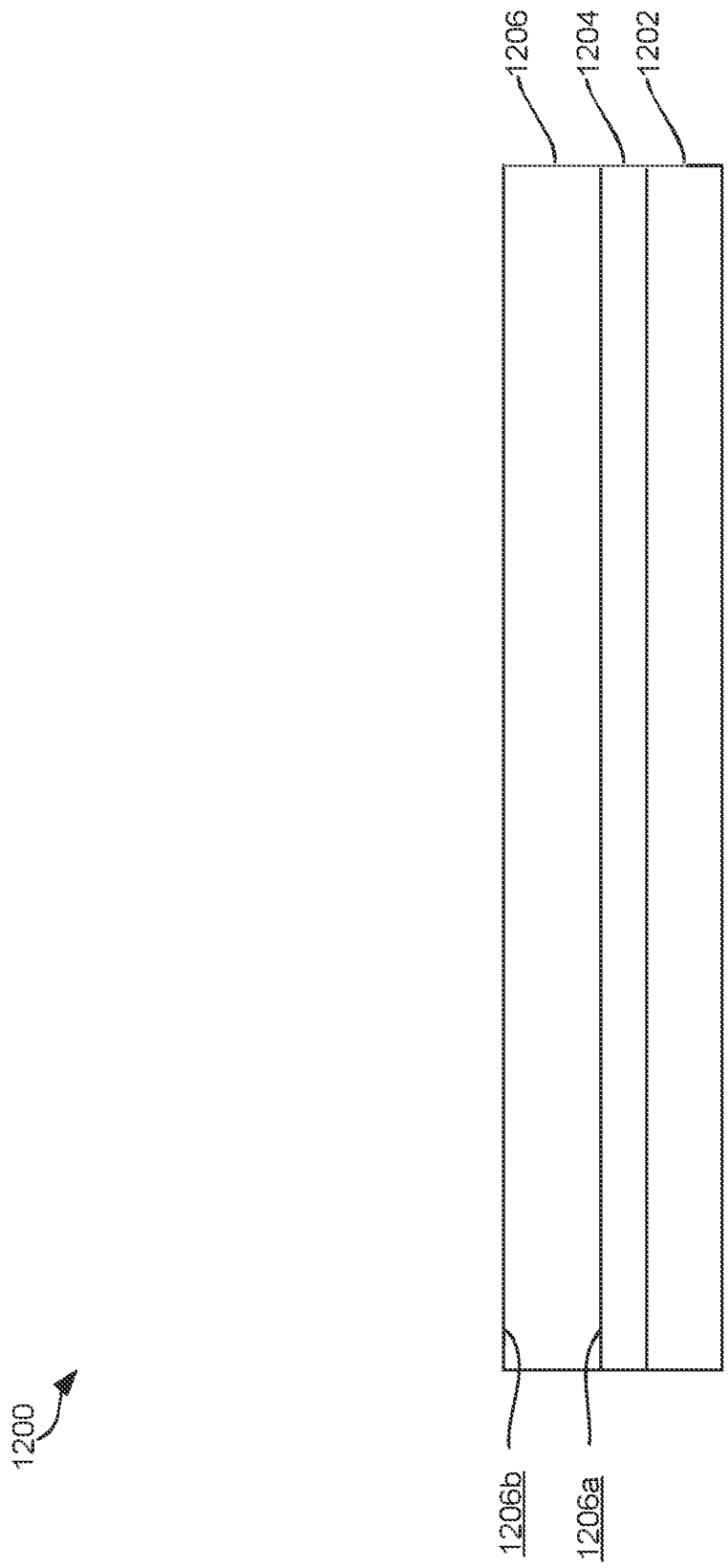
Figure 12D:
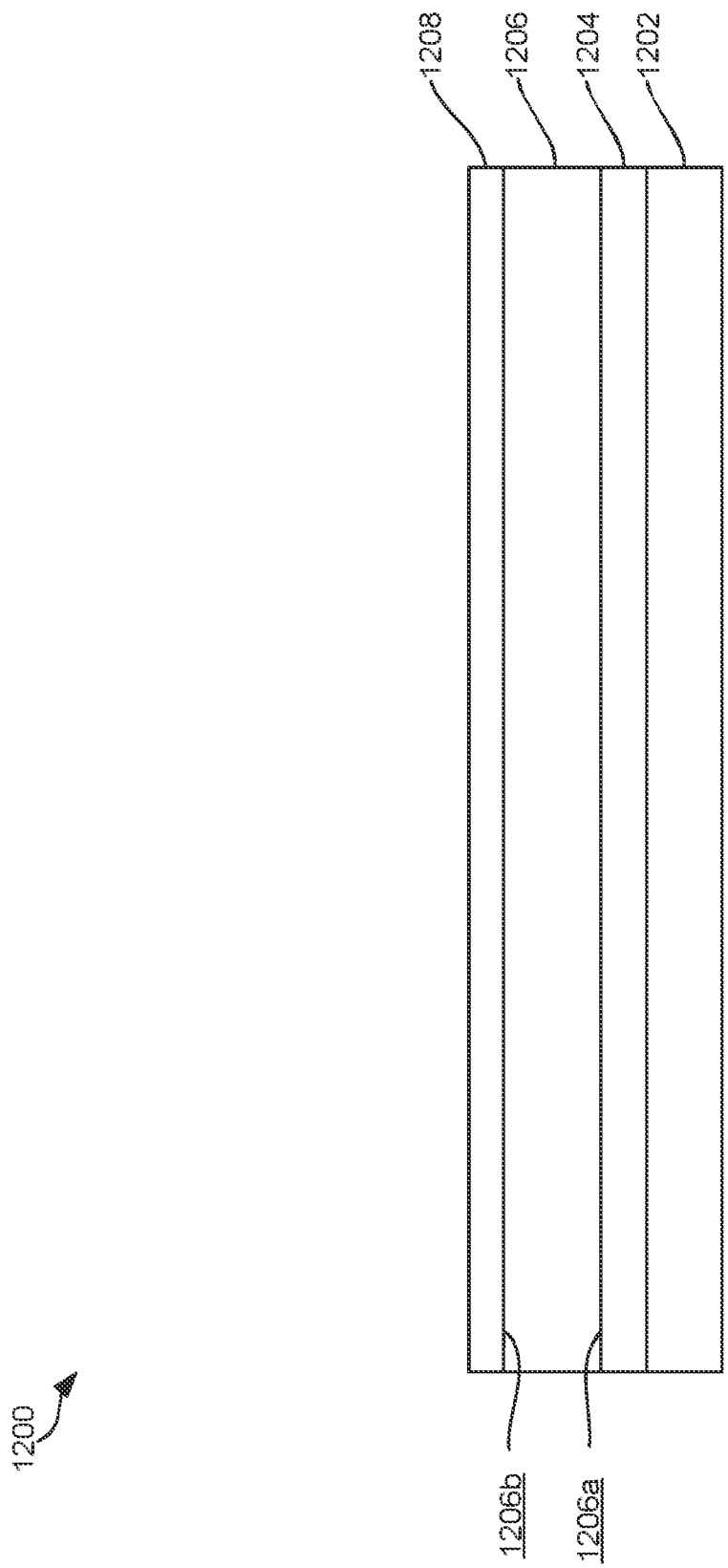
Figure 12E:
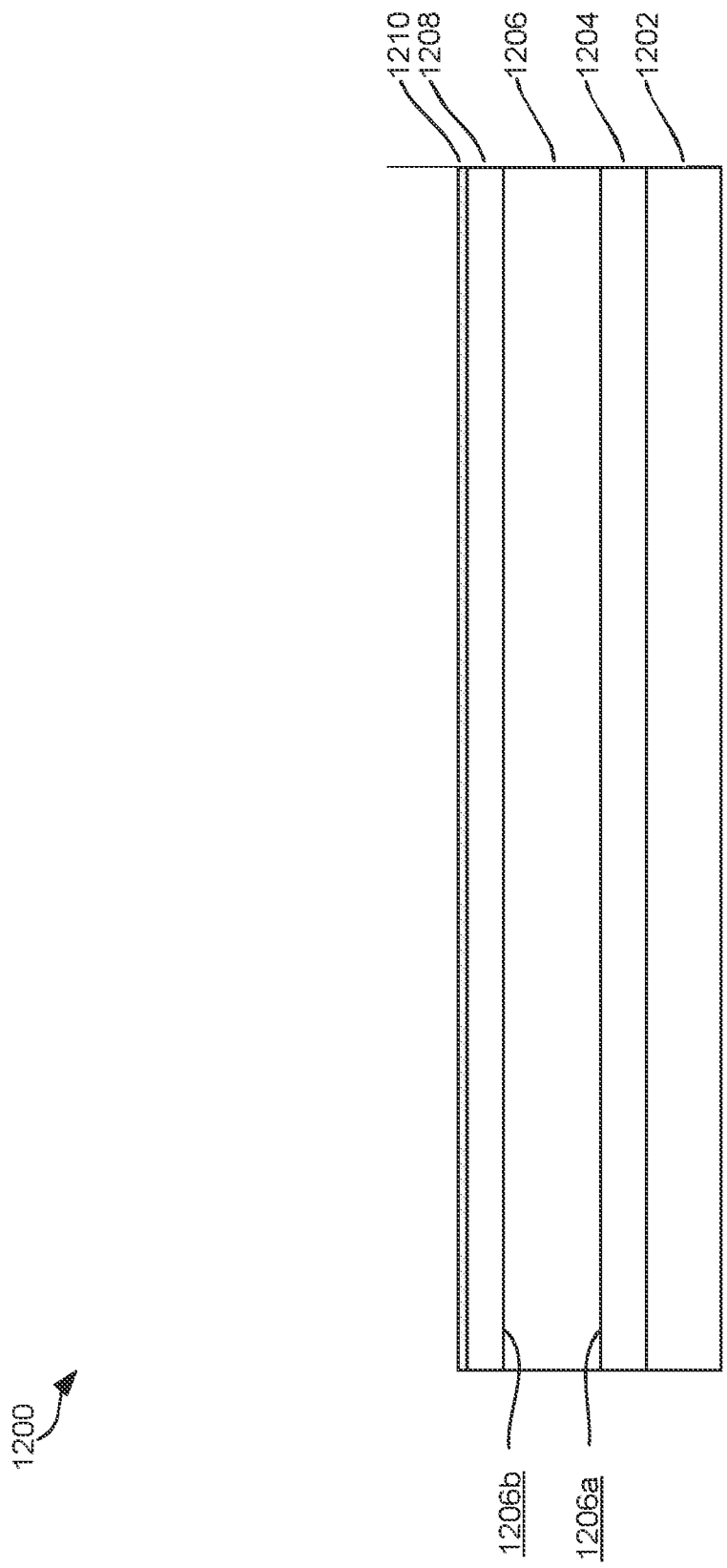
Figure 12F:
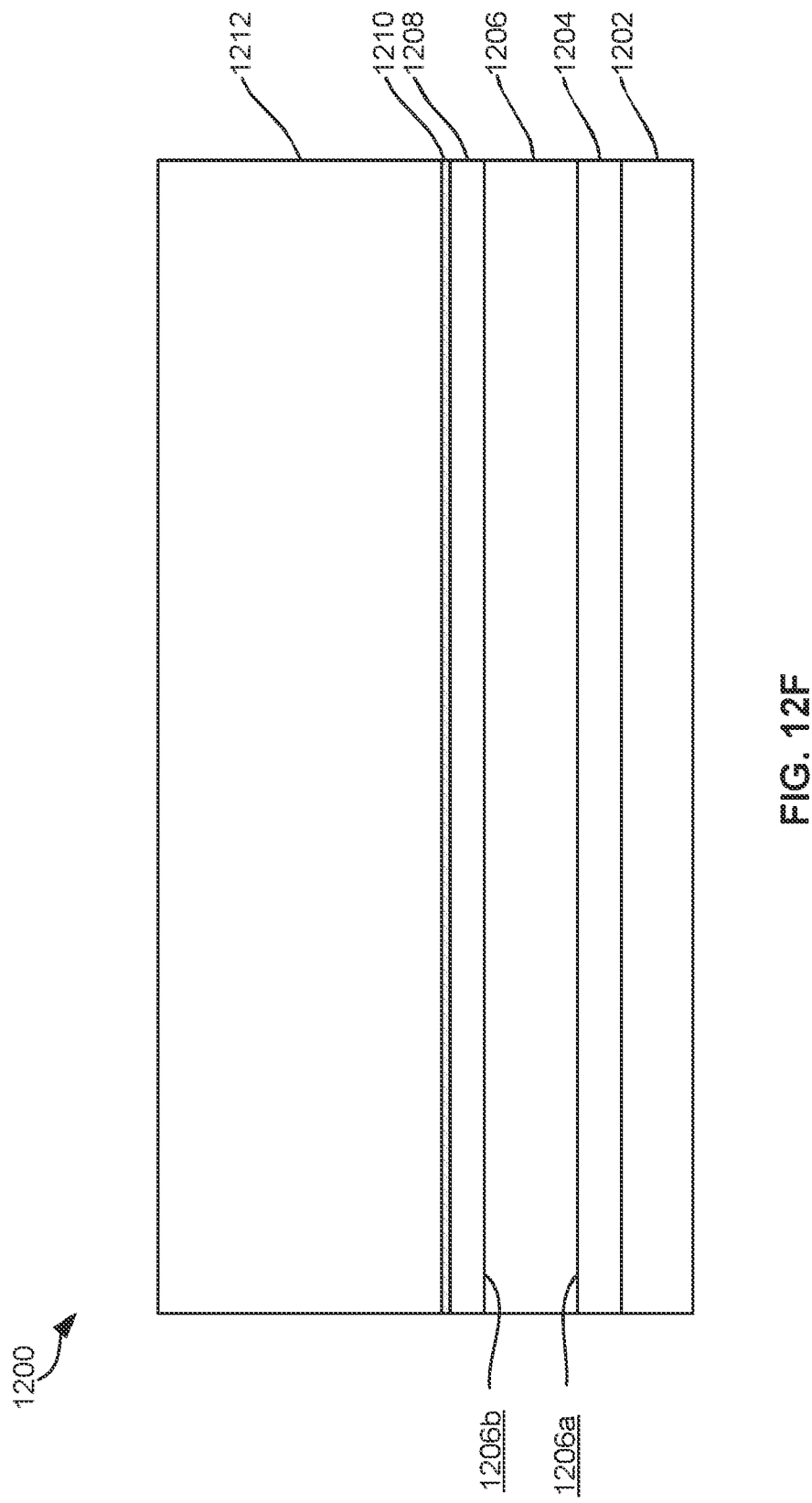
Figure 12G:
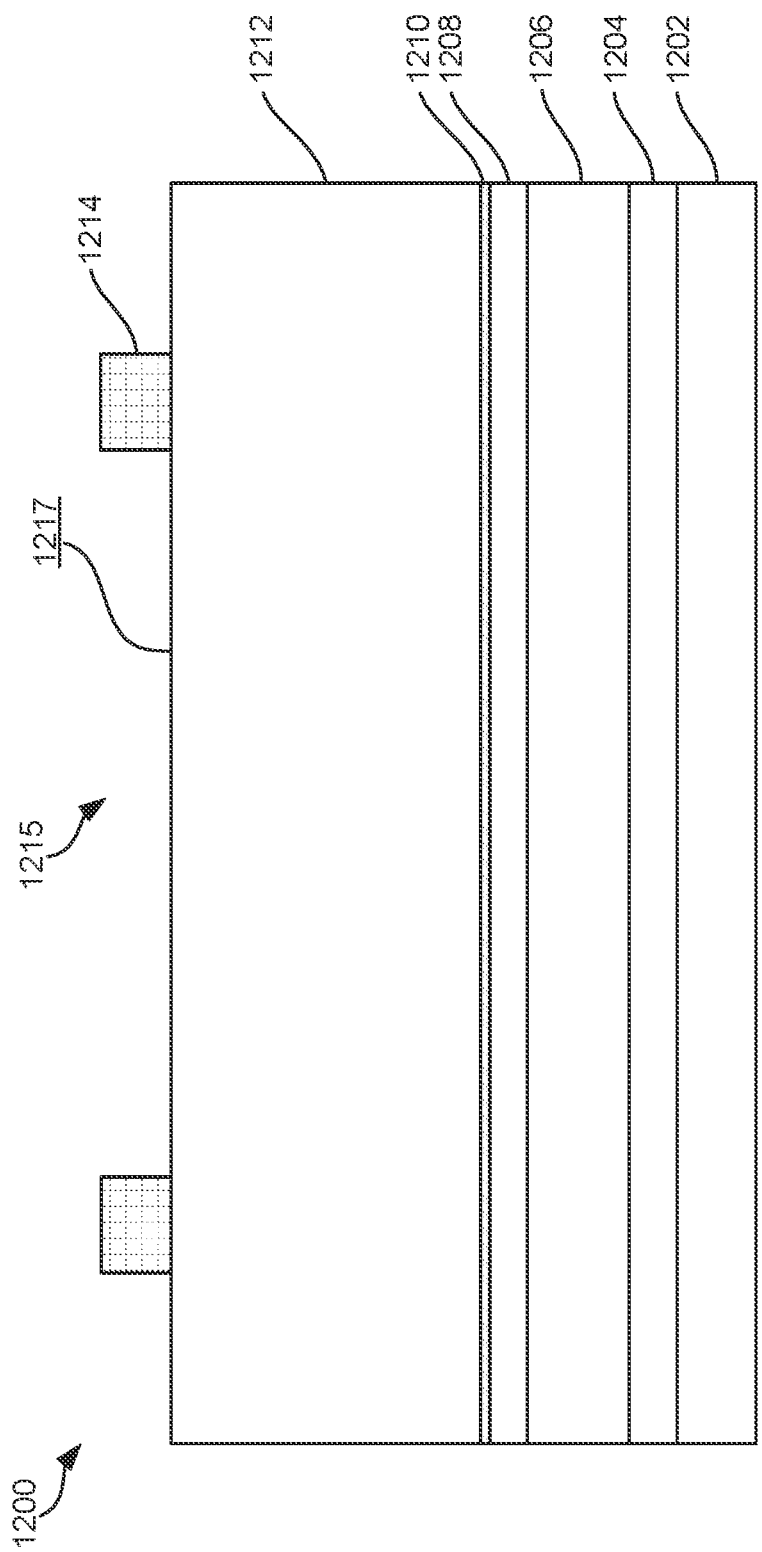
Figure 12H:
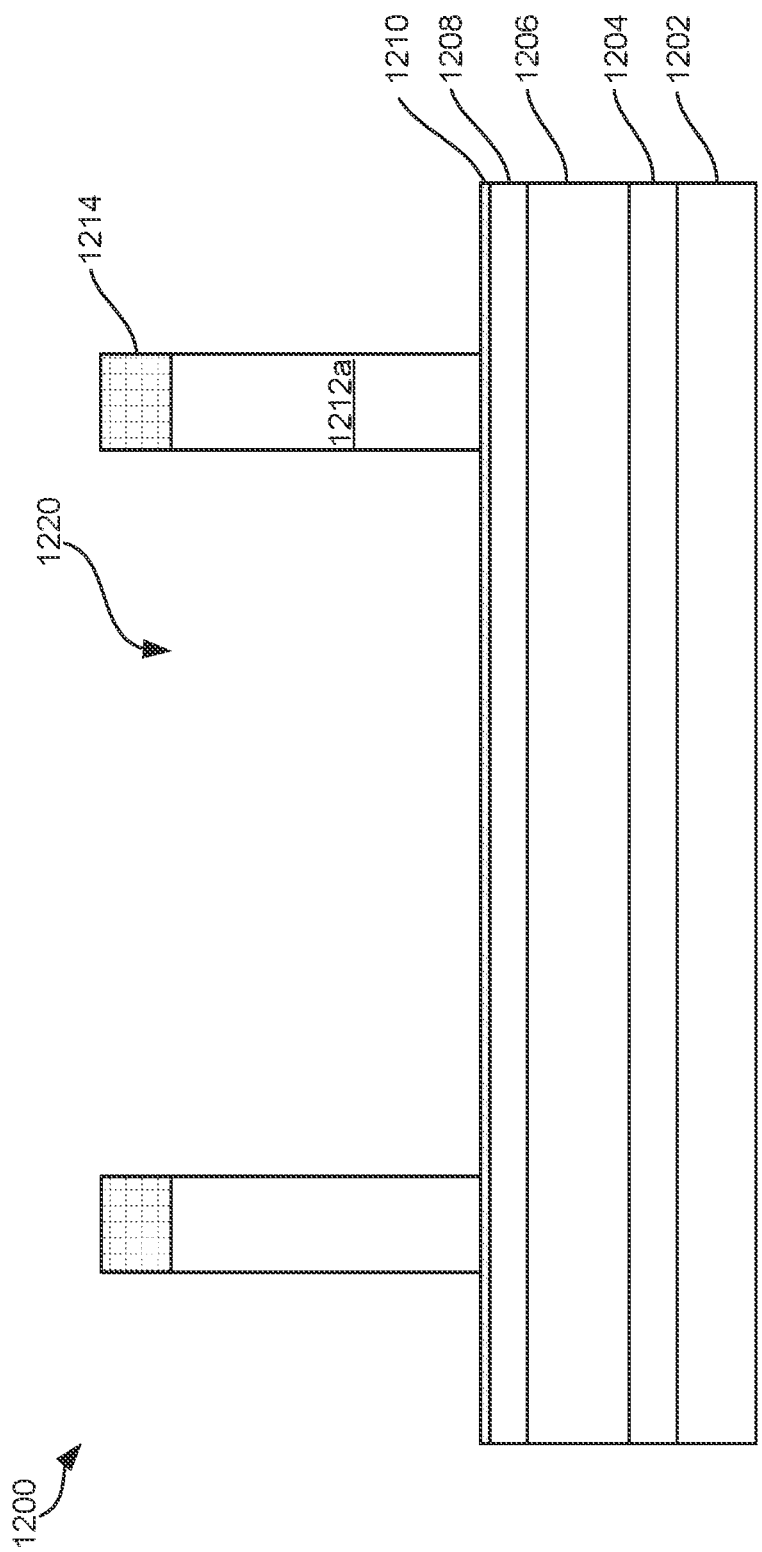
Figure 12I:
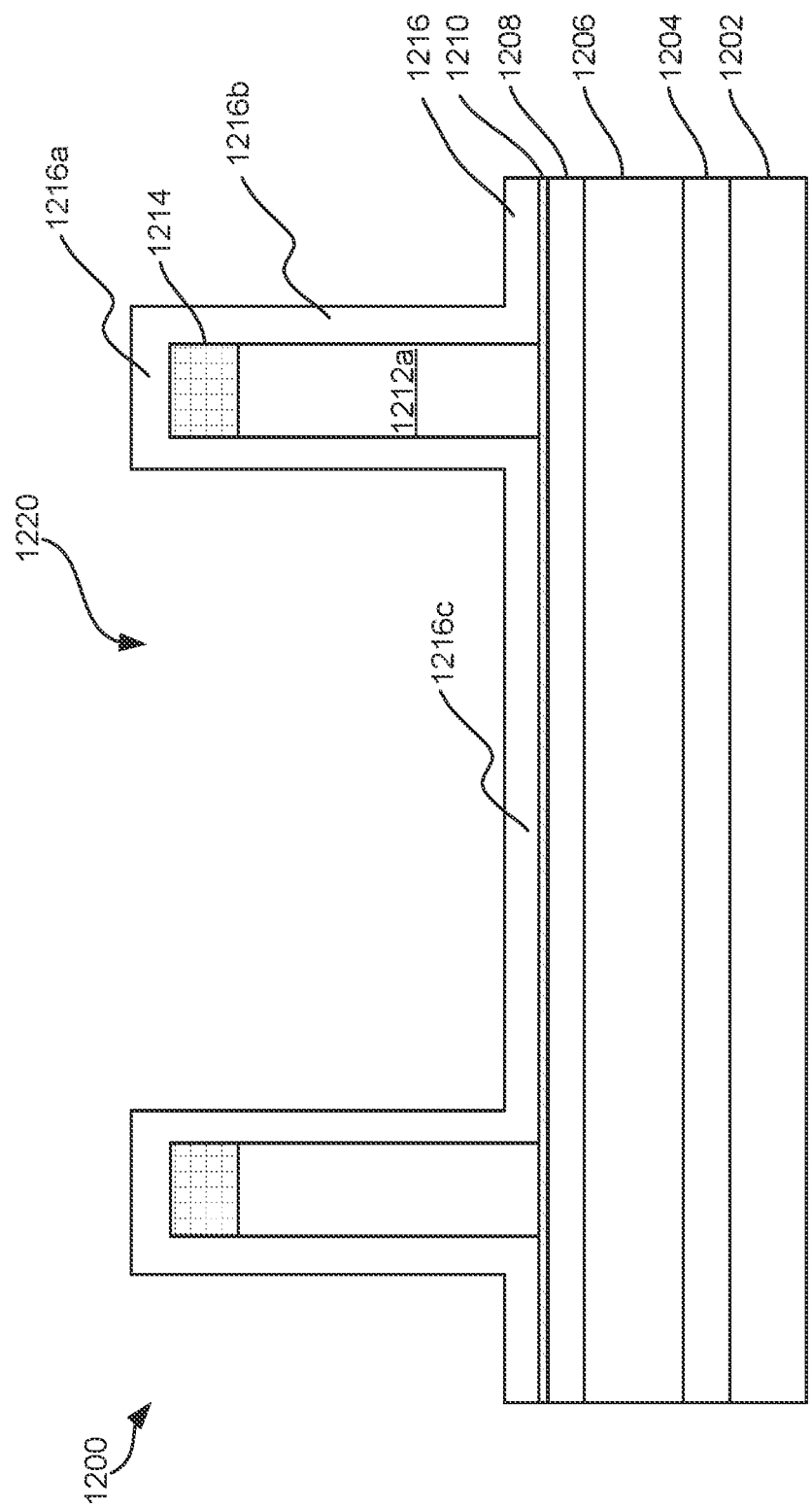
Figure 12J:
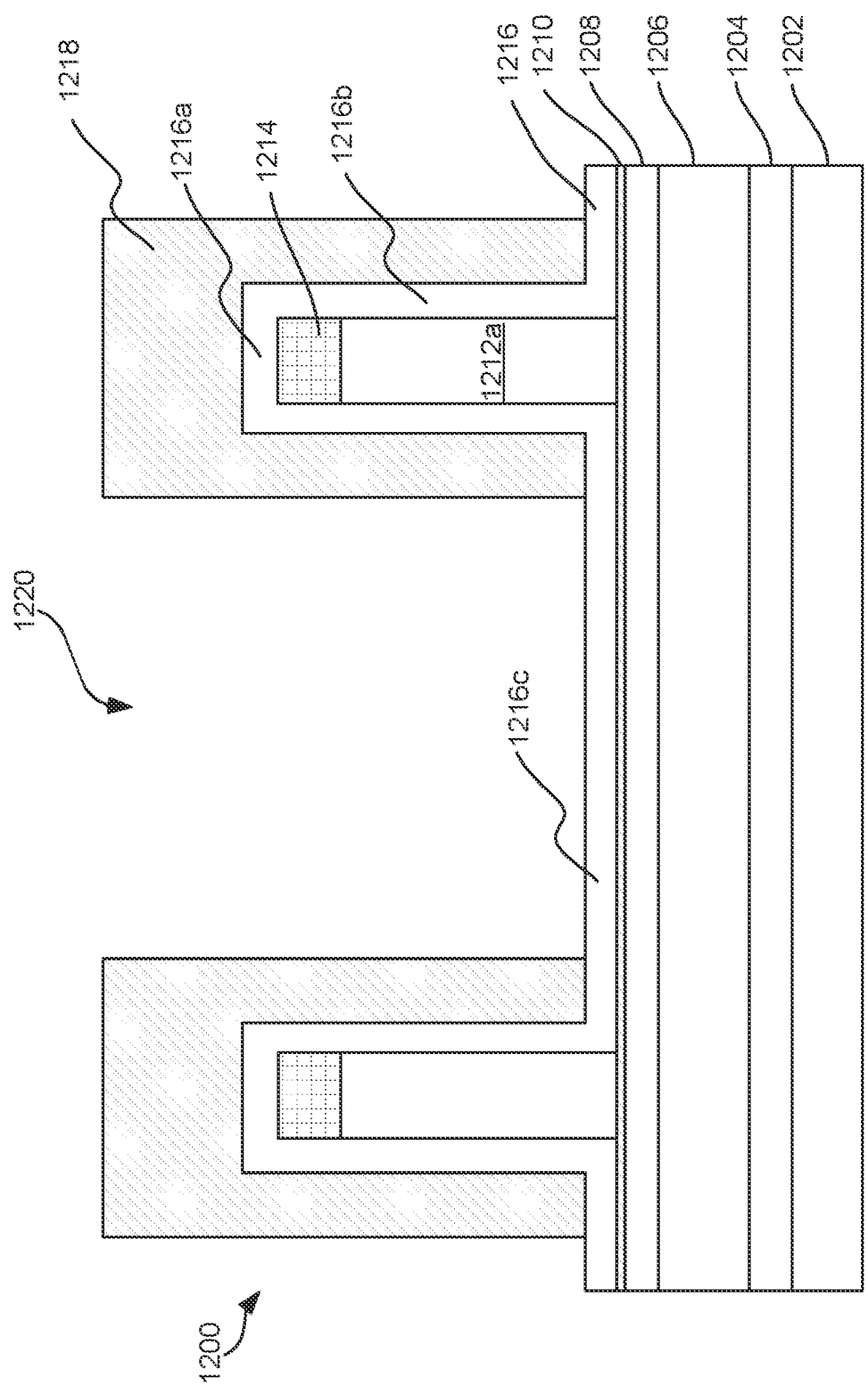
Figure 12K:
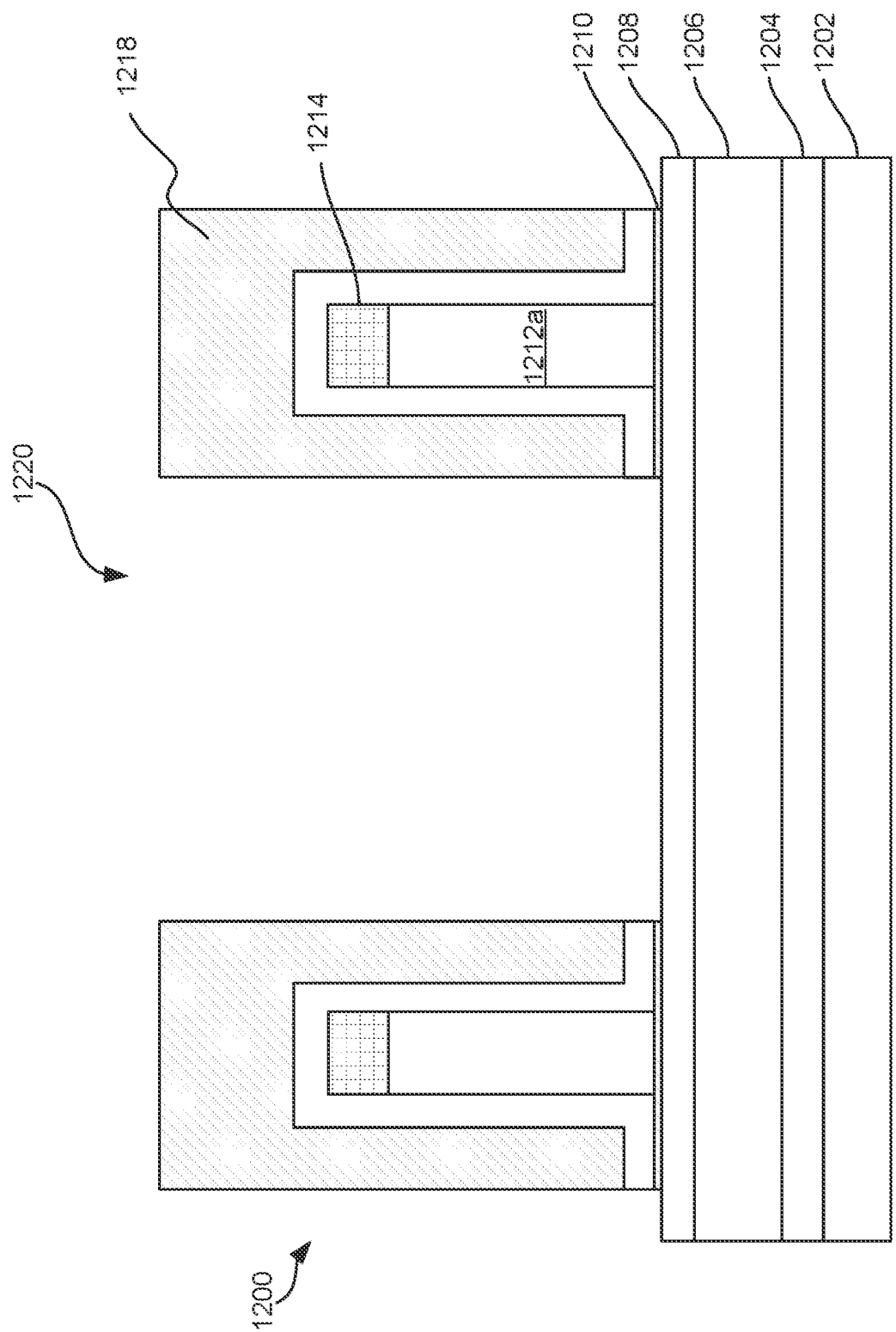
Figure 12L:
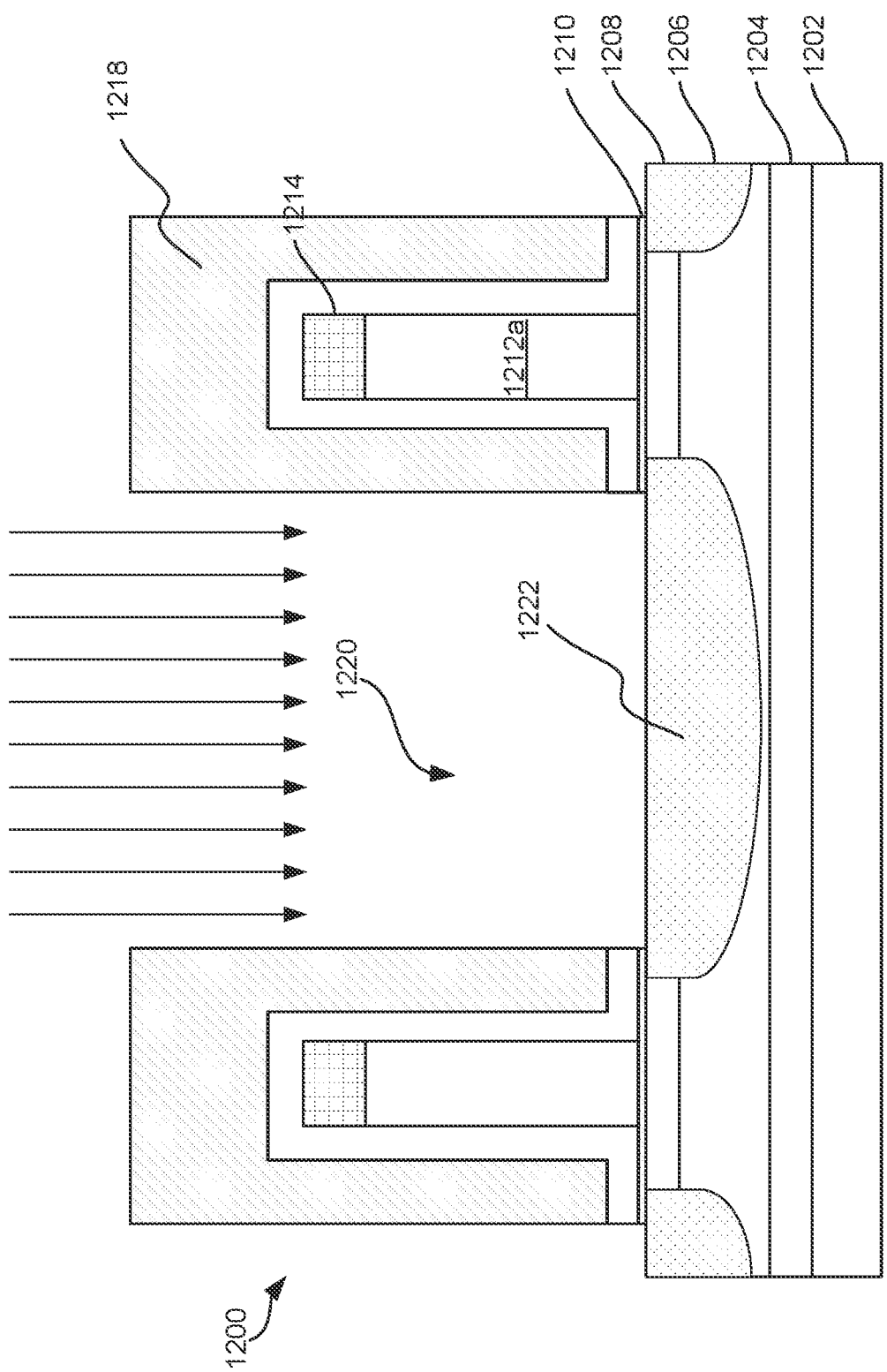
Figure 12M:
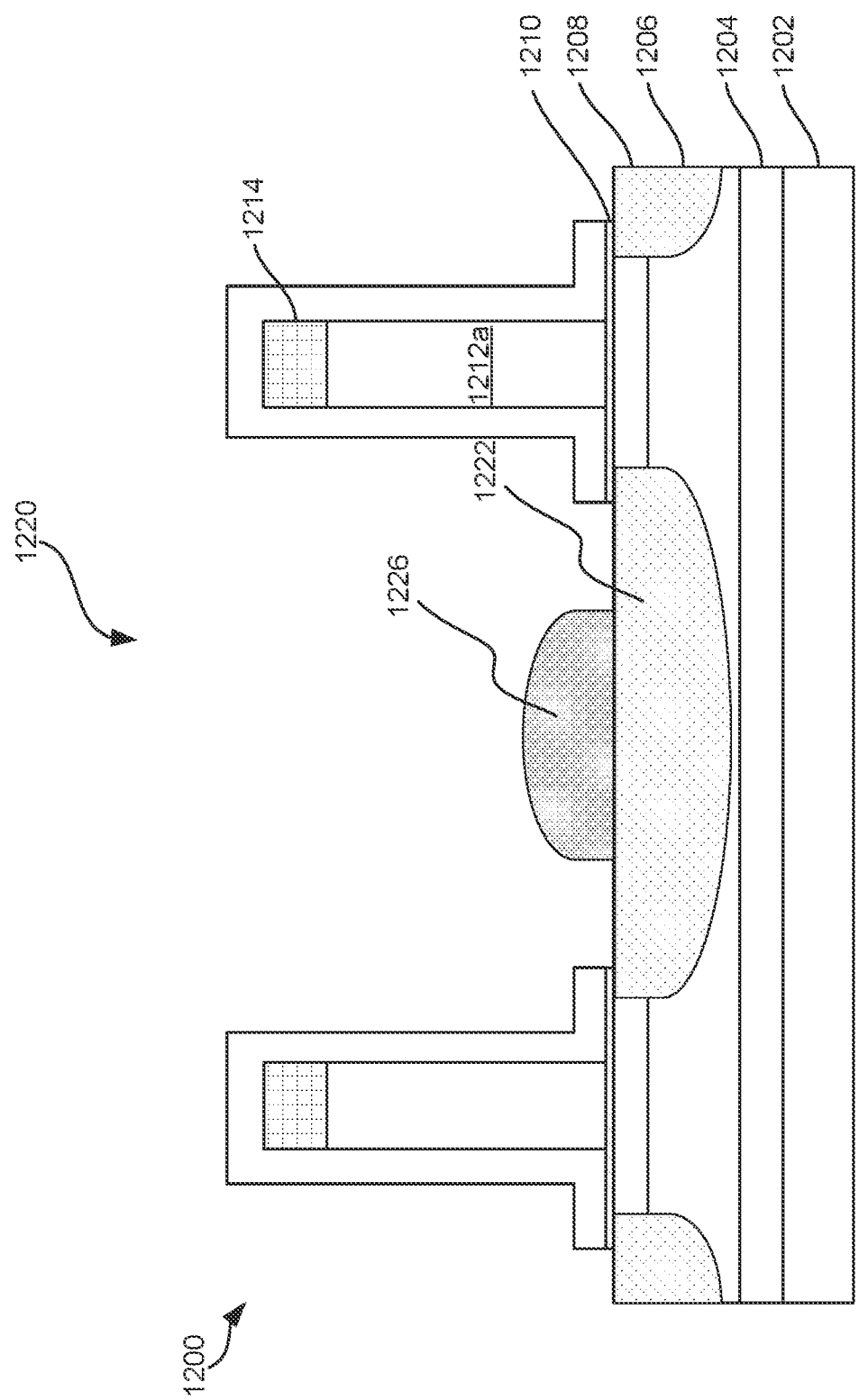
Figure 12N:
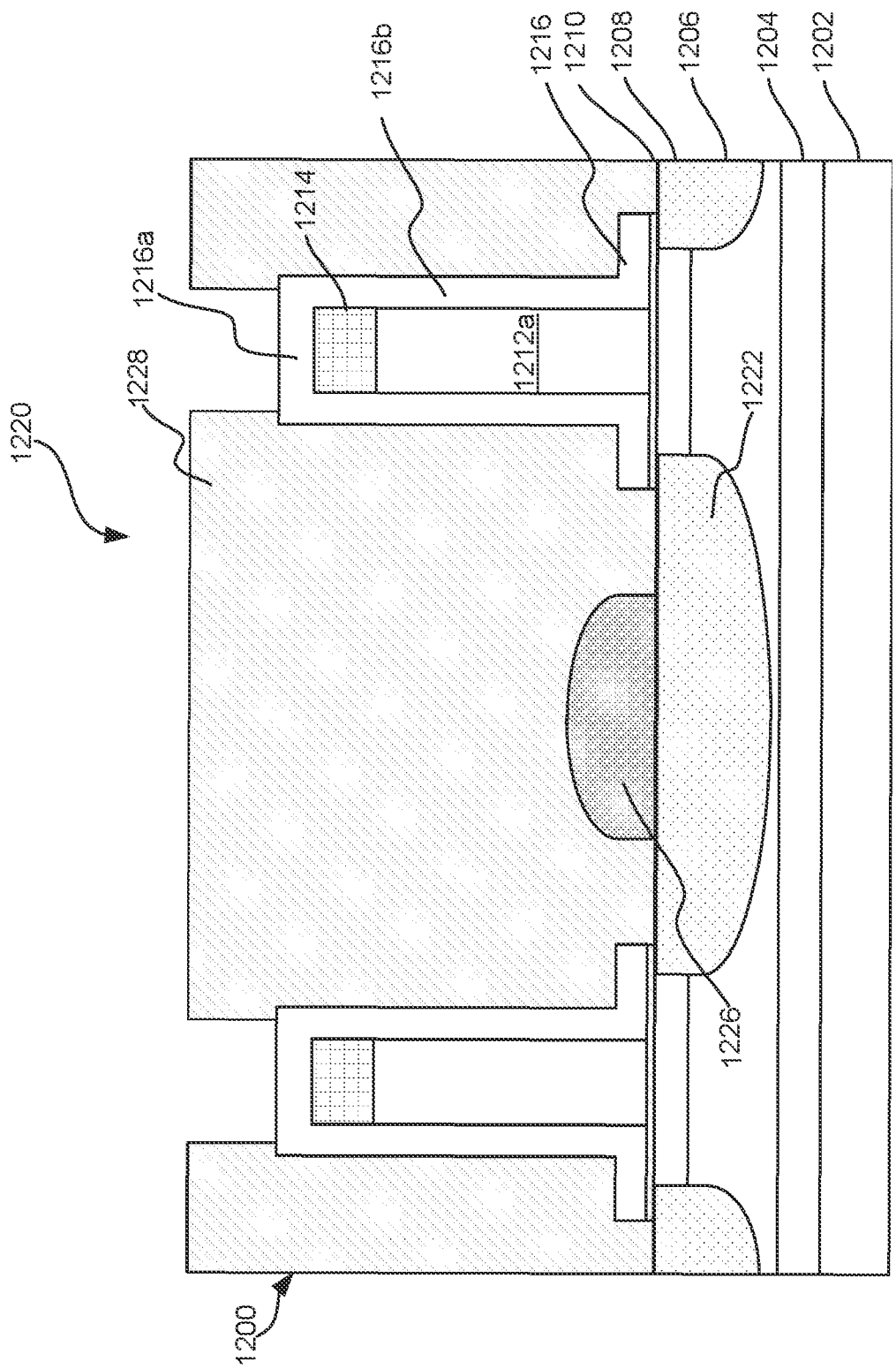
Figure 12O:
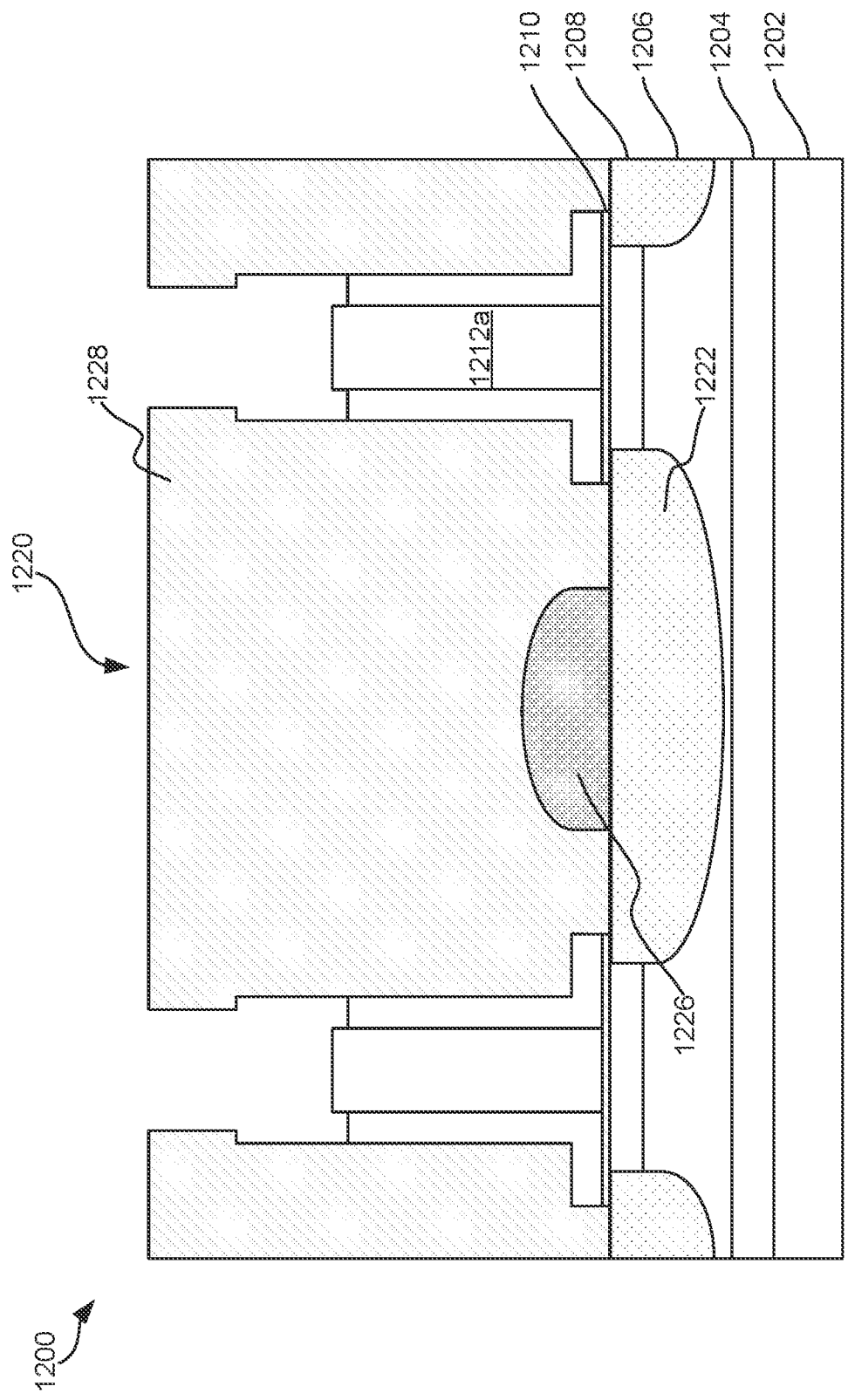
Figure 12P:
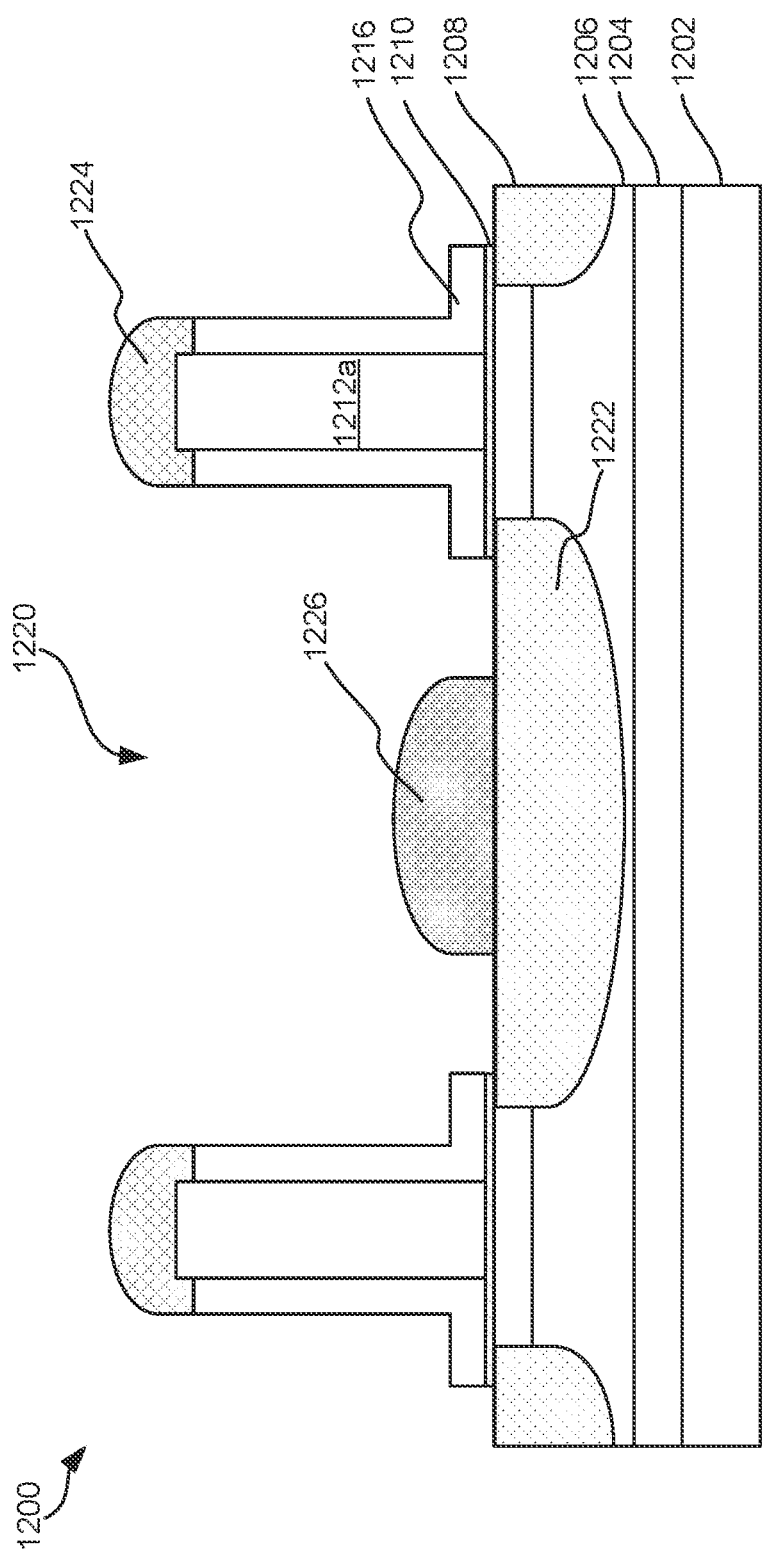

Referring to FIGS. 12A-12P, a method of manufacturing a vertical junction FET (JFET) device 1200 is described according to an embodiment of the present invention. FIG. 12A is a partial cross-sectional view illustrating a vertical JFET device 1200 having an n+ type doped semiconductor substrate 1202. In one embodiment, the semiconductor substrate may include III-nitride compounds, such as GaN. In one embodiment, the semiconductor substrate is n+ type doped GaN substrate, having a dopant concentration in a range of about $5\times10^{17}$ atoms/cm$^3$ to about $1\times10^{19}$ atoms/cm$^3$. In one embodiment, the substrate has a resistivity of less than 0.020 ohm-cm$^2$. Referring to FIG. 12B, an n-type doped first semiconductor layer 1204 is epitaxially grown on semiconductor substrate 1202. In one embodiment, first semiconductor layer 1204 is a GaN layer. Referring to FIG. 12C, an n-type doped second semiconductor layer 1206 is epitaxially grown on first semiconductor layer 1204. In one embodiment, second semiconductor layer 1206 is a GaN layer. In one embodiment, first semiconductor layer 1204 has a dopant concentration of $1\times10^{16}$ atoms/cm$^3$. In one embodiment, second semiconductor layer 1206 has a dopant concentration of $7.5\times10^{16}$ atoms/cm$^3$. In one embodiment, second semiconductor layer 1206 has a graded dopant concentration between a first side 1206a and a second side 1206b opposite first side 1206a. In one embodiment, the graded dopant concentration is linearly increased from a lower dopant concentration (e.g., $1\times10^{16}$ atoms/cm$^3$) at first side 1206a adjacent first semiconductor layer 1204 to a higher dopant concentration (e.g., $7.5\times10^{16}$ atoms/cm$^3$) at second side 1206b. In one embodiment, second semiconductor layer 1206 has a thickness of 0.3 µm.

Referring to FIG. 12D, a third semiconductor layer 1208 is epitaxially grown on second semiconductor layer 1206. Third semiconductor layer 1208 is characterized by the first conductivity type. In one embodiment, the dopant concentration of third semiconductor layer 1208 is greater than the dopant concentration of first semiconductor layer 1204. In one embodiment, third semiconductor layer 1208 includes n-type doped GaN with a dopant concentration of $1.3\times10^{17}$ atoms/cm$^3$.

Referring to FIG. 12E, a marker layer 1210 is coupled to (e.g., deposited on) third semiconductor layer 1208. In one embodiment, the marker layer 1210 may comprise a GaN layer incorporating a metallurgical concentration of silicon of $1\times10^{19}$ atoms/cm$^3$. In another embodiment, the marker layer 1210 may comprise an AlGaN layer incorporating a metallurgical concentration of aluminum of $1.3\times10^{17}$ atoms/cm$^3$. In another embodiment, the marker layer 1210 may comprise an InGaN layer incorporating a metallurgical concentration of indium of $1\times10^{17}$ to $1\times10^{19}$ atoms/cm$^3$. In one embodiment, the marker layer 1210 may have a thickness in a range of 1-10 nm, preferably 3-8 nm. In an exemplary embodiment, the marker layer 1210 has a thickness of 5 nm. In one embodiment, vertical JFET device 1200 may omit third semiconductor layer 1208. In such an embodiment, marker layer 1210 can be directly deposited on second semiconductor layer 1206.

Referring to FIG. 12F, a fourth semiconductor layer 1212 is epitaxially grown on marker layer 1210. In one embodiment, fourth semiconductor layer 1212 includes n-type doped GaN with a dopant concentration of $1.3\times10^{17}$ atoms/cm$^3$ and a thickness of about 0.3 µm-0.7 µm. In one embodiment, the dopant concentration of fourth semiconductor layer 1212 is greater than the dopant concentration of first semiconductor layer 1204. In another embodiment, the dopant concentration of fourth semiconductor layer 1212 is greater than the higher dopant concentration within the graded dopant concentration of second semiconductor layer 1206. In another embodiment, the dopant concentration of fourth semiconductor layer 1212 is equal to or greater than the dopant concentration of third semiconductor layer 1208.

Referring to FIG. 12G, a hardmask layer 1214 is formed on fourth semiconductor layer 1212. Hardmask layer 1214 comprises a set of openings 1215 operable to expose an upper surface portion 1217 of fourth semiconductor layer 1212. Referring to FIG. 12H, an etching process is performed using hardmask layer 1214 as a mask to form a plurality of fins 1212a within fourth semiconductor layer 1212. Each of the fins 1212a is separated by one of a plurality of recess regions 1220 formed by the etching process. As shown in FIG. 12H, the etching process is monitored to detect when the etching process reaches marker layer 1210. In one embodiment, the etching process is monitored to detect etching of at least a portion of marker layer 1210. In one embodiment, the detection process may be conducted by standard methods (e.g., end point detectors). In one embodiment using silicon layer as the marker layer, a spike of silicon dopant is readily detectable. In another embodiment using AlGaN layer as the marker layer, the Al dopant is readily detectable. In another embodiment using an In-doped layer, the In dopant is readily detectable.

For clarification of illustration, the etching process in the below examples may stop once it is detected that the etching process has reached marker layer 1210. One of ordinary skill in the art would understand that the present invention is not limited to such examples. The etching process may be finely controlled to achieve a predetermined etch depth in a target doping layer, as described above referring to FIG. 6D. For clarity of description and illustration, the below examples are described using a single recess region 1220 or a single fin 1212a. One of ordinary skill in the art would understand that the relevant description with respect to one recess region 1220 or one fin 1212a equally applies to all recess regions 1220 or fins 1212a unless it is otherwise expressly described.

In one embodiment, after forming the recess regions, a cleaning process is carried using a TMAH solution of about 25% by weight, at a temperature of about 85° C., and for a duration of about 30 minutes. In another embodiment, prior to performing a cleaning using the TMAH solution, a pre-cleaning, such as piranha clean using a $H_2SO_4:H_2O_2$ in a volume ratio 2:1 for two minutes, may also be performed.

Referring to FIG. 12I, a dielectric spacer layer 1216 is disposed on hardmask layer 1214 and the plurality of recess region 1220. In one embodiment, dielectric spacer layer 1216 is deposited in a manner to be a conformal coating on hardmask layer 1214 and the sidewalls of fins 1212a. For example, as shown in FIG. 12I, dielectric spacer layer 1216 may include a first portion 1216a on top of hardmask layer 1214, a second portion 1216b conformal to the side walls of plurality of fins 1212a, and a third portion 1216c coupled to the plurality of recess regions 1220. In some embodiments, dielectric spacer layer 1216 may include titanium oxide (TiOx). In some embodiments, dielectric spacer layer 1216 may be deposited using a thermal atomic layer deposition (ALD) process. In some embodiments, dielectric spacer layer 1216 may include silicon nitride, silicon-aluminum nitride, or silicon dioxide. In some embodiment, dielectric spacer layer 1216 may have a thickness in the range of about 3 nm-8 nm.

Referring to FIG. 12J, a first photoresist layer 1218 is formed on dielectric spacer layer 1216. In some embodiment, photoresist layer 1218 is disposed on first portion 1216a and second portion 1216b of dielectric spacer layer 1216. Third portion 1216c in recess region 1220 is exposed. In some embodiments, first photoresist layer 1218 protects the portion of dielectric spacer layer 1216 disposed on fins 1212a and hardmask layer 1214 from subsequent processing.

Referring to FIG. 12K, an etching process is performed in recess region 1220 using first photoresist layer 1218 as a mask to remove dielectric spacer layer 1216 within recess region 1220. Then the etching process continues to remove a portion of marker layer 1210 within recess region 1220 and stop in third semiconductor layer 1208. In some embodiments, the etching process is monitored to detect when the etching process reaches marker layer 1210, then subsequent etching process may be finely controlled to achieve a predetermined etch depth in third semiconductor layer 1208. For example, the subsequent etching may be timed to achieve an etch depth of 0.1 μm in third semiconductor layer 1208. In some embodiments, the subsequent etching process may be finely controlled to stop at the upper surface of third semiconductor layer 1208. In some embodiments, photoresist layer 1218 is omitted and the etching process removes the portions 1216a and 1216c of dielectric spacer layer 1216, leaving only portion 1216b on the sidewalls of fins 1212a.

Referring to FIG. 12L, an ion implantation process is performed in the plurality of recess regions 1220 to implant p-type dopants in second semiconductor layer 1206 within the plurality of recess regions 1220. In some embodiments, the ion implantation process also implants the p-type dopants in third semiconductor layer 1208. In some embodiments, the ion implantation is performed using multiple tilt angles such that p-type dopants are also implanted into the sidewalls of fins 1212a. In some embodiments, the ion implantation is performed prior to etching dielectric spacer layer 1216. In some embodiments, the ion implantation is annealed (e.g., by a rapid thermal annealing process) prior to etching the dielectric spacer layer 1216. After the ion implantation process, a gate region 1222 is formed in third semiconductor layer 1208 and second semiconductor layer 1206 within recess region 1220. In some embodiments, the gate region 1222 extends up the sidewalls of fins 1212a. In some embodiments, the p-type dopants may include boron, aluminum, indium, or the like. After forming gate region 1222, first photoresist layer 1218 is removed.

Referring to FIG. 12M, a gate metal layer 1226 is formed on gate regions 1222 within the plurality of recess regions 1220. In some embodiments, gate metal layer 1226 may include nickel, gold, molybdenum, platinum, palladium, silver, combinations thereof, and the like.

Referring to FIG. 12N, a second photoresist layer 1228 is formed on gate metal layer 1226 within the plurality of recess regions 1220. In one embodiment, second photoresist layer 1228 is formed to be conformal to the sidewalls of fins 1212a and to expose the upper portion of dielectric spacer layer 1216 on top of fins 1212a. In some embodiments, second photoresist layer 1228 can protect gate metal layer 1226 from subsequent processing.

Referring to FIG. 12O, an etching process is performed using second photoresist layer 1228 as a mask to remove dielectric spacer layer 1216, hardmask layer 1214, and stop on fourth semiconductor layer 1212. In some embodiments, the etching process removes first portion 1216a of dielectric spacer layer 1216 on top of fin 1212a, hardmask layer 1214, and a portion of second portion 1216b of dielectric spacer layer 1216. After the etching process, the upper portion of fin 1212a is exposed. After the etching process, second photoresist layer 1228 is removed.

Referring to FIG. 12P, a source metal layer 1224 is formed on fourth semiconductor layer 1212. Specifically, source metal layer 1224 is formed on the upper portion of fin 1212a. In some embodiments, source metal layer 1224 may include a refractory metal, a refractory metal compound, or a refractory metal alloy (e.g., TiN).

Figure 13:
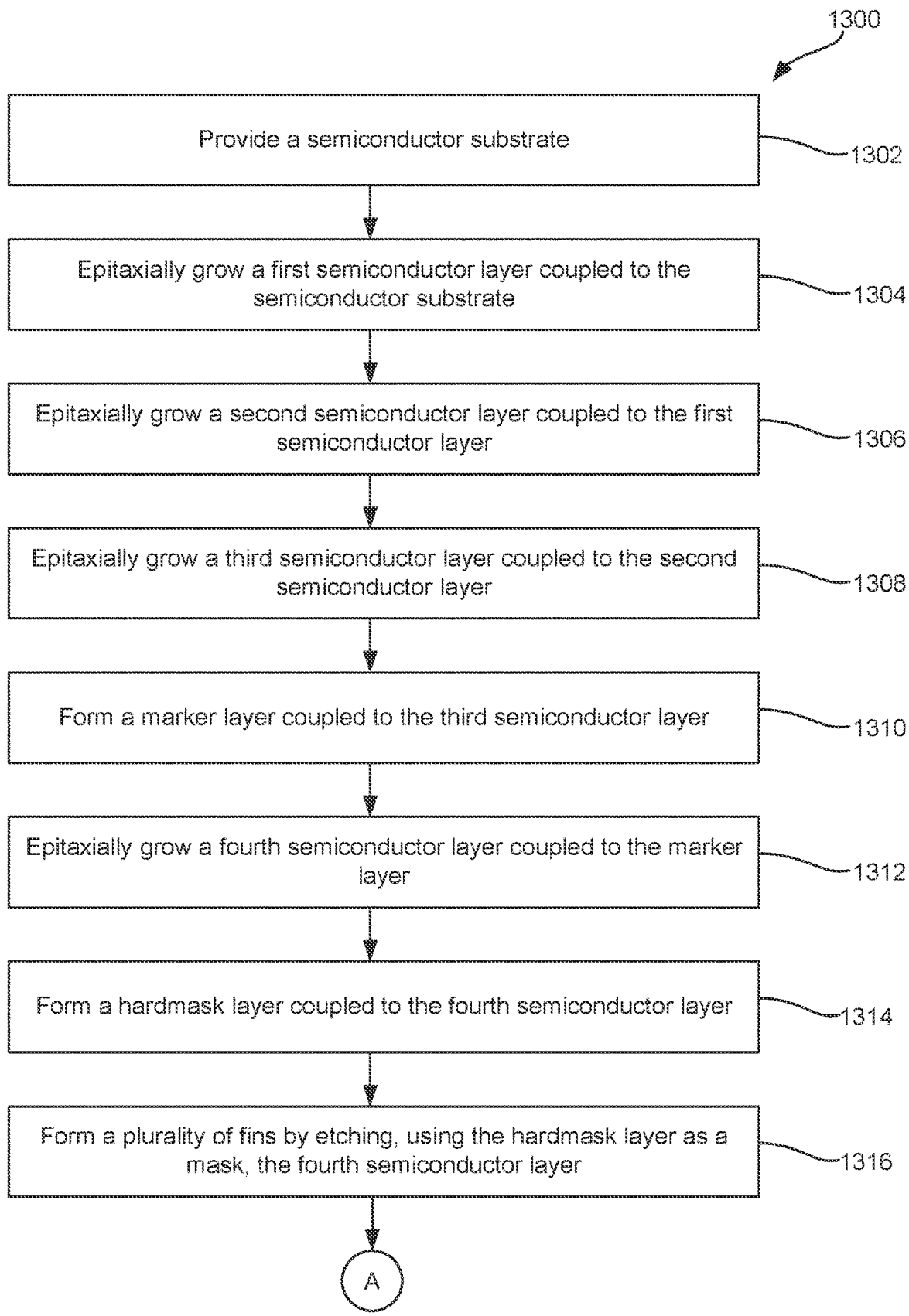
FIG. 13 is a simplified flowchart showing a method of manufacturing a vertical FET device according to an embodiment of the present invention.
Figure 13:
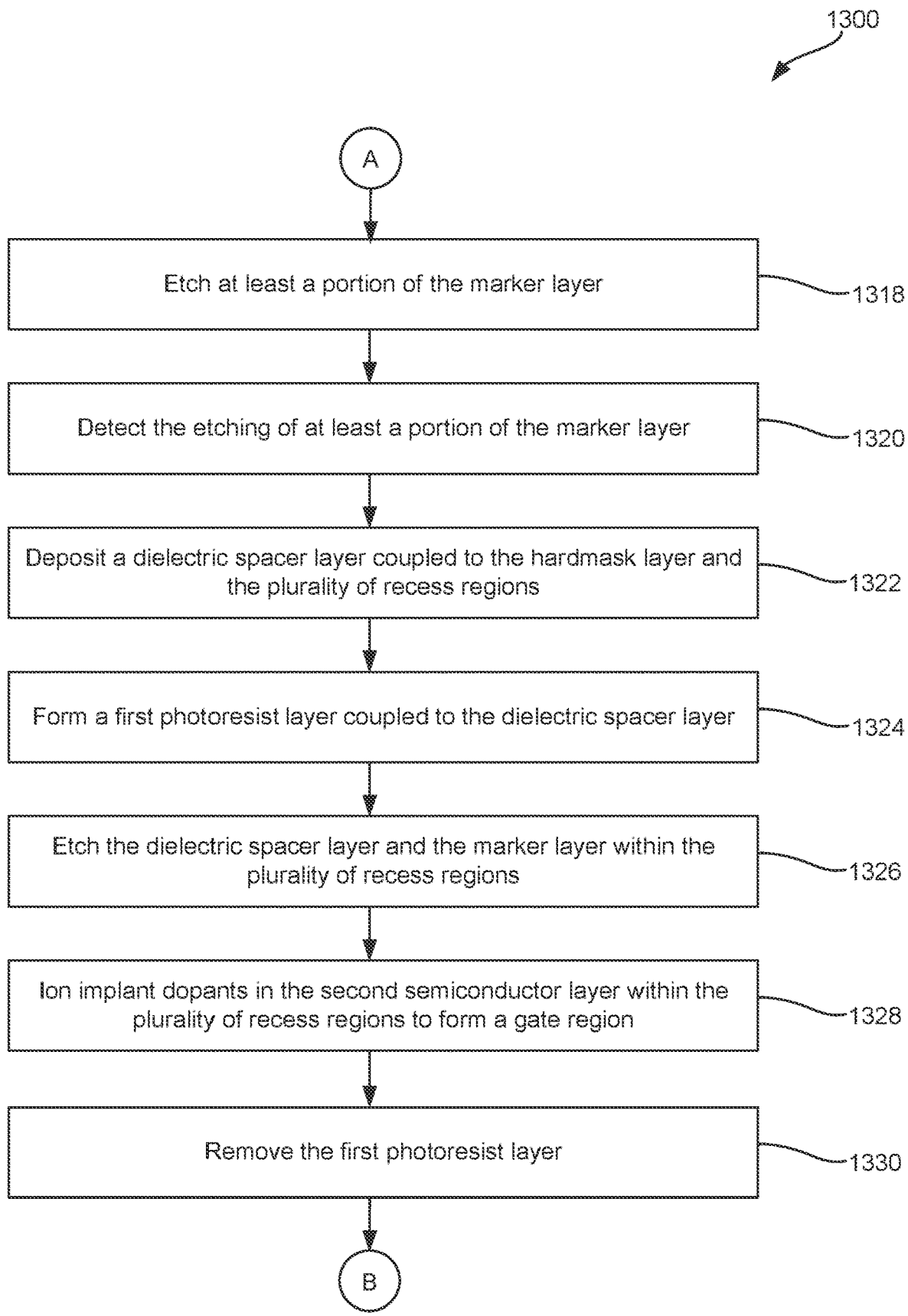
Figure 13:
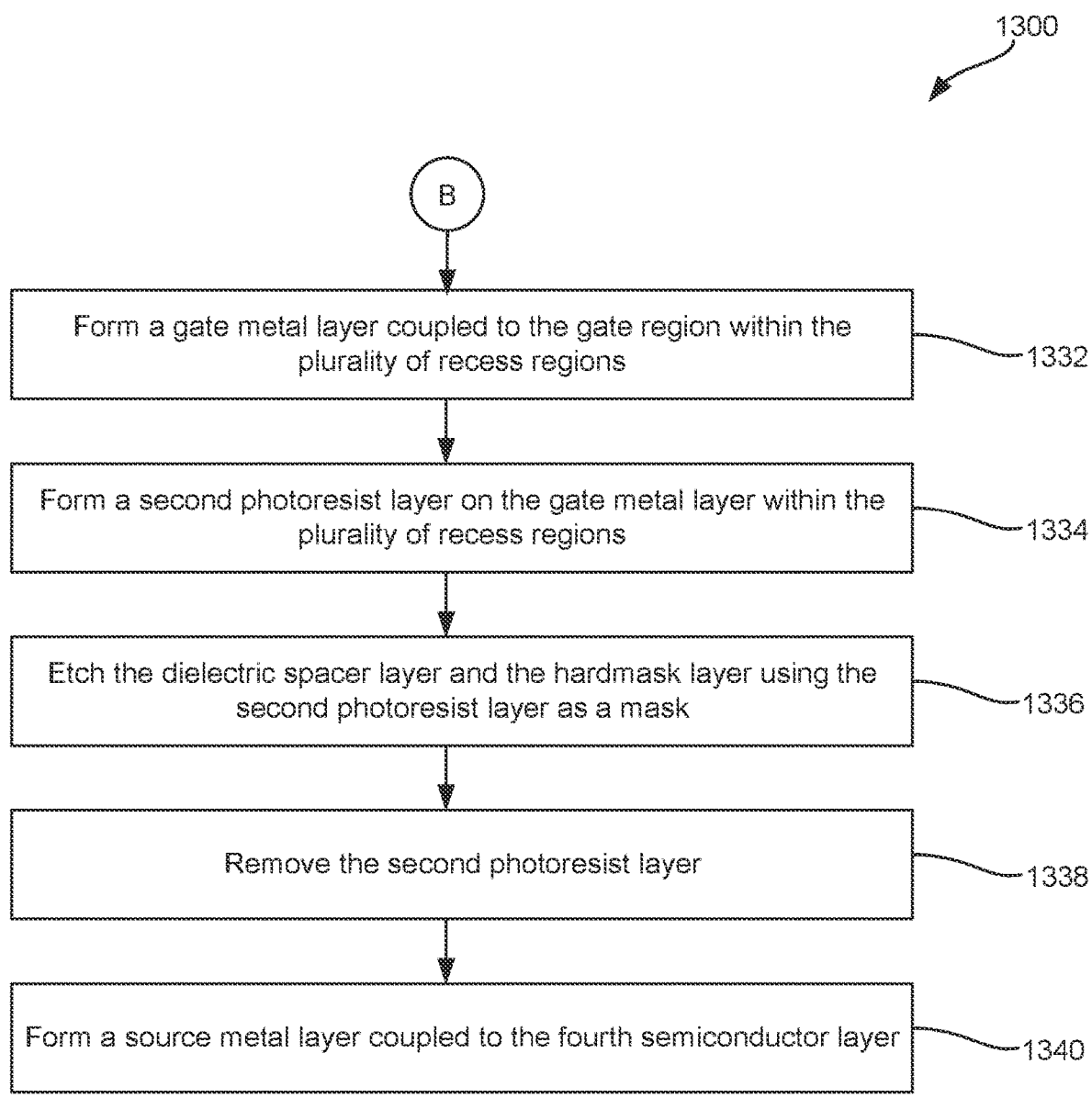

FIG. 13 is a simplified flowchart illustrating a method 1300 for manufacturing a vertical JFET device according to an embodiment of the present invention. Referring to FIG. 13, method 1300 may include providing a semiconductor substrate (1302). In one embodiment, the semiconductor substrate may include III-nitride compounds, such as GaN. In one embodiment, the semiconductor substrate is n+ type doped GaN substrate, having a dopant concentration in a range of about $5\times10^{17}$ atoms/cm$^3$ to about $1\times10^{19}$ atoms/cm$^3$ and a resistivity of less than 0.020 ohm-cm$^2$. A first semiconductor layer is epitaxially grown that is coupled to (e.g., grown on) the semiconductor substrate (1304). In one embodiment, the first semiconductor layer is characterized by a first conductivity type and a first dopant concentration.

In one embodiment, the first semiconductor layer may include n-type doped GaN with a dopant concentration of about $1 \times 10^{16}$ atoms/cm$^3$.

Method 1300 may further include epitaxially growing a second semiconductor layer coupled to the first semiconductor layer, wherein the second semiconductor layer is characterized by the first conductivity type (1306). In one embodiment, the second semiconductor layer is further characterized by a graded dopant concentration between a first side and a second side opposite the first side. In one embodiment, the second semiconductor layer includes n-type doped GaN, and the graded dopant concentration is linearly increased from a lower dopant concentration (e.g., $1 \times 10^{16}$ atoms/cm$^3$) at the first side adjacent the first semiconductor layer to a higher dopant concentration (e.g., $7.5 \times 10^{16}$ atoms/cm$^3$) at the second side. In one embodiment, the second semiconductor layer has a thickness of 0.3 µm.

Method 1300 may further include epitaxially growing a third semiconductor layer coupled to the second semiconductor layer, wherein the third semiconductor layer is characterized by the first conductivity type (1308). In one embodiment, the third semiconductor layer may include n-type doped GaN with a dopant concentration of $1.3 \times 10^{17}$ atoms/cm$^3$. In one embodiment, the dopant concentration of the third semiconductor layer is greater than the first dopant concentration of the first semiconductor layer. In another embodiment, the dopant concentration (e.g., $1.3 \times 10^{17}$ atoms/cm$^3$) of the third semiconductor layer is greater than the higher dopant concentration (e.g., $7.5 \times 10^{16}$ atoms/cm$^3$) within the graded dopant concentration of the second semiconductor layer. In some embodiments, the thickness of the third semiconductor layer is about 0.1 µm-0.3 µm.

Method 1300 may further include forming a marker layer coupled to the third semiconductor layer (1310). In one embodiment, the marker layer may comprise a GaN layer incorporating a metallurgical concentration of silicon of $1 \times 10^{19}$ atoms/cm$^3$. In another embodiment, the marker layer may comprise an AlGaN layer incorporating a metallurgical concentration of aluminum of $1.3 \times 10^{17}$ atoms/cm$^3$. In another embodiment, the marker layer may comprise an InGaN layer incorporating a metallurgical concentration of indium of $1 \times 10^{17}$ to $1 \times 10^{19}$ atoms/cm$^3$. In one embodiment, the marker layer may have a thickness in a range of 1-10 nm, preferably 3-8 nm. In an exemplary embodiment, the marker layer has a thickness of 5 nm.

Method 1300 may further include epitaxially growing a fourth semiconductor layer coupled to the marker layer, wherein the fourth semiconductor layer is characterized by the first conductivity type and a second dopant concentration (1312). In one embodiment, the second dopant concentration of the fourth semiconductor layer is greater than the first dopant concentration of the first semiconductor layer. In one embodiment, the fourth semiconductor layer may include n-type doped GaN with a dopant concentration of $1.3 \times 10^{17}$ atoms/cm$^3$ and a thickness of about 0.3 µm-0.7 µm. In one embodiment, the second dopant concentration (e.g., $1.3 \times 10^{17}$ atoms/cm$^3$) of the fourth semiconductor layer is greater than the higher dopant concentration (e.g., $7.5 \times 10^{16}$ atoms/cm$^3$) within the graded dopant concentration of the second semiconductor layer.

Method 1300 may further include forming a hardmask layer coupled to the fourth semiconductor layer, wherein the hardmask layer comprises a set of openings operable to expose an upper surface portion of the fourth semiconductor layer (1314).

Method 1300 may further include forming a plurality of fins by etching, using the hardmask layer as a mask, the fourth semiconductor layers, wherein each of the plurality of fins is separated by one of a plurality of recess regions (1316). In one embodiment, each of the plurality of fins may have a thickness of about 0.8 µm.

Method 1300 may further include etching at least a portion of the marker layer (1318) and detecting the etching of the at least a portion of the marker layer (1320). In one embodiment, the detection process may be conducted by standard methods (e.g., end point detectors). In one embodiment using silicon layer as the marker layer, a spike of silicon dopant is readily detectable. In another embodiment using AlGaN layer as the marker layer, the Al dopant is readily detectable. In one embodiment, method 1300 may stop etching when it is detected that the etching process has reached the marker layer. In another embodiment, method 1300 may further include etching through the marker layer, then continuing to etch the third semiconductor layer and second semiconductor layer using the hardmask layer as a mask for a predetermined time period.

Method 1300 may further include depositing a dielectric spacer layer coupled to the hardmask layer and the plurality of recess regions (1322). In one embodiment, the dielectric spacer layer is formed to be conformal to the sidewalls of the plurality of fins and the upper surface of the hardmask layer.

Method 1300 may further include forming a first photoresist layer coupled to the dielectric spacer layer (1324). In one embodiment, the first photoresist layer is patterned to cover a portion of the dielectric spacer layer on top of the plurality of fins and to leave the plurality of recess regions exposed. In some embodiments, the photoresist layer is omitted.

Method 1300 may further include etching the dielectric spacer layer and the marker layer within the plurality of recess regions (1326). In some embodiments, the etching process stops in the third semiconductor layer. In some embodiments, the etching process is monitored to detect when the etching process reaches the marker layer, then subsequent etching process may be finely controlled to achieve a predetermined etch depth in the third semiconductor layer. In some embodiments, the subsequent etching process may be finely controlled to stop at the upper surface of third semiconductor layer.

Method 1300 may further include ion implanting dopants in the second semiconductor layer within the plurality of recess regions to form a gate region (1328). In some embodiments, the dopants may be characterized by the second conductivity type opposite the first conductivity type. In one embodiment, the dopants may include the p-type dopants. After the ion implanting process, the gate region is formed in the third semiconductor layer. In another embodiment, the dopants may be implanted in the both the third semiconductor layer and the second semiconductor layer. In another embodiment, the implantation process is performed in such a manner (e.g., by implanting at an angle) so that the dopants are implanted into the sidewalls of the plurality of fins. Hence, the gate region may be formed in both the third semiconductor layer and the second semiconductor layer. In some embodiments, the gate region is also formed in the fourth semiconductor layer. Then, method 1300 may further include removing the first photoresist layer (1330).

Method 1300 may further include forming a gate metal layer coupled to the gate region within the plurality of recess regions (1332). In some embodiments, the gate metal layer may include nickel, gold, molybdenum, platinum, palladium, silver, combinations thereof, and the like.

Method 1300 may further include forming a second photoresist layer on the gate metal layer within the plurality of recess regions (1334). In some embodiments, the second photoresist layer is formed to be conformal to the sidewalls of the plurality of fins and to expose the upper portion of the dielectric spacer layer on top of the plurality of fins.

Method 1300 may further include etching the dielectric spacer layer and the hardmask layer using the second photoresist layer as a mask (1336). In some embodiments, the etching process stops on the fourth semiconductor layer, exposing the upper portion of the plurality of fins. After the etching process, the second photoresist layer is removed (1338).

Method 1300 may further include forming a source metal layer coupled to the fourth semiconductor layer (1340). In some embodiments, the source metal layer is coupled to the upper portion of the plurality of fins. In some embodiments, the source metal layer may include a refractory metal, a refractory metal compound, or a refractory metal alloy (e.g., TiN).

It should be understood that the specific steps illustrated in FIG. 13 provide a particular method of manufacturing a vertical JFET device according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual steps. Furthermore, additional steps may be added or removed depending on a particular application. One of ordinary skill in the art would recognize many variations, modifications, and alternatives.

Figure 14A:
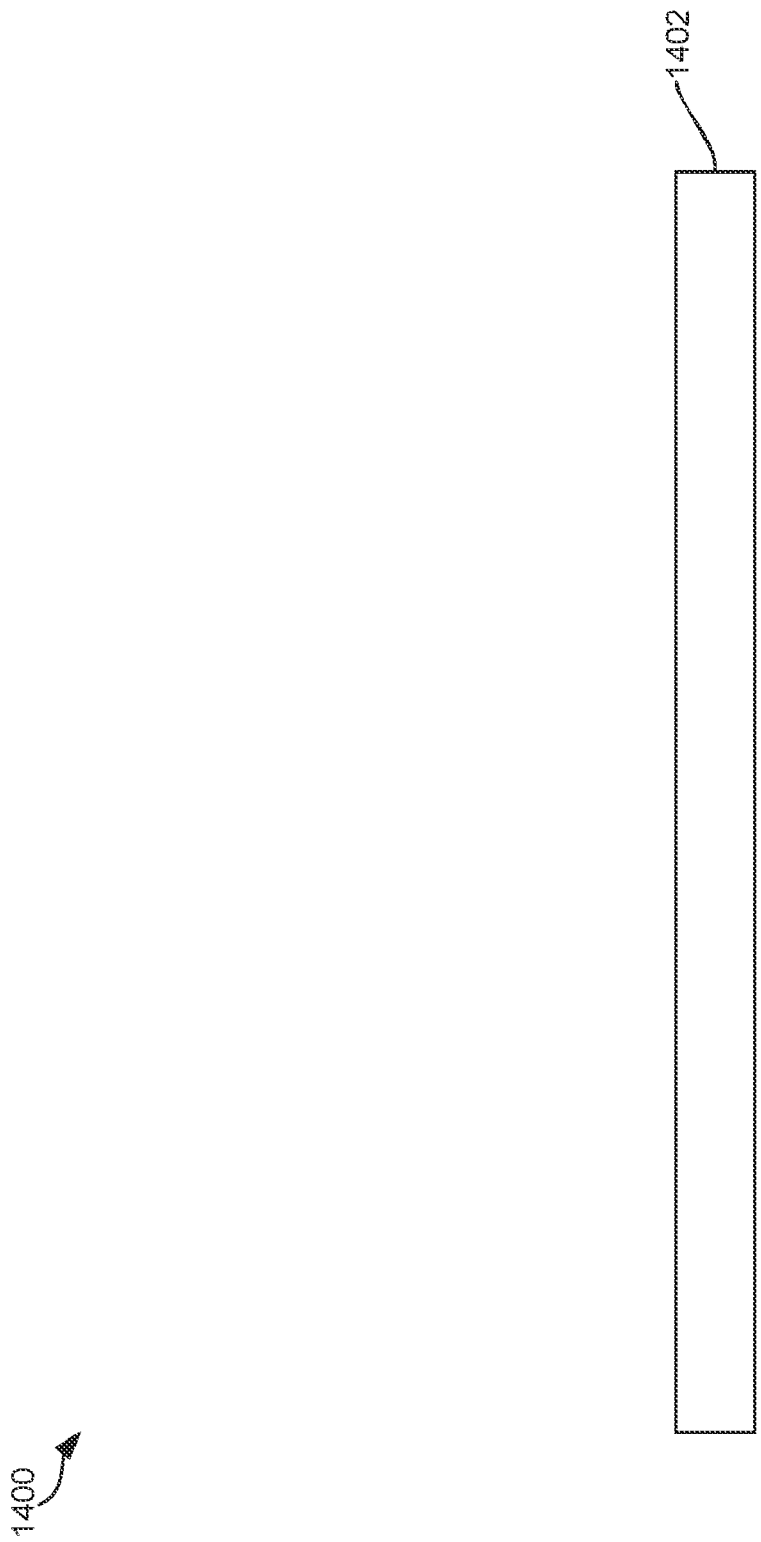
FIGS. 14A-14P are partial cross-sectional views illustrating the intermediate stages of a method of manufacturing a MOSFET device according to an embodiment of the present invention.
Figure 14C:
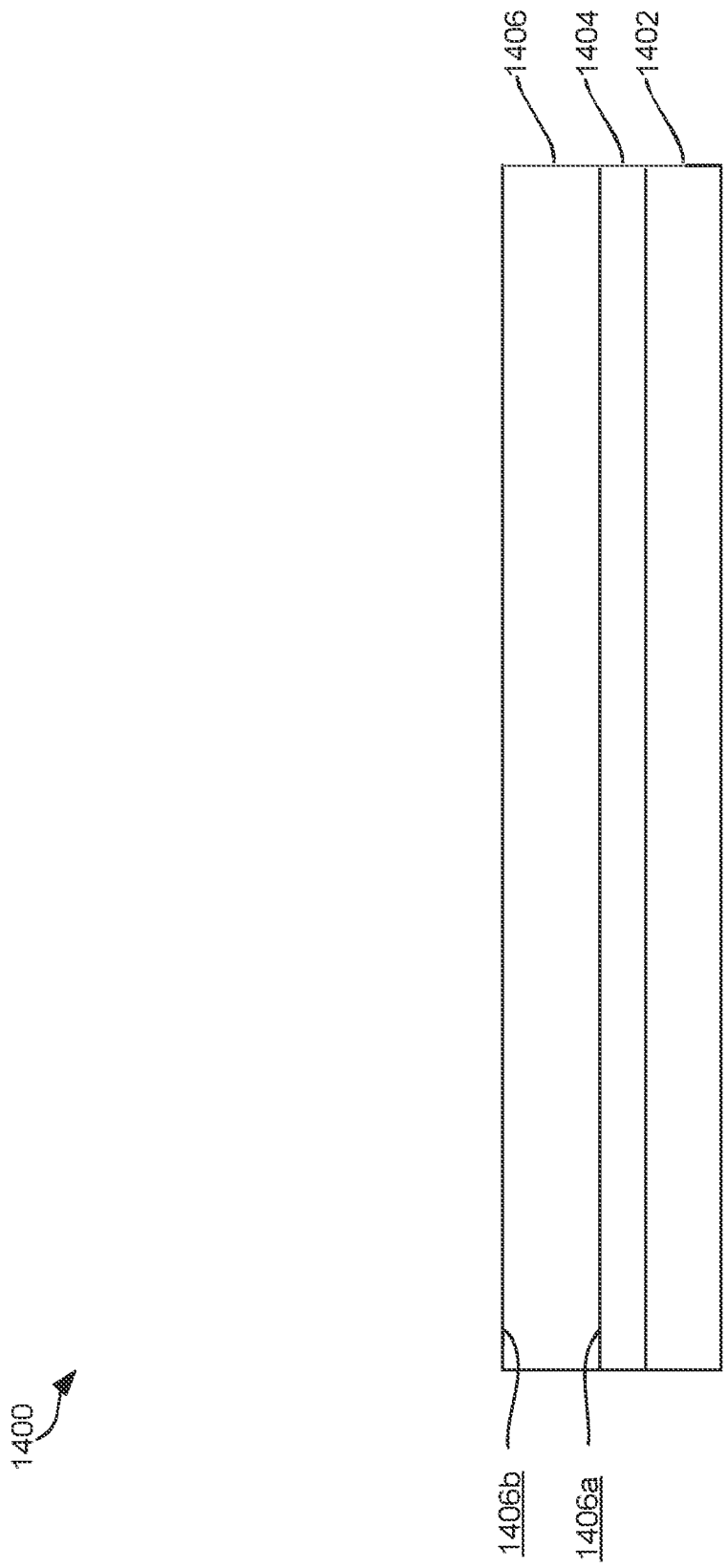
Figure 14D:
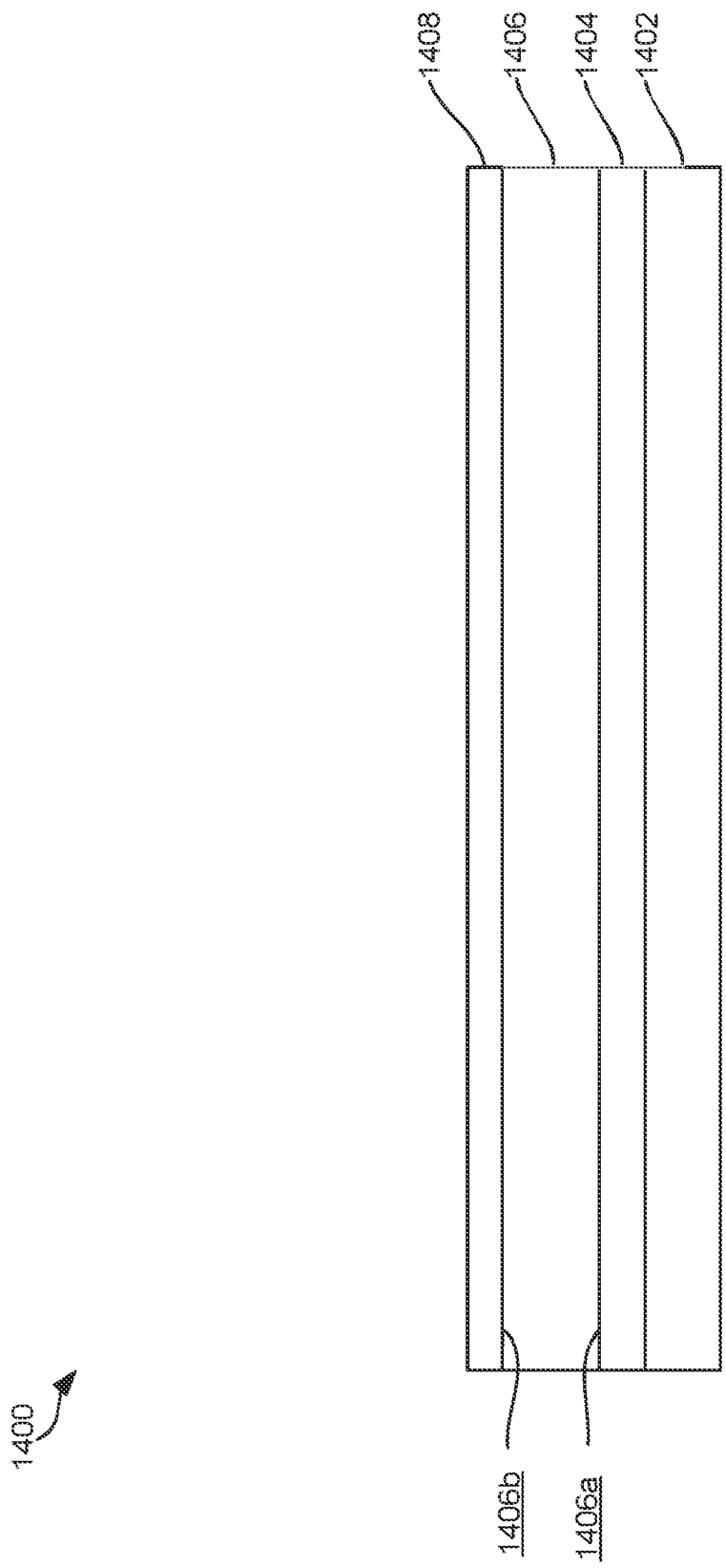
Figure 14E:
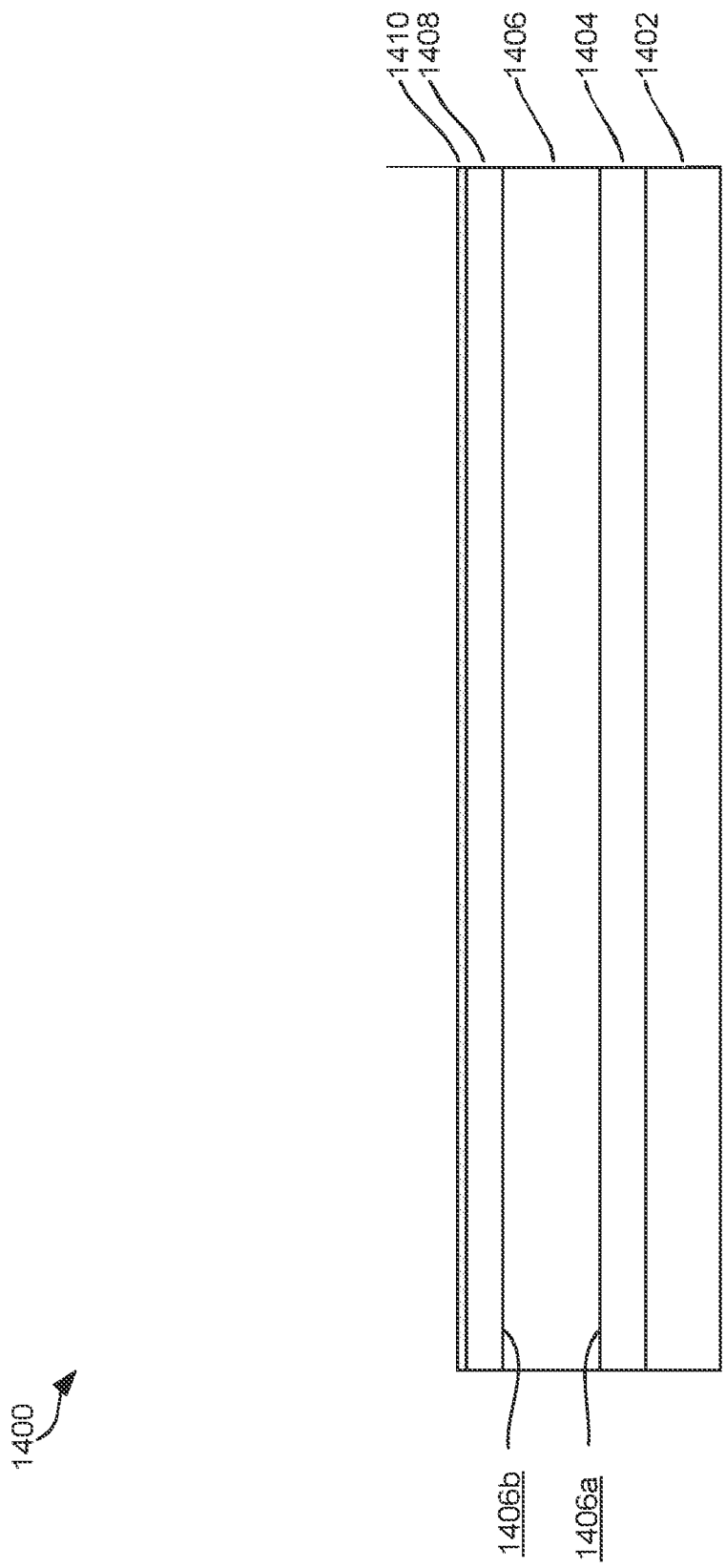
Figure 14G:
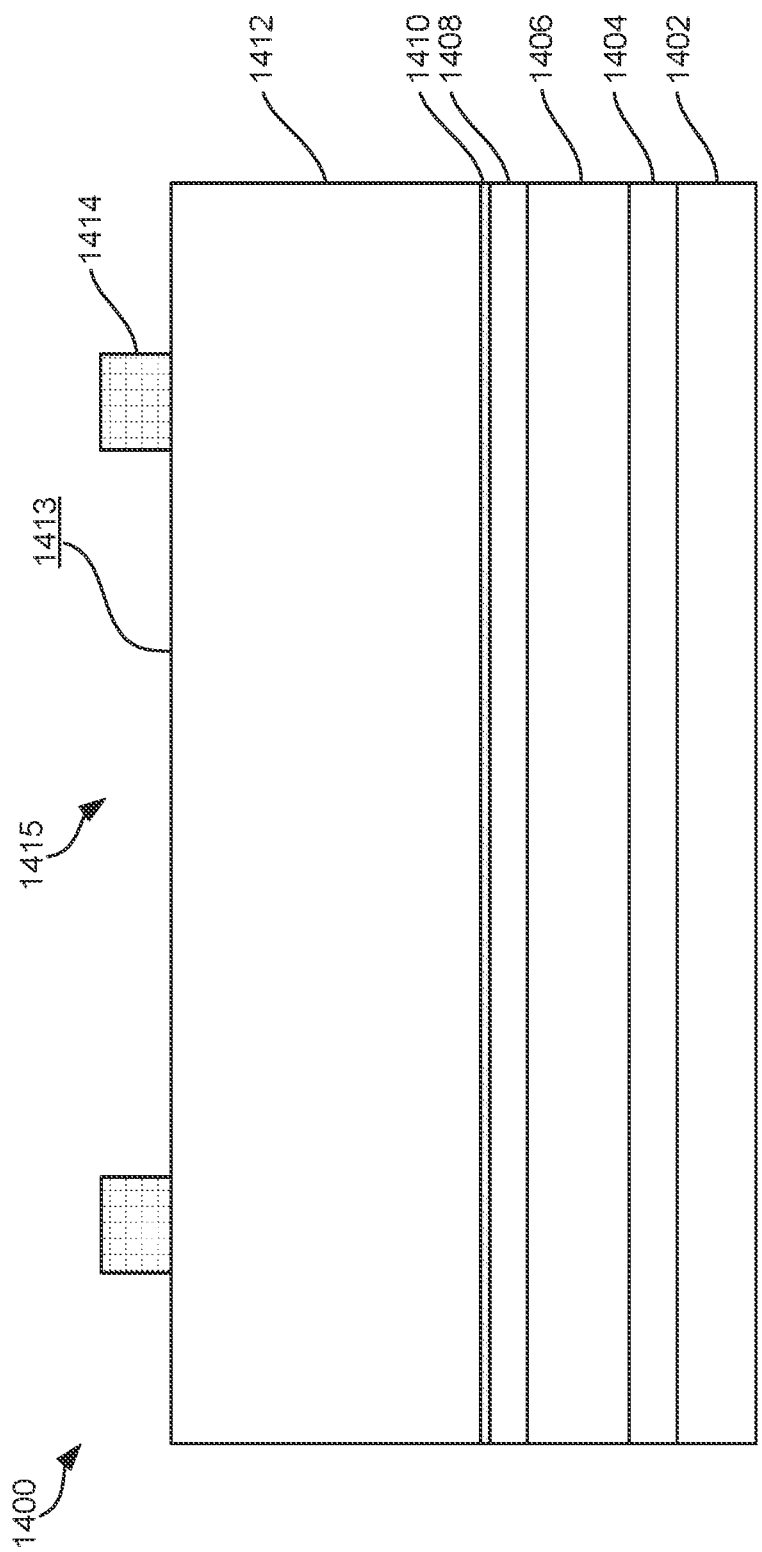
Figure 14H:
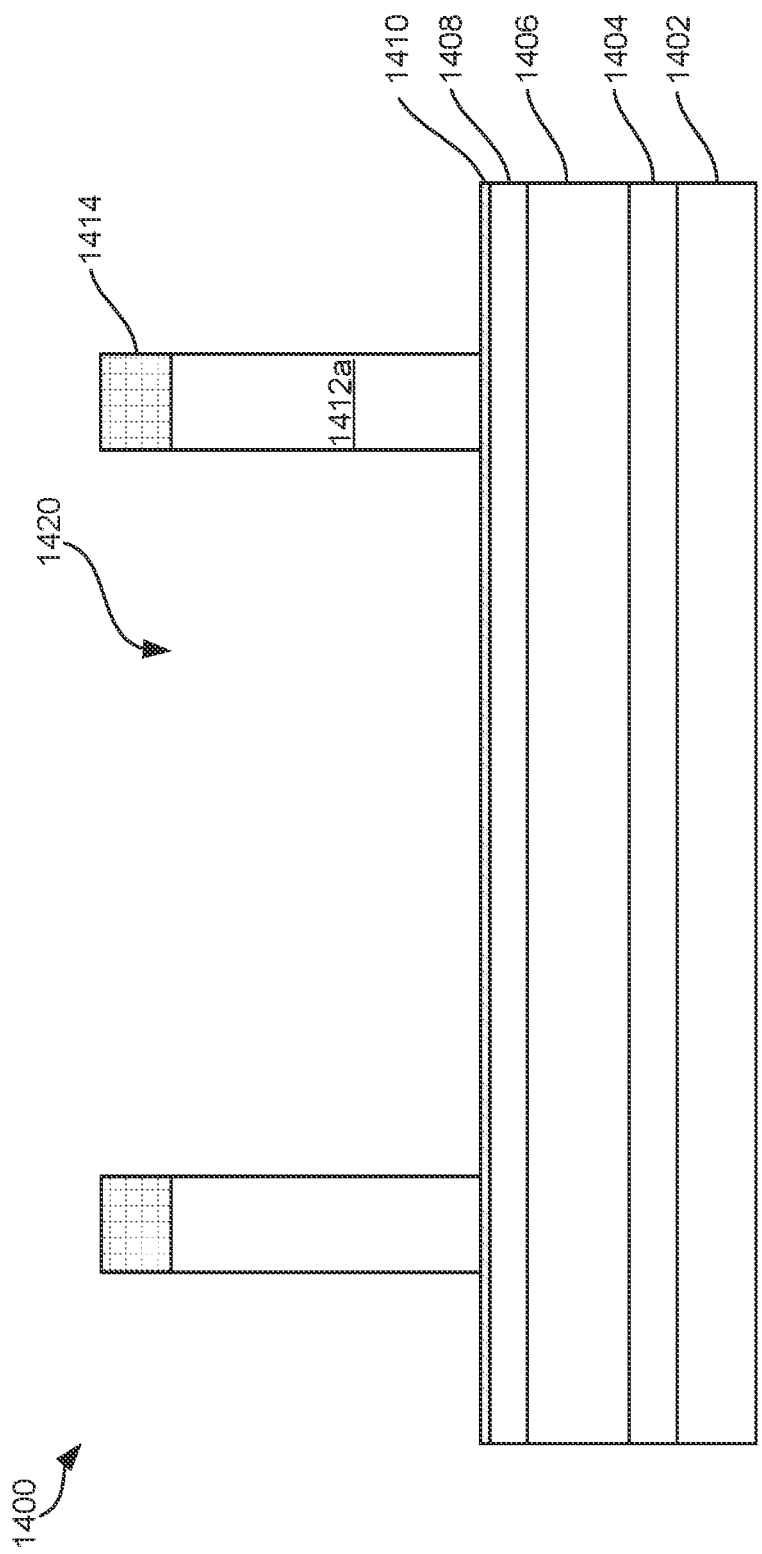
Figure 14I:
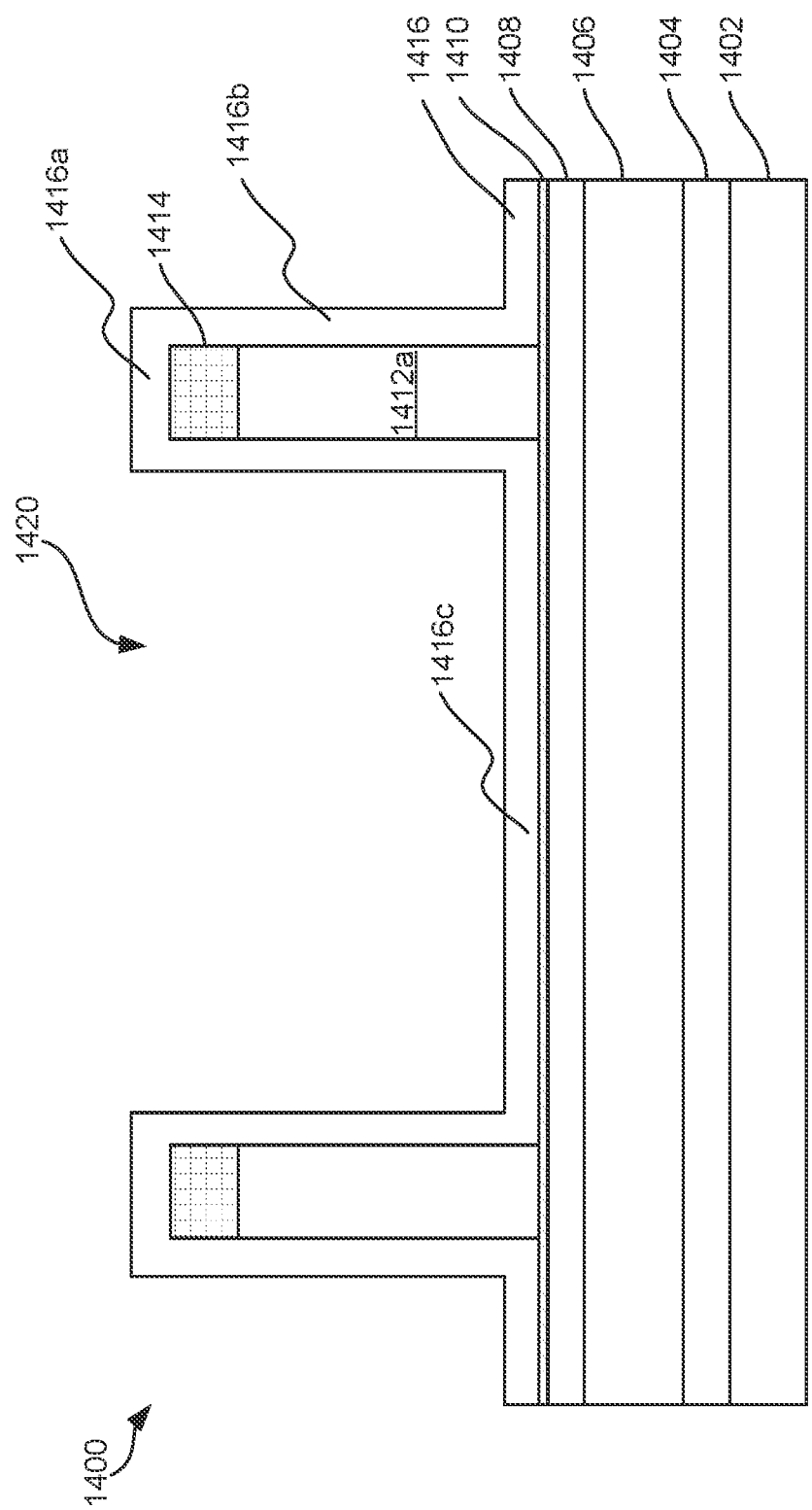
Figure 14J:
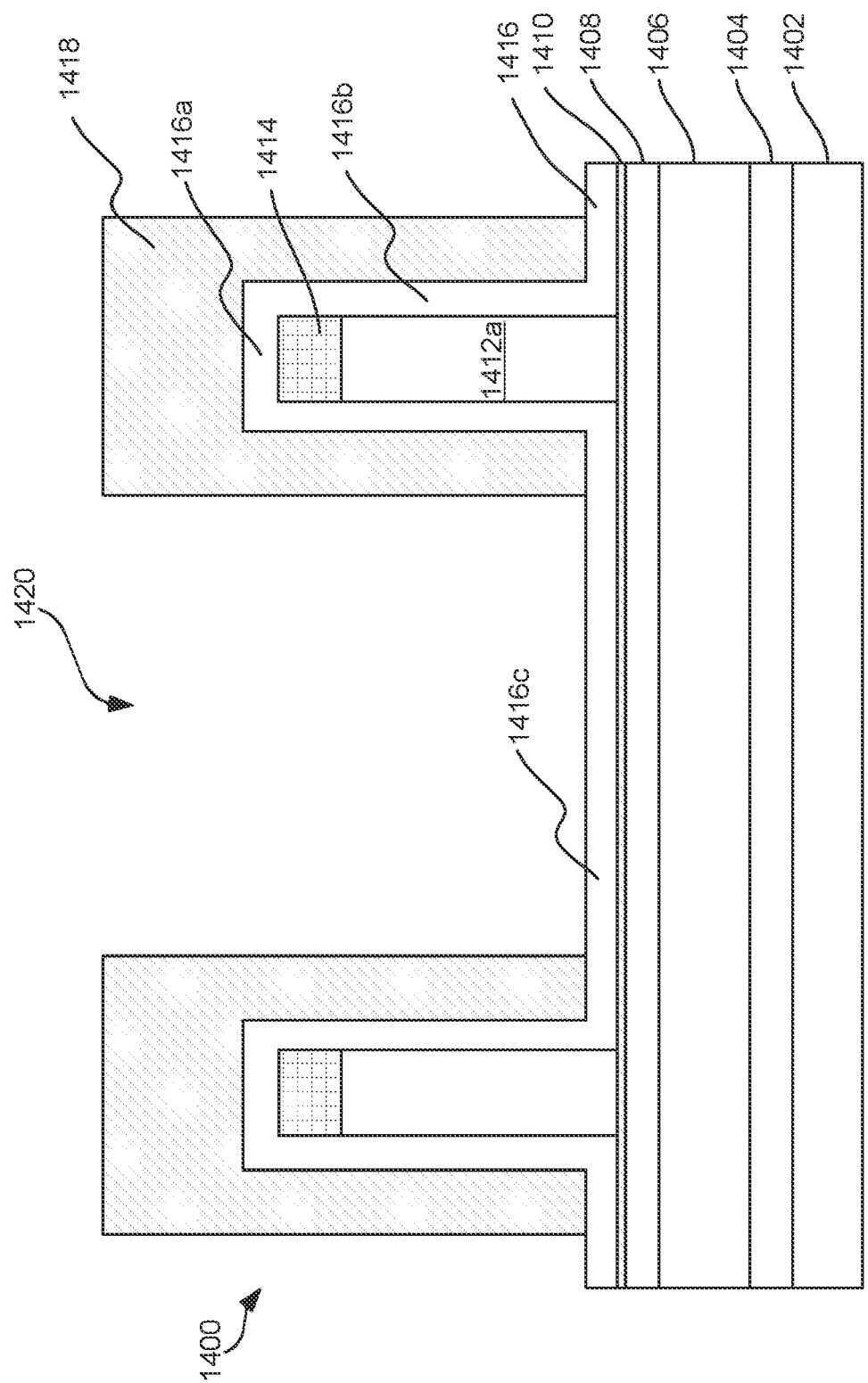
Figure 14K:
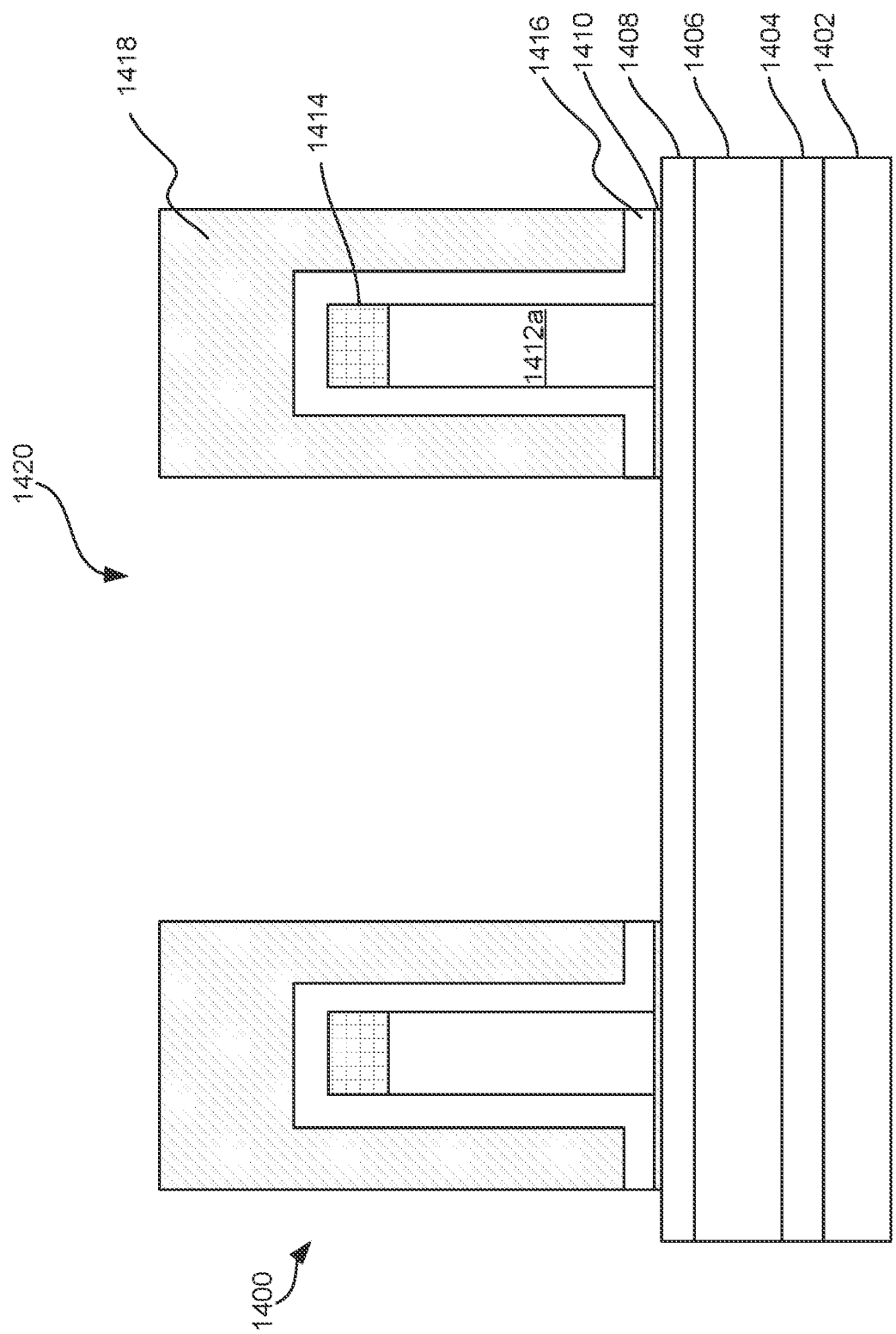
Figure 14L:
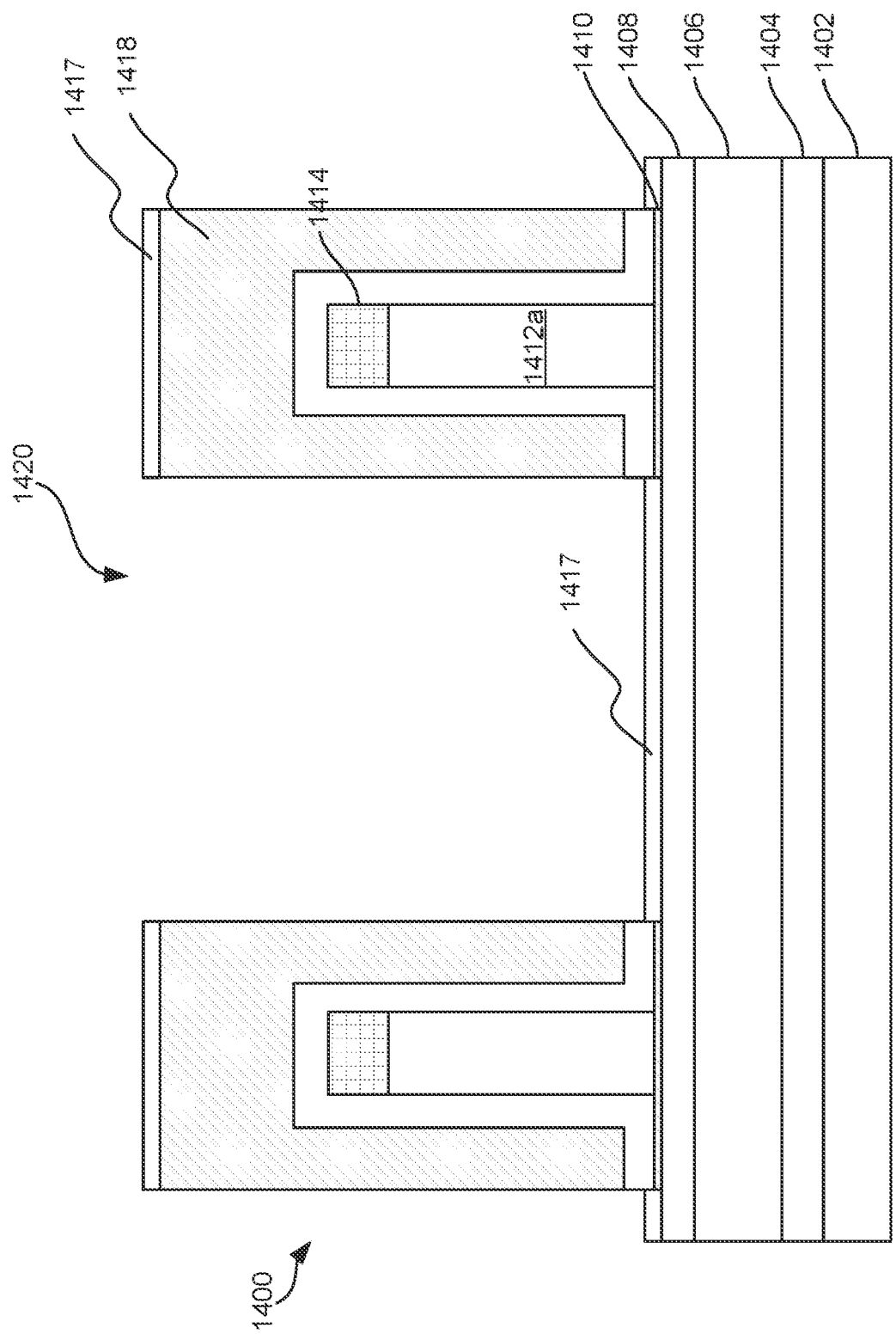
Figure 14M:
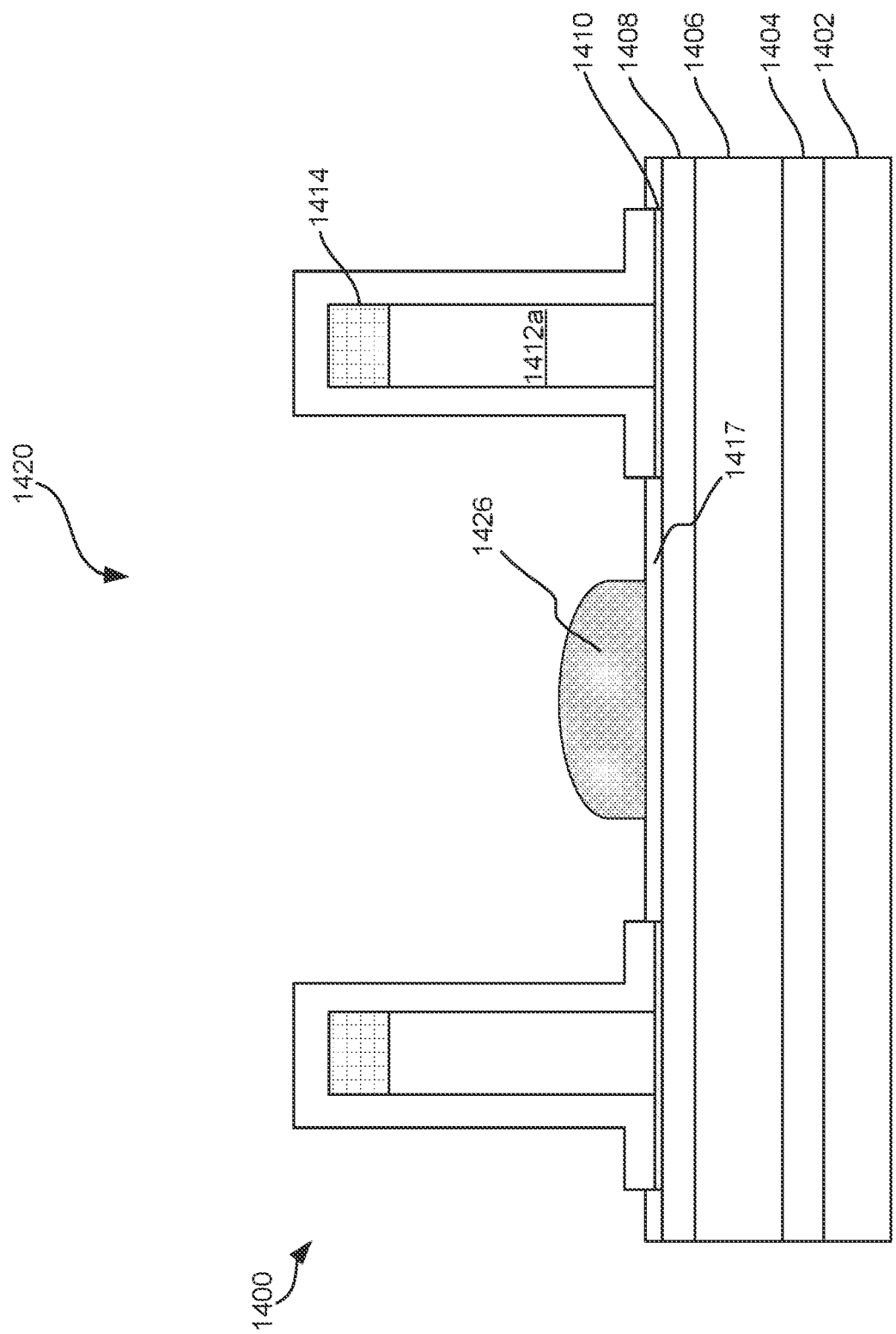
Figure 14N:
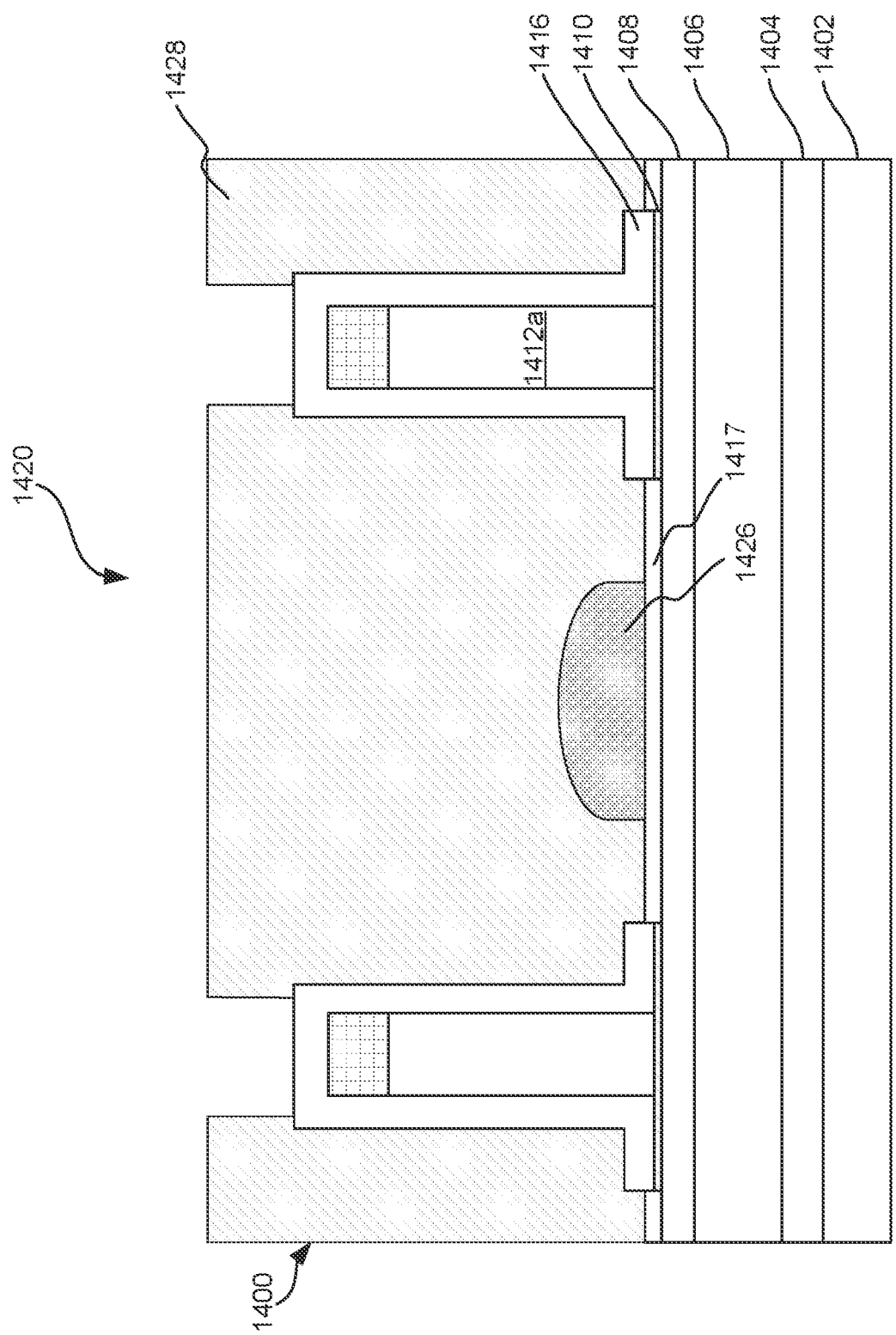
Figure 14O:
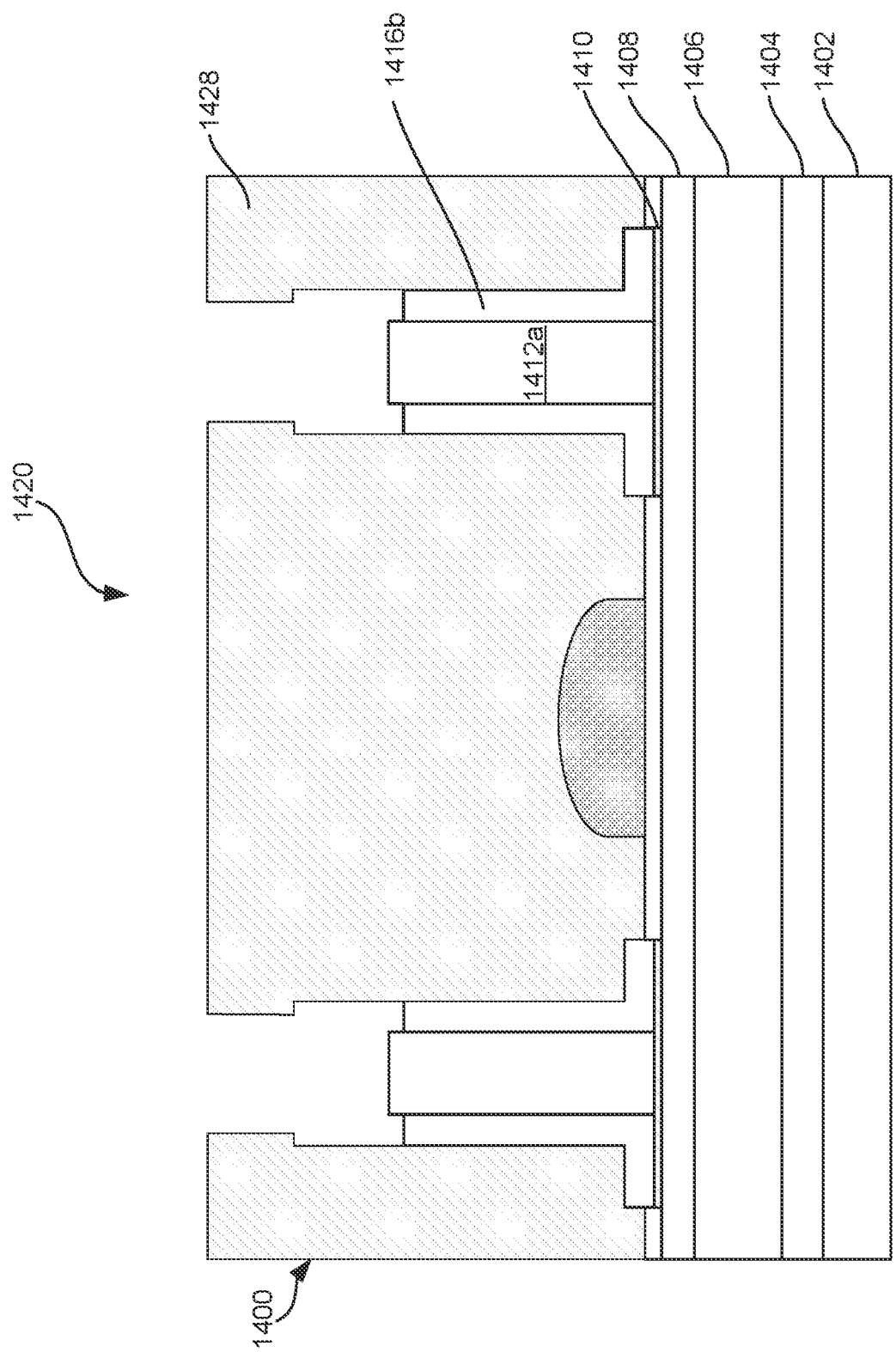
Figure 14P:
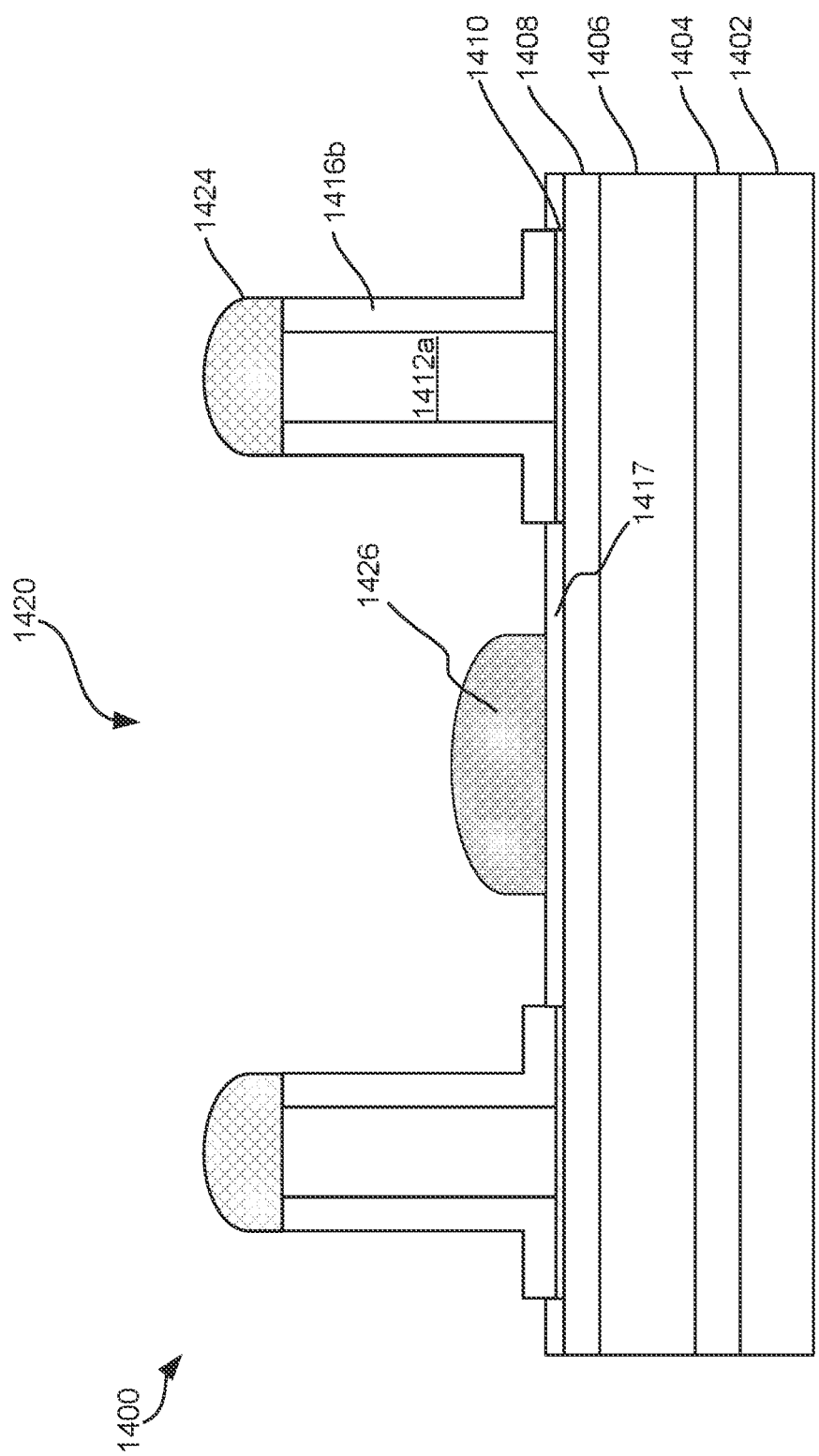

Referring to FIGS. 14A-14P, a method of manufacturing a MOSFET device 1400 is described according to an embodiment of the present invention. FIG. 14A is a partial cross-sectional view illustrating an n+ type doped semiconductor substrate 1402. Referring to FIG. 14B, an n-type doped first semiconductor layer 1404 is epitaxially grown on semiconductor substrate 1402. Referring to FIG. 14C, an n-type doped second semiconductor layer 1406 is epitaxially grown on first semiconductor layer 1404. In one embodiment, first semiconductor layer 1404 has a dopant concentration of $1\times10^{16}$ atoms/cm$^3$. In one embodiment, second semiconductor layer 1406 has a dopant concentration of $7.5\times10^{16}$ atoms/cm$^3$. In one embodiment, second semiconductor layer 1406 has a graded dopant concentration between a first side 1406a and a second side 1406b opposite first side 1406a. In one embodiment, the graded dopant concentration is linearly increased from a lower dopant concentration (e.g., $1\times10^{16}$ atoms/cm$^3$) at first side 1406a adjacent first semiconductor layer 1404 to a higher dopant concentration (e.g., $7.5\times10^{16}$ atoms/cm$^3$) at second side 1406b. In one embodiment, second semiconductor layer 1406 has a thickness of 0.3 μm.

Referring to FIG. 14D, a third semiconductor layer 1408 is epitaxially grown on second semiconductor layer 1406. Third semiconductor layer 1408 is characterized by the first conductivity type. In one embodiment, the dopant concentration of third semiconductor layer 1408 is greater than the dopant concentration of first semiconductor layer 1404. In one embodiment, third semiconductor layer 1408 includes n-type doped GaN with a dopant concentration of $1.3\times10^{17}$ atoms/cm$^3$.

Referring to FIG. 14E, a marker layer 1410 is deposited on third semiconductor layer 1408. In one embodiment, the marker layer 1410 may comprise a GaN layer incorporating a metallurgical concentration of silicon of $1\times10^{19}$ atoms/cm$^3$. In another embodiment, the marker layer 1410 may comprise an AlGaN layer incorporating a metallurgical concentration of aluminum of $1.3\times10^{17}$ atoms/cm$^3$. In another embodiment, the marker layer 1410 may comprise an InGaN layer incorporating a metallurgical concentration of indium of $1\times10^{17}$ to $1\times10^{19}$ atoms/cm$^3$. In one embodiment, the marker layer 1410 may have a thickness in a range of 1-10 nm, preferably 3-8 nm. In an exemplary embodiment, the marker layer 1410 has a thickness of 5 nm. In one embodiment, vertical JFET device 1400 may omit third semiconductor layer 1408. In such embodiment, marker layer 1410 is directly deposited on second semiconductor layer 1406.

Referring to FIG. 14F, a fourth semiconductor layer 1412 is epitaxially grown on marker layer 1410. In one embodiment, fourth semiconductor layer 1412 includes n-type doped GaN with a dopant concentration of $1.3\times10^{17}$ atoms/cm$^3$ and a thickness of about 0.3 μm-0.7 μm. In one embodiment, the dopant concentration of fourth semiconductor layer 1412 is greater than the dopant concentration of first semiconductor layer 1404. In another embodiment, the dopant concentration of fourth semiconductor layer 1412 is greater than the higher dopant concentration within the graded dopant concentration of second semiconductor layer 1406. In another embodiment, the dopant concentration of fourth semiconductor layer 1412 is equal to or greater than the dopant concentration of third semiconductor layer 1408.

Referring to FIG. 14G, a hardmask layer 1414 is formed on fourth semiconductor layer 1412. Hardmask layer 1414 comprises a set of openings 1415 operable to expose an upper surface portion 1413 of fourth semiconductor layer 1412. Referring to FIG. 14H, an etching process is performed using hardmask layer 1414 as a mask to form a plurality of fins 1412a within fourth semiconductor layer 1412. Each of the fins 1412a is separated by one of a plurality of recess regions 1420 formed by the etching process. As shown in FIG. 14H, the etching process is monitored to detect when the etching process reaches marker layer 1410. In one embodiment, the etching process is monitored to detect etching of at least a portion of marker layer 1410. In one embodiment, the detection process may be conducted by standard methods (e.g., end point detectors). In one embodiment using silicon layer as the marker layer, a spike of silicon dopant is readily detectable. In another embodiment using AlGaN layer as the marker layer, the Al dopant is readily detectable. In another embodiment using an In-doped layer, the In dopant is readily detectable.

For clarification of illustration, the etching process in the below examples may stop once it is detected that the etching process has reached marker layer 1410. One of ordinary skill in the art would understand that the present invention is not limited to such examples. The etching process may be finely controlled to achieve a predetermined etch depth in a target doping layer, as described above referring to FIG. 6D. For clarity of description and illustration, the below examples are described using a single recess region 1420 or a single fin 1412a. One of ordinary skill in the art would understand that the relevant description with respect to one recess region 1420 or one fin 1412a equally applies to all recess regions 1420 or fins 1412a unless it is otherwise expressly described.

In one embodiment, after forming the recess regions, a cleaning process is carried using a TMAH solution of about 25% by weight, at a temperature of about 85° C., and for a duration of about 30 minutes. In another embodiment, prior to performing a cleaning using the TMAH solution, a pre-cleaning, such as piranha clean using an $H_2SO_4$:$H_2O_2$ in a volume ratio 2:1 for two minutes, may also be performed.

Referring to FIG. 14I, a dielectric spacer layer 1416 is deposited on hardmask layer 1414 and the plurality of recess region 1420. In one embodiment, dielectric spacer layer 1416 is deposited conformal to hardmask layer 1414 and the sidewalls of fins 1412a. For example, as shown in FIG. 14I, dielectric spacer layer 1416 may include a first portion 1416a on top of hardmask layer 1414, a second portion 1416b conformal to the side walls of the plurality of fins 1412a, and a third portion 1416c coupled to the plurality of recess regions 1420. In some embodiments, dielectric spacer layer 1416 may include TiOx. In some embodiments, dielectric spacer layer 1416 may be deposited using a thermal ALD process. In some embodiments, dielectric spacer layer 1416 may have a thickness in the range of about 3 nm-8 nm.

Referring to FIG. 14J, a first photoresist layer 1418 is formed on dielectric spacer layer 1416. In some embodiments, photoresist layer 1418 is disposed on first portion 1416a and second portion 1416b of dielectric spacer layer 1416. Third portion 1416c in recess region 1420 is exposed. In some embodiments, first photoresist layer 1418 protects the portion of dielectric spacer layer 1416 disposed on fins 1412a and hardmask layer 1414 from subsequent processing.

Referring to FIG. 14K, an etching process is performed in recess region 1420 using first photoresist layer 1418 as a mask to remove dielectric spacer layer 1416 within recess region 1420. Then the etching process continues to remove a portion of marker layer 1410 within recess region 1420 and stop in third semiconductor layer 1408. In some embodiments, the etching process is monitored to detect when the etching process reaches marker layer 1410, then subsequent etching process may be finely controlled to achieve a predetermined etch depth in third semiconductor layer 1408. For example, the subsequent etching may be timed to achieve an etch depth of 0.1 μm in third semiconductor layer 1408. In some embodiments, the subsequent etching process may be finely controlled to stop at the upper surface of third semiconductor layer 1408.

Referring to FIG. 14L, a metal dielectric layer 1417 is formed on third semiconductor layer 1408 within the plurality of recess regions 1420. In some embodiments, metal dielectric layer 1417 is also formed on top of the plurality of fins 1412a. Specifically, metal dielectric layer 1417 is formed on first photoresist layer 1418 that remains on top of the plurality of fins 1412a. In some embodiments, metal dielectric layer 1417 may include TiOx. In some embodiments, metal dielectric layer 1417 may be deposited using a thermal ALD process. In some embodiments, metal dielectric layer 1417 may have a thickness in the range of about 3 nm-8 nm. Then, the portion of metal dielectric layer 1417 on first photoresist layer 1418 together with first photoresist layer 1418 are removed.

Referring to FIG. 14M, a gate metal layer 1426 is formed on metal dielectric layer 1417 within the plurality of recess regions 1420. In some embodiments, gate metal layer 1426 may include nickel, gold, molybdenum, platinum, palladium, silver, combinations thereof, and the like.

Referring to FIG. 14N, a second photoresist layer 1428 is formed on gate metal layer 1426 within the plurality of recess regions 1420. In one embodiment, second photoresist layer 1428 is formed to be conformal to the sidewalls of fins 1412a and to expose the upper portion of dielectric spacer layer 1416 on top of the plurality of fins 1412a. In some embodiments, second photoresist layer 1428 can protect gate metal layer 1426 from subsequent processing.

Referring to FIG. 14O, an etching process is performed using second photoresist layer 1428 as a mask to remove dielectric spacer layer 1416 and hardmask layer 1414 and stop on fourth semiconductor layer 1412. In some embodiments, the etching process removes first portion 1416a of dielectric spacer layer 1416 on top of the plurality of fins 1412a, hardmask layer 1414, and a portion of second portion 1416b of dielectric spacer layer 1416. After the etching process, the upper portion of fin 1412a is exposed. After the etching process, second photoresist layer 1428 is removed.

Referring to FIG. 14P, a source metal layer 1424 is formed on fourth semiconductor layer 1412. Specifically, source metal layer 1424 is formed on the upper portion of the plurality of fins 1412a. In some embodiments, source metal layer 1424 may include a refractory metal, a refractory metal compound, or a refractory metal alloy (e.g., TiN).

Figure 15:
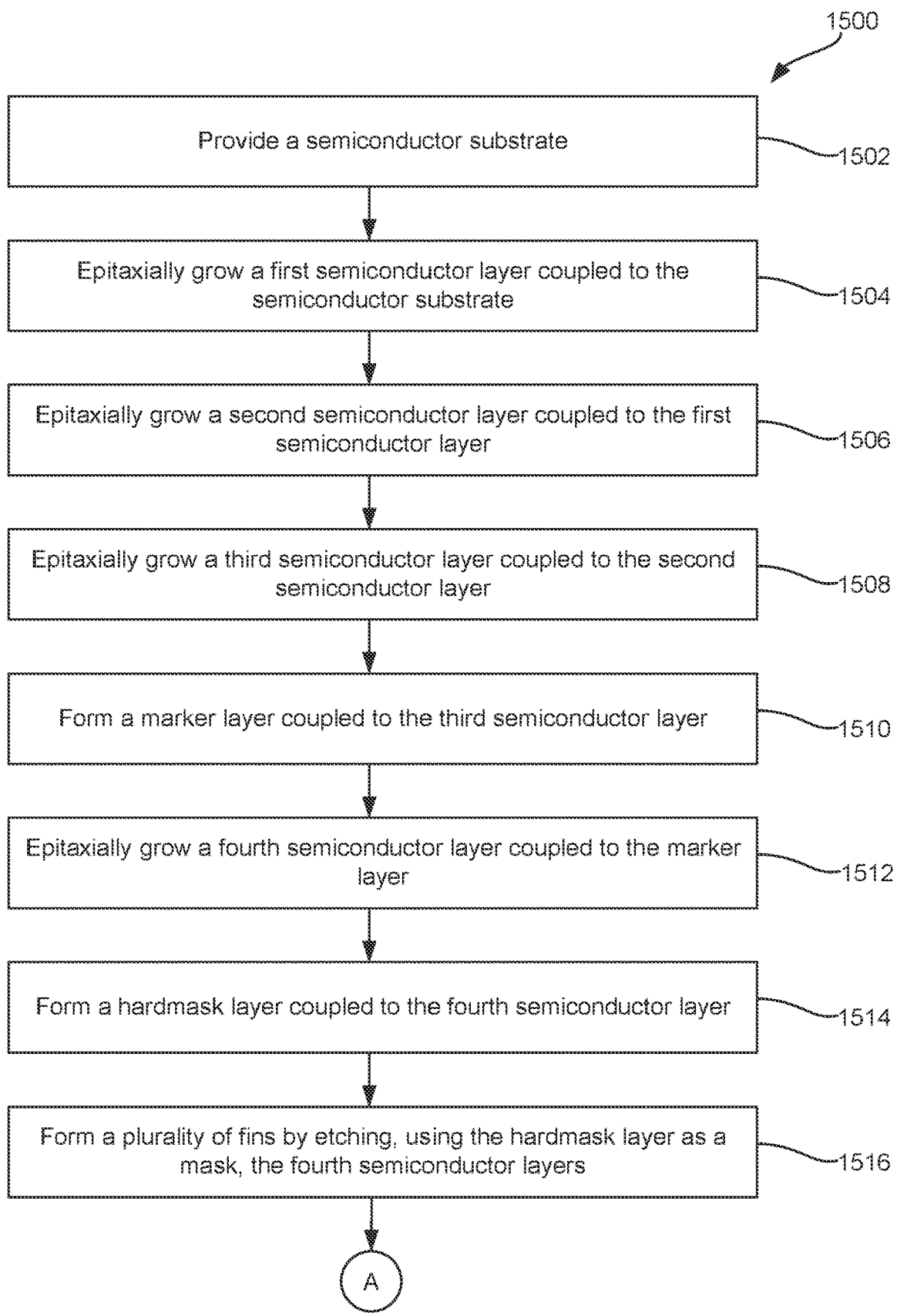
FIG. 15 is a simplified flowchart showing a method of manufacturing a MOSFET device according to an embodiment of the present invention.
Figure 15:
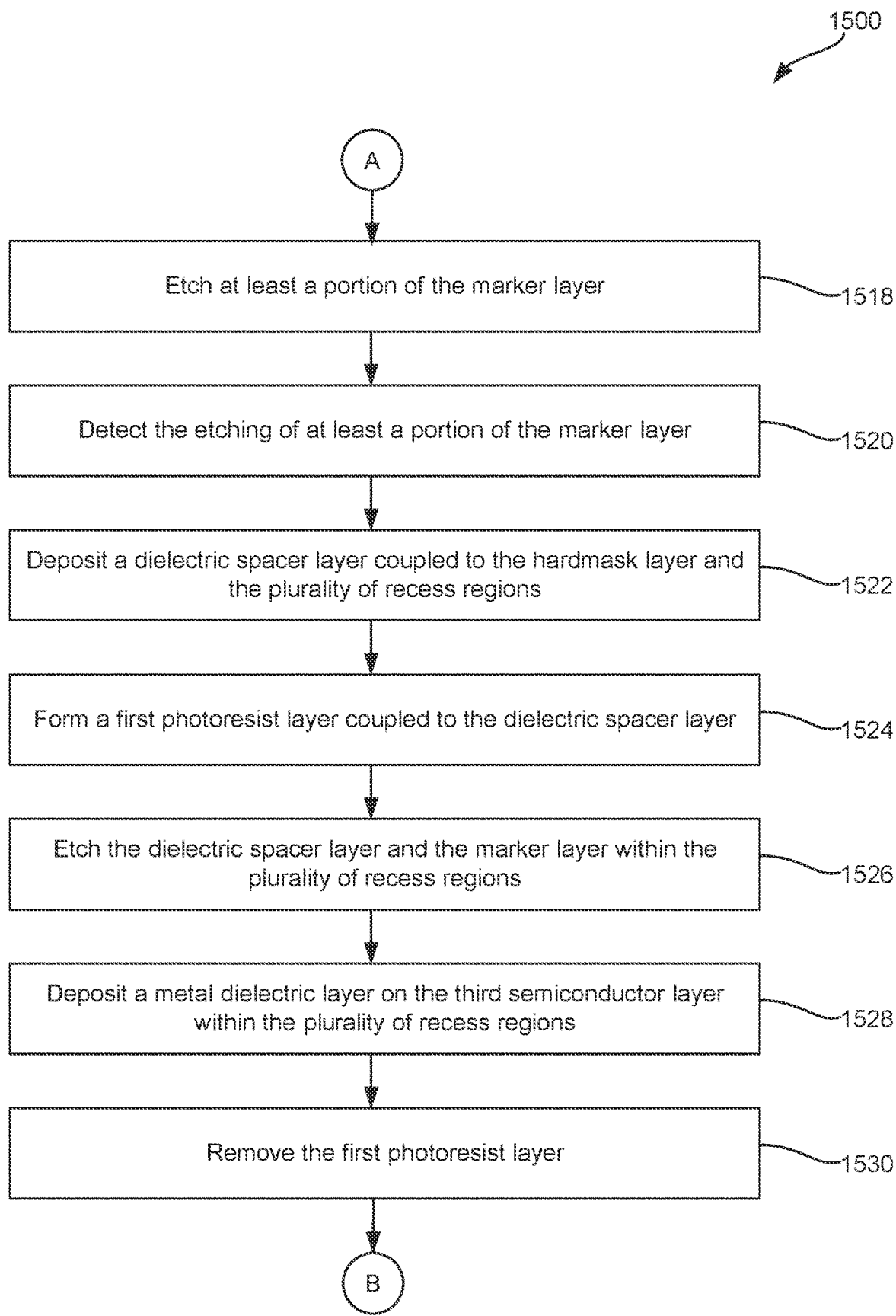
Figure 15:
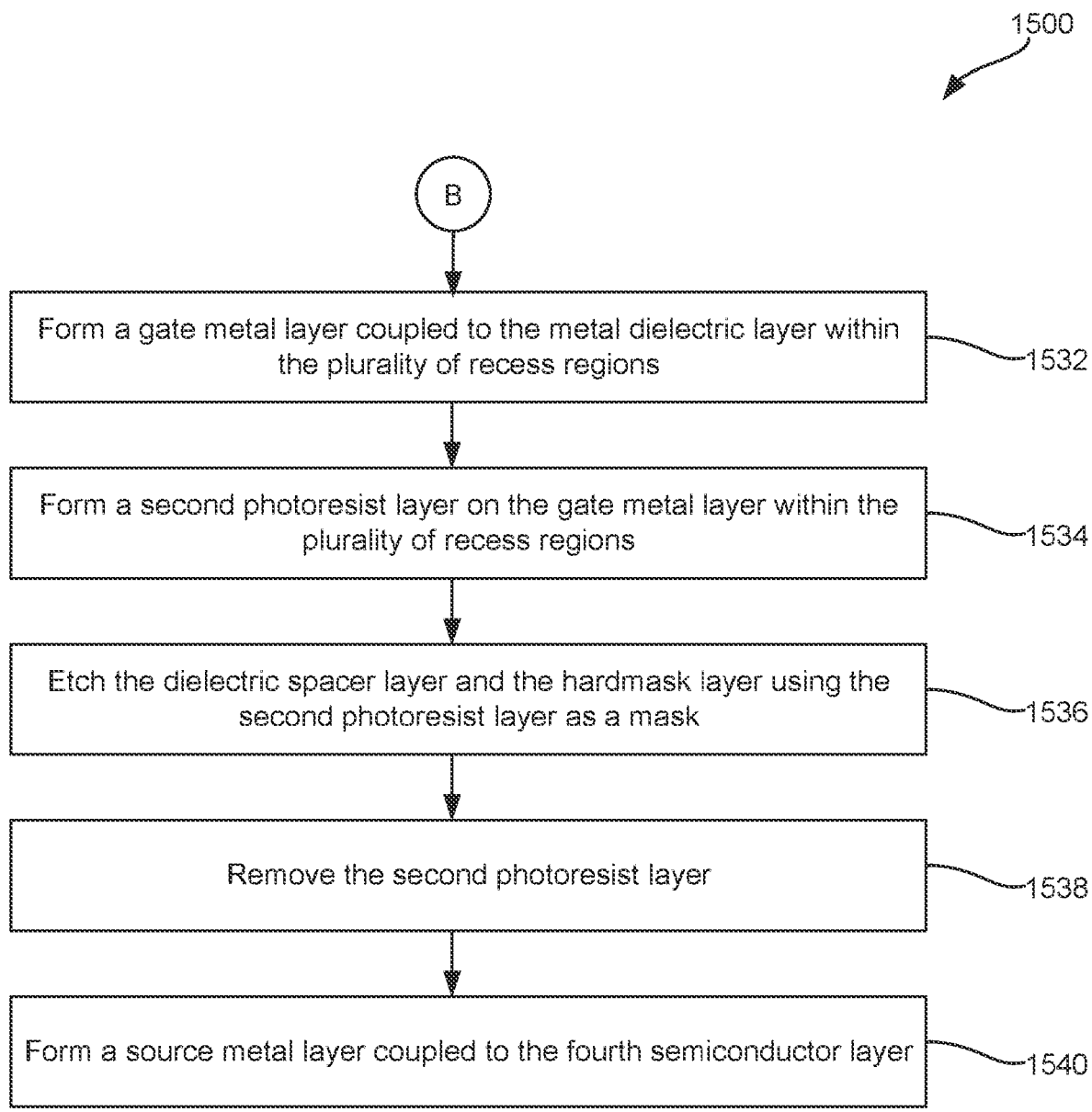

FIG. 15 is a simplified flowchart illustrating a method 1500 for manufacturing a MOSFET device according to an embodiment of the present invention. Referring to FIG. 15, method 1500 may include providing a semiconductor substrate (1502). In one embodiment, the semiconductor substrate may include III-nitride compounds, such as GaN. In one embodiment, the semiconductor substrate is n+ type doped GaN substrate, having a dopant concentration in a range of about $5\times10^{17}$ atoms/cm$^3$ to about $1\times10^{19}$ atoms/cm$^3$ and a resistivity of less than 0.020 ohm-cm$^2$. A first semiconductor layer is epitaxially grown on the semiconductor substrate (1504). In one embodiment, the first semiconductor layer is characterized by a first conductivity type and a first dopant concentration. In one embodiment, the first semiconductor layer may include n-type doped GaN with a dopant concentration of about $1\times10^{16}$ atoms/cm$^3$.

Method 1500 may further include epitaxially growing a second semiconductor layer coupled to the first semiconductor layer, wherein the second semiconductor layer is characterized by the first conductivity type (1506). In one embodiment, the second semiconductor layer is further characterized by a graded dopant concentration between a first side and a second side opposite the first side. In one embodiment, the second semiconductor layer includes n-type doped GaN, and the graded dopant concentration is linearly increased from a lower dopant concentration (e.g., $1\times10^{16}$ atoms/cm$^3$) at the first side adjacent the first semiconductor layer to a higher dopant concentration (e.g., $7.5\times10^{16}$ atoms/cm$^3$) at the second side. In one embodiment, the second semiconductor layer has a thickness of 0.3 μm.

Method 1500 may further include epitaxially growing a third semiconductor layer coupled to the second semiconductor layer, wherein the third semiconductor layer is characterized by the first conductivity type (1508). In one embodiment, the third semiconductor layer may include n-type doped GaN with a dopant concentration of $1.3\times10^{17}$ atoms/cm$^3$. In one embodiment, the dopant concentration of the third semiconductor layer is greater than the first dopant concentration of the first semiconductor layer. In another embodiment, the dopant concentration (e.g., $1.3\times10^{17}$ atoms/cm$^3$) of the third semiconductor layer is greater than the higher dopant concentration (e.g., $7.5\times10^{16}$ atoms/cm$^3$) within the graded dopant concentration of the second semiconductor layer. In some embodiments, the thickness of the third semiconductor layer is about 0.1 μm-0.3 μm.

Method 1500 may further include forming a marker layer coupled to the third semiconductor layer (1510). In one embodiment, the marker layer may comprise a GaN layer incorporating a metallurgical concentration of silicon of $1 \times 10^{19}$ atoms/cm$^3$. In another embodiment, the marker layer may comprise an AlGaN layer incorporating a metallurgical concentration of aluminum of $1.3 \times 10^{17}$ atoms/cm$^3$. In another embodiment, the marker layer may comprise an InGaN layer incorporating a metallurgical concentration of indium of $1 \times 10^{17}$ to $1 \times 10^{19}$ atoms/cm$^3$. In one embodiment, the marker layer may have a thickness in a range of 1-10 nm, preferably 3-8 nm. In an exemplary embodiment, the marker layer has a thickness of 5 nm.

Method 1500 may further include epitaxially growing a fourth semiconductor layer coupled to the marker layer, wherein the fourth semiconductor layer is characterized by the first conductivity type and a second dopant concentration (1512). In one embodiment, the second dopant concentration of the fourth semiconductor layer is greater than the first dopant concentration of the first semiconductor layer. In one embodiment, the fourth semiconductor layer may include n-type doped GaN with a dopant concentration of $1.3 \times 10^{17}$ atoms/cm$^3$ and a thickness of about 0.3 μm-0.7 μm. In one embodiment, the second dopant concentration (e.g., $1.3 \times 10^{17}$ atoms/cm$^3$) of the fourth semiconductor layer is greater than the higher dopant concentration (e.g., $7.5 \times 10^{16}$ atoms/cm$^3$) within the graded dopant concentration of the second semiconductor layer.

Method 1500 may further include forming a hardmask layer coupled to the fourth semiconductor layer, wherein the hardmask layer comprises a set of openings operable to expose an upper surface portion of the fourth semiconductor layer (1514).

Method 1500 may further include forming a plurality of fins by etching, using the hardmask layer as a mask, the fourth semiconductor layers, wherein each of the plurality of fins is separated by one of a plurality of recess regions (1516). In one embodiment, each of the plurality of fins may have a thickness of about 0.8 μm.

Method 1500 may further include etching at least a portion of the marker layer (1518) and detecting the etching of the at least a portion of the marker layer (1520). In one embodiment, the detection process may be conducted by standard methods (e.g., end point detectors). In one embodiment using silicon layer as the marker layer, a spike of silicon dopant is readily detectable. In another embodiment using AlGaN layer as the marker layer, the Al dopant is readily detectable. In one embodiment, method 1500 may stop etching when it is detected that the etching process has reached the marker layer. In another embodiment, method 1500 may further include etching through the marker layer, then continuing to etch the third semiconductor layer and second semiconductor layer using the hardmask layer as a mask for a predetermined time period.

Method 1500 may further include depositing a dielectric spacer layer coupled to the hardmask layer and the plurality of recess regions (1522). In one embodiment, the dielectric spacer layer is formed conformal to the sidewalls of the plurality of fins and the upper surface of the hardmask layer.

Method 1500 may further include forming a first photoresist layer coupled to the dielectric spacer layer (1524). In one embodiment, the first photoresist layer covers a portion of the dielectric spacer layer on top of the plurality of fins and to leave the plurality of recess regions exposed.

Method 1500 may further include etching the dielectric spacer layer and the marker layer within the plurality of recess regions (1526). In some embodiments, the etching process stops in the third semiconductor layer. In some embodiments, the etching process is monitored to detect when the etching process reaches the marker layer, then subsequent etching process may be finely controlled to achieve a predetermined etch depth in the third semiconductor layer. In some embodiments, the subsequent etching process may be finely controlled to stop at the upper surface of third semiconductor layer.

Method 1500 may further include depositing a metal dielectric layer on the third semiconductor layer within the plurality of recess regions (1528). In some embodiments, the metal dielectric layer is also formed on top of the plurality of fins. Specifically, the metal dielectric layer is formed on the first photoresist layer that remains on top of the plurality of fins. In some embodiments, the metal dielectric layer may include TiOx. In some embodiments, the metal dielectric layer may be deposited using a thermal ALD process. After depositing the metal dielectric layer, the first photoresist layer is removed (1530).

Method 1500 may further include forming a gate metal layer coupled to the metal dielectric layer within the plurality of recess regions (1532). In some embodiments, the gate metal layer may include nickel, gold, molybdenum, platinum, palladium, silver, combinations thereof, and the like.

Method 1500 may further include forming a second photoresist layer on the gate metal layer within the plurality of recess regions (1534). In some embodiments, the second photoresist layer is formed also conformal to the sidewalls of the plurality of fins and to expose the upper portion of the dielectric spacer layer on top of the plurality of fins.

Method 1500 may further include etching the dielectric spacer layer and the hardmask layer using the second photoresist layer as a mask (1536). In some embodiments, the etching process stops on the fourth semiconductor layer, exposing the upper portion of the plurality of fins. After the etching process, the second photoresist layer is removed (1538).

Method 1500 may further include forming a source metal layer coupled to the fourth semiconductor layer (1540). In some embodiments, the source metal layer is coupled to the upper portion of the plurality of fins. In some embodiments, the source metal layer may include a refractory metal, a refractory metal compound, or a refractory metal alloy (e.g., TiN).

It should be understood that the specific steps illustrated in FIG. 15 provide a particular method of manufacturing a MOSFET device according to an embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual steps. Furthermore, additional steps may be added or removed depending on a particular application. One of ordinary skill in the art would recognize many variations, modifications, and alternatives.

Figure 16A:
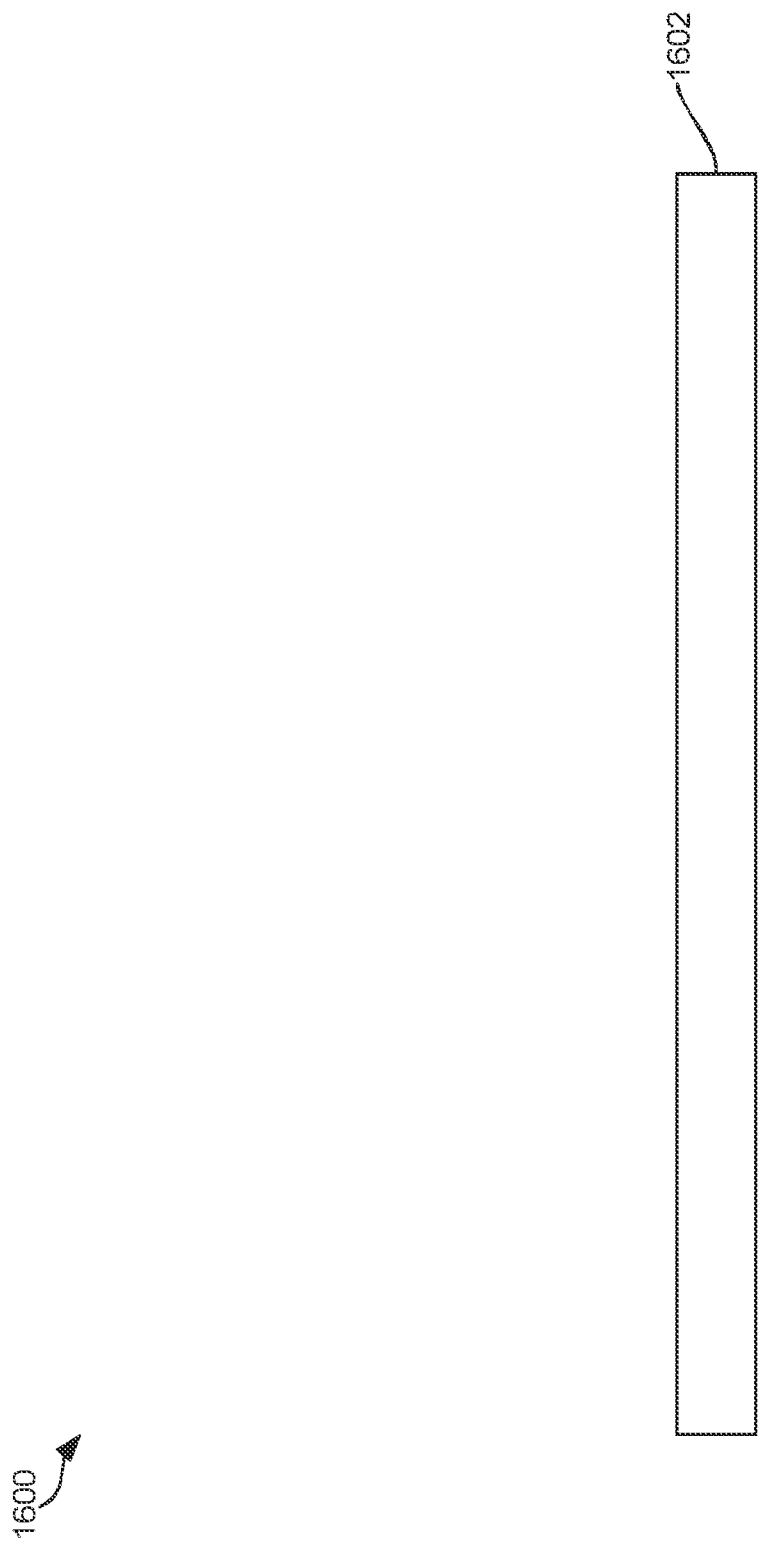
FIGS. 16A-16V are partial cross-sectional views illustrating the intermediate stages of a method of manufacturing a MOSFET device according to another embodiment of the present invention.
Figure 16B:
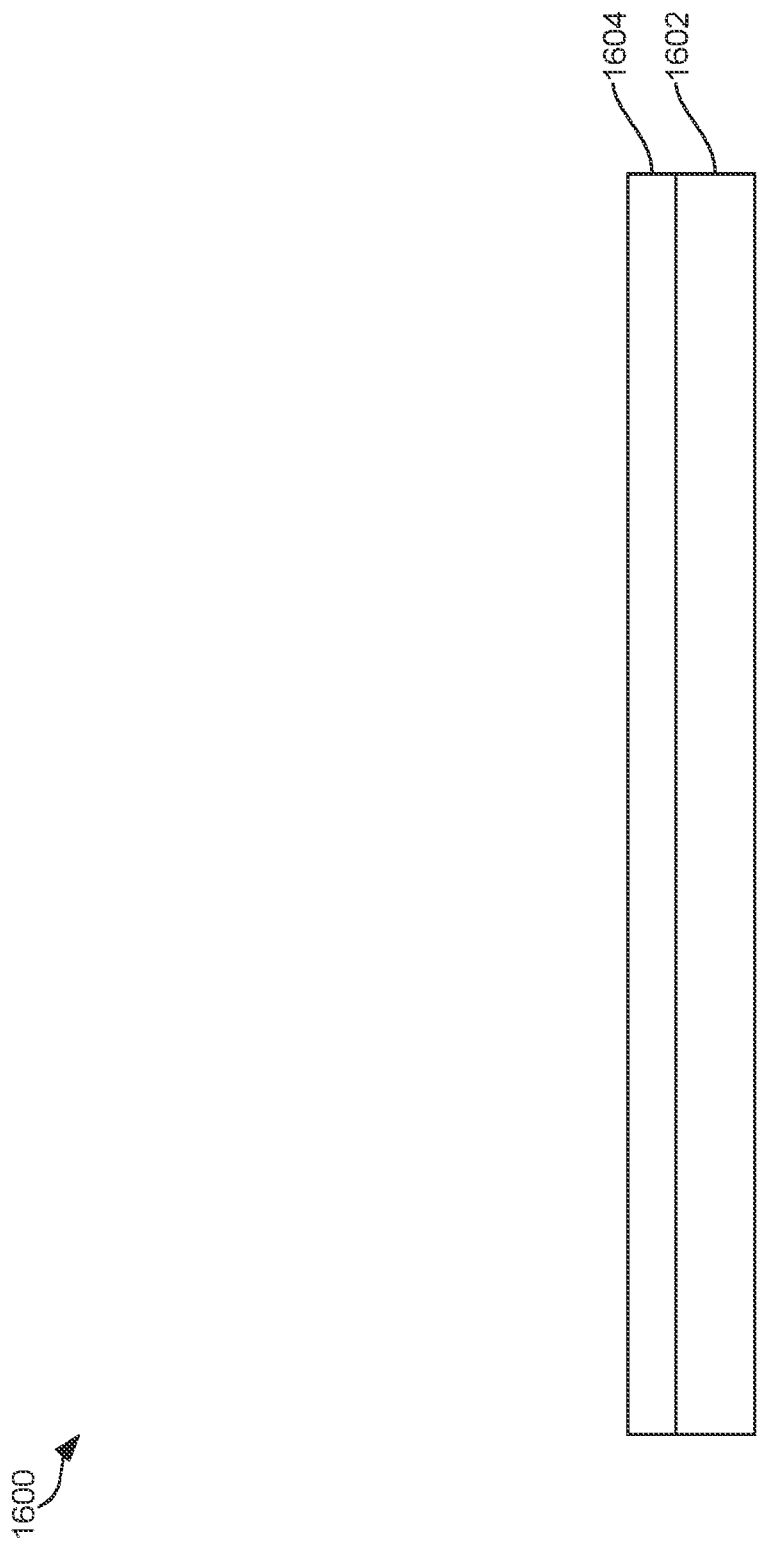
Figure 16D:
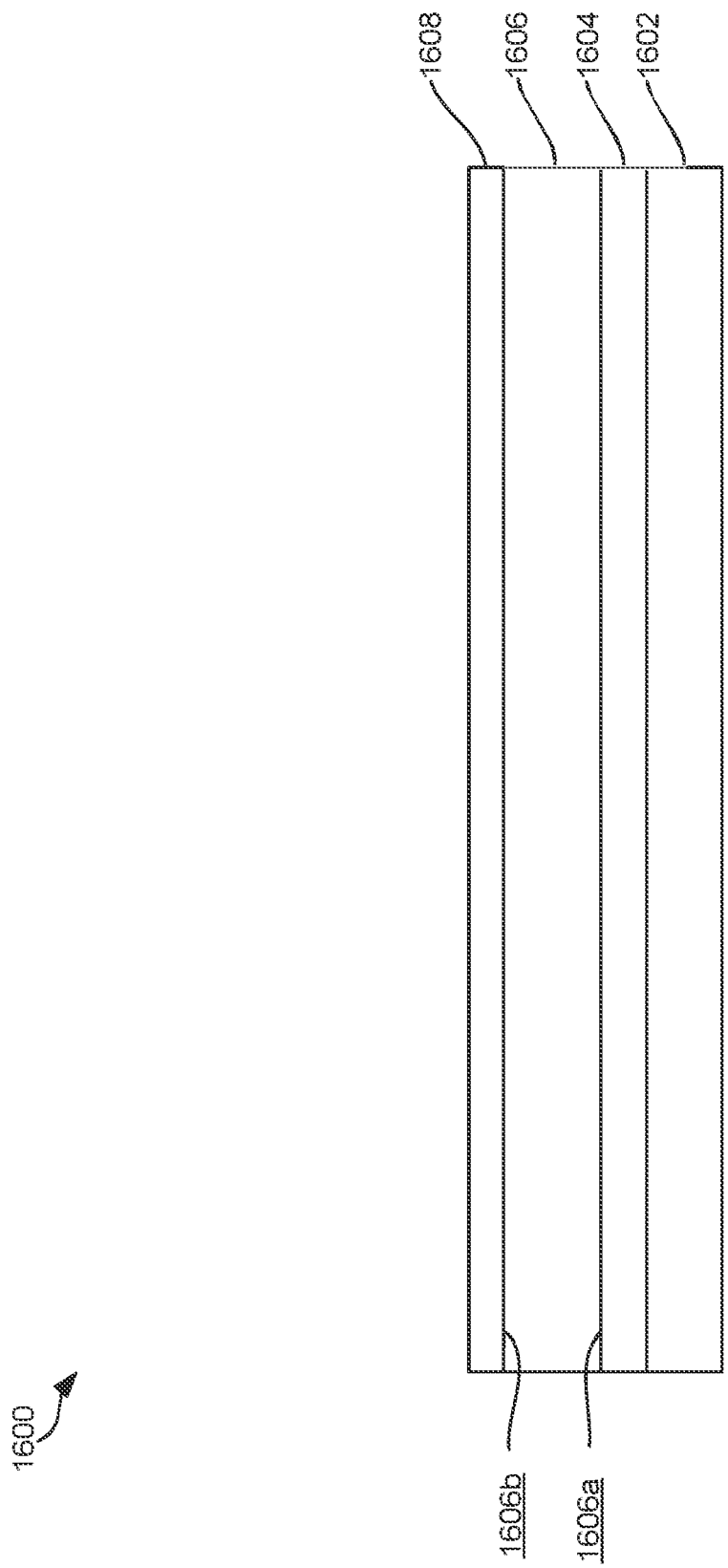
Figure 16E:
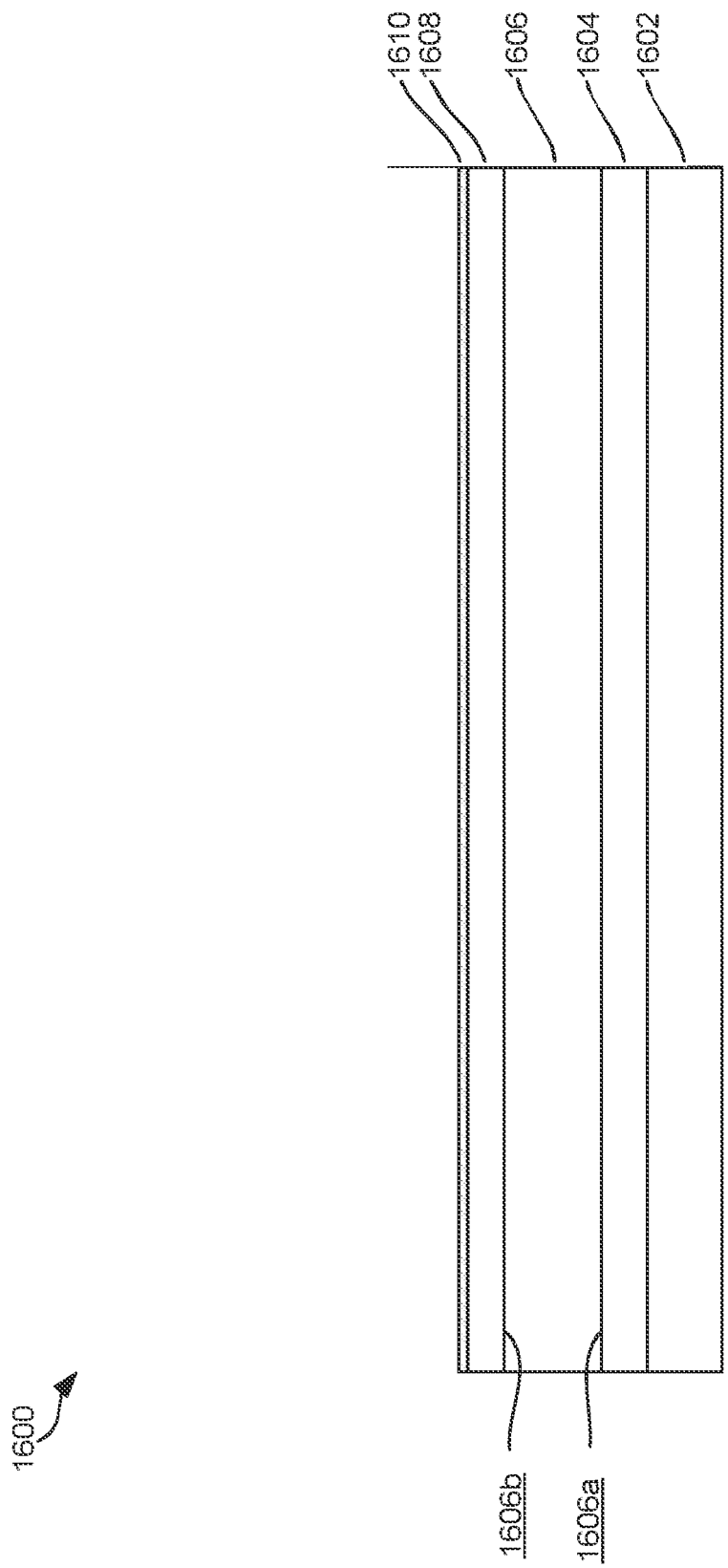
Figure 16G:
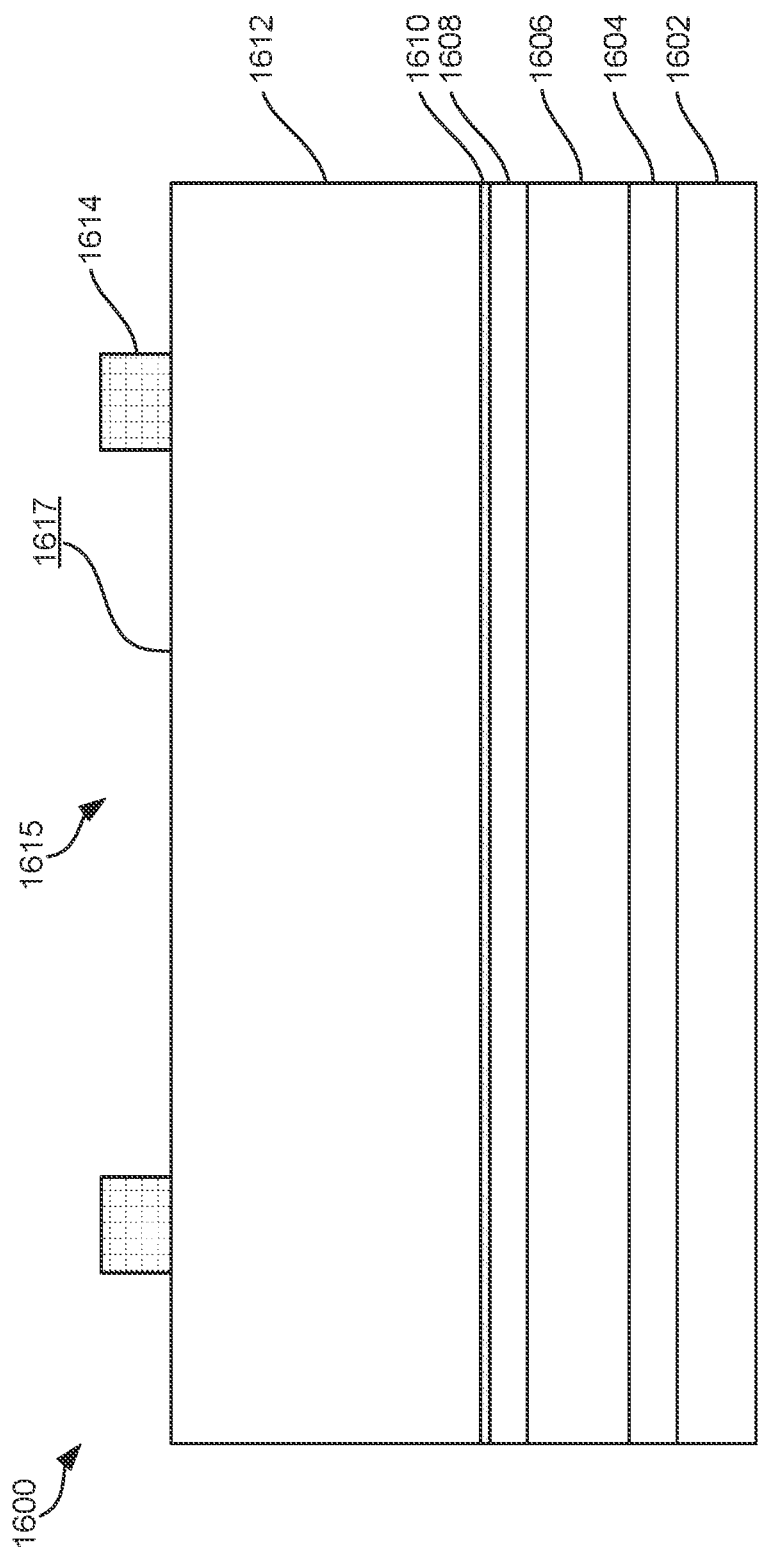
Figure 16H:
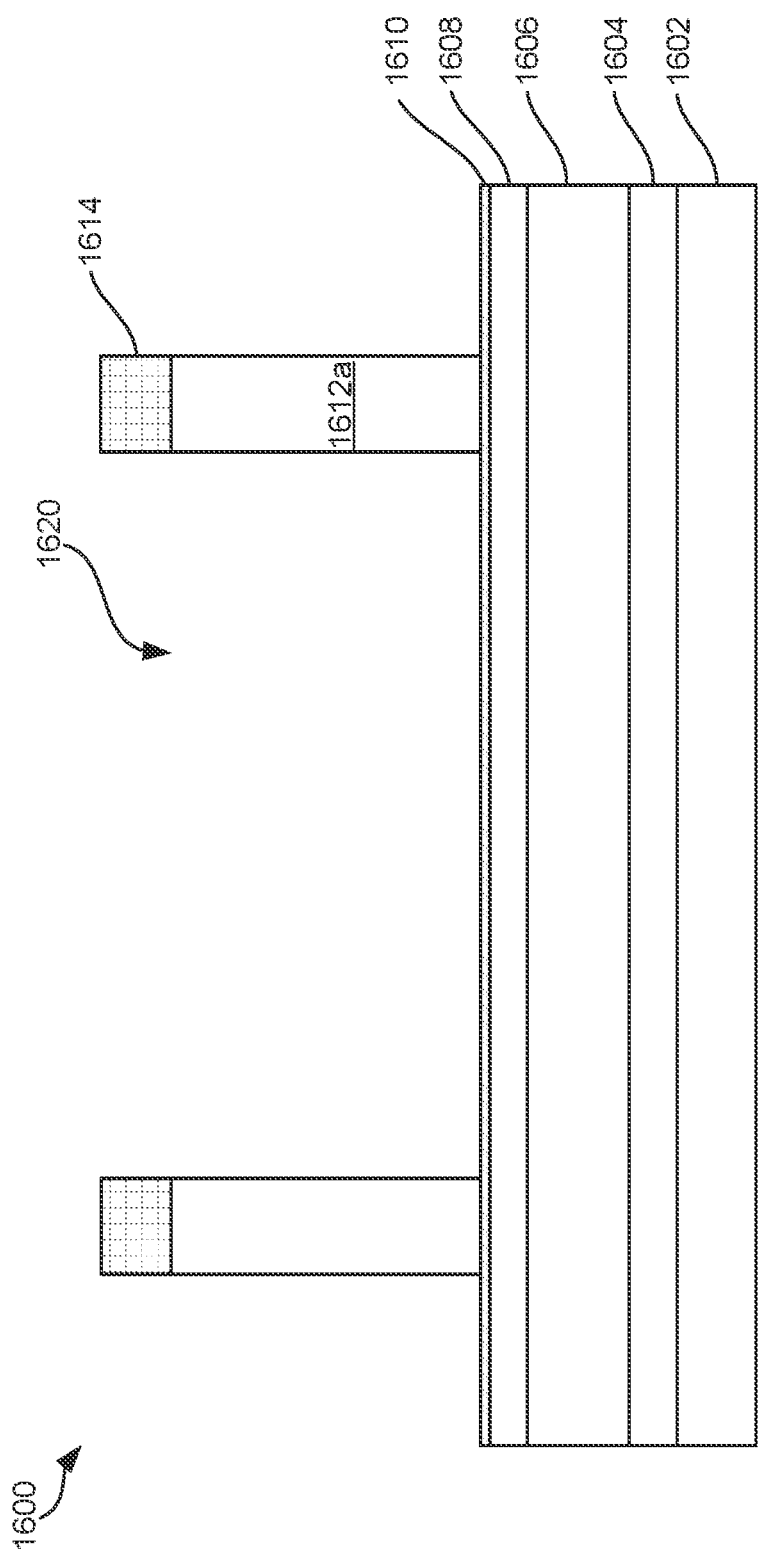
Figure 16I:
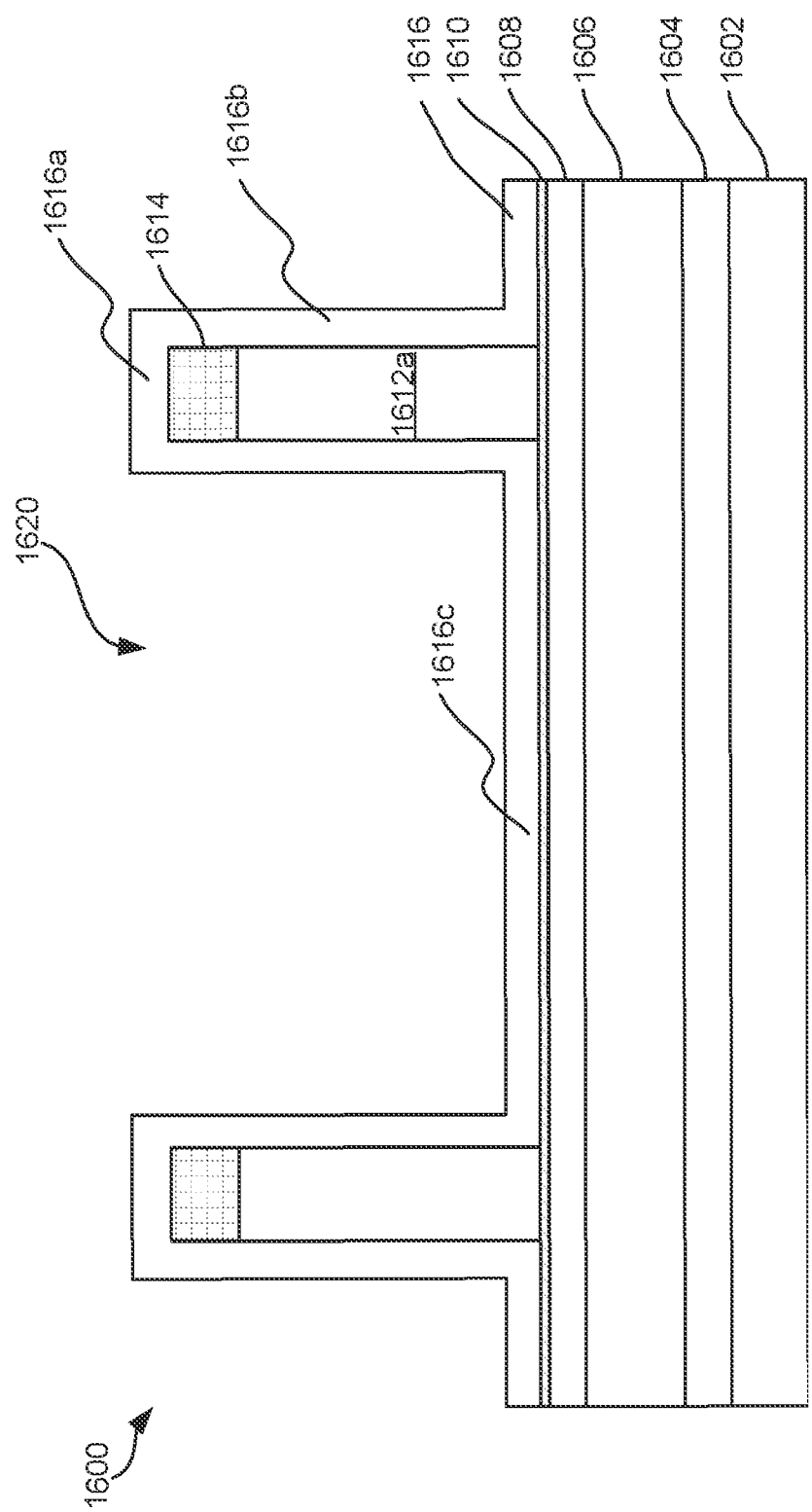
Figure 16J:
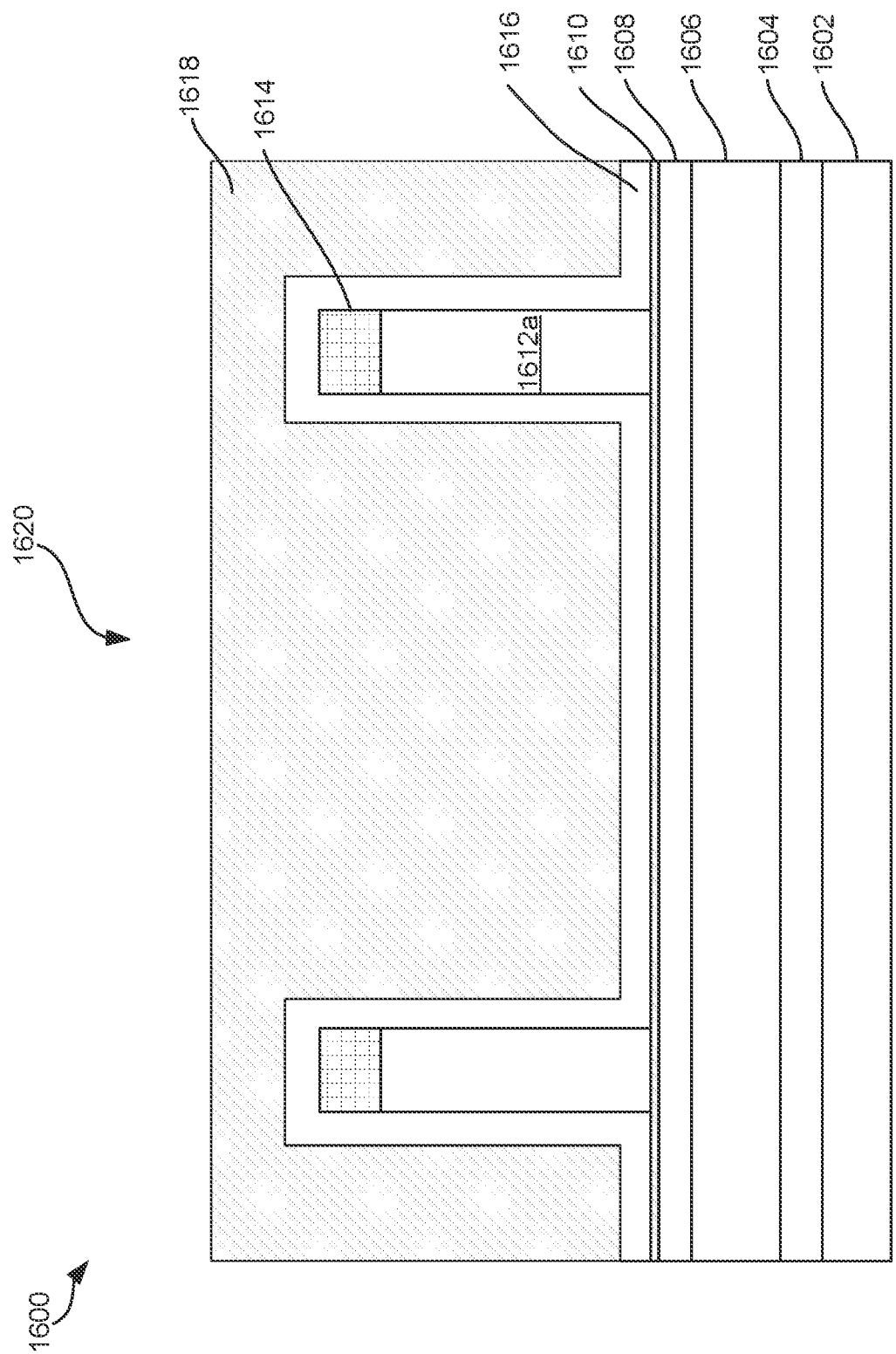
Figure 16K:
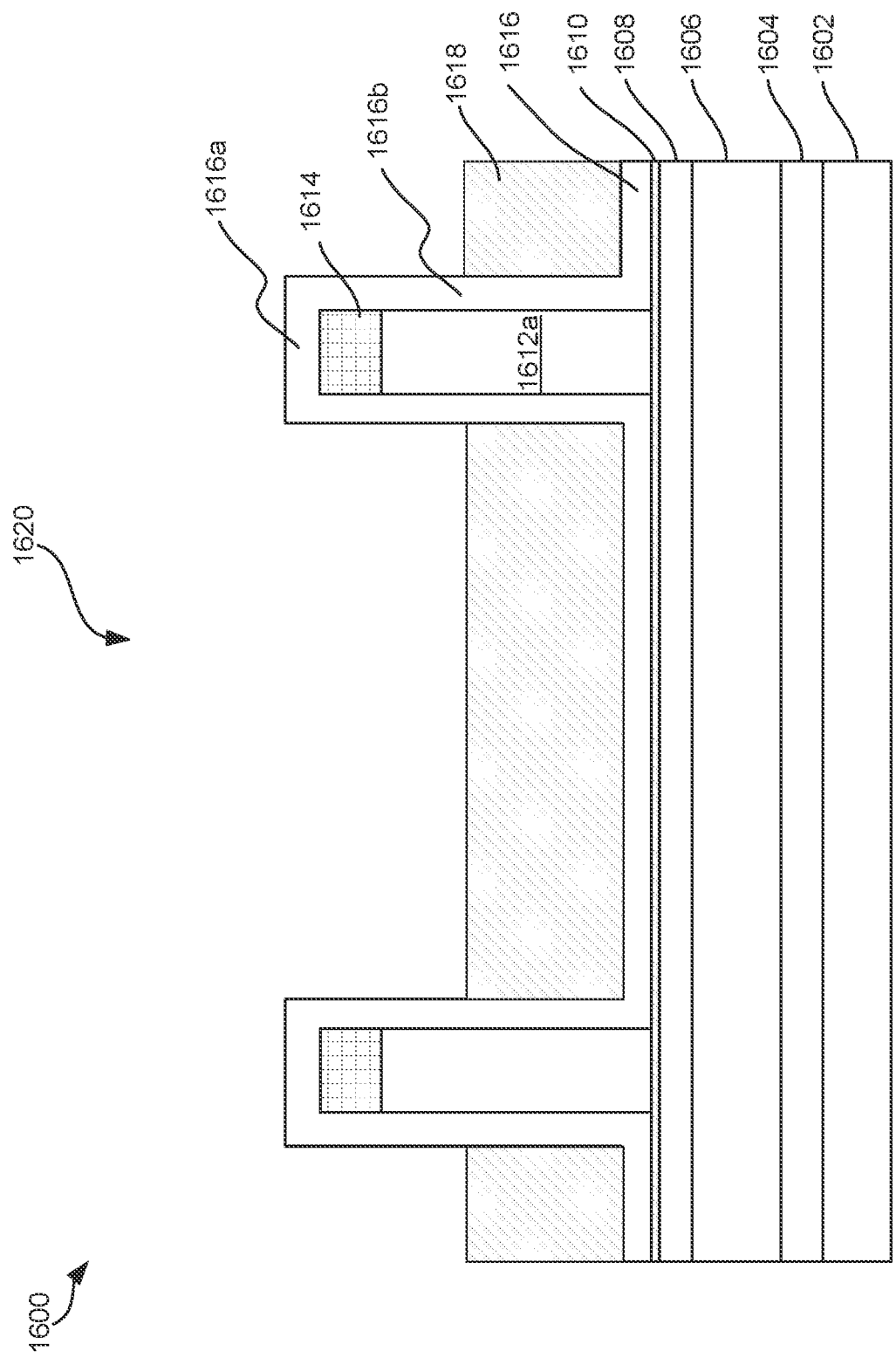
Figure 16L:
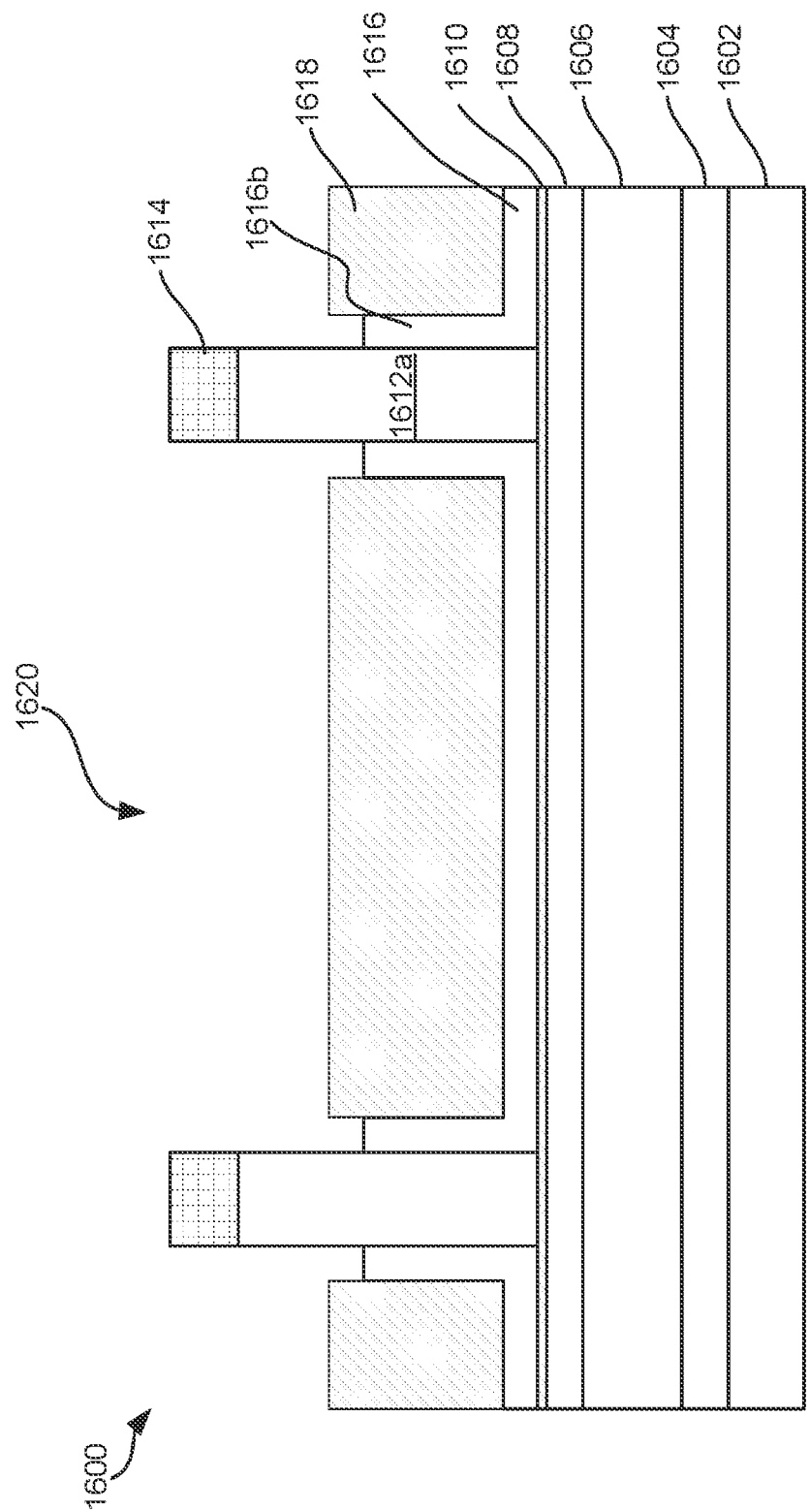
Figure 16M:
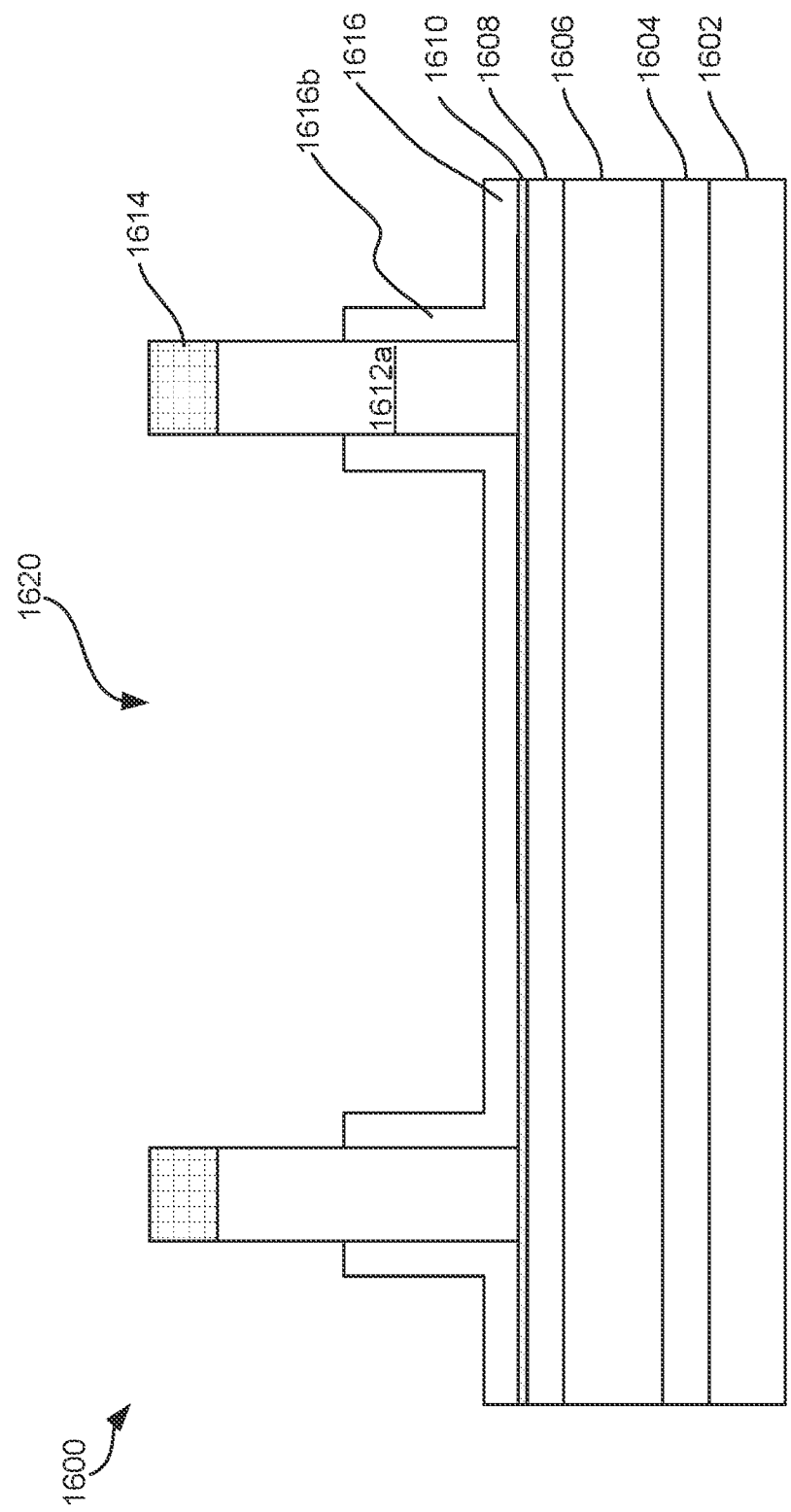
Figure 16N:
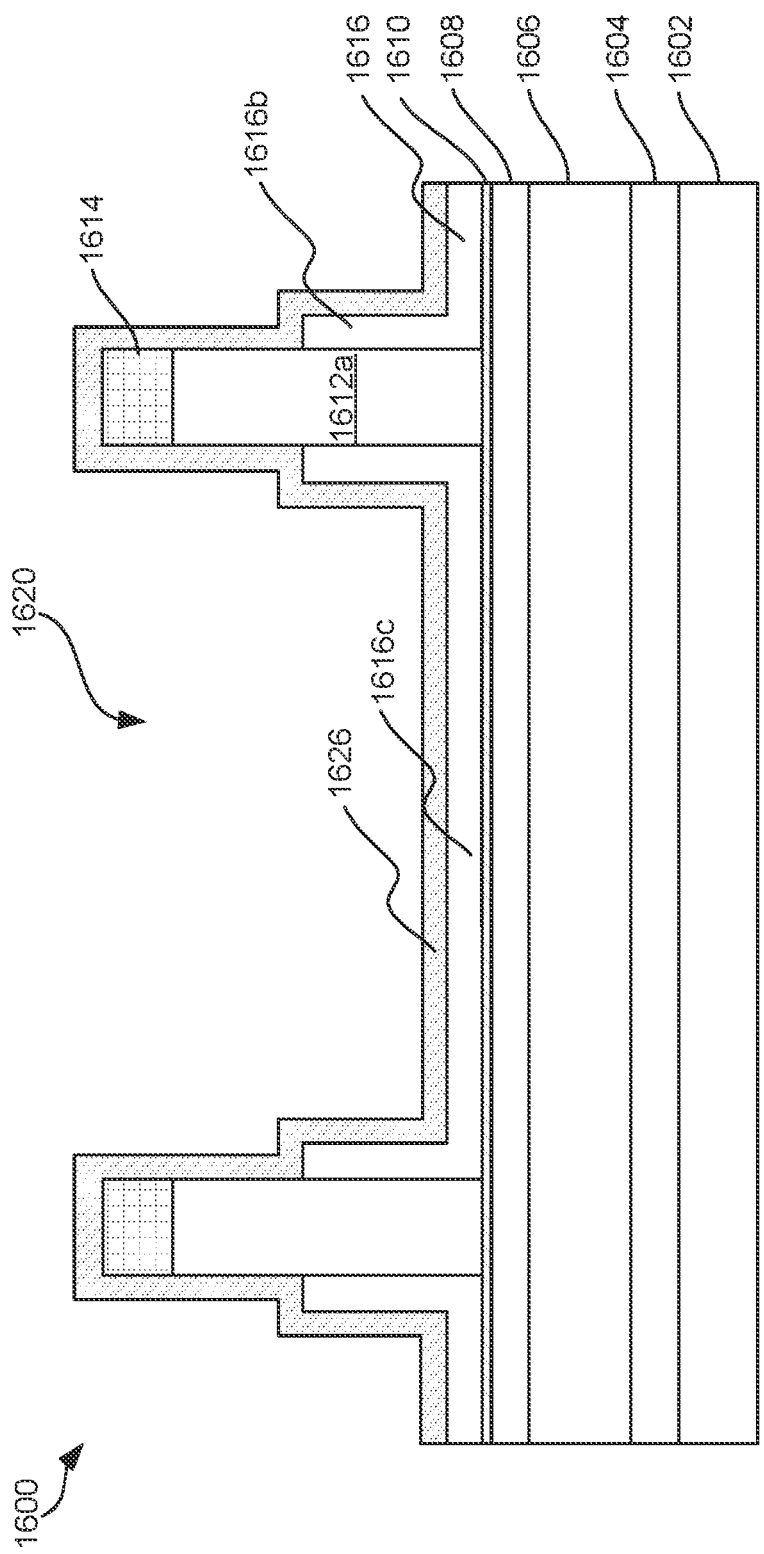
Figure 16O:
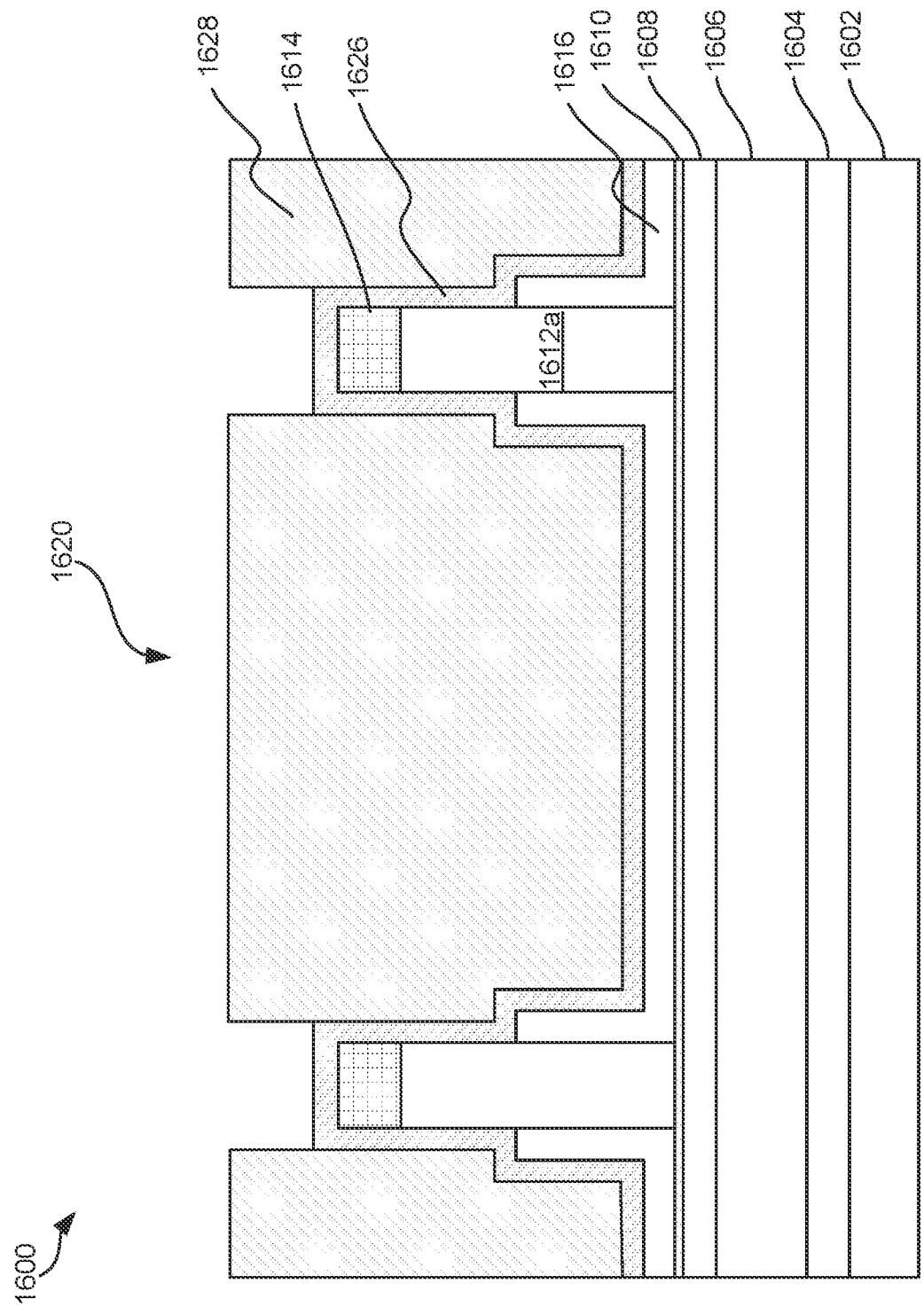
Figure 16P:
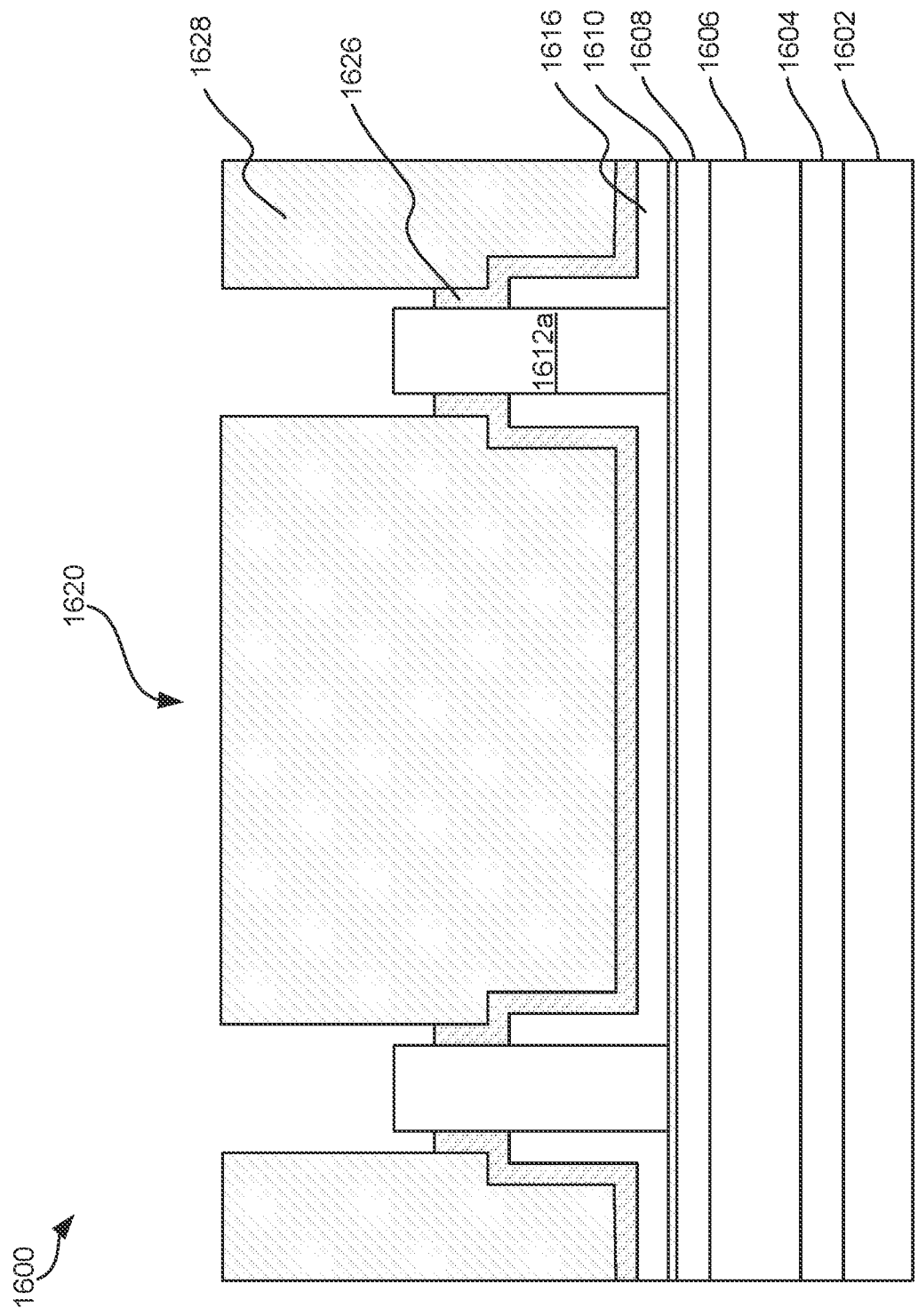
Figure 16Q:
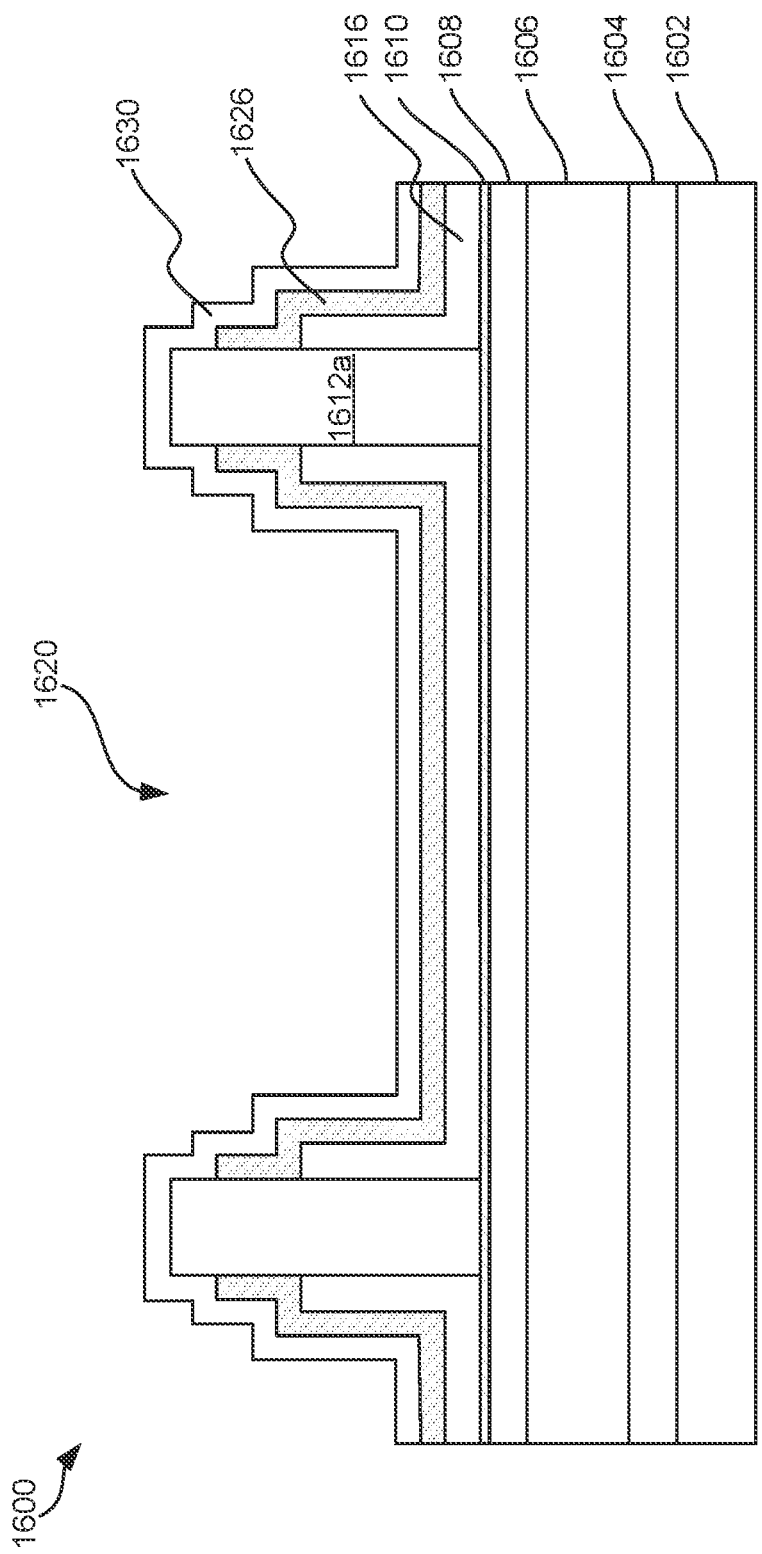
Figure 16R:
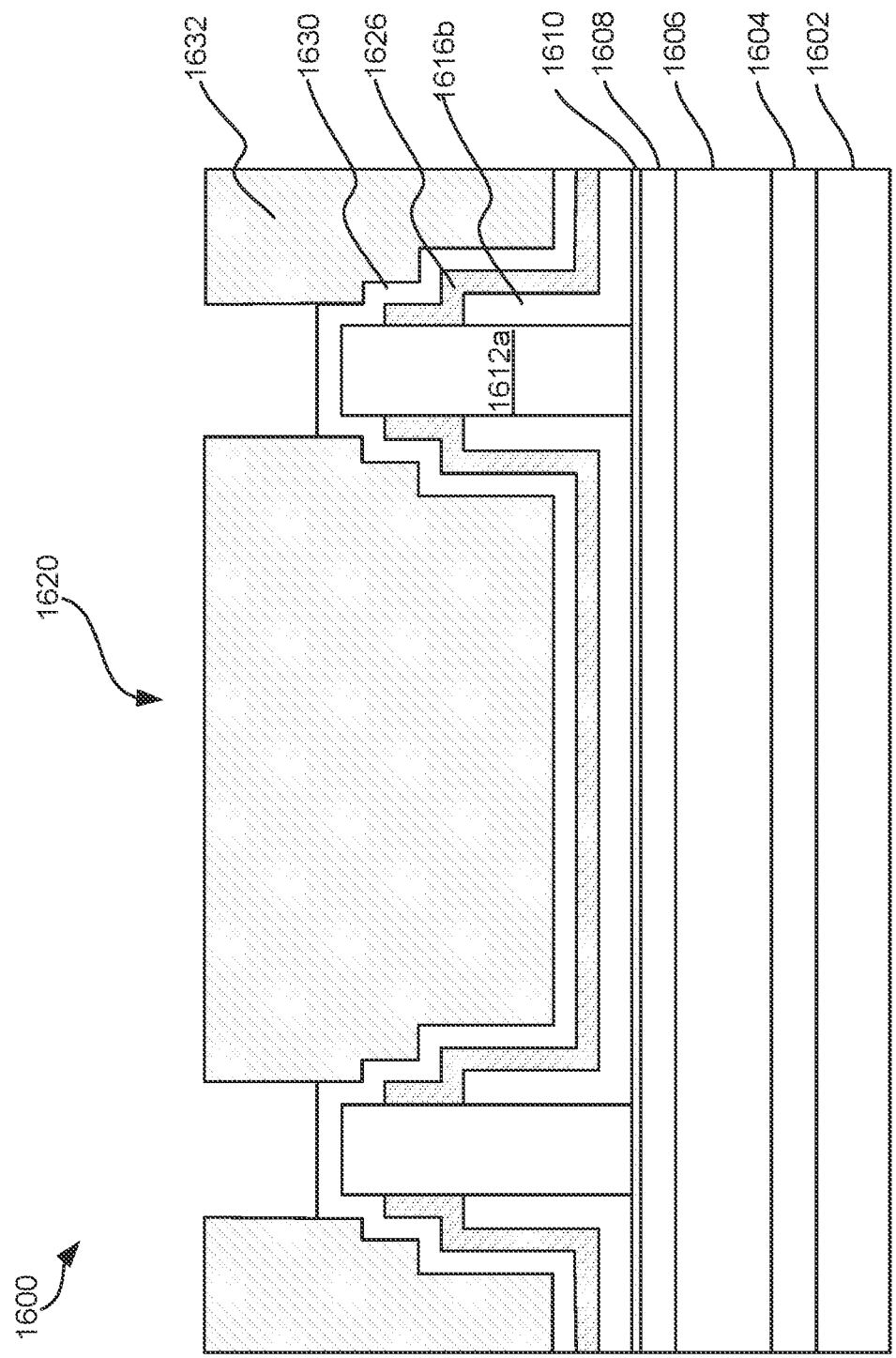
Figure 16S:
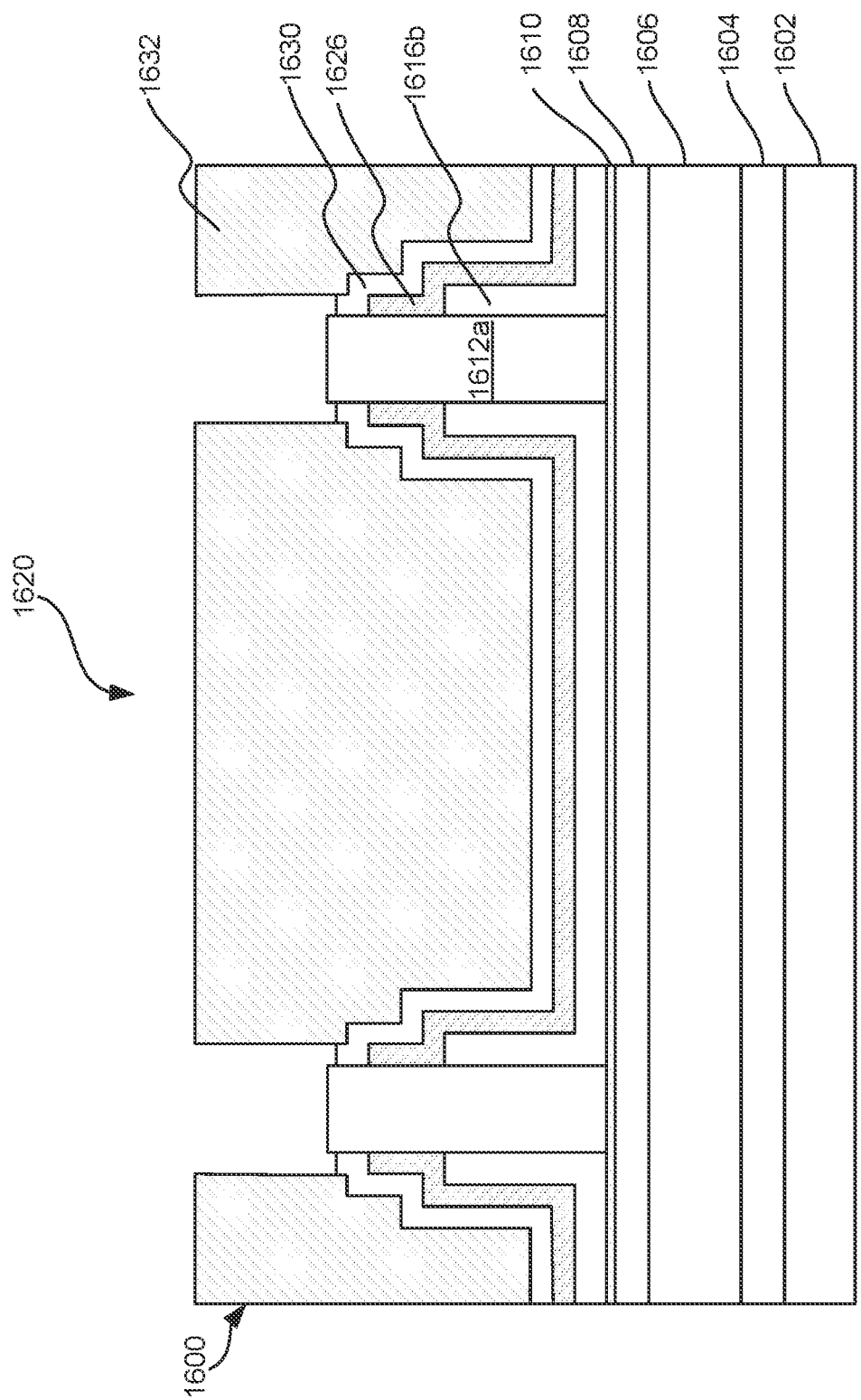
Figure 16T:
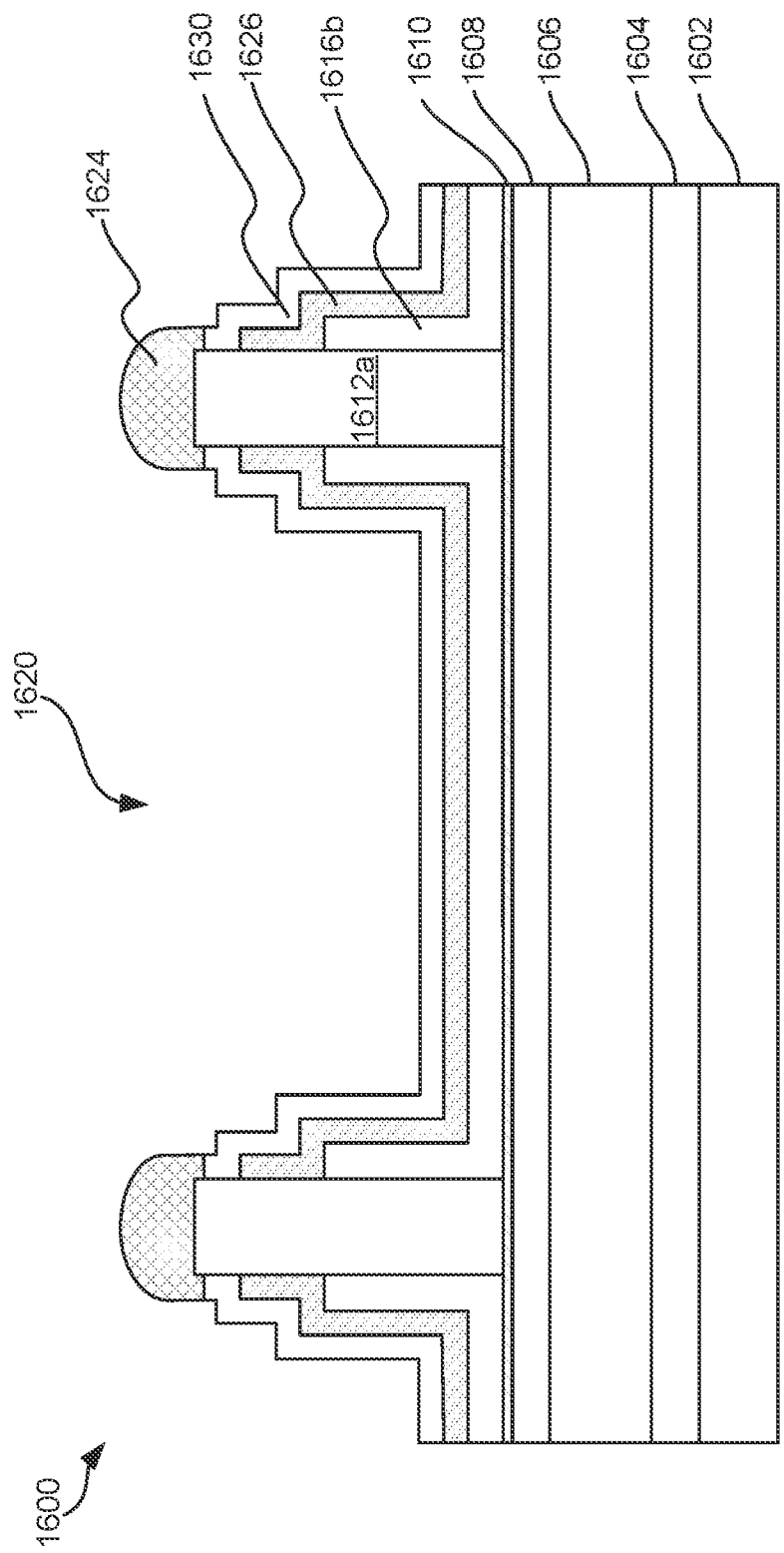
Figure 16U:
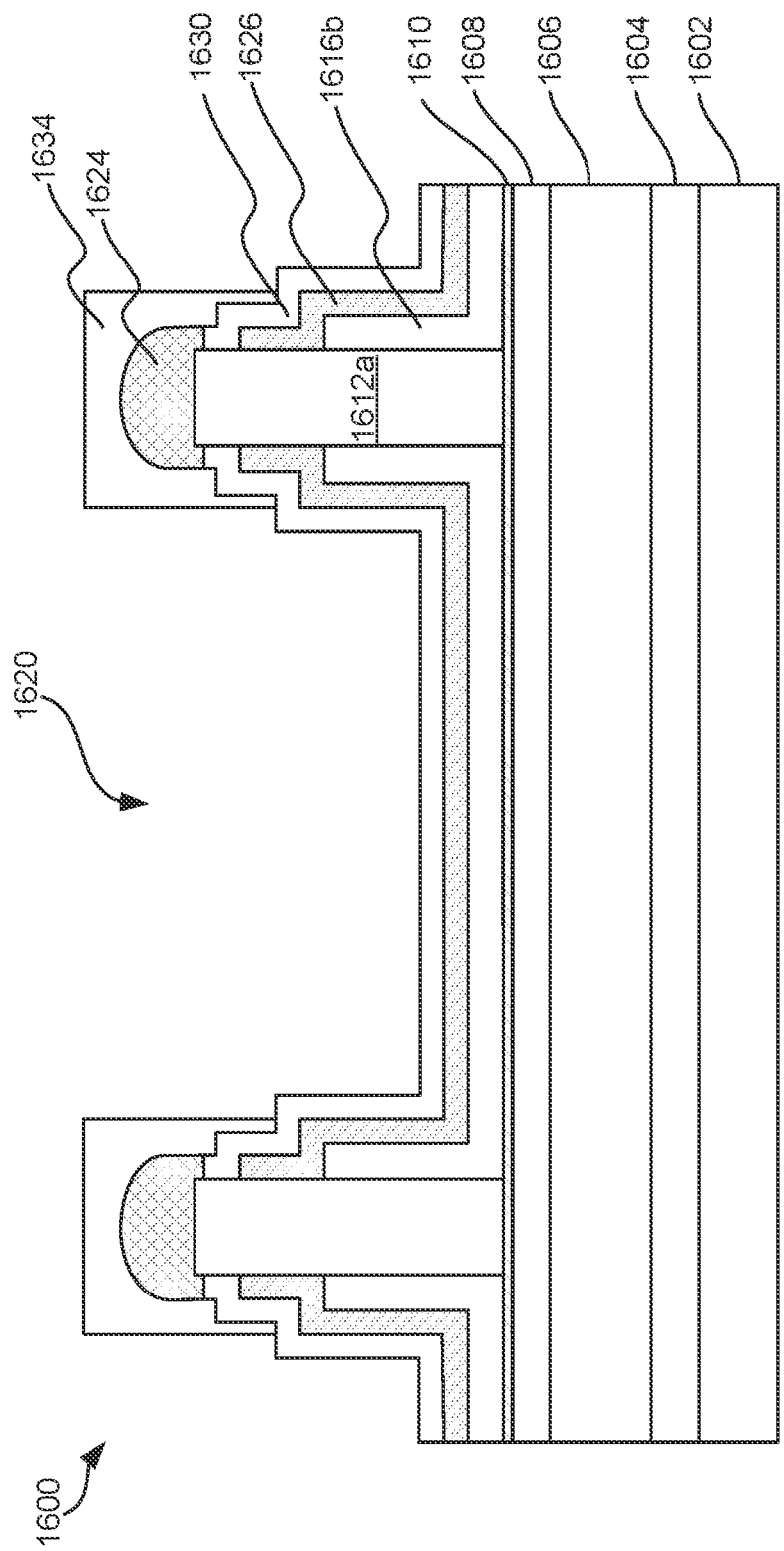
Figure 16V:
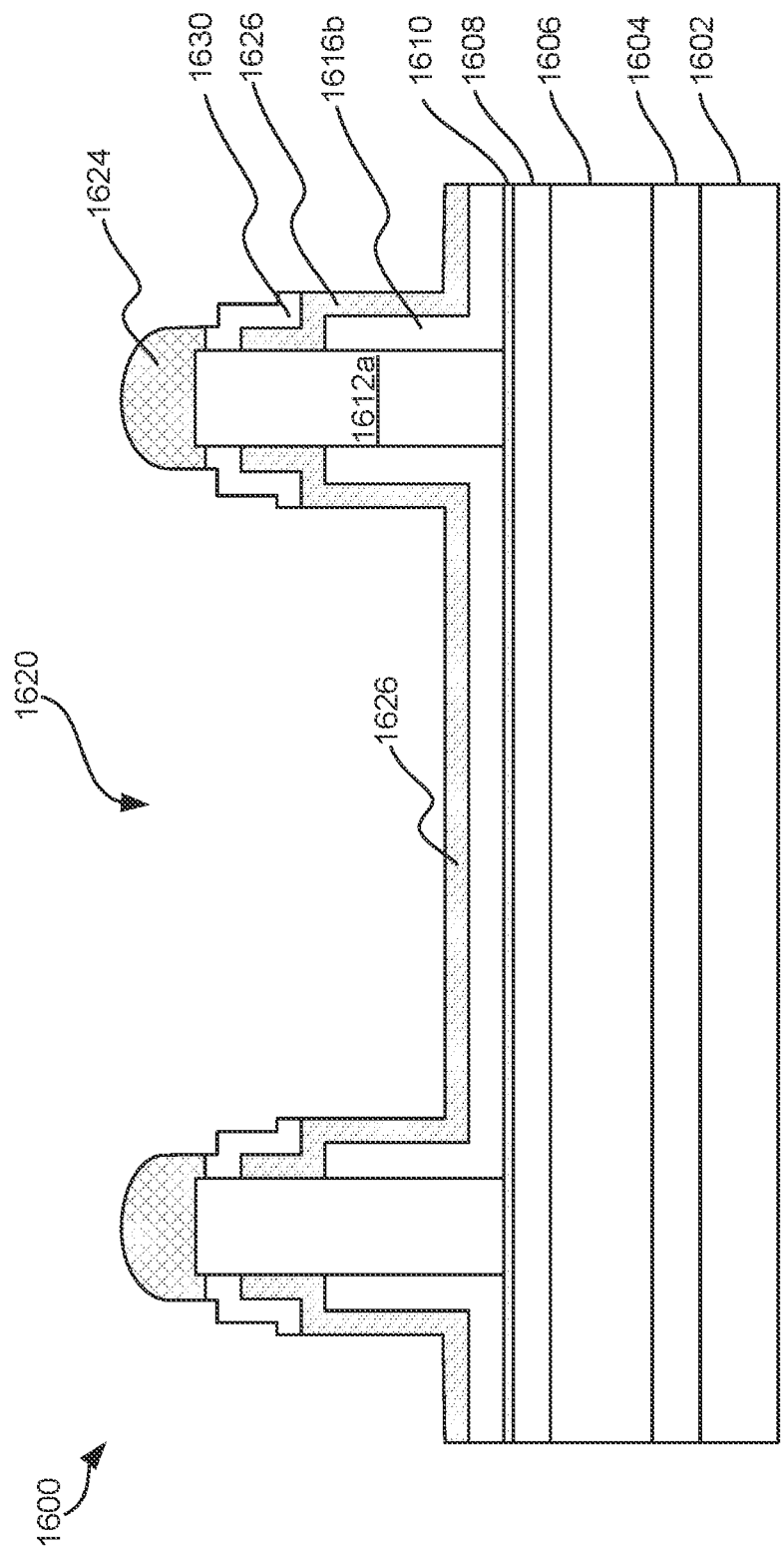

Referring to FIGS. 16A-16V, a method for manufacturing a MOSFET device 1600 is described according to another embodiment of the present invention. FIG. 16A is a partial cross-sectional view illustrating an n+ type doped semiconductor substrate 1602. In one embodiment, the semiconductor substrate 1602 may include III-nitride compounds, such as GaN. In one embodiment, the semiconductor substrate is n+ type doped GaN substrate, having a dopant concentration in a range of about $5 \times 10^{17}$ atoms/cm$^3$ to about $1 \times 10^{19}$ atoms/cm$^3$. In one embodiment, the substrate has a resistivity of less than 0.020 ohm-cm$^2$. Referring to FIG. 16B, an n-type doped first semiconductor layer 1604 is epitaxially grown on semiconductor substrate 1602. In one embodiment, first semiconductor layer 1604 is a GaN layer. Referring to FIG. 16C, an n-type doped second semiconductor layer 1606 is epitaxially grown on first semiconductor layer 1604. In one embodiment, second semiconductor layer 1606 is a GaN layer. In one embodiment, first semiconductor layer 1604 has a dopant concentration of $1 \times 10^{16}$ atoms/cm$^3$. In one embodiment, second semiconductor layer 1606 has a dopant concentration of $7.5 \times 10^{16}$ atoms/cm$^3$. In one embodiment, second semiconductor layer 1606 has a graded dopant concentration between a first side 1606a and a second side 1606b opposite first side 1606a. In one embodiment, the graded dopant concentration is linearly increased from a lower dopant concentration (e.g., $1 \times 10^{16}$ atoms/cm$^3$) at first side 1606a adjacent first semiconductor layer 1604 to a higher dopant concentration (e.g., $7.5 \times 1^{16}$ atoms/cm$^3$) at second side 1606b. In one embodiment, second semiconductor layer 1606 has a thickness of 0.3 μm.

Referring to FIG. 16D, a third semiconductor layer 1608 is epitaxially grown on second semiconductor layer 1606. Third semiconductor layer 1608 is characterized by the first conductivity type. In one embodiment, the dopant concentration of third semiconductor layer 1608 is greater than the dopant concentration of first semiconductor layer 1604. In one embodiment, third semiconductor layer 1608 includes n-type doped GaN with a dopant concentration of $1.3 \times 10^{17}$ atoms/cm$^3$.

Referring to FIG. 16E, a marker layer 1610 is deposited on third semiconductor layer 1608. In one embodiment, the marker layer 1610 may comprise a GaN layer incorporating a metallurgical concentration of silicon of $1 \times 10^{19}$ atoms/cm$^3$. In another embodiment, the marker layer 1610 may comprise an AlGaN layer incorporating a metallurgical concentration of aluminum of $1.3 \times 10^{17}$ atoms/cm$^3$. In another embodiment, the marker layer 1610 may comprise an InGaN layer incorporating a metallurgical concentration of indium of $1 \times 10^{17}$ to $1 \times 10^{19}$ atoms/cm$^3$. In one embodiment, the marker layer 1610 may have a thickness in a range of 1-10 nm, preferably 3-8 nm. In an exemplary embodiment, the marker layer 1610 has a thickness of 5 nm. In one embodiment, vertical JFET device 1600 may omit third semiconductor layer 1608. In such embodiment, marker layer 1610 is directly deposited on second semiconductor layer 1606.

Referring to FIG. 16F, a fourth semiconductor layer 1612 is epitaxially grown on marker layer 1610. In one embodiment, fourth semiconductor layer 1612 includes n-type doped GaN with a dopant concentration of $1.3 \times 10^{17}$ atoms/cm$^3$ and a thickness of about 0.3 μm-0.7 μm. In one embodiment, the dopant concentration of fourth semiconductor layer 1612 is greater than the dopant concentration of first semiconductor layer 1604. In another embodiment, the dopant concentration of fourth semiconductor layer 1612 is greater than the higher dopant concentration within the graded dopant concentration of second semiconductor layer 1606. In another embodiment, the dopant concentration of fourth semiconductor layer 1612 is equal to or greater than the dopant concentration of third semiconductor layer 1608.

Referring to FIG. 16G, a hardmask layer 1614 is formed on fourth semiconductor layer 1612. Hardmask layer 1614 comprises a set of openings 1615 operable to expose an upper surface portion 1617 of fourth semiconductor layer 1612. Referring to FIG. 16H, an etching process is performed using hardmask layer 1614 as a mask to form a plurality of fins 1612a within fourth semiconductor layer 1612. Each of the fins 1612a is separated by one of a plurality of recess regions 1620 formed by the etching process. As shown in FIG. 16H, the etching process is monitored to detect when the etching process reaches marker layer 1610. In one embodiment, the etching process is monitored to detect etching of at least a portion of marker layer 1610. In one embodiment, the detection process may be conducted by standard methods (e.g., end point detectors). In one embodiment using silicon layer as the marker layer, a spike of silicon dopant is readily detectable. In another embodiment using AlGaN layer as the marker layer, the Al dopant is readily detectable. In another embodiment using an In-doped layer, the In dopant is readily detectable.

For clarification of illustration, the etching process in the below examples may stop once it is detected that the etching process has reached marker layer 1610. One of ordinary skill in the art would understand that the present invention is not limited to such examples. The etching process may be finely controlled to achieve a predetermined etch depth in a target doping layer, as described above referring to FIG. 6D. For clarity of description and illustration, the below examples are described using a single recess region 1620 or a single fin 1612a. One of ordinary skill in the art would understand that the relevant description with respect to one recess region 1620 or one fin 1612a equally applies to all recess regions 1620 or fins 1612a unless it is otherwise expressly described.

In one embodiment, after forming the recess regions, a cleaning process is carried using a TMAH solution of about 25% by weight, at a temperature of about 85° C., and for a duration of about 30 minutes. In another embodiment, prior to performing a cleaning using the TMAH solution, a pre-cleaning, such as piranha clean using an $H_2SO_4:H_2O_2$ in a volume ratio 2:1 for two minutes, may also be performed.

Referring to FIG. 16I, a dielectric spacer layer 1616 is deposited on hardmask layer 1614 and the plurality of recess region 1620. In one embodiment, dielectric spacer layer 1616 is deposited to be conformal to hardmask layer 1614 and the sidewalls of fins 1612a. For example, as shown in FIG. 16I, dielectric spacer layer 1616 may include a first portion 1616a on top of hardmask layer 1614, a second portion 1616b conformal to the side walls of the plurality of fins 1612a, and a third portion 1616c coupled to the plurality of recess regions 1620. In some embodiments, dielectric spacer layer 1616 may include TiOx. In some embodiments, dielectric spacer layer 1616 may be deposited using a thermal ALD process. In some embodiments, dielectric spacer layer 1616 may have a thickness in the range of about 3 nm-8 nm.

Referring to FIG. 16J, a first photoresist layer 1618 is formed on dielectric spacer layer 1616 to planarize the plurality of recess regions 1620. In some embodiments, first photoresist layer 1618 protects a portion of dielectric spacer layer 1616 disposed within the plurality of recess regions 1620 from subsequent processing.

Referring to FIG. 16K, an etching process is performed on first photoresist layer 1618 to etch back first photoresist layer 1618 to expose dielectric spacer layer 1616 on top of hardmask layer 1614. Specifically, first portion 1616a of dielectric spacer layer 1616 and a portion of second portion 1616b of dielectric spacer layer 1616 are exposed.

Referring to FIG. 16L, the portion of dielectric spacer layer 1616 on top of hardmask layer 1614 and the exposed portion of dielectric spacer layer 1616 on the sidewall are removed to expose fourth semiconductor layer 1612. Specifically, first portion 1616a of dielectric spacer layer 1616 and a portion of second portion 1616b of dielectric spacer layer 1616 are removed. In one embodiment, the portion of second portion 1616b of dielectric spacer layer 1616 may be removed to make the remaining portion of second portion 1616b lower than the upper surface of the remaining portion of first photoresist layer 1618.

Referring to FIG. 16M, first photoresist layer 1618 is stripped off dielectric spacer layer 1616. Then, referring to FIG. 16N, a gate dielectric layer (not shown) and gate metal layer 1626 are formed on fourth semiconductor layer 1612 on the sidewall. For clarification, the gate dielectric layer is omitted in the below description. In some embodiments, the gate dielectric may be formed from $Al_2O_3$. In some embodiments, the gate dielectric may be formed from $SiO_2$. In some embodiments, the gate dielectric may be formed from silicon nitride. Specifically, the gate dielectric layer and gate metal layer 1626 are formed to be conformal to the top of hardmask layer 1614, a portion of the sidewall of fins 1612a that is exposed, second portion 1616b of dielectric spacer layer 1616, and third portion 1616c of dielectric spacer layer 1616 within the plurality of recess regions 1620. In some embodiments, the fins 1612a are n-type GaN, and the gate metal layer 1626 has a work function such that the fins 1612a are depleted in the region where the sidewall was exposed after the etch of dielectric spacer. In some embodiments, the gate metal layer is one of molybdenum, tungsten, or tantalum.

Referring to FIG. 16O, a second photoresist layer 1628 is masked and patterned to expose a portion of gate metal layer 1626. In some embodiments, second photoresist layer 1628 is masked and patterned within the plurality of recess regions 1620, exposing a portion of gate metal layer 1626 on top of the plurality of fins 1612a. In some embodiments, second photoresist layer 1628 may protect gate metal layer 1626 within the plurality of recess regions 1620 from subsequent processing.

Referring to FIG. 16P, an etching process is performed using second photoresist layer 1628 as a mask to etch gate metal layer 1626, the gate dielectric layer (not shown), and hardmask layer 1614, stopping on fourth semiconductor layer 1612. Specifically, the upper portion of the plurality of fins 1612a is exposed. In some embodiments, the etching process removes more material from gate metal layer 1626 in the thickness direction than the amount of material that is removed from fin 1612a.

Referring to FIG. 16Q, a second dielectric layer 1630 is deposited on the exposed gate metal layer 1626 and fourth semiconductor layer 1612. Specifically, second dielectric layer 1630 is formed on cover gate metal layer 1626 within the plurality of recess regions 1620 and the upper portion of the plurality of fins 1612a.

Referring to FIG. 16R, a third photoresist layer 1632 is formed on second dielectric layer 1630. In some embodiments, third photoresist layer 1632 is patterned to expose a portion of second dielectric layer 1630 on top of the plurality of fins 1612a.

Referring to FIG. 16S, an etching process is performed using third photoresist layer 1632 as a mask to etch back second dielectric layer 1630 to expose fourth semiconductor layer 1612. Specifically, the etching process is performed to etch back the portion of second dielectric layer 1630 on top of the plurality of fins 1612a, to expose the upper portion of the plurality of fins 1612a. In some embodiments, the etching process removes more material from second dielectric layer 1630 in the thickness direction than the amount of material that is removed from fin 1612a. Then, third photoresist layer 1632 is removed.

Referring to FIG. 16T, a source metal layer 1624 is formed on fourth semiconductor layer 1612 and second dielectric layer 1630, which can be an oxide layer. Specifically, source metal layer 1624 is formed on the upper portion of the plurality of fins 1612a and also coupled to second dielectric layer 1630. In some embodiments, source metal layer 1624 may include a refractory metal, a refractory metal compound (e.g., TiN), or a refractory metal alloy (e.g., TiAlx).

Referring to FIG. 16U, a fourth photoresist layer 1634 is formed on source metal layer 1624. Specifically, fourth photoresist layer 1634 is patterned to expose a portion of second dielectric layer 1630 within the plurality of recess regions 1620.

Referring to FIG. 16V, an etching process is performed using fourth photoresist layer 1634 as a mask to etch second dielectric layer 1630 to expose gate metal layer 1626. Specifically, the etching process is performed to etch the portion of second dielectric layer 1630 within the plurality of recess regions 1620 to expose gate metal layer 1626 within the plurality of recess regions 1620.

The above FIGS. 16A-16V form a MOSFET with a gate controlling a section of fin 1612a in such a manner that the fin is initially fully depleted. With an n-type fin, as the gate voltage is made more positive, the depletion of the fin is reduced, and vertical conduction from source metal layer 1624 to substrate 1602 can occur. As the gate voltage is further increased, an accumulation region of electrons forms on the sidewall of fin 1612a to further improve the conductance between source metal layer 1624 and substrate 1602. The resulting MOSFET operates in a normally-off state, with combination of bulk conduction and accumulation-layer conduction in the "on" state.

It will be recognized that a rearrangement of layers, particularly with layer 1608, can result in a conventional enhancement-mode MOSFET. Specifically, if the upper portion of layer 1608 is n-type, and the lower portion of layer 1608 is p-type, a MOSFET is formed such that the conducting channel arises by "inverting" the conduction of the sidewall surface of the p-type region as the gate voltage is increased. The resulting surface electron layer enables conduction between source metal layer 1624 and substrate 1602.

Figure 17:
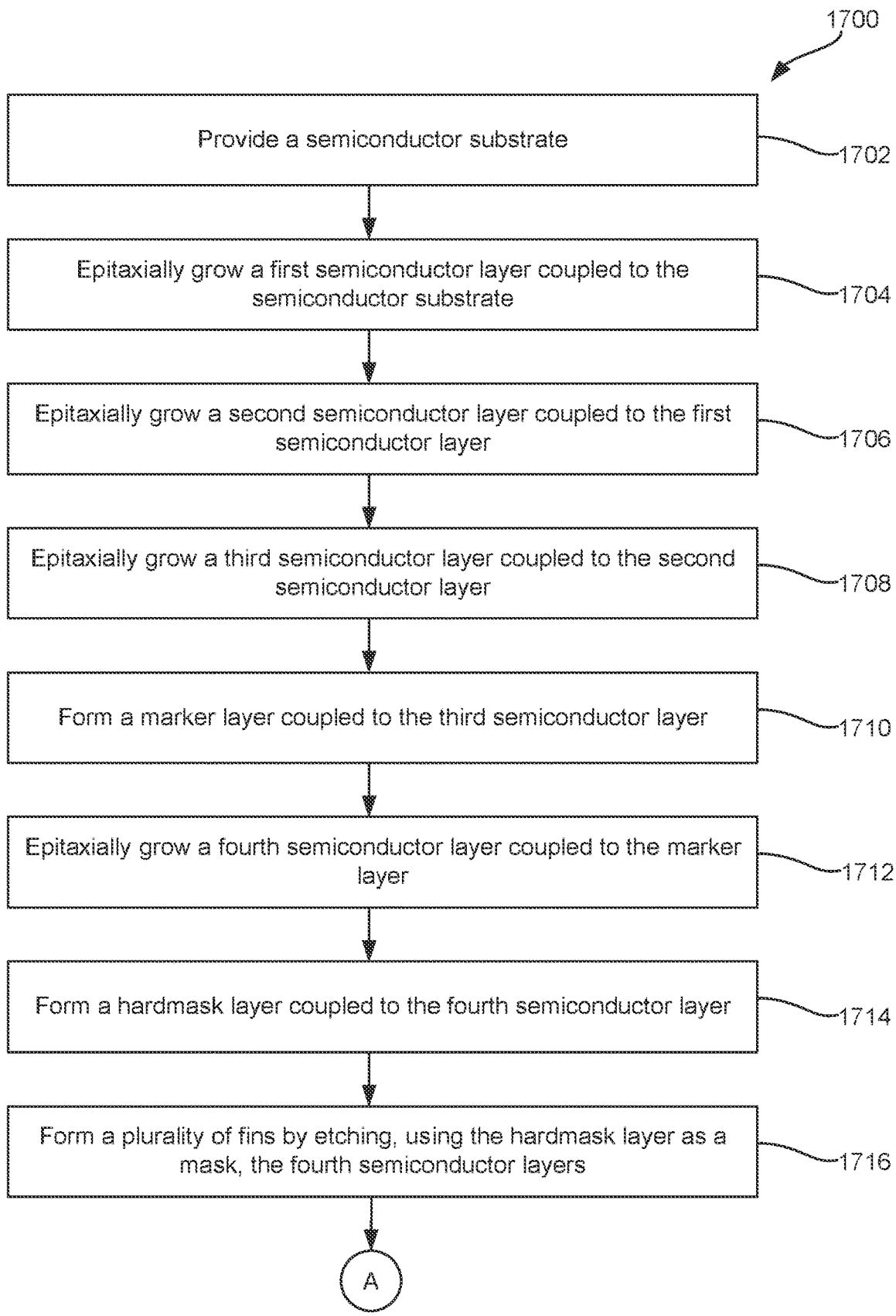
FIG. 17 is a simplified flowchart showing a method of manufacturing a MOSFET device according to another embodiment of the present invention.
Figure 17:
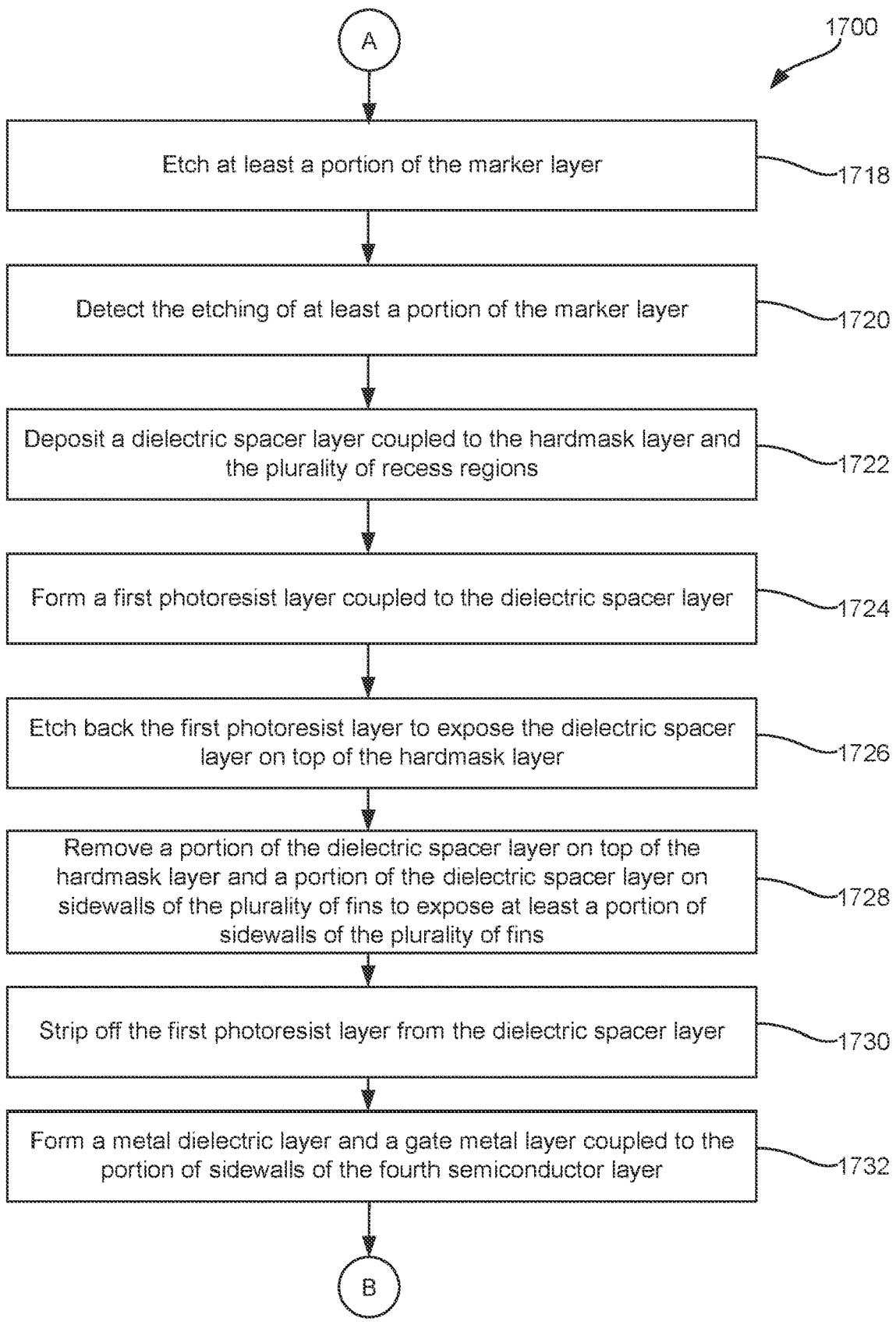
Figure 17:
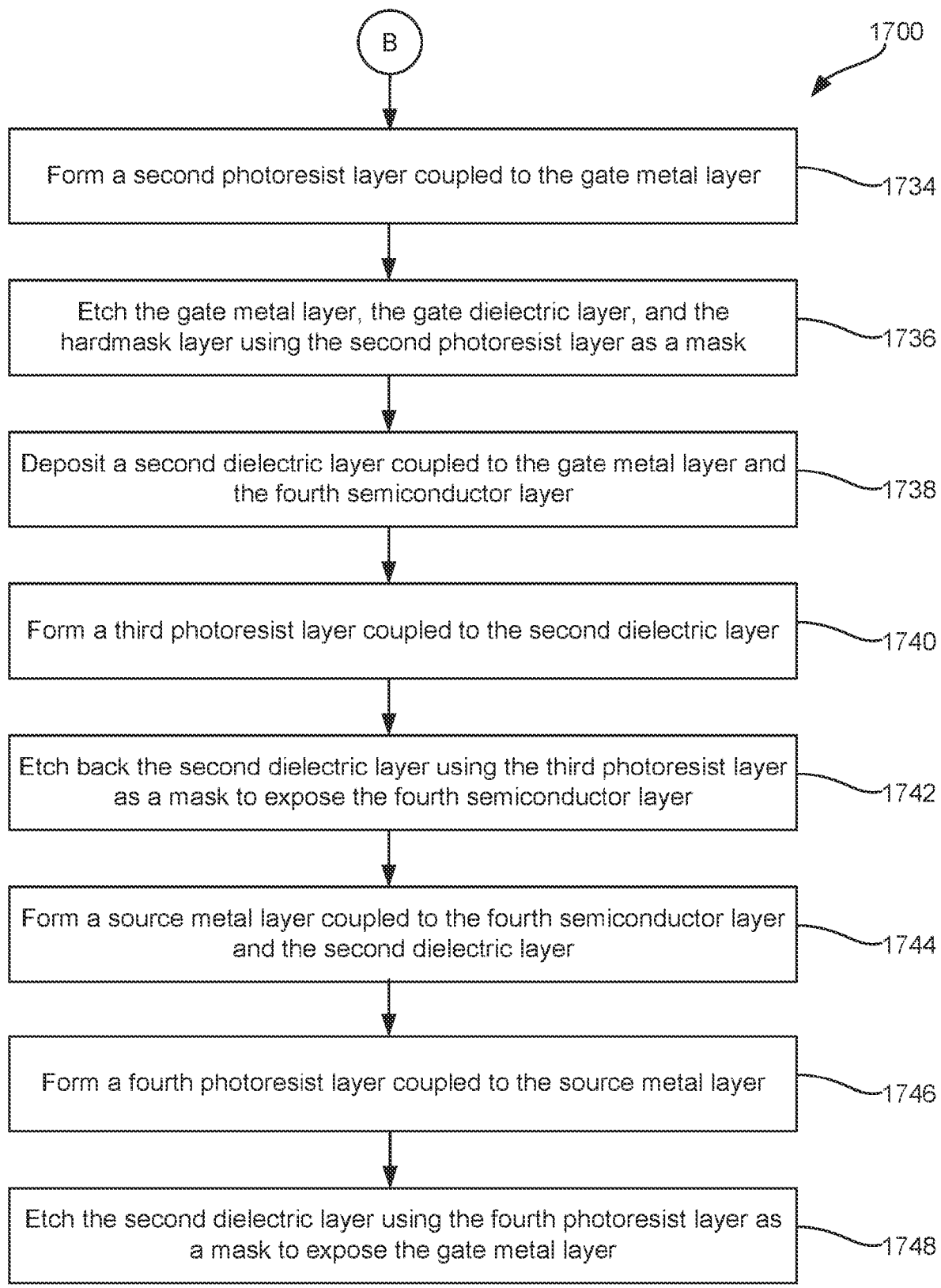

FIG. 17 is a simplified flowchart illustrating a method 1700 for manufacturing a MOSFET device according to another embodiment of the present invention. Referring to FIG. 17, method 1700 may include providing a semiconductor substrate (1702). In one embodiment, the semiconductor substrate may include III-nitride compounds, such as GaN. In one embodiment, the semiconductor substrate is n+ type doped GaN substrate, having a dopant concentration in a range of about $5 \times 10^{17}$ atoms/cm³ to about $1 \times 10^{19}$ atoms/cm³ and a resistivity of less than 0.020 ohm-cm². A first semiconductor layer is epitaxially grown on the semiconductor substrate (1704). In one embodiment, the first semiconductor layer is characterized by a first conductivity type and a first dopant concentration. In one embodiment, the first semiconductor layer may include n-type doped GaN with a dopant concentration of about $1 \times 10^{16}$ atoms/cm³.

Method 1700 may further include epitaxially growing a second semiconductor layer coupled to the first semiconductor layer, wherein the second semiconductor layer is characterized by the first conductivity type (1706). In one embodiment, the second semiconductor layer is further characterized by a graded dopant concentration between a first side and a second side opposite the first side. In one embodiment, the second semiconductor layer includes n-type doped GaN, and the graded dopant concentration is linearly increased from a lower dopant concentration (e.g., $1 \times 10^{16}$ atoms/cm³) at the first side adjacent the first semiconductor layer to a higher dopant concentration (e.g., $7.5 \times 10^{16}$ atoms/cm$^3$) at the second side. In one embodiment, the second semiconductor layer has a thickness of 0.3 µm.

Method 1700 may further include epitaxially growing a third semiconductor layer coupled to the second semiconductor layer, wherein the third semiconductor layer is characterized by the first conductivity type (1708). In one embodiment, the third semiconductor layer may include n-type doped GaN with a dopant concentration of $1.3 \times 10^{17}$ atoms/cm$^3$. In one embodiment, the dopant concentration of the third semiconductor layer is greater than the first dopant concentration of the first semiconductor layer. In another embodiment, the dopant concentration (e.g., $1.3 \times 10^{17}$ atoms/cm$^3$) of the third semiconductor layer is greater than the higher dopant concentration (e.g., $7.5 \times 10^{16}$ atoms/cm$^3$) within the graded dopant concentration of the second semiconductor layer. In some embodiments, the thickness of the third semiconductor layer is about 0.1 µm-0.3 µm.

Method 1700 may further include forming a marker layer coupled to the third semiconductor layer (1710). In one embodiment, the marker layer may comprise a GaN layer incorporating a metallurgical concentration of silicon of $1 \times 10^{19}$ atoms/cm$^3$. In another embodiment, the marker layer may comprise an AlGaN layer incorporating a metallurgical concentration of aluminum of $1.3 \times 10^{17}$ atoms/cm$^3$. In another embodiment, the marker layer may comprise an InGaN layer incorporating a metallurgical concentration of indium of $1 \times 10^{17}$ to $1 \times 10^{19}$ atoms/cm$^3$. In one embodiment, the marker layer may have a thickness in a range of 1-10 nm, preferably 3-8 nm. In an exemplary embodiment, the marker layer has a thickness of 5 nm.

Method 1700 may further include epitaxially growing a fourth semiconductor layer coupled to the marker layer, wherein the fourth semiconductor layer is characterized by the first conductivity type and a second dopant concentration (1712). In one embodiment, the second dopant concentration of the fourth semiconductor layer is greater than the first dopant concentration of the first semiconductor layer. In one embodiment, the fourth semiconductor layer may include n-type doped GaN with a dopant concentration of $1.3 \times 10^{17}$ atoms/cm$^3$ and a thickness of about 0.3 µm-0.7 µm. In one embodiment, the second dopant concentration (e.g., $1.3 \times 10^{17}$ atoms/cm$^3$) of the fourth semiconductor layer is greater than the higher dopant concentration (e.g., $7.5 \times 10^{16}$ atoms/cm$^3$) within the graded dopant concentration of the second semiconductor layer.

Method 1700 may further include forming a hardmask layer coupled to the fourth semiconductor layer, wherein the hardmask layer comprises a set of openings operable to expose an upper surface portion of the fourth semiconductor layer (1714).

Method 1700 may further include forming a plurality of fins by etching, using the hardmask layer as a mask, the fourth semiconductor layers, wherein each of the plurality of fins is separated by one of a plurality of recess regions (1716). In one embodiment, the depth of the recess regions 1716 is between 0.6 and 1.5 µm. In one embodiment, the depth of the recess regions 1716 is about 0.8 to 1.0 µm. In one embodiment, each of the plurality of fins may have a width (between recess regions) of about 0.2 µm.

Method 1700 may further include etching at least a portion of the marker layer (1718) and detecting the etching of the at least a portion of the marker layer (1720). In one embodiment, the detection process may be conducted by standard methods (e.g., end point detectors). In one embodiment using silicon layer as the marker layer, a spike of silicon dopant is readily detectable. In another embodiment using AlGaN layer as the marker layer, the Al dopant is readily detectable. In one embodiment, method 1700 may stop etching when it is detected that the etching process has reached the marker layer. In another embodiment, method 1700 may further include etching through the marker layer, then continuing to etch the third semiconductor layer and second semiconductor layer using the hardmask layer as a mask for a predetermined time period.

Method 1700 may further include depositing a dielectric spacer layer coupled to the hardmask layer and the plurality of recess regions (1722). In one embodiment, the dielectric spacer layer is formed to be conformal to the sidewalls of the plurality of fins and the upper surface of the hardmask layer.

Method 1700 may further include forming a first photoresist layer coupled to the dielectric spacer layer (1724). In one embodiment, the first photoresist layer is formed on the dielectric spacer layer to planarize the plurality of recess regions.

Method 1700 may further include etching back the first photoresist layer to expose the dielectric spacer layer on top of the hardmask layer (1726).

Method 1700 may further include removing the dielectric spacer on top of the hardmask layer and the dielectric spacer on the sidewall to expose the fourth semiconductor layer (1728). In some embodiments, method 1700 may include removing a portion of the dielectric spacer layer on top of the hardmask layer and a portion of the dielectric spacer layer on sidewalls of the plurality of fins to expose at least a portion of the sidewalls of the plurality of fins. In some embodiments, the exposed portion of the sidewalls is between 0.4 and 0.8 µm.

Method 1700 may further include stripping off the first photoresist layer from the dielectric spacer layer (1730).

Method 1700 may further include forming a gate dielectric layer and a gate metal layer coupled to the portion of sidewalls of the fourth semiconductor layer (1732). In an embodiment, the gate metal is chosen such that the work function of the gate metal layer is such that the fin is fully depleted of mobile carriers in the region where the gate dielectric layer is in contact with the fin sidewall. In some embodiments, the fin is n-type GaN, and the gate metal layer is one of molybdenum, tungsten, or tantalum.

Method 1700 may further include forming a second photoresist layer coupled to gate metal layer (1734). In some embodiments, the second photoresist layer is patterned within the plurality of recess regions, exposing a portion of the gate metal layer on top of the plurality of fins.

Method 1700 may further include etching the gate metal layer, the gate dielectric layer, and the hardmask layer using the second photoresist layer as a mask, stopping on the fourth semiconductor layer (1736). The second photoresist layer is then removed.

Method 1700 may further include depositing a second dielectric layer coupled to the exposed gate metal layer and the fourth semiconductor layer (1738). Specifically, the second dielectric layer is deposited to cover the gate metal layer within the plurality of recess regions and the upper portion of the plurality of fins.

Method 1700 may further include forming a third photoresist layer coupled to the second dielectric layer (1740). In some embodiments, the third photoresist layer is patterned to expose a portion of the second dielectric layer on top of the plurality of fins.

Method 1700 may further include etching back the second dielectric layer using the third photoresist layer as a mask to expose the fourth semiconductor layer (1742). Specifically, the etching process is performed to etch back the portion of the second dielectric layer on top of the plurality of fins, to expose the upper portion of the plurality of fins. The third photoresist layer is then removed.

Method 1700 may further include forming a source metal layer coupled to the fourth semiconductor layer and the second dielectric layer (1744). Specifically, the source metal layer is formed on the upper portion of the plurality of fins and also coupled to the second dielectric layer.

Method 1700 may further include forming a fourth photoresist layer coupled to the source metal layer (1746). Specifically, the fourth photoresist layer is patterned to expose a portion of the second dielectric layer within the plurality of recess regions.

Method 1700 may further include etching the second dielectric layer using the fourth photoresist layer as a mask to expose the gate metal layer (1748). Specifically, the etching process is performed to etch the portion of the second dielectric layer within the plurality of recess regions to expose the gate metal layer within the plurality of recess regions.

It should be understood that the specific steps illustrated in FIG. 17 provide a particular method of manufacturing a MOSFET device according to another embodiment of the present invention. Other sequences of steps may also be performed according to alternative embodiments. For example, alternative embodiments of the present invention may perform the steps outlined above in a different order. Moreover, the individual steps illustrated in FIG. 17 may include multiple sub-steps that may be performed in various sequences as appropriate to the individual steps. Furthermore, additional steps may be added or removed depending on a particular application. One of ordinary skill in the art would recognize many variations, modifications, and alternatives.

Embodiments of the present invention are described herein with reference to the accompanying drawings. The invention may however, be embodied in many different forms and should not be construed as limited to the embodiments set forth herein. Rather, these embodiments are provided so that this invention will be thorough and complete, and will fully convey the scope of the invention to those skilled in the art. The features may not be drawn to scale, some details may be exaggerated relative to other elements for clarity. Like numbers refer to like elements throughout.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

It is to be understood that the appended claims are not limited to the precise configuration illustrated in the drawings. One of ordinary skill in the art would recognize various modification, alternatives, and variations may be made in the arrangement and steps of the methods and devices above without departing from the scope of the invention.

What is claimed is:

1. A method of manufacturing a field-effect transistor (FET) device, the method comprising:
   providing a semiconductor substrate structure comprising:
      a first epitaxial semiconductor layer coupled to a semiconductor substrate, wherein the first epitaxial semiconductor layer is characterized by a first conductivity type and a first dopant concentration;
      a second epitaxial semiconductor layer coupled to the first epitaxial semiconductor layer, wherein the second epitaxial semiconductor layer is characterized by the first conductivity type;
      a marker layer over the second epitaxial semiconductor layer;
      a third epitaxial semiconductor layer over the marker layer, wherein the third epitaxial semiconductor layer is characterized by the first conductivity type; and
      a fourth epitaxial semiconductor layer over the third epitaxial semiconductor layer, wherein the fourth epitaxial semiconductor layer is characterized by the first conductivity type and a second dopant concentration;
   forming a hardmask layer coupled to the fourth epitaxial semiconductor layer, wherein the hardmask layer comprises a set of openings operable to expose an upper surface portion of fourth epitaxial semiconductor layer;
   etching a portion of the fourth epitaxial semiconductor layer and the third epitaxial semiconductor layer to form a plurality of fins;
   etching at least a portion of the marker layer;
   detecting the etching of the at least a portion of the marker layer;
   epitaxially growing a semiconductor layer in recess regions disposed between adjacent fins of the plurality of fins;
   forming a source metal layer on each of the plurality of fins; and
   forming a gate metal layer coupled to the semiconductor layer.

2. The method of claim 1, wherein etching of the at least a portion of the marker layer comprises etching through the marker layer and etching a portion of the second epitaxial semiconductor layer.

3. The method of claim 1, wherein;
providing the semiconductor substrate structure comprises providing the marker layer comprising a marker layer dopant concentration; and
detecting the etching comprises measuring the marker layer dopant concentration.

4. The method of claim 1, wherein;
detecting the etching comprises measuring threshold voltage of the FET device.

5. The method of claim 1, wherein the semiconductor layer comprises-a fifth epitaxial semiconductor layer characterized by a second conductivity type opposite to the first conductivity type.

6. The method of claim 1, further comprising etching the second epitaxial semiconductor layer using the hardmask layer as a mask for a predetermined time period.

7. The method of claim 1, wherein the second epitaxial semiconductor layer is characterized by a first graded dopant concentration that is a gradient linearly increased from the first dopant concentration to a third dopant concentration, wherein the third dopant concentration is greater than the first dopant concentration and less than the second dopant concentration.

8. The method of claim 1, wherein the third epitaxial semiconductor layer is characterized by a second graded dopant concentration that is a gradient linearly increased from a third dopant concentration to the second dopant concentration, wherein the third dopant concentration is greater than the first dopant concentration and less than the second dopant concentration.

9. The method of claim 1, wherein the second dopant concentration is greater than the first dopant concentration.

10. The method of claim 1, wherein;
the marker layer comprises silicon and is characterized by a marker layer dopant concentration; and
detecting the etching comprises measuring the marker layer dopant concentration.

11. The method of claim 1, wherein the marker layer has a thickness in a range of 5-10 nm.

12. A method of forming a field-effect transistor (FET) device, comprising:
providing a semiconductor substrate;
providing a first semiconductor layer coupled to the semiconductor substrate, wherein the first semiconductor layer is characterized by a first conductivity type and a first dopant concentration;
providing a second semiconductor layer coupled to the first semiconductor layer, wherein the second semiconductor layer is characterized by the first conductivity type;
providing a marker layer over to the second semiconductor layer, wherein the marker layer is characterized by a marker layer dopant concentration;
providing a third semiconductor layer over the marker layer, wherein the third semiconductor layer is characterized by the first conductivity type;
providing a fourth semiconductor layer over the third semiconductor layer;
selectively removing portions of the fourth semiconductor layer, portions of the third semiconductor layer, and at least a portion of the marker layer to provide a plurality of fins separated by one of a plurality of recess regions, wherein selectively removing comprises detecting the marker layer dopant concentration, and wherein each of the plurality of fins is characterized by a second dopant concentration;
providing a fifth semiconductor layer epitaxially grown within the plurality of recess regions, wherein the fifth semiconductor layer is characterized by a second conductivity type opposite to the first conductivity type;
providing a source metal layer coupled to each of the plurality of fins; and
providing a gate metal layer coupled to the fifth semiconductor layer.

13. The method of claim 12 wherein:
providing the second semiconductor layer comprises providing the second semiconductor layer characterized by a first graded dopant concentration that is a gradient linearly increased from the first dopant concentration to a third dopant concentration; and
the third dopant concentration is greater than the first dopant concentration and less than the second dopant concentration.

14. The method of claim 12 wherein:
providing the third semiconductor layer comprises providing the third semiconductor layer characterized by a second graded dopant concentration that is a gradient linearly increased from a third dopant concentration to the second dopant concentration; and
the third dopant concentration is greater than the first dopant concentration and less than the second dopant concentration.

15. The method of claim 12, wherein providing the marker layer comprises:
providing the marker layer comprising one or more of silicon or AlGaN; and
providing the marker layer comprises a thickness in a range of 5-10 nm.

16. The method of claim 12, wherein:
providing the first semiconductor layer comprises providing the first semiconductor layer comprising a III-nitride compound; and
providing the second semiconductor layer comprises providing the second semiconductor layer comprising a III-nitride compound.

17. The method of claim 12 wherein:
providing the source metal layer comprises providing the source metal layer comprising at least one material chosen from a refractory metal, a refractory metal compound, and a refractory metal alloy; and
providing the gate metal layer comprises providing the gate metal layer comprising at least one material chosen from nickel, gold, molybdenum, platinum, palladium, and silver.

18. The method of claim 12, wherein:
providing the marker layer comprises providing the marker layer comprising a GaN layer incorporating a metallurgical concentration of silicon of about $1\times10^{19}$ atoms/cm$^3$.

19. The method of claim 12, wherein:
providing the marker layer comprises providing the marker layer comprising:
InGaN incorporating a metallurgical concentration of indium in a range from about $1.0\times10^{17}$ atoms/cm$^3$ to about $1.0\times10^{19}$ atoms/cm$^3$; and
a thickness in a range from about 3 to about 8 nanometers.

20. The method of claim 12, wherein:
selectively removing comprises removing a portion of the second semiconductor layer under the marker layer.

* * * * *